(12) United States Patent
Lopez et al.

(10) Patent No.: US 8,260,628 B2
(45) Date of Patent: *Sep. 4, 2012

(54) AUTOMATED PRICING AND/OR "GREEN" INDICATING METHOD AND SYSTEM

(75) Inventors: Douglas D. Lopez, Los Alamitos, CA (US); Robert L. Klug, Laguna Beach, CA (US)

(73) Assignee: Uniloc Luxembourg S. A., Luxembourg (LU)

( * ) Notice: Subject to any disclaimer, the term of this patent is extended or adjusted under 35 U.S.C. 154(b) by 226 days.

This patent is subject to a terminal disclaimer.

(21) Appl. No.: 12/802,848

(22) Filed: Jun. 15, 2010

(65) Prior Publication Data

US 2010/0324956 A1      Dec. 23, 2010

Related U.S. Application Data

(63) Continuation-in-part of application No. 12/011,270, filed on Jan. 25, 2008, now Pat. No. 7,769,595, which is a continuation-in-part of application No. 12/004,187, filed on Dec. 20, 2007, now Pat. No. 7,783,523, which is a continuation-in-part of application No. 10/346,989, filed on Jan. 17, 2003, now Pat. No. 7,337,151.

(51) Int. Cl.
*G06Q 99/00* (2006.01)
(52) U.S. Cl. .......... 705/1.1; 705/26.1; 705/400
(58) Field of Classification Search .......... 705/1.1, 705/26.1, 400
See application file for complete search history.

(56) References Cited

U.S. PATENT DOCUMENTS

| 5,189,606 | A | 2/1993 | Burns et al. ............ 364/401 |
| 5,307,261 | A | 4/1994 | Maki et al. ............ 364/401 |

(Continued)

FOREIGN PATENT DOCUMENTS

JP        2001/357075 A     12/2001

(Continued)

OTHER PUBLICATIONS

"Timberline CAD Integrator Uses IFC Standard to Create Cost Estimates Directly from CAD Designs in Record Time", Mar. 4, 2002, 10.aeccafe.com, 2 pages.*

(Continued)

*Primary Examiner* — John Hayes
*Assistant Examiner* — Freda A Nelson
(74) *Attorney, Agent, or Firm* — Sean D. Burdick

(57) ABSTRACT

The present invention comprises a rapid and automated creation of a price schedule and/or a "green" schedule comprising steps and an implementation for providing a set of construction (or other) plans created with an architectural, civil, industrial or other software design tool, such as CAD, and optionally a palette of 2-dimensional and/or 3-dimensional architectural parametric symbols that correspond to respective construction plan elements, such as windows, doors, acrylic glass blocks and/or sky lights. At least one parametric symbol corresponding to a construction plan element is preferably inserted into the construction plans. A cost value and a statement indicating whether or not a parametric symbol is "green" for each of the inserted parametric symbols is calculated and/or determined corresponding to respective plan elements. A price schedule, a "green" schedule or both are then created, which can include the total cost for all of the inserted parametric symbols corresponding to respective plan elements, and a statement for each of the inserted symbols indicating whether or not they are certified as being energy efficient or rated "green."

539 Claims, 52 Drawing Sheets

U.S. PATENT DOCUMENTS

| | | | |
|---|---|---|---|
| 5,570,292 A | 10/1996 | Abraham et al. | 364/473.01 |
| 5,761,674 A | 6/1998 | Ito | 707/104 |
| 5,893,082 A | 4/1999 | McCormick | 705/400 |
| 5,918,219 A | 6/1999 | Isherwood | 705/37 |
| 6,002,855 A | 12/1999 | Ladner et al. | 395/500.01 |
| 6,037,945 A | 3/2000 | Loveland | 345/240 |
| 6,038,547 A | 3/2000 | Casto | 705/30 |
| 6,324,508 B1 | 11/2001 | Finney | 704/246 |
| 6,393,410 B1 | 5/2002 | Thompson | 705/37 |
| 6,446,035 B1 | 9/2002 | Grefenstette et al. | 704/1 |
| 6,446,053 B1 | 9/2002 | Elliott | 705/400 |
| 6,581,040 B1 | 6/2003 | Wright et al. | 705/7.23 |
| 6,681,140 B1 | 1/2004 | Heil | 700/95 |
| 6,810,401 B1 * | 10/2004 | Thompson et al. | 1/1 |
| 6,826,516 B1 | 11/2004 | Ito | 703/1 |
| 6,854,218 B2 | 2/2005 | Weiss | 52/79.1 |
| 6,859,768 B1 * | 2/2005 | Wakelam et al. | 703/1 |
| 6,922,701 B1 | 7/2005 | Ananian et al. | 1/1 |
| 7,283,975 B2 | 10/2007 | Broughton | 705/28 |
| 7,337,151 B2 | 2/2008 | Lopez et al. | 705/400 |
| 7,769,595 B2 | 8/2010 | Lopez et al. | |
| 7,783,523 B2 | 8/2010 | Lopez et al. | |
| 2001/0047250 A1 | 11/2001 | Schuller et al. | |
| 2001/0047251 A1 | 11/2001 | Kemp | |
| 2002/0016725 A1 | 2/2002 | Eichstaedt et al. | |
| 2002/0026343 A1 | 2/2002 | Duenke | |
| 2002/0035408 A1 * | 3/2002 | Smith | 700/97 |
| 2002/0099617 A1 | 7/2002 | Fogelson | |
| 2002/0103557 A1 | 8/2002 | Land | |
| 2003/0050871 A1 | 3/2003 | Broughton | |
| 2003/0097240 A1 | 5/2003 | Atasoy | |
| 2003/0139995 A1 | 7/2003 | Farley | |
| 2004/0049739 A1 | 3/2004 | McArdle et al. | |
| 2004/0205519 A1 * | 10/2004 | Chapel et al. | 715/502 |
| 2005/0038636 A1 | 2/2005 | Wakelam et al. | |
| 2005/0080502 A1 | 4/2005 | Chernyak et al. | |
| 2006/0277007 A1 | 12/2006 | Wakelam et al. | |
| 2008/0077364 A1 | 3/2008 | Wakelam et al. | |
| 2008/0249756 A1 | 10/2008 | Chaisuparasmikul | |

FOREIGN PATENT DOCUMENTS

| | | | |
|---|---|---|---|
| JP | 2004/062601 | | 2/2004 |
| JP | 2002062601 A | * | 2/2004 |
| WO | WO 01/08269 A2 | | 1/2001 |
| WO | WO 01/29634 A2 | | 4/2001 |
| WO | WO 01/55831 A1 | | 8/2001 |
| WO | WO 01/67372 A1 | | 9/2001 |
| WO | WO 01/88740 A1 | | 11/2001 |
| WO | WO 02/13108 A1 | | 2/2002 |
| WO | WO 02/29518 A2 | | 4/2002 |
| WO | WO 02/070989 | | 9/2002 |
| WO | WO 03/062957 | | 7/2003 |

OTHER PUBLICATIONS

John G. Swanson (Editor), "E. Business Evolving Rapidly," Mar. 2001, Window & Door, 8 pages.

"California Distributor Selling Windows On Line," Sep. 2000, Window & Door, 2 pages.

Activewin.com.

EPIC Electronic Product Information Corp., Product Brochures, Apr. 1997.

EPIC Product Information Corp., Technology, Software Brochure, May 1992.

EPIC Electronic Product Information Corp., Quick Reference Technology Demo, Mar. 1995.

Edgenet Media, Made 2 Order, Brochure, Rev. Jul. 28, 1998.

"Timberline CAD Integrator Uses IFC Standard to Create Cost Estimates Directly from CAD Designs in Record Time," Mar. 4, 2002, 10.aeccafe.com.

H. Edward Goldberh, "BIM Update 2006—How Complete is the Building Information Model?," Cadalysts, vol. 23, No. 11, p. 50, Nov. 2006.

* cited by examiner

| Name | Library | Description | Full path |
|---|---|---|---|
| Peak Rake | Window | No description | C:\Program |
| Picture Window | Window | No description | C:\Program |
| Right Facing Quarter Ro... | Window | No description | C:\Program |

⇐ Details Column Controls

Your only a few steps away from accessing 1stpricing/1stwindows.com new quoting features including Quote Storage, Multiple Quotes, Password Protection, Customizing Bidding and much more! It's easy, fast and free. To sign up, simply fill out the following form below and click "Submit" when you are finished.

Personal Profile  * Indicates a Mandatory Field

First Name: *
Last Name: *
User Name: *  ← UserID
Password: *
Re-Type Password: *

You will use this information to log into your 1stpricing/1stwindows.com account. Your password must be at least 4 characters long and should be different than your username. Remember that the password is case sensitive.

Type of Account: * ⦿ Contractor  ○ Architect  ○ Consumer
Company Name: *
Contractors License:
(if your state requires one)
Address:
City:
State: * [Alabama ▼]

Reference Number: 6519035

Select window and door manufacture:
- ◉ 1stWindows  $4,277.26
- ○ None

Account Name
tester
Log Out

Change Quote
View Quote
Alter Quote
View All Quotes
Create New Quote
Compare Prices
Prepare a Quote

Current Quote

Name: 1stPricing Reference #6519035

State: California
Change State

Number of Items: 4

Total: $1074.13

Check Out Process

Payment Information

Method of Payment:
- ● American Express
- ○ Discover
- ○ Mastercard
- ○ Pay on account
- ○ Pay over the phone
- ○ Visa Card Holder's Name: [_____]  ← Check out process Credit Card Number: [_____]

Expiration Month: [Jan ▼]   Expiration Year: [2007 ▼]

☐ To complete your purchase you must check this box to signify that you have read and accept the following:

---

Terms and Conditions of Sale

All sales are final. Your credit card will be processed at the time of the order.

"ARBITRATION OF DISPUTES

Any controversy or claim arising out of or relating to this contract or breach thereof shall be settled by arbitration in accordance with the Uniform Rules for Better Business Bureau Arbitration, and the judgment upon the award rendered by the arbitrator's may be entered in any court having jurisdiction thereof."

[Next Page]

*FIG. 31*

Check Out Process

| Ship To: | Bill To: |
|---|---|
| Window Buyer | Window Buyer |
| 1858 East 20th Street | 1858 East 20th Street |
| Signal Hill, CA US | Signal Hill, CA US |
| Phone: 562-494-8069 Fax: | Phone: 562-494-8069 Fax: |
| Cell: Pager: | Cell: Pager: |

| Product | Quantity | Unit | Total |
|---|---|---|---|
| Milgard Tuscany Vinyl Half Vent Sliding Window | 1 | $123.98 | $123.98 |

← Check out process

Rough Opening
Type: XO
Size: 22" x 14"
Frame Type: Nail On
Frame Color: White
Grid Pattern: None
Glass Type: Clear
Low E: Yes
Tempered: No Sub-Total $123.98
Shipping $55.00
Tax $14.77

Total $193.75

Billing Information: Card Type: Pay on account
Expiration: 1/2008

A confirmation email will be sent to info@1stwindows.com

If this information is correct, click on 'Submit Order' button.
Otherwise, click the 'Change Fields' button to go back to make the necessary changes.

[Submit Order]  [Change Fields]

TAX: All purchase within California will be subject to a sales tax of 8.25%. For all purchase outside of California, the contractor is required to pay all local and state taxes.

FIG. 32

Thank You for your order

A confirmation email has been sent to you.

For reference your order number is TS9G7D

Click Here to Continue Shopping

Back

AUTOMATED PRICING AND/OR "GREEN" INDICATING METHOD AND SYSTEM

FIELD OF THE INVENTION

This application is a continuation-in-part non-provisional patent application of non-provisional patent application U.S. Ser. No. 12/011,270, filed on Jan. 25, 2008 now U.S. Pat. No. 7,769,595 ("third continuation-in-part patent application"), which is a continuation-in-part non-provisional patent application of non-provisional patent application U.S. Ser. No. 12/004,187, filed on Dec. 20, 2007 now U.S. Pat. No. 7,783,523 ("second continuation-in-part patent application"), which is a continuation-in part non-provisional patent application of non-provisional patent application U.S. Ser. No. 10/346,989, filed on Jan. 17, 2003, now U.S. Pat. No. 7,337,151 ("first continuation-in-part patent application"). This continuation-in-part patent application claims the benefit of prior non-provisional patent applications U.S. Ser. No. 12/011,270, filed on Jan. 25, 2008, U.S. Ser. No. 12/004,187, filed on Dec. 20, 2007, and U.S. Ser. No. 10/346,989, filed on Jan. 17, 2003, which patent applications are each hereby incorporated into this continuation-in-part patent application in their entireties by reference.

BACKGROUND OF THE INVENTION

1. Background

In a typical construction design, a set of construction plan drawings are generated, usually with a computer-implemented tool, such as an architectural CAD (Computer Aided Design) software product. Disadvantageously, the various elements and materials of the construction project, for example, windows, doors, skylights, acrylic glass blocks and the like, are priced out in estimating the cost of the job in a completely separate process, and usually only by one manufacturer. This separate process very disadvantageously adds a significant amount of time and effort to the process of generating a construction job price. Also very disadvantageously, because different construction materials of varying quality and cost can generally be used on the same construction job or project, the cost amounts that are set forth on a price schedule that is generated by this separate process can vary by a very wide margin. Further, and also disadvantageously, in the event that the price schedule needs to be changed, for example, due to cost overruns, competitive bidding and/or other factors, a new price schedule must be generated, with an additional significant investment of time and effort involved for each such revision. Again, this ads a significant amount of extra expense to a construction project, and this typical process limits the flexibility in selected various construction materials for contractors and end-use customers.

It is important to provide a price, rather than an estimate, for a proposed construction project. In order for a bank (or other lending institution) to approve a construction loan for a proposed construction project, the bank generally requires an accurate price for the construction project, and will not rely upon an estimate, because estimates are often extremely inaccurate. If a bank does accept an estimate, and the estimate turns out to be lower than the final price for the construction project, the bank, which has control in such a situation, may then additionally charge large points and/or fees for the construction loan, substantially raising the price of the construction project, which is very undesirable. If the estimate turns out to be lower than the final price, this often results in construction cost overruns, construction time delays and dissatisfaction of customers.

Most of the time when architectural plans are drawn, the plans are drawn inaccurately. If an architectural plan is drawn inaccurately, and a price is provided for a corresponding construction project, this situation generally presents significant problems with respect to construction cost overruns, construction time delays and the satisfaction of customers (homeowners or building owners).

Further, architects and other building designers that are interested in designing energy efficient and/or water efficient buildings currently have to manually look up (in books or various web sites) whether or not each different construction plan element, object, item and/or appliance that is to be used in the building, such as a bamboo floor, a concrete floor, other flooring, a window, a door, a skylight, an acrylic glass block, insulation, a roof, a fireplace, appliances, electrical fixtures, plumbing fixtures, drywall, heaters, forced air units, air conditioners, lumber, laminates, molding, siding, engineered lumber products, carpet or the like, is environmentally responsible, has a U.S. "Energy Star" label or is otherwise certified by a third party individual or entity as being "green." The plan drawer then has to describe this on the building plan. Disadvantageously, this process is extremely labor intensive and time consuming, often resulting in plan drawers simply not doing this.

To design a "green" building typically costs about 2% more than designing a building that is not "green." However, this additional cost typically pays itself back more than 10 times during the estimated 20 year life span of a building by saving money in energy and/or water costs, resulting in a huge long-term energy cost savings for the building owner (in heating, cooling, lighting, water heating, lawn watering, water and sewer costs and the like). Further, the "green" building design is most effective when architects and contractors integrate "green" energy and/or water efficient features into the building design as far in advance as possible, thereby making the building to be constructed the highest performing building possible. Moreover, the designing of a "green" building is very beneficial for the welfare of our planet. Energy consumption from information technology is known to be a major contributor to global warming, and significant resulting changes in the weather (massive hurricanes, tsunamis, droughts, glacier meltings and the like).

It was a goal of the present invention to solve the above-described problems.

2. Description of the Art

Wakelam et al. (U.S. Pat. No. 6,859,768 B1) describe a computer-implemented automated building design and modeling system ("DMES system") that includes a database (column 4, lines 30-32) that provides a central source for all design and construction information for a construction project (abstract, column 1, lines 57-67, and claim 1). Ordinary elements and massing elements are assembled into a building model according to a sequential assembly hierarchy, "thus assembling a complete building model automatically . . . " (abstract and claim 11). Software for a commercially-available "cost estimating system" (represented as 112 in the figures), as well as software for several other systems that may be employed in a network implementation of the DMES system, is stored on a hard drive of a computer (FIG. 1 and column 7, lines 45-62). The "cost estimating system" produces a cost estimate (not a price), which is implemented using Ice 2000 computer software.

In contrast with the present invention, Wakelam et al. do not describe the production of a "price quote" or a "price schedule," or of information in connection with the environmental and/or energy efficiency and/or responsibility of a building. It is clear from a detailed review of Wakelam et al.

that the systems and processes described therein only produce an estimate (a "cost estimate"), which is for a production of an entire building. (See, for example, FIGS. 2g, 2h, 2i, 2j, 2k and 6b, the abstract, Appendix A, and column 1, lines 51-54, column 3, lines 42-46, column 7, lines 37-43, column 9, lines 8-31, and the claims of Wakelam et al.).

The "cost estimating system" that is described by Wakelam et al. for producing cost estimates is one of several different systems that are implemented with the DMES system described therein, and is a known computer software named "Ice 2000" that is commercially available from $MC^2$ Management Computer Controls, Inc., and described on the $MC^2$ Management Computer Controls, Inc. mc2-ice web site (column 7, lines 55-58).

Also, in contrast with the present invention, Wakelam et al. does not describe an ability to determine a price quote or price schedule for only one or two construction plan elements, such as only a window, or only a window and a door. It is clear from a detailed review of Wakelam et al. (including FIGS. 1-6) that the processes and systems that are described therein only provide a "cost estimate" (only a "ball park" figure regarding what the actual cost of designing and building a building may be) for the production of an entire building (i.e., not for individual construction products, such as a window, a door, an acrylic glass block, a sky light or the like). The cost estimate for the entire building includes cost estimate data for a wide variety of materials, components and labor, such as electrical devices, equipment and wiring, lights, HVAC systems, elevators, and man hours of labor involved in the fabrication of the building, as well as construction products, such as windows and doors.

As a result of the above difference, the methods and systems of the present invention are advantageously much more versatile than the methods and systems that are described by Wakelam et al. For example, the present invention can be employed in small or large residential or commercial remodeling construction projects, as well as for constructing entire new residential or commercial buildings. In contrast, the methods and systems described by Wakelam et al. can only be used for the construction of an entire new building.

Also in contrast with embodiments within the present invention, Wakelam et al. does not describe a process or system having a plug-in (add-on) computer software code that runs as an internal component within a software design tool on a local computer, such as architectural CAD, but rather uses a stand alone, interview-based system, and a commercially available cost estimation software named Ice 2000. It is clear from a detailed review of Wakelam et al. that the processes and systems that are described therein are stand-alone processes and systems that can work in a network along with the DMES system.

Moreover, Wakelam et al., which describe a very complicated system that is employed to construct an entire building using a series of multiple tiers and hierarchies, teach away from the use of architectural CAD (a software design tool) by stating the following at Column 4, Lines 38-59, and Column 18, Lines 7-23, respectively:

" . . . In contrast to a conventional CAD tool, which uses software algorithms that scan and sort the locations and extents of all three-dimensional primitive geometries in a building model and compares all of the locations thereof for potential overlaps, the DMES system of the present invention performs clash detection, or interference checking, by cross-checking the location and extents of a current instance of an object against only those other existing instances in the model, i.e., the spatial database, and adjusting its position if necessary before assembling it into the model. This automatic clash detection is part of the assembly code included in each massing element and each element uses its own specific functions to determine the parameters of a clash and the rules by which to reposition the instance. This process has a small incremental impact on the speed of the assembly process, but completely removes the need for a series of long clash detection exercises after the model is complete." [Emphasis added.]

" . . . In contrast to a conventional CAD tool, which uses software algorithms that scan and sort the locations and extents of all three-dimensional primitive geometries in a building model and compares all of the locations thereof for potential overlaps, the DMES system of the present invention performs clash detection, or interference checking, by cross checking the location and extents of the current instance against only those other existing instances in the model and adjusting its position if necessary before assembling it into the model. This automatic clash detection is part of the assembly process in each massing element and each element uses its own specific functions to determine the parameters of a clash and the rules by which to reposition the instance. This process has a small incremental impact on the speed of the assembly process, but completely removes the need for a series of long clash detection exercises after the model is complete." [Emphasis added.]

Further, in contrast with embodiments within the present invention, Wakelam et al. does not describe a process or system that employs a zip code of a construction site to access price data from a web site on a remote server system, an external or other physical storage medium or the like. Wakelam et al. does not describe a process or system that employs a web site that includes price data for a purchase of one or more construction plan elements in a geographical location within a zip code or otherwise. Further, in contrast with the "cost estimates" described by Wakelam et al., the price data described herein can be relied upon to purchase one or more construction plan (or other) elements.

In contrast with embodiments within the processes and systems of the invention, the processes and systems that are described by Wakelam et al. are very complicated (perhaps because an entire building is being assembled), and include an assembly hierarchy having five or more tiers.

Further, in contrast with embodiments within the present invention, Wakelam et al. do not describe: (a) an insertion of a price schedule into a construction plan; (b) a price schedule that contains a list of construction plan elements with corresponding price quotes; (c) a placing of an order to purchase one or more construction plan elements; (d) a placing of an order to purchase one or more construction plan elements using a local computer or a web site on a remote server, or both; (e) a placing of an order to purchase one or more construction plan elements using a credit card and a local computer or a web site on a remote server, or both; or (f) a creation of a price schedule including one or two construction plan elements.

U.S. Pat. No. 6,446,053 B1 (Elliott) describes a computer-implemented method and system for producing a proposal for a construction project (title). The system includes a central site with various databases and a user site connected for electronic communication over a networked communication system such as the Internet (abstract). The user site includes a computer having stored in memory an application that enables a user to develop a construction proposal including a detailed graphical model and a detailed cost estimate model, have the proposal submitted electronically over a networked communication system to a construction professional for a bid, and receive a response on the proposal from the construction professional over the networked communications system (abstract). The application educates the user as it guides the user through a series of construction phases and steps, prompting the user to input critical information and make appropriate selections throughout the series of phases and steps (abstract). The method and system provide a proposal and a cost "estimate," not a final price (abstract).

In contrast with embodiments within the methods and systems of the present invention, Elliott: (1) does not employ a plug-in (add-on) computer software code that runs as an internal component within a software design tool on a local computer, such as architectural CAD (but rather uses a stand alone, interview-based system); (2) does not insert parametric symbols into a construction plan; (3) does not, using an add-on computer software code, transmit data corresponding to inserted parametric symbols from a local computer over the Internet to a remote server system; (4) use a zip code and an add-on computer software code to access price data from a web site on a remote server system; (5) determine from price data a price quote for each of several construction elements, but rather provides only a cost estimate; or (6) provide information in connection with the environmental responsibility of a building, building component or building material.

Both Wakelam et al. and Elliott use stand alone computer software for cost estimation that does not include an add-on (plug-in) computer software code. Wakelam et al. uses commercially available Ice 2000 (column 7, lines 55-58), and Elliott uses a software package (not named) that is "preferably installed on the hard disc of a user's computer" (column 5, lines 25-27).

Further, Elliott does not teach or suggest the creation of a construction plan using a software design tool, such as architectural CAD. In contrast, Elliott describes (col. 6, lines 43-50, and col. 10, lines 20-24) the scanning of a photograph or construction plan into a user's computer to produce a digital image, which is a completely different process.

Additionally, the systems of both Wakelam et al. and Elliott provide only an "estimate" for the products described therein, and not a final price. This is a very important distinction between the present invention and the teachings of Wakelam et al. and Elliott. For the reasons that follow, it is important to obtain a price, rather than an estimate. Generally, lending institutions will not rely upon an "estimate" when considering whether or not to make a construction loan because estimates are often extremely inaccurate, and such inaccuracy often results in large construction cost overruns and significant construction time delays. Further, a price is binding upon the person or entity that provides the price, whereas an estimate does not bind a person or entity to a particular price. Therefore, a person or entity that provides a price must honor their price (or may be sued for not doing so), even if the construction job for which the price was quoted ends up costing significantly more money than the price quoted, causing the person or entity that quoted the price to lose a significant amount of money. This is not true of an estimate, which does not bind a person or entity to a particular price. As can be seen, it is significantly more risky to provide a price in comparison with an estimate, which is the reason why contractors generally only provide estimates (i.e., they do not want to be bound to a particular price). Further, it is a much more complex process to provide a price (an assigned amount of money that is required to be paid in order to make a purchase) in comparison with an estimate (a rough calculation). Elliott itself acknowledges this fact by stating, "Calculating the material quantities and costs [of large construction projects] can be very complicated" (column 1, lines 25-26).

Moreover, neither Wakelam et al. nor Elliott teach or suggest the use of a zip code to determine price data for one or more construction plan elements. Although Elliott discusses zip codes, such discussion only relates to the average labor rate, the average price of land, the average cost of builder's risk insurance and building permit costs, not to construction plan elements (col. 4, lines 44-62). The foregoing items are completely different from construction plan elements, and the pricing of the foregoing items would be completely different from the pricing of construction plan elements.

In contrast with embodiments within the present invention, neither Wakelam et al. nor Elliott teach or suggest any of the following:

(1) inserting a price schedule into a construction plan;
(2) a price schedule that contains a list of construction plan elements with corresponding price quotes;
(3) the use of a CAD (Computer Aided Design) software product to create a construction plan;
(4) an add-on computer software code that imbeds a price schedule into a construction plan;
(5) the creation of a price schedule that includes one or two construction plan elements;
(6) a plug-in (add-on) computer software code and a web site that permit a user to place an order to purchase one or more of the construction plan elements that are present in a price schedule; or
(7) a plug-in (add-on) computer software code and a web site that permit a user to automatically receive information in connection with the environmental responsibility of a building, building component or building material.

U.S. Pat. No. 6,810,401 B2 (Thompson et al.) describes an automated configuration system (and method) for facilitating the configuration of desired products, services, or other assemblages that require users to gather and assimilate disparate knowledge of makes, models, types, features, codes, and prices of the desired product/service to be configured (abstract). In accordance with a preferred embodiment, configuration is facilitated through interaction of a user with a frame engine that performs frame-based inferences to discern stored knowledge of a product (or the like), as supplemented by a rules-based inference system (column 1, lines 30-34).

In contrast with embodiments within the methods and systems of the present invention, Thompson et al. describe a configuration system that does not use a plug-in (add-on) computer software code that runs as an internal component within a software design tool on a local computer, such as architectural CAD. Further, a construction product, such as a window or door, cannot be drawn in architectural CAD using the Thompson et al. system because the Thompson et al. system does not work in architectural CAD. In contrast, a construction product may only be cut and pasted into architectural CAD (in the same manner that a picture can be cut and pasted into a Word document). The configuration system of Thompson et al. is just drawing a picture on a computer. Moreover, the Thompson et al. system can only provide a price for one type of a construction product, such as a window, at a time, and provides a very slow process for providing such price. For example, in contrast with the methods and systems of the present invention, the system of Thompson et al. cannot provide a price for both a window and a door at the same time, or using the same computer software. Very disadvantageously, the Thompson et al. system must use a different type of software for each different type of construction product, for example, four different softwares for a window, a door, an acrylic glass block and a sky light, which is very time consuming and expensive.

In contrast with the Thompson et al. system, embodiments within the methods and systems of the present invention use a plug-in (add-on) computer software code that runs as an internal component within a software design tool on a local computer, such as architectural CAD. A product, such as a bay window, can be drawn in architectural CAD, and may then be imbedded into a wall of a room or structure, such as a Great Room. The window preferably gets sized, and then may optionally be "burned" into a wall, so that one can clearly see exactly what the window will look like when it is added to the room and embedded into the wall. The "burning" of the window into the wall is a function of the plug-in (add-on) computer software code that runs as an internal component within the architectural CAD program (or otherwise). The system that is described by Thompson et al. does not do this. Such system is not working in architectural CAD. Further, with the methods and systems of the present invention, changes may be made to the window (while embedded into the wall in a room or otherwise), and the changes to the window can then be clearly viewed (while the window is embedded into the wall in a room or otherwise). These methods and systems can provide a price (a final price, and not an estimate) very rapidly for one or more different types of construction or other products, which is "tricky" (i.e., not easily accomplished). With the methods and systems of the present invention, it is possible to obtain a price for a construction (or other) product, such as a window or door, from as many as fifteen or more different manufacturers and/or distributors (or others) at the same time, an average price in the geographic (or other) area, or any other type of a desired or required price. Further, the present invention optionally may use a zip code to obtain, and provide, price data for the purchase of one or more construction (or other) products, which includes a subtotal, tax and a final price. Very advantageously, the construction (or other) products can be purchased the same day (i.e. immediately).

None of Thompson et al., Wakelam et al. or Elliott teach or suggest any of the following steps, elements or limitations of embodiments within the methods and systems of the present invention:

(1) using an add-on (plug-in) computer software code that runs as an internal component within a software design tool on a local computer;

(2) an insertion of parametric symbols into a construction plan;

(3) using the add-on computer software code, transmitting data corresponding to each inserted parametric symbol from a local computer over the Internet to a remote server system, or to an external storage device (with or without the use of the Internet and/or a web site) or otherwise;

(4) using a zip code and an add-on computer software code to access price data from a web site on a remote server system, or from a database maintained anywhere, such as in an external storage device or otherwise;

(5) creating a price schedule from price quotes; or (6) a plug-in (add-on) computer software code and optionally a web site that permit a user to automatically receive information in connection with the environmental responsibility of a building, building component or building material.

Further, Thompson et al. does not teach or suggest: (1) providing a construction plan on a local computer; (2) creating a construction plan with a software design tool; or (3) providing on a local computer a palette that includes at least one parametric symbol.

The products that are described by Thompson et al. cannot be drawn in an architectural CAD (or other) software design tool. In contrast, they may only be assembled in such a tool by an architect (a different user with a different computer). With the use of human intervention (i.e. no automation), drawings that are created by the Thompson et al. system can be sent or exported to an architect, for example, using e-mail, and the architect can then cut and paste the drawings into an architectural CAD program that the architect is using. The Thompson et al. system merely allows one to cut and paste drawings of products into a CAD program. For example, a window could be drawn in Microsoft Word using its drawing tools, and such drawing could be considered to be a CAD drawing because it is a "computer assisted drawing" (i.e., a computer assists a user in drawing the window). Further, the drawing could be e-mailed to an architect to be inserted into an architectural CAD program. However, in contrast with the methods and systems of the present invention, the user is not working in an architectural CAD program, and the drawing is not an add-on to an architectural CAD program.

In contrast with the above, the methods and systems of the present invention perform one or more sets of operations in a software design tool, such as architectural CAD, using an add-on (plug-in) computer software program. With this invention, no human intervention is required or generally desired (i.e., it is automated), and drawings can be "burned" (inserted) into a construction plan that has been designed using an architectural CAD program (or other software design tool).

Further, the Thompson et al. system can only be employed with one single product type, such as a window, whereas the methods and systems of the present invention can draw and price multiple different projects, such as a window, a door and an acrylic glass block, and rapidly provide comparison pricing for the various products from multiple different manufacturers and/or distributors (or others).

Moreover, like Wakelam et al. and Elliott, Thompson et al. does not teach or suggest the use of a zip code to determine price data for one or more construction plan (or other) elements. Additionally, Thompson et al. do not teach or suggest:

(1) placing an order to purchase one or more of the construction plan (or other) elements that are present in a price schedule (because no price schedule is created by Thompson et al.); or (2) a system wherein an add-on (plug-in) computer software code and a web site permit a user to place an order to purchase one or more construction plan (or other) elements.

U.S. Patent Application Publication No. 2001/0047250 A1 (Schuller et al.) describes a computer-implemented method of visualizing a decorating project (abstract). The method includes rendering an image of a building space (e.g., a room) that includes a number of structural objects (such as doors, walls, and furniture) (abstract). The structural objects may be portrayed in the rendered image with visual characteristics that are determined by decorative materials (such as paint, fabric, or wallpaper) associated with the objects (abstract). Schuller et al. also describe a computer-implemented decorating system that includes a server operatively coupled to a memory, a database, and a network over which data can be exchanged with client computers (abstract). The memory includes software instructions to configure the server to retrieve modeling software from the database in response to requests from client computers, and to send the modeling software over the network to the client computers (abstract).

The modeling software includes instructions to configure the client computers to model structural objects, to associate decorative materials with the structural objects, and to render an image of a building space (abstract). The rendered image portrays structural objects in accordance with visual characteristic of associated decorative materials (abstract).

In contrast with embodiments within the methods and systems of the present invention, the decorating system of Schuller et al.: (1) does not employ a plug-in (add-on) computer software code that runs as an internal component within a software design tool on a local computer, such as architectural CAD but, rather, uses a stand alone computer program; and (2) does not employ a zip code to provide any prices. Although Schuller et al. state that their implementations can include automated purchasing [of structural objects and decorative materials], Schuller et al. do not describe how this may be accomplished.

None of Thompson et al., Wakelam et al., Elliott or Schuller et al. teach or suggest any of the following steps, elements or limitations of embodiments within the present invention:

(1) using an add-on (plug-in) computer software code that runs as an internal component within a software design tool on a local computer;
(2) an insertion of parametric symbols into a construction plan;
(3) using the add-on computer software code, transmitting data corresponding to each (or one or more) inserted parametric symbol from a local computer over the Internet to a remote server system, or to an external, internal or other database;
(4) using a zip code and an add-on computer software code to access price data from a web site on a remote server system or from an external, internal or other database;
(5) creating a price schedule from one or a plurality of price quotes; or
(6) a plug-in (add-on) computer software code and a web site that permit a user to automatically receive information in connection with the environmental responsibility of a building, building component or building material.

Additionally, Schuller et al. do not teach or suggest: (1) providing a construction plan on a local computer; (2) creating a construction plan with a software design tool; or (3) providing on a local computer a palette that includes at least one parametric symbol.

The teachings of Schuller et al. are clearly limited to the visualization of a decoration project (page 1, paragraphs [0006] and [0007]), and do not discuss construction projects.

Further, the "input images" that are discussed by Schuller et al. are obtained using a "digital image capture device," such as a scanner, digital camera or video signal capture device, and not a software design tool, such as CAD (page 1, paragraph [0009]).

The method and system of Schuller et al., which are drawn to the decoration of a room with, for example, paint, wallpaper and fabric (page 2, paragraphs [0023] and [0028]), are much simpler, and quite different, in comparison with the methods and systems of the present invention, which are drawn to construction projects, and the pricing of one or more construction elements. Such pricing is quite "tricky" (i.e., is not easily accomplished).

Like Wakelam et al., Elliott and Thompson et al., Schuller et al. do not teach or suggest the use of a zip code to determine price data for one or more construction plan elements.

While Schuller et al. do discuss an automatic purchasing of furnishings and decorating materials (page 5, paragraph [0049], page 7, paragraph [0067], and claims 11, 12, 29 and 30), Schuller et al. do not specify the mechanism that is employed to procure pricing for such purchasing. The teachings that are present in Schuller et al. regarding an automated purchasing are very vague.

Moreover, Schuller et al. do not teach or suggest the use of an add-on (plug-in) computer software code to a software design tool that permits a user to pay for an order using a credit card.

A need in the architectural, construction and other industries currently exists for rapidly, efficiently and cost-effectively generating, and modifying, a set of construction (or other) plans for one or more construction (or other) elements, and a corresponding price quote schedule for such construction (or other) elements, in one general process, wherein a user can rapidly procure one, two, three, four, five or more comparative prices from one, two, three, four, five or more different manufacturers, distributors or others, which may be competitors, to determine the "best" (most competitive) final price for the various construction (or other) elements that will be used in the set of construction (or other) plans. A need also currently exists in the architectural, construction and other industries for rapidly, efficiently and cost-effectively procuring information regarding whether or not a particular building, building material or building component (or other material or component) is "green."

SUMMARY OF THE INVENTION

Very advantageously, the present invention provides methods and systems for rapidly, efficiently and cost-effectively generating, and modifying, a set of residential or commercial construction (or other) plan drawings for one or more construction (or other) elements, and optionally a corresponding price quote schedule for such construction (or other) elements, in one general process, wherein a user can rapidly procure one, two, three, four, five or more comparative prices from one, two, three, four, five or more different manufacturers, distributors and/or others (individuals, corporations, partnerships, other businesses, entities, organizations, universities, computers, computer systems, and/or the like) that can provide such information, either directly or indirectly, which may be competitors, to determine the "best" (most competitive), average or other "real time" final price for the various construction (or other) elements that may be used in the set of construction, architectural, civil engineering, industrial engineering (or other) plans. Also very advantageously, the present invention provides methods and systems for rapidly, efficiently and cost-effectively procuring information regarding whether or not a particular building, building material or building component (or other material or component) is "green" (i.e., has a third party energy certification, such as "Energy Star" or "green" ratings and/or the like). This latter aspect of the present invention is an improvement over the invention that is described in U.S. patent application Ser. No. 12/004,187, and very advantageously save architects and other plan drawers a significant amount of time and labor, and homeowners, other building owners and others a significant amount of energy (and the costs associated with the purchase of energy).

The difficulties and drawbacks that are associated with the above-described systems are advantageously overcome by the present invention, which is a method and system for an automated creation of a price schedule and/or a "green" schedule for a construction or other project. The present invention comprises steps and an implementation for providing a set of one or more construction plan (or other) drawings created with a software design tool and optionally a palette of one or a plurality of architectural 2D and/or 3D parametric symbols corresponding to one or more respective construction elements. Optionally, but preferably, at least one parametric symbol (generic or manufacturer/distributor/other specific) corresponding to each construction element is inserted into the construction plan drawings. A cost value for one or more (and preferably each) of the inserted parametric symbols (and/or of the construction plan elements) is calculated corresponding to respective construction elements. A price schedule may optionally be automatically, manually and/or otherwise created including the total (or other) cost for one or more, or all, of the inserted parametric symbols corresponding to respective construction elements (or for one or more construction elements if no palette of parametric symbols is employed), using one or a plurality of the same or different computers, consoles, web sites, databases and/or the like including pricing and/or "green" information for construction plan (or other) elements and/or parametric symbols. Such price schedule can optionally provide comparison pricing between two or more different manufacturers, distributors and/or others for the same construction (or other) element(s) or parametric symbols, for example, the pricing of a bay window for a kitchen having a variety of specified features (white in color, vinyl frame, Low E glass, Argon filled glass, a specified number of grids, corresponding grid patterns, etc.) from 1stWindows, Andersen Windows and Pella Corporation. The price schedule may include one or a plurality of prices, which preferably are the same prices that are procured using the systems and methods of the invention, but optionally may be different prices obtained from one or a plurality of other web sites, databases, manufacturers, vendors, distributors and/or the like. Alternatively, or additionally, a "green" schedule may be automatically created including for one or more, or all, of the inserted parametric symbols corresponding to respective construction elements (or for one or more construction elements if no palette of parametric symbols is employed) information that states whether or not the construction plan elements are "green."

A price schedule, "green" schedule, or both, including one or a plurality of selected construction plan (or other) elements or parametric symbols, which optionally but preferably correspond to construction plan elements, or both, and corresponding or other prices and/or "green" statements and/or indications may optionally be inserted into the construction plan drawing. Additionally, or alternatively, a user may place an order for one or a plurality (or all) of selected construction plan (or other) elements or parametric symbols, or both, automatically using the systems and/or methods of the invention, including a use of one or a plurality of local and/or remote computers or consoles, local and/or remote servers, databases and/or the like, or manually using some other method, as is known by those having ordinary skill in the art, such as otherwise using one or a plurality of computers or consoles, web sites, telephones, facsimile machines, U.S. or foreign mail carriers or deliverers, or in person at a facility of a manufacturer, distributor or other provider of construction plan (or other) elements, and/or the like, or any combination thereof.

In one aspect, the present invention provides an automated method for creating a price schedule for one or more construction plan elements of a construction project comprising:

(a) providing on a local computer an architectural software design tool and a construction plan drawing having at least one construction plan element, wherein the construction plan drawing is created with the architectural software design tool;

(b) providing on the local computer an add-on computer software code that runs as an internal component within the architectural software design tool, and that includes a palette containing one or more parametric symbols, and optionally one or more corresponding parametric symbol values, wherein the palette includes a parametric symbol for each of the construction plan elements;

(c) selecting one or more of the parametric symbols that is included in the palette for insertion into the construction plan drawing;

(d) optionally, selecting one or more parametric symbol values for one or more of the selected parametric symbols;

(e) optionally, selecting one or more types of manufacturers or distributors for one or more of the selected parametric symbols;

(f) inserting one or more of the selected parametric symbols into the construction plan drawing;

(g) using the add-on computer software code and an Internet connection, transmitting data corresponding to each of the inserted parametric symbols from the local computer to a remote server system;

(h) using a zip code, the add-on computer software code and a Internet connection, accessing price data from a web site present on the remote server system that includes price data for a purchase of construction plan elements corresponding to inserted parametric symbols from one or more available manufacturers or distributors in a geographical location within the zip code;

(i) determining from the price data a price for each of the construction plan elements corresponding to an inserted parametric symbol; and (j) using the add-on computer software code, creating a price schedule from the prices, wherein the price schedule includes a total cost for all of the construction plan elements corresponding to inserted parametric symbols, wherein the price schedule can include one or more construction plan elements, and wherein the price schedule may be immediately used on the local computer to place an order to purchase one or more construction plan elements that are present in the price schedule.

In another aspect, the present invention provides an automated method for creating a schedule for one or more construction plan elements of a construction project that states whether or not the construction plan elements are "green" comprising:

(a) providing on a local computer an architectural software design tool and a construction plan drawing having at least one construction plan element, wherein the construction plan drawing is created with the architectural software design tool;

(b) providing on the local computer an add-on computer software code that runs as an internal component within the architectural software design tool, and that includes a palette containing one or more parametric symbols, and optionally one or more corresponding parametric symbol values, wherein the palette includes a parametric symbol for each of the construction plan elements;

(c) selecting one or more of the parametric symbols that is included in the palette for insertion into the construction plan drawing;

(d) inserting one or more of the selected parametric symbols into the construction plan drawing;

(e) using the add-on computer software code and an Internet connection, transmitting data corresponding to each of the inserted parametric symbols from the local computer to a remote server system, either directly or via an optional communication module;

(f) using the add-on computer software code and an Internet connection, accessing data from a web site present on the remote server system that includes data for construction plan elements corresponding to inserted parametric symbols, wherein the data states whether or not the construction plan elements are "green"; and (g) using the add-on computer software code, creating a schedule from the data, wherein the schedule states for each construction plan element corresponding to an inserted parametric symbol whether or not the construction plan element is "green."

In yet another aspect, the present invention provides an automated system for creating a price schedule for one or more construction plan elements of a construction project comprising:

(a) a local computer;

(b) an architectural software design tool, wherein the architectural software design tool provides on the local computer a construction plan drawing having at least one construction plan element;

(c) a remote server system having a web site that maintains a database including pricing data for the construction plan elements, wherein an Internet connection exists between the remote server system and the local computer; and (d) an add-on computer software code that runs as an internal component within the architectural software design tool on the local computer;

wherein the add-on computer software code has a palette that includes at least one parametric symbol that corresponds with each of the construction plan elements, and that may be selected by a user for insertion into the construction plan drawing; and wherein the add-on computer software code:

(i) inserts at least one of the parametric symbols that are selected by a user into the construction plan drawing;

(ii) transmits via the Internet connection data corresponding to each inserted parametric symbol from the local computer to the remote server system;

(iii) receives via the Internet connection a price for the purchase of each of the construction plan elements corresponding to an inserted parametric symbol from the remote server system, wherein the price may be determined using a zip code and price data that is present on the web site on the remote server system, and corresponds with the purchase of the construction plan elements in a geographical location within the zip code; and (iv) generates a price schedule from the prices, wherein the price schedule includes a total cost for all of the construction plan elements corresponding to inserted parametric symbols, wherein the price schedule can include one or more construction plan elements, and wherein the price schedule can be immediately used on the local computer to place an order to purchase one or more construction plan elements that are present in the price schedule.

In still another aspect, the present invention provides an automated system for creating a schedule for one or more construction plan elements of a construction project that states whether or not the construction plan elements are "green" comprising:

(a) a local computer;

(b) an architectural software design tool, wherein the architectural software design tool provides on the local computer a construction plan drawing having at least one construction plan element;

(c) a remote server system having a web site that maintains a database including data for the construction plan elements, wherein the data states whether or not the construction plan elements are "green," and wherein an Internet connection exists between the remote server system and the local computer; and (d) an add-on computer software code that runs as an internal component within the architectural software design tool on the local computer;

wherein the add-on computer software code has a palette that includes at least one parametric symbol that corresponds with each of the construction plan elements, and that may be selected by a user for insertion into the construction plan drawing; and wherein the add-on computer software code:

(i) inserts at least one of the parametric symbols that are selected by a user into the construction plan drawing;

(ii) transmits via the Internet connection data corresponding to each inserted parametric symbol from the local computer to the remote server system, either directly or via an optional communication module;

(iii) receives via the Internet connection from the remote server system for each of the construction plan elements corresponding to an inserted parametric symbol a statement or other indication as to whether or not the construction plan elements are "green," either directly or via an optional communication module; and (iv) generates a schedule from the statements, wherein the schedule includes a statement for each construction plan element corresponding to an inserted parametric symbol indicating whether or not the construction plan element is "green."

It is, of course, possible to combine the above methods and systems, so that one method or system produces for all construction plan elements corresponding to inserted parametric symbols both a price schedule and a schedule indicating whether or not the construction plan element is "green."

Thus, in another aspect, the present invention provides an automated method for creating for one or more construction plan elements of a construction project both a price schedule and a schedule that states whether or not the construction plan elements are "green" comprising:

(a) providing on a local computer an architectural software design tool and a construction plan drawing having at least one construction plan element, wherein the construction plan drawing is created with the architectural software design tool;

(b) providing on the local computer an add-on computer software code that runs as an internal component within the architectural software design tool, and that includes a palette containing one or more parametric symbols, and optionally one or more corresponding parametric symbol values, wherein the palette includes a parametric symbol for each of the construction plan elements;

(c) selecting one or more of the parametric symbols that is included in the palette for insertion into the construction plan drawing;

(d) optionally, selecting one or more parametric symbol values for one or more of the selected parametric symbols;

(e) optionally, selecting one or more types of manufacturers or distributors for one or more of the selected parametric symbols;

(f) inserting one or more of the selected parametric symbols into the construction plan drawing;

(g) using the add-on computer software code and an Internet connection, transmitting data corresponding to each of the inserted parametric symbols from the local computer to a remote server system;

(h) using a zip code, the add-on computer software code and an Internet connection, accessing price data from a web site present on the remote server system that includes price data for a purchase of construction plan elements corresponding to inserted parametric symbols from one or more available manufacturers or distributors in a geographical location within the zip code, and using the add-on computer software code and the Internet connection, accessing data from the web site that states whether or not the construction plan elements are "green";

(i) determining from the price data a price for each of the construction plan elements corresponding to an inserted parametric symbol; and (j) using the add-on computer software code:
  (1) creating a price schedule from the prices, wherein the price schedule includes a total cost for all of the construction plan elements corresponding to inserted parametric symbols, wherein the price schedule can include one or more construction plan elements, and wherein the price schedule may be immediately used on the local computer to place an order to purchase one or more construction plan elements that are present in the price schedule; and
  (2) creating a schedule from the data that states whether or not the construction plan elements are "green," wherein the schedule states for each construction plan element corresponding to an inserted parametric symbol whether or not the construction plan element is "green."

In still another aspect, the present invention provides an automated system for creating for one or more construction plan elements of a construction project both a price schedule and a schedule that states whether or not the construction plan elements are "green" comprising:

(a) a local computer;

(b) an architectural software design tool, wherein the architectural software design tool provides on the local computer a construction plan drawing having at least one construction plan element;

(c) a remote server system having a web site that maintains one or more databases for the construction plan elements including pricing data and data indicating whether or not the construction plan elements are "green," wherein an Internet connection exists between the remote server system and the local computer; and (d) an add-on computer software code that runs as an internal component within the architectural software design tool on the local computer;

wherein the add-on computer software code has a palette that includes at least one parametric symbol that corresponds with each of the construction plan elements, and that may be selected by a user for insertion into the construction plan drawing; and wherein the add-on computer software code:
  (i) inserts at least one of the parametric symbols that are selected by a user into the construction plan drawing;
  (ii) transmits via the Internet connection data corresponding to each inserted parametric symbol from the local computer to the remote server system;
  (iii) receives via the Internet connection from the remote server system for each of the construction plan elements corresponding to an inserted parametric symbol:
    (a) a price for the purchase of each of the construction plan elements, wherein the price may be determined using a zip code and price data that is present on the web site on the remote server system, and corresponds with the purchase of the construction plan elements in a geographical location within the zip code; and
    (b) a statement as to whether or not the construction plan elements are "green"; and
  (iv) generates:
    (a) a price schedule from the prices, wherein the price schedule includes a total cost for all of the construction plan elements corresponding to inserted parametric symbols, wherein the price schedule can include one or more construction plan elements, and wherein the price schedule can be immediately used on the local computer to place an order to purchase one or more construction plan elements that are present in the price schedule; and
    (b) a schedule of statements indicating whether or not each of the construction plan elements corresponding to inserted parametric symbols is "green."

In another aspect, the present invention provides an automated system for creating one or a plurality of statements or indications, or a combination thereof, for one or a plurality of construction plan elements of a construction project that describes or indicates whether or not the construction plan elements fulfill one or a plurality of predetermined environmental or efficiency criteria or requirements, or both, and optionally one or a plurality of corresponding schedules comprising:

(a) one or a plurality of local or remote computers or consoles, or any combination thereof;

(b) one or a plurality of local or remote servers, or any combination thereof;

(c) an architectural, civil or industrial software design tool, wherein the software design tool provides on the computer, console or server a construction plan drawing having one or a plurality of construction plan elements;

(d) a local server system or remote server system that maintains one or a plurality of databases including data or information, or both, for one or a plurality of the construction plan elements, wherein the data, information or both state or indicate, or both, whether or not the one or a plurality of construction plan elements fulfill one or a plurality of predetermined environmental or efficiency criteria, or both, and wherein an Intranet connection exists between the local server system and the computer or console or an Internet connection exists between the remote server system and the computer or console, or both; and (e) an add-on computer software code that runs as an internal component within the software design tool when executed on the computer, console or server or outside of the software design tool operating as a dynamic link library, executable (.exe), ActiveX, COM object, or combination thereof;

wherein the add-on computer software code optionally includes a palette, or uses an existing palette, that contains one or a plurality of parametric symbols that correspond with one or a plurality of the construction plan elements, and that optionally may be selected by a user for insertion into the construction plan drawing; and wherein the add-on computer software code, when executed by the computer, console, server, dynamic link library, executable (.exe), ActiveX, COM object, or a combination thereof:
- (i) optionally inserts one or a plurality of the construction plan elements, or of the parametric symbols that may optionally be selected by a user, or both, into the construction plan drawing;
- (ii) transmits via the Intranet connection, the Internet connection, or both, data or information, or both, corresponding to one or a plurality of construction plan elements or parametric symbols from the computer, console, server, dynamic link library, executable (.exe), ActiveX, COM object, or a combination thereof, to a local server system, a remote server system, or both, either directly or via an optional communication module;
- (iii) receives via the Intranet connection, the Internet connection, or both, from the local server system, the remote server system, or both, for one or a plurality of the construction plan elements or parametric symbols, or both, one or a plurality of statements or indications, or any combination thereof, describing or indicating whether or not the one or plurality of construction plan elements or parametric symbols, or both, fulfill one or a plurality of predetermined environmental or efficiency criteria or requirements, or both, either directly or via an optional communication module; and
- (iv) optionally, generates a schedule from the statements or indications, or any combination thereof, that includes one or a plurality of statements or other indications, or any combination thereof, for the one or plurality of construction plan elements or parametric symbols, or both, stating or indicating, or both, whether or not one or a plurality of construction plan elements or parametric symbols fulfill one or a plurality of predetermined environmental or efficiency criteria, or both.

In still another aspect, the present invention provides an automated system for creating for one or a plurality of construction plan elements of a construction project both one or a plurality of prices and one or a plurality of statements or indications, or a combination thereof, that describes or indicates, or both, whether or not the construction plan elements fulfill one or a plurality of predetermined environmental or efficiency criteria or requirements, or both, and optionally one or a plurality of corresponding schedules comprising:
- (a) one or a plurality of local or remote computers or consoles, or any combination thereof;
- (b) one or a plurality of local or remote servers, or any combination thereof;
- (c) an architectural, civil or industrial software design tool, wherein the software design tool provides on the computer, console or server a construction plan drawing having one or a plurality of construction plan elements;
- (d) a local server system or remote server system that maintains one or a plurality of databases including pricing data or information, or both, for the one or a plurality of construction plan elements and data or information, or both, that states or indicates, or both, whether or not one or a plurality of the construction plan elements fulfill one or a plurality of predetermined environmental or efficiency criteria, or both, wherein an Intranet connection exists between the local server system and the computer or console or an Internet connection exists between the remote server system and the computer or console, or both; and
- (e) an add-on computer software code that runs as an internal component within the software design tool when executed on the computer, console or server or outside of the software design tool operating as a dynamic link library; executable (.exe), ActiveX or COM object, or any combination thereof;

wherein the add-on computer software code optionally includes a palette, or uses an existing palette, that contains one or a plurality of parametric symbols that corresponds with one or a plurality of the construction plan elements, and that optionally may be selected by a user for insertion into the construction plan drawing; and wherein the add-on computer software code, when executed by the computer, console, server or dynamic link library, executable (.exe), ActiveX or COM object:
- (i) optionally inserts one or a plurality of the construction plan elements, or parametric symbols that may optionally be selected by a user, into the construction plan drawing;
- (ii) transmits via the Intranet connection, the Internet connection, or both, data, information or both corresponding to one or a plurality of the construction plan elements or parametric symbols from the computer, console, server or dynamic link library, executable (.exe), ActiveX or COM object to the local server system, the remote server system, or both, either directly or via an optional communication module;
- (iii) receives via the Intranet connection, the Internet connection, or both, from the local server system, remote server system, or both, for one or a plurality of the construction plan elements or parametric symbols, or both:
  - (a) one or a plurality of prices for a purchase of one or a plurality of construction plan elements or parametric symbols, or both, wherein the prices may be determined using price data or information, or both, that is present on, or accessed by, the local server system, the remote server system, or both, and, optionally, using a zip code, a geographical location, or a combination thereof, and correspond with the purchase of the one or a plurality of construction plan elements or parametric symbols, or both, and, optionally, when a zip code, geographical location, or a combination thereof, is employed, within an area or region within the zip code or geographical location, either directly or via an optional communication module; and
  - (b) one or a plurality of statements or indications, or any combination thereof, describing or indicating whether or not the one or a plurality of construction plan elements or parametric symbols, or both, fulfill one or a plurality of predetermined environmental or efficiency criteria, or both, either directly or via an optional communication module; and
- (iv) optionally generates:
  - (a) a price schedule from the prices, wherein the price schedule includes individual or combined costs for the one or plurality of construction plan elements or parametric symbols, or both, a total cost for all of the construction plan elements or parametric symbols, or any combination thereof, wherein the price schedule optionally can include one or a plurality of construction plan elements or parametric symbols, or both, and wherein the price schedule optionally can be used immediately or at a subsequent time or date, or both, on the computer, console, server, dynamic link library, executable (.exe), ActiveX or COM object to place an order to purchase one or a plurality of construction plan elements or parametric symbols that are present in the price schedule;

(b) a schedule of statements or indications, or any combination thereof, stating or indicating whether or not one or a plurality of the construction plan elements or parametric symbols, or both, fulfill one or a plurality of predetermined environmental or efficiency criteria, or both; or (c) both of the schedules described in (a) and (b).

In another aspect, the present invention provides an automated method for creating one or a plurality of statements or indications, or a combination thereof, for one or a plurality of construction plan elements of a construction project that describes or indicates whether or not the construction plan elements fulfill one or a plurality of predetermined environmental or efficiency criteria or requirements, or both, and optionally one or a plurality of corresponding schedules comprising:

(a) providing on a local or remote computer, console or server an architectural, civil or industrial software design tool and a construction plan drawing having one or a plurality of construction plan elements, wherein the construction plan drawing is created with the software design tool;

(b) providing on the computer, console or server, or on a dynamic link library, executable (.exe), ActiveX or COM object:
  (i) an add-on computer software code that runs as an internal component within the software design tool when executed on the computer, console or server, or outside of the software design tool when executed by the dynamic link library, executable (.exe), ActiveX or COM object: and
  (ii) optionally, a palette containing one or a plurality of parametric symbols that correspond with one or more of the construction plan elements, and optionally one or a plurality of corresponding parametric symbol values;

(c) optionally, selecting one or a plurality of the construction plan elements, or parametric symbols included in the optional palette, for insertion into the construction plan drawing;

(d) optionally inserting one or a plurality of the construction plan elements or parametric symbols, or both, into the construction plan drawing;

(e) using the add-on computer software code and an Intranet connection, an Internet connection, or both, transmitting data, information, or both, corresponding to one or a plurality of the construction plan elements or parametric symbols, or both, from the computer, console, server or dynamic link library, executable (.exe), ActiveX or COM object to a local server system, a remote server system, or both, either directly or via an optional communication module;

(f) using the add-on computer software code and an Intranet connection, an Internet connection, or both, accessing data, information, or both, from one or a plurality of databases maintained on, or accessed by, the local server system, the remote server system, or both, stating, indicating, or both, whether or not the one or plurality of construction plan elements or parametric symbols, or both, fulfill one or a plurality of predetermined environmental or efficiency criteria, or both; and (g) optionally, using the add-on computer software code, creating a schedule from the data, information, or both, wherein the schedule states, indicates, or both, for the one or plurality of construction plan elements or parametric symbols, or both, whether or not the construction plan elements or parametric symbols, or both, fulfill one or a plurality of predetermined environmental or efficiency criteria, or both.

In yet another aspect, the present invention provides an automated method for creating for one or a plurality of construction plan elements of a construction project both one or a plurality of prices and one or a plurality of statements or indications, or a combination thereof, that describes or indicates, or both, whether or not the construction plan elements fulfill one or a plurality of predetermined environmental or efficiency criteria or requirements, or both, and optionally one or a plurality of corresponding schedules comprising:

(a) providing on a local or remote computer, console or server an architectural, civil or industrial software design tool and a construction plan drawing having one or a plurality of construction plan elements, wherein the construction plan drawing is created with the software design tool;

(b) providing on the local computer, console or server, or on a dynamic link library, executable (.exe), ActiveX or COM object:
  (i) an add-on computer software code that runs as an internal component within the software design tool when executed on the computer, console or server, or outside of the software design tool when executed by the dynamic link library, executable (.exe), ActiveX or COM object: and
  (ii) optionally, a palette containing one or a plurality of parametric symbols that correspond with the one or more construction plan elements, and optionally one or a plurality of corresponding parametric symbol values;

(c) optionally, selecting one or a plurality of the construction plan elements, or parametric symbols included in the optional palette, or both, for insertion into the construction plan drawing;

(d) optionally, selecting one or a plurality of construction plan elements or parametric symbol values, or both, for one or a plurality of the selected parametric symbols;

(e) optionally, selecting one or a plurality of types of manufacturers, distributors or other construction plan element providers for one or a plurality of the construction plan elements or parametric symbols, or both;

(f) optionally, inserting one or a plurality of the construction plan elements or parametric symbols, or both, into the construction plan drawing;

(g) using the add-on computer software code and an Intranet connection, an Internet connection, or both, transmitting data, information, or both, corresponding to one or a plurality of the construction plan elements or parametric symbols, or both, from the computer, console, server or dynamic link library, executable (.exe), ActiveX or COM object to a local server system, a remote server system, or both, either directly or via an optional communication module;

(h) using the add-on computer software code and an Intranet connection, an Internet connection, or both, and, optionally, a zip code, a geographical location, or a combination thereof, accessing price data, information or both from the local server system, the remote server system, or both, that includes price data, information or both for a purchase of the one or plurality of construction plan elements or parametric symbols, or both, optionally from one or a plurality of available manufacturers, distributors or other construction plan element providers, or any combination thereof, optionally within the zip code or geographical location, or a combination thereof, and using the add-on computer software code and the Intranet connection, the Internet connection, or both, accessing data, information, or both, from the local server system, the remote server system, or both, that states or indicates, or both, whether or not the one or plurality of construction plan elements or parametric symbols, or both, fulfill one or a plurality of predetermined environmental or efficiency criteria, or both;

(i) determining from the price data, information, or both, one or a plurality of prices for the one or plurality of construction plan elements or parametric symbols, or both; and (j) optionally, using the add-on computer software code:
  (1) generating a price schedule from the prices, wherein the price schedule includes individual or combined costs for the one or plurality of construction plan elements or inserted parametric symbols, or both, a total cost for all of the construction plan elements or inserted parametric symbols, or both, or any combination thereof, wherein the price schedule can optionally include one or a plurality of construction plan elements or inserted parametric symbols, or both, and wherein the price schedule can optionally be used immediately or at a subsequent time or date, or both, on the computer, console, server or dynamic link library, executable (.exe), ActiveX or COM object to place an order to purchase one or a plurality of construction plan elements or inserted parametric symbols, or both, that are present in the price schedule;
  (2) generating a schedule of statements or indications, or any combination thereof, stating or indicating whether or not the one or a plurality of the construction plan elements or inserted parametric symbols, or both, fulfill one or a plurality of predetermined environmental or efficiency criteria, or both; or
  (3) generating both of the schedules of (1) and (2).

In another aspect, the present invention provides an automated system for creating for one or a plurality of construction plan elements of a construction project one or a plurality of statements or indications, or a combination thereof, that describes or indicates, or both, whether or not the construction plan elements fulfill one or a plurality of predetermined environmental or efficiency criteria or requirements, or both, and optionally one or a plurality of corresponding schedules comprising:

(a) one or a plurality of local or remote computers, consoles or servers, or any combination thereof;

(b) an architectural, civil or industrial software design tool, wherein the software design tool provides on the computer, console or server a construction plan drawing having at least one construction plan element;

(c) one or a plurality of databases including data or information, or both, for the one or more construction plan elements, wherein the data or information, or both, states or indicates, or both, whether or not the one or more construction plan elements meet predetermined environmental or efficiency criteria, or both; and (d) an add-on computer software code that runs as an internal component within the software design tool on the computer, console or server;

wherein the add-on computer software code optionally has a palette that includes one or more parametric symbols that corresponds with the one or more construction plan elements, and that may optionally be selected by a user for insertion into the construction plan drawing; and wherein the add-on computer software code when executed by the computer, console or server:
  (i) optionally inserts at least one of the parametric symbols that are optionally selected by a user into the construction plan drawing;
  (ii) transmits data or information, or both, corresponding to the one or more construction plan elements or parametric symbols, or both, from the computer, console or server to the database, either directly or via an optional communication module;
  (iii) receives from the database for one or more construction plan elements or parametric symbols, or both, one or a plurality of statements or indication, or both, stating or indicating, or both, whether or not the construction plan elements or parametric symbols, or both, meet predetermined environmental or efficiency criteria, or both, either directly or via an optional communication module; and
  (iv) optionally generates a schedule from the statements or indications, or both, wherein the schedule includes one or a plurality of statement or indications, or both, for one or more of the construction plan elements or parametric symbols, or both, stating or indicating, or both, whether or not the construction plan elements or parametric symbols meet predetermined environmental or efficiency criteria, or both.

In still another aspect, the present invention provides an automated system for creating for one or a plurality of construction plan elements of a construction project both one or a plurality of prices and one or a plurality of statements or indications, or a combination thereof, that describes or indicates, or both, whether or not the construction plan elements fulfill one or a plurality of predetermined environmental or efficiency criteria or requirements, or both, and optionally one or a plurality of corresponding schedules comprising:

(a) one or a plurality of local or remote computers, consoles or servers, or any combination thereof;

(b) an architectural, civil or industrial software design tool, wherein the software design tool provides on the computer; console or server a construction plan drawing having one or more construction plan elements;

(c) one or more databases for the construction plan elements including pricing data or information, or both, or data or information, or both, stating or indicating whether or not the construction plan elements meet predetermined environmental or efficiency criteria, or both, or a combination thereof; and (d) an add-on computer software code that runs as an internal component within the software design tool on the computer, console or server;

wherein the add-on computer software code optionally has a palette that includes one or more parametric symbols that correspond with one or more construction plan elements, and that may optionally be selected by a user for insertion into the construction plan drawing; and wherein the add-on computer software code when executed by the computer, console or server:
  (i) optionally, inserts at least one of the construction plan elements or parametric symbols, or both, that are optionally selected by a user into the construction plan drawing;
  (ii) transmits data or information, or both, corresponding to one or more construction plan elements or parametric symbols, or both, from the computer, console or server to the database;
  (iii) receives from the database for the one or more construction plan elements or parametric symbols, or both:

(a) a price for the purchase of the one or more construction plan elements or parametric symbols, or both, wherein the price may be determined using price data or information, or both, that is present in the database; and/or (b) a statement as to whether or not the one or more construction plan elements or parametric symbols, or both, meet predetermined environmental or efficiency criteria, or both; and (iv) optionally, generates:

(a) a price schedule from the prices, wherein the price schedule may optionally include one or more costs for the one or more construction plan elements or parametric symbols, or both, or a total cost for all of the construction plan elements or parametric symbols, or both, wherein the price schedule can optionally include one or more construction plan elements or parametric symbols, or both, and wherein the price schedule can optionally be immediately used on the local computer to place an order to purchase one or more construction plan elements or parametric symbols, or both, that are present in the price schedule;

(b) a schedule of statements or indications, or both, stating or indicating whether or not the one or more construction plan elements or parametric symbols, or both, meet predetermined environmental or efficiency criteria, or both; or (c) both the price schedule of (a) and the schedule of (b).

In another aspect, the present invention provides an automated method for creating one or a plurality of statements or indications, or a combination thereof, for one or a plurality of construction plan elements of a construction project that describes or indicates whether or not the construction plan elements fulfill one or a plurality of predetermined environmental or efficiency criteria or requirements, or both, and optionally one or a plurality of corresponding schedules comprising:

(a) providing on a local or remote computer, console or server an architectural, civil or industrial software design tool and a construction plan drawing having at least one construction plan element, wherein the construction plan drawing is created with the software design tool;

(b) providing on the computer, console or server an add-on computer software code that runs as an internal component within the software design tool, and that optionally includes a palette containing one or more parametric symbols that correspond with one or more construction plan elements, and optionally one or more corresponding parametric symbol values;

(c) optionally, selecting one or more of the construction plan elements or parametric symbols, or both, that is included in the optional palette for insertion into the construction plan drawing;

(d) optionally, inserting one or more of the construction plan elements or parametric symbols into the construction plan drawing;

(e) using the add-on computer software code, transmitting data or information, or both, corresponding to the one or more construction plan elements or parametric symbols, or both, from the computer, console or server to one or a plurality of databases, either directly or via an optional communication module;

(f) using the add-on computer software code, accessing data or information, or both, from the database that includes data or information, or both, for the one or more construction plan elements or parametric symbols, or both, wherein the data or information, or both, states whether or not the one or more construction plan elements or parametric symbols, or both, meet predetermined environmental or efficiency criteria, or both; and (g) optionally, using the add-on computer software code, creating a schedule from the data or information, or both, wherein the schedule states for the one or more construction plan elements or parametric symbols, or both, whether or not the one or more construction plan elements or parametric symbols, or both, meet predetermined environmental or efficiency criteria, or both.

In yet another aspect, the present invention provides an automated method for creating for one or a plurality of construction plan elements of a construction project both one or a plurality of prices and one or a plurality of statements or indications, or a combination thereof, that describes or indicates, or both, whether or not the construction plan elements fulfill one or a plurality of predetermined environmental or efficiency criteria or requirements, or both, and optionally one or a plurality of corresponding schedules comprising:

(a) providing on one or a plurality of local or remote computers, servers or consoles, or a combination thereof, an architectural, civil or industrial software design tool and a construction plan drawing having at least one construction plan element, wherein the construction plan drawing is created using the software design tool;

(b) providing on the computer, server or console an add-on computer software code that runs as an internal component within the software design tool, and that optionally includes a palette containing one or more parametric symbols corresponding to the one or more construction plan elements, and optionally one or more corresponding parametric symbol values;

(c) optionally, selecting one or more of the parametric symbols that is included in the palette for insertion into the construction plan drawing;

(d) optionally, selecting one or more parametric symbol values for one or more of the selected parametric symbols;

(e) optionally, selecting one or more types of manufacturers, distributors or other construction plan element providers for one or more of the construction plan elements or parametric symbols, or both;

(f) optionally, inserting one or more of the construction plan elements or parametric symbols, or both, into the construction plan drawing;

(g) using the add-on computer software code, transmitting data or information, or both, corresponding to the construction plan elements or parametric symbols, or both, from the one or plurality of computers, consoles or servers to one or a plurality of databases, either directly or via an optional communication module;

(h) using the add-on computer software code, accessing price data or information, or both, from the database that includes price data or information, or both, for a purchase of one or a plurality of the construction plan elements or parametric symbols, or both, and, using the add-on computer software code, accessing data or information, or both, from the database that states or indicates, or both, whether or not the one or plurality of construction plan elements or parametric symbols, or both, meet predetermined environmental or efficiency criteria, or both;

(i) determining from the price data a price for the one or a plurality of construction plan elements or parametric symbols, or both; and (j) optionally, using the add-on computer software code when executed by the one or plurality of computers, consoles or servers:
  (1) creating a price schedule from the prices, wherein the price schedule may optionally include one or more costs or a total cost for all of the construction plan elements or parametric symbols, or both, wherein the price schedule may optionally include one or more construction plan elements or parametric symbols, or both, and wherein the price schedule may optionally be immediately used on the local computer to place an order to purchase one or more construction plan elements or parametric symbols, or both, that are present in the price schedule;
  (2) creating a schedule from the data or information, or both, that states or indicates, or both, whether or not the one or more construction plan elements or parametric symbols, or both, meet predetermined environmental or efficiency criteria, or both, wherein the schedule states for the one or more construction plan elements or parametric symbols, or both, whether or not the construction plan elements or parametric symbols, or both, meet predetermined environmental or efficiency criteria, or both; or
  (3) creating both the price schedule of (1) and the schedule of (2).

The methods and systems of the present invention are each "revolutionary," and architects "love them." For example, the November 2006 issue of Cadalyst, an independent (non-biased) magazine containing numerous articles about CAD, includes an article (page 50, right column) that states, in part:

"1ST Pricing is the only product available that allows automatic product pricing and purchasing directly within AutoCAD, ArchiCAD and TurboCAD (FIG. 2). Its developer expects to soon introduce an Architectural desktop and Revit plug-in as well as Vectorworks integration. This patent-pending product automatically gives you five real-time quotes on doors and windows delivered to the job site based on zip code. Look forward to the ability to get realtime pricing updates for all components such as lumber packages." [Emphasis added.]

Currently, there is no plug-in (add-on) computer software or other mechanism, system or method that links the parameters of buildings, building materials, building components, appliances, objects and/or the like to a database that can automatically bring or transmit back to a user's computer or console an indication of the energy and/or water performance or efficiency of the item (i.e., specify whether or not the item is "green").

As will be realized, the present invention is capable of a wide variety of other and different embodiments, and its several details are capable of numerous modifications in various respects, all without departing from the scope and spirit of the invention. Accordingly, the description and accompanying figures are to be regarded as illustrative and not restrictive.

BRIEF DESCRIPTION OF THE DRAWINGS

FIG. 4 shows parametric symbol details of the Parametric Symbol Palette illustrated in FIG. 3.

FIG. 15 depicts a "Registration" dialog that may be opened in accordance with the plug-in (add-on) computer software code of the present invention when a user clicks the "Registration" scheduler control button.

FIG. 18 shows a registration page for registering a new user in accordance with the plug-in (add-on) computer software code of the present invention.

FIG. 21 shows details of the parametric symbol schedule of FIG. 20.

FIG. 24 shows a dialog in the 1stPricing or 1stWindows (or other) online database for allowing a user to indicate a type of manufacturer or distributor (or other person, entity or object that can provide one or a plurality of prices and/or statements and/or indications as to whether or not a construction plan (or other) element or material is "green") in accordance with the present invention.

FIG. 26 shows a highlighted portion of the exemplary price quote of FIG. 25, and options that are available for each price quote (view quote, alter quote, view all quotes, create new quotes, compare prices, prepare a quote and the like).

FIGS. 29-33 show various dialogs that may be present in the 1stPricing or 1stWindows online or offline (or other) database in connection with the check out process in accordance with the present invention after a price quote has been completed, and a user clicks a "Check Out" button.

FIG. 34 shows an export function of a generated price schedule in the 1stPricing or 1stWindows online or offline (or other) database that permits the price schedule to be exported as a standalone object into a database in the form of various common computer applications or formats including, but not limited to, Excel, Word, Plain Text, HTML, XML, PDF and/or the like.

In FIG. 35, the plug-in computer software code and the communication module operate inside of a plan drawer's (or other user's) computer or console, the plan drawer's (or other user's) computer/console requests pricing data and/or information from the plug-in computer software code, which requests the pricing data and/or information from the communication module, which requests the pricing data and/or information from one or a plurality of online or offline databases. The database(s) send the pricing data and/or information back to the communication module, which sends the pricing data and/or information back to the plug-in computer software code, which sends the pricing data and/or information to the plan drawer's computer or console.

In FIG. 38, the plug-in computer software code operates in the plan drawer's computer connected across the Internet to a remoter server with one or more databases local or remote.

In FIG. 39, the plan drawer's (or other user's) computer/console requests data and/or information from the plug-in computer software code and the plug-in computer software code requests the data and/or information from the communication module. The communication module requests the data and/or information from the remote server, the remote server sends the data and/or information to the communication module, the communication module sends the data and/or or information to the plug-in computer software code, and the plug-in computer software code sends the data and/or information to the plan drawer's computer/console. In FIG. 39, the plug-in computer software code operates in a plan drawer's (or other user's) computer/console, and the pricing data and/or information is procured using a remote server system that accesses one or a plurality of separate local and/or remote databases, which can be connected directly to the remote server, or the remote server can access additional remote servers which provide the data and/or information.

In FIG. 40, the plug-in computer software code operates in the plan drawer's (or other user's) computer. In FIG. 40, the plug-in computer software code operates in the plan drawer's (or other user's) computer, which requests data and/or information from the plug-in computer software code, which in turn requests the data and/or information from the database(s) present on the physical storage medium. The physical storage medium sends the data and/or information back to the plug-in computer software code, and the plug-in computer software code transmits the data and/or information to the plan drawer's computer.

In FIG. 41, the plan drawer's (or other user's) computer/console requests updated pricing, "green" and/or other data and/or information from the local server, the local server requests the updated data and/or information from the remote data update server, the remote data update server sends the updated data and/or information to the local server, the local server stores the updated data and/or information to one or more physical storage media, one or more of the plan drawer's computers/consoles and/or the local server. In an alternative method, one or more of the plan drawer's computers/consoles request updated data and/or information from the remote server, the remote server moves the updated data and/or information from the updated physical storage medium, and the local server stores the updated data and/or information to the physical storage medium, one or more of the plan drawer's computers/consoles and/or the local server.

In FIG. 41, one or both of the plan drawer's (or other user's) computers/consoles request pricing, "green" and/or other data and/or information from the plug-in computer software code operating in the local server, which requests the data and/or information from the remote server, which requests the data and/or information from one or a plurality of remote databases, which send the data and/or information back to the remote server, which sends the data and/or information back to the plug-in computer software code operating in the local server, which provides the data and/or information to one or a plurality of the plan drawer's computers/consoles. In FIG. 42, the "green" data and/or information (energy compliance (green match), Energy Star, carbon emission, Home Star, geospatial, VOC, LEED, RFID and the like) is procured using a remote server system that accesses a plurality of separate databases, which can be connected directly to the remote server, or the remote server can access additional remote servers which provide the "green" data and/or information.

In FIG. 43, one or a plurality of the plan drawer's (or other user's) computers/consoles request pricing and/or other data and/or information from the plug-in computer software code (operating in a local server), the plug-in computer software code requests the data and/or information from the communication module, the communication module requests the data and/or information from the remote server, and the remote server procures the data and/or information from one or more local and/or remote databases. The database(s) then sends the data and/or information back to the communication module, which sends it to the plug-in computer software code (operating in the local server), which provides it to one or a plurality of the plan drawer's computers/consoles.

In FIG. 44, one or a plurality of the plan drawer's (or other user's) computers/consoles request updated pricing, "green" and/or other data and/or information from the communication module, the communication module requests the updated data and/or information from the remote data update server, the remote data update server sends the updated (more current) data and/or information to the communication module, and the communication module stores the updated data and/or information to the physical storage medium, one or a plurality of the plan drawer's computers/consoles and/or the local server. In an alternative method, one or a plurality of the plan drawer's computers/consoles request updated data and/or information from the communication module, the communication module moves the updated data and/or information from the updated physical storage medium, and the communication module stores the updated data and/or information to the physical storage medium, the plan drawers computer/console and/or the server.

In FIG. 45. one or a plurality of the plan drawer's (or other user's) computers/consoles request pricing and/or other data and/or information from the plug-in computer software code (operating in a local server), the plug-in computer software code requests the data and/or information from the communication module (also operating in a local server), and the communication module requests the data and/or information from the remote server. The remote server sends the data and/or information back to the communication module, the communication module sends the data and/or information back to the plug-in computer software code, and the plug-in computer software code provides the data and/or information to one or a plurality of the plan drawer's computers/consoles.

In FIG. 47, the remote third plan drawer's computer/console (as well as optionally the first and/or second local plan drawer's computers/consoles) requests updated pricing and/or other data and/or information from the local server across the WAN. The local server requests the updated data and/or information from the remote data update server, the remote data update server sends the updated data and/or information across the WAN to the local server, and the local server stores the updated data and/or information to one or a plurality of physical storage media, the local server and/or across the WAN on one or a plurality of the plan drawer's computers/consoles.

DETAILED DESCRIPTION OF THE PREFERRED EMBODIMENTS

Figure 1:
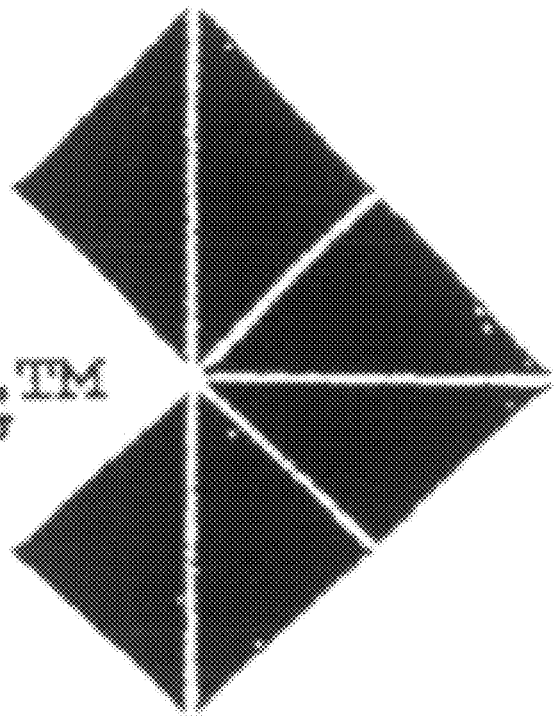
FIG. 1 is a depiction of an activation button that is present in a software toolbar of a plug-in (add-on) computer software code in accordance with the present invention

The present invention may be understood more readily by reference to the following detailed description of the preferred embodiments.

Definitions

For purposes of clarity, various terms and phrases used throughout this specification and the appended claims are defined in the manner set forth below. If a term or phrase used in this specification, or in the appended claims, is not defined below, or otherwise in this specification, the term or phrase should be given its ordinary meaning.

The term "about" as is used herein means approximately, as is known, and may be determined, by those having ordinary skill in the art.

The phrase "acid rain" as is used here means rain or any other form of precipitation (snow, sleet, hail and/or the like) that is unusually acidic, i.e., having an elevated level of hydrogen ions (low pH). It often has harmful effects on plants, aquatic animals, buildings and infrastructure through a process of wet deposition. Acid rain is caused by emissions of pollutant and other compounds, such as ammonium, carbon, nitrogen and sulfur compounds, which react with water molecules present in the atmosphere to produce acids. Governments have made efforts since the 1970s to reduce the production of sulfuric oxide and other pollutants into the Earth's atmosphere.

The term "ActiveX" as is used herein means a framework for defining reusable software components in a programming language independent way. Software applications can then be composed from one or more of these components in order to provide their functionality in a manner known by those having ordinary skill in the art.

The phrase "adaptor" as is used herein means a hardware device, such as a printed circuit board, that enables a computer to use one or more additional peripheral devices and/or pieces of hardware.

The phrase "application" as is used herein means software other than the operating system, such as Word processors, database managers, Web browsers and/or the like. Each application generally has its own user interface that allows a user to interact with a particular program. The user interface for most operating systems and applications is a graphical user interface (GUI), which uses graphical screen elements, such as windows (which are used to separate the screen into distinct work areas), icons (which are small images that represent computer resources, such as files), pull-down menus (which give a user a list of options), scroll bars (which allow a user to move up and down a window) and buttons (which can be "pushed" with a click of a mouse). A wide variety of applications is known by those having ordinary skill in the art.

The phrases "Application Program Interface" and API as are used herein mean a set of commands, functions and/or protocols that computer programmers can use when building software for a specific operating system. The API allows programmers to use predefined functions to interact with an operating system, instead of writing them from scratch. All computer operating systems, such as Windows, Unix, and the Mac OS, usually provide an application program interface for programmers. APIs are also used by hardware devices that can run software programs. While the API makes the programmer's job easier, it also benefits the end user, since it generally ensures that all programs using the same API will have a similar user interface.

The phrases "architectural CAD software," "architectural Computer Aided Design software" and "architectural software design tool" as are used herein refer to specialized computer software (computer readable instructions and/or data, typically in the form of a code) that enable engineers, architects and/or others to design structures, such as rooms, houses, commercial buildings, construction elements (doors, windows, walls, floors, ceilings and the like), furniture and the like, on a computer, for example, TurboCAD V8 software (version 9), AutoCAD® software (versions 2002, 2004 and 2005), AutoCAD Architectural Desktop™ 2002 and 2004 and Autodesk Map® 5, 6 and 3D. Often, in addition to this specialized software, architectural CAD systems use a graphics monitor, a light pen or digitizing tablet for drawing, and a special printer or plotter for printing design specifications. Architectural CAD software, and other architectural Computer Aided Design software, is commercially available from sources that are known by those having ordinary skill in the art, for example, from CAD companies directly, or from CAD software dealers, such as Design Integrations Inc. (Marietta, Ga.).

The phrases "Bill of Materials" and "BOM" as are used herein mean a list of one or a plurality of raw or other materials, sub-assemblies, intermediate assemblies, sub-components, components, parts and/or the like, and/or the quantities of the same, that are required or desired to manufacture or otherwise produce one or a plurality of end items (final products). It may include one or a plurality of price and/or "green" statements, indications and/or items of data and/or information, and is a type of a price schedule and/or "green" schedule.

The phrases "boot loader" or "boot manager" as are used herein mean a relatively small program that places the operating system of a computer into memory. When a computer is powered-up or restarted, the basic input/output system (BIOS) typically performs some initial tests, and then transfers control to the Master Boot Record (MBR), where the boot loader typically resides. Most new computers are shipped with boot loaders for some version of Microsoft Windows or the Mac OS. If a computer is to be used with Linux, a special boot loader must typically be installed. For Linux, the two most common boot loaders are known as LILO (Linux Loader) and LOADLIN (LOAD LINux). An alternative boot loader, called GRUB (GRand Unified Bootloader), is used with Red Hat Linux. LILO is typically the most popular boot loader among computer users that employ Linux as the main, or only, operating system. The primary advantage of LILO is the fact that it allows for fast boot-up. LOADLIN is preferred by some users whose computers have multiple operating systems, and who spend relatively little time in Linux. LOADLIN is sometimes used as a backup boot loader for Linux in case LILO fails. GRUB is preferred by many users of Red Hat Linux because it is the default boot loader for that distribution.

The phrase "breather tube" as is used herein means a small metal tube that is placed into an insulated unit's spacer to equalize pressure differences. Breather tubes can allow moisture to enter into the insulating unit, and are mostly used in high altitude locations.

The abbreviation "Btu" as used herein means British Thermal Unit, which is a precise measure of energy (the amount of energy required to raise the temperature of 1 pound of water 1 degree Fahrenheit), work and quantity of heat, and is a common unit of electric power consumption. 1 Btu=1,054.8 joules (J), and 3412 Btus=1 kilowatt-hour. Additional information concerning Btus, and fuels containing different quantities of Btus, is publicly available from The National Energy Information Center (Washington, D.C.).

The phrases "building products" and "construction elements" as are used herein include, but are not limited to, windows, doors, acrylic glass or other blocks, fireplaces, sky lights, cabinets, fireplaces, Forced Air Units, drywall, lumber, insulation, molding, laminates, plumbing fixtures, electrical fixtures and the like.

The term "byte" as is used herein refers to a unit of memory in a memory location or device of a computer. The storage capacity of a memory location or device, such as a main or secondary memory (hard disks, floppy disks, CD-ROMs, and the like) of a computer, is the total number of bytes that it can hold. Some computers can store thousands or millions of bytes. A large main memory permits large programs, or many programs, to run. On many personal computers, the hard drive can usually store between 40 GB and 120 GB. The table below shows the relation between bytes, number of bytes and symbols used to represent them.

| Unit | Symbol | Number of Bytes |
| --- | --- | --- |
| Byte | None | $2^0 = 1$ |
| Kilobyte | KB | $2^{10} = 1024$ |
| Megabyte | MB | $2^{20} = 1,048,576$ |
| Gigabyte | GB | $2^{30} = 1,073,741,824$ |
| Terabyte | TB | $2^{40} = 1,099,511,627,776$ |

The phrase "CalStar" as is used herein means an Energy Efficient Program that promotes green and sustainable building practices at the State of California level. Credits are given by the State of California to users of properly certified building products.

The phrases "campus area network" and "CAN" as are used herein mean a computer network that typically interconnects local area networks throughout a limited geographical area, such as a university campus, a corporate campus or a military base. It may be considered as a metropolitan area network (MAN) that is specific to a campus setting. A campus area network is, therefore, typically larger than a local area network (LAN) but smaller than a wide area network (WAN). Although generally not considered to be a wide area network (WAN), a CAN typically extends the reach of each local area network (LAN) within the campus area of an organization. In a CAN, the buildings of a university or corporate campus typically are interconnected using the same types of hardware and networking technologies that one would use in a LAN. In addition, all of the components, including switches, routers, and cabling, as well as wireless connection points, typically are owned and maintained by the organization.

The terms "CAD" and "Computer-Aided Design" as are used herein mean the use of a computer software tool for a design of three-dimensional and other objects, or parts, real or virtual. CAD often involves more than just shapes, and CAD may be used to define assembly and dimensional manufacturing processes, both manual and automated. The output of CAD often must convey also symbolic information such as materials, processes, dimensions and tolerances according to application-specific conventions. CAD may be used to design curves and figures in two-dimensional (2D) space or curves, surfaces, or solids in three-dimensional (3D) objects. Additional information about CAD is present in G. Farin, *A History of Curves and Surfaces in CAGD, Handbook of Computer Aided Geometric Design* (North Holland, ISBN 0 444 51104-0). CAD software is commercially available from sources that are known by those having ordinary skill in the art.

The phrase "carbon footprint" as is used herein means the total set of greenhouse gases (GHG) emissions that is generally caused by an individual, organization, entity, event and/or product, or manufacture thereof. For simplicity of reporting, it is often expressed in terms of the amount of carbon dioxide, or its equivalent of other GHGs, emitted. The add-on computer software code described herein has an ability to transmit data or information, or both, describing or indicating a quantity of carbon emissions emitted from a manufacture of one or a plurality of products, elements, materials and/or the like, thus providing a size of a carbon emission footprint of the same, which indicates how environmentally friendly or clean the manufacture of such product, element, material and/or the like is.

The phrase "central processing unit" as is used herein means a computer hardware component that executes individual commands of a computer software program. It reads program instructions from a main or secondary memory, and then executes the instructions one at a time until the program ends. During execution, the program may display information to an output device such as a monitor.

The term "civil" as is used herein means a discipline that works with a design, construction, maintenance and/or the like of a physical and/or naturally built environment, including works such as roads, bridges, canals, dams, buildings and/or the like.

The terms "COM" and "Component Object Model" as are used herein mean a binary-interface standard for software componentry introduced by Microsoft Corporation (Redmond, Wash.) in or around 1993. It is used to enable inter-process communication and dynamic object creation in a large range of programming languages.

The term "compiler" as is used herein means one or more computer program (alone or in a set) that transform human readable source code of another computer program into the machine readable code that a CPU can execute or source code written in a computer language into another computer language (the machine code or target language, which often has a binary form known as object code). The most common reason for wanting to transform source code is to create an executable program. For many compilers, source code is translated directly into a particular machine language. Java source code, for example, may be converted using a Java compiler into Java byte code, and another compiler could be employed, for example, to convert the Java byte code into a particular machine language for execution on a particular computer.

Figure 2:
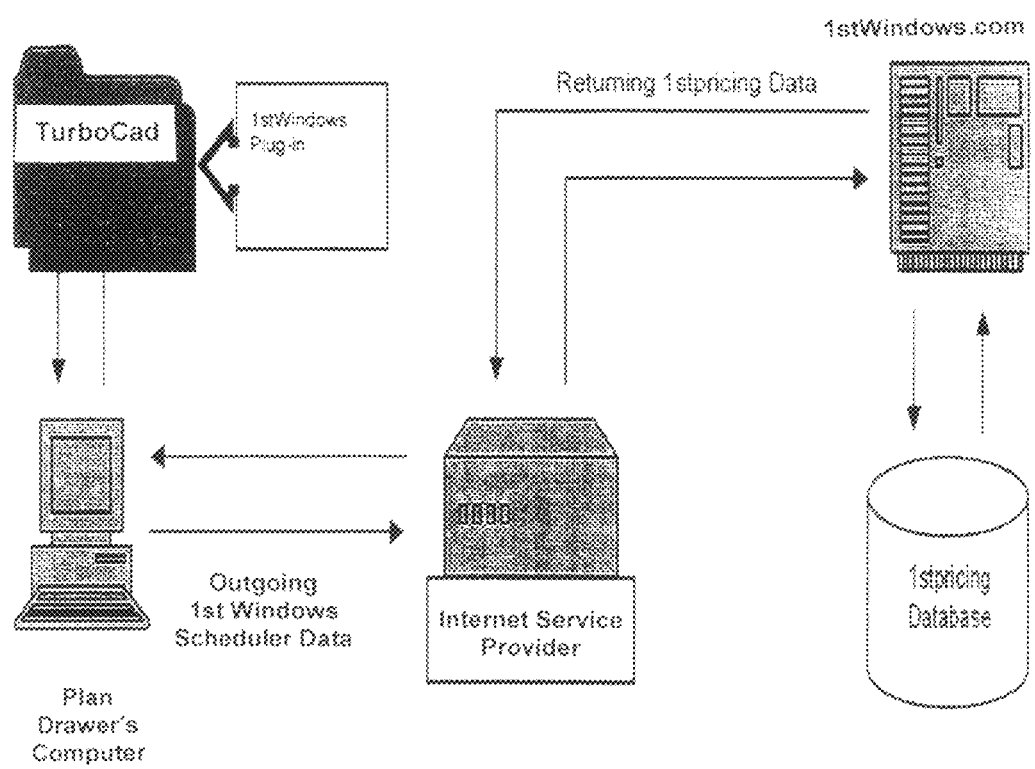
FIG. 2 is a flow chart that illustrates a basic data interaction between the plug-in (add-on) computer software code and a 1stPricing or 1stWindows (or other) online database in accordance with the present invention.

The phrase "communication module" as used herein means a system for an optional use that is a part of the enhanced add-on (plug-in) computer software code that is described herein, and that may be employed to connect a plan drawer's (or other user's) computer and/or console to an Internet or other service provider, or otherwise, for the purpose of permitting communication between the two (or between more than two systems). This module is a translation module. It takes the data from the plan drawer's (or other user's) computer and/or console and formats it into a standard format for the 1stPricing server and/or 1stWindows server (or other server). The module sends the formatted information to the server, subsequently receives back from the server formatted data, and then makes the formatted data available to the CAD (or other software design) program. CAD programs generally have copyrighted custom programming that is unique. The inventors have created, developed and standardized a way to get or otherwise procure pricing data and/or information from the pricing server, and "green" data and/or information from the "green" server, so that it is not necessary to have a separate server for each of the types of CAD program. In essence, there are CAD companies that speak all different languages. For example, CAD company 1 speaks language A, CAD company 2 speaks language B, and CAD company 3 speaks language C. If, for example, the 1stPricing server only speaks language Z, when CAD company 1 comes in speaking language A, it goes through the communication module and the communication module translates the data and/or information from CAD language A to CAD language Z, and then sends it to the 1stPricing server. The server interprets the data and/or information and sends back the information to the module with pricing, "green" data and/or other data (RFID tags, geospatial information, product specification information and/or the like). The module then translates the language from language Z back to language A, and then sends it to CAD company 1. From there, it is displayed to the CAD user. As used in the methods and systems of the present invention, the optional communication modules typically permit all CAD (and other software design tool) companies to enter as an additional method for communicating with the server on the 1stPricing or other web site. Alternatively, the CAD companies may achieve the same result using the method and system that are illustrated in FIG. 2. The communication module works automatically. In one embodiment of the invention, all that a user has to do is hit the Create Schedule button or Update Schedule button described herein. From that point on, it works automatically.

The phrases "computer" and "programmable computer" as are used herein mean a programmable, preferably multipurpose, electronic machine that accepts data, such as raw data, facts and/or figures, and processes, transforms and/or manipulates the data into information that can be used. It is typically operated under the control of instructions that are stored in its own memory unit, which can accept and store data (e.g. data entered using a keyboard), perform arithmetic and logical operations on that data without human intervention (e.g. process data into information) and produce output from the processing (e.g. view information on a screen). A computer may be a stand-alone unit or may consist of a plurality of interconnected units that are operably connected with each other.

The phrase "computer programmer" as is used herein means a person or entity that designs, writes, develops and/or tests computer programs, or the like.

The phrase "computer programming" as is used herein means a process of writing, testing, debugging/troubleshooting and/or maintaining source code of computer programs. This source code is written in a programming language, and the code may be a modification of an existing source or something completely new. The purpose of programming is to create a program that exhibits a certain desired behavior (customization). The process of writing source code may require, depending upon the circumstances, knowledge of the application domain, specialized algorithms and/or formal logic.

The phrase "computer software" as is used herein refers to computer programs and/or a series of instructions that may be installed on a computer, and that the computer's hardware executes, generally one after another. It generally consists of lines of code written by computer programmers that have been compiled into a computer program. Software programs are generally stored as binary data (a 2-digit numerical system used by computers to store data and compute functions that consists of ones and zeros) that is copied to a computer's hard drive when it is installed. Since software is virtual and does not take up any physical space, it is generally easier, and often less expensive, to upgrade than computer hardware. Computer software is often continuously upgraded and improved. CD-ROMs, DVDs and other types of media, which are known by those having ordinary skill in the art, can be used to distribute software. When one purchases or otherwise procures a software program, it usually comes on a disc, which is a physical means for storing the software. Many software programs require that one first install them on a computer before using them. For example, if one purchases Microsoft Office, it needs to be installed on a computer before one can run any of the included programs, such as Word or Excel. The software can be installed from a CD or DVD, an external hard drive, or from a networked computer, or the like. A software program or software update can also often be installed using a file that is downloaded from the Internet. Installing a software program generally writes the necessary data for running a program on a computer's hard drive. Often the installer program will decompress the data that is included with the installer immediately before writing the information to a hard drive. Software updates, which are often downloaded from the Internet, generally work the same way. When an update is run, the installer file generally decompresses the data, and then updates the correct program or operating system. Installing software usually involves double-clicking an installer icon, and then clicking "I Agree" when the license agreement pops up. A computer operator may have to choose what directory on a hard disk that the software should be installed in, but often the installer will even choose that for the computer operator. Some software can be installed by simply dragging a folder or application program onto a hard drive.

The term "computer port" as is used herein refers to a physical or wireless connection on a programmable computer, an optical projector and/or another peripheral device that functions to provide communication between two or more instruments or devices, usually by one or more communication cables being inserted into one or more of the ports present on the instruments or devices or wirelessly (using, for example, Wi-Fi, Bluetooth, 4610X and/or the like) in a manner that information (including data) may be transferred from one instrument or device to the other, or vice versa, or between each of the devices or instruments.

The phrase "computer usable medium" as is used herein means any portable or non-portable medium in which computer readable program code can be physically embodied, including, but not limited to, an optical disk, a CD, a CD-ROM, a CD-R, a floppy disc, a drive, a hard drive, a DVD, a USB memory key, a SD memory cards, or the like.

The phrase "configure" as is used herein means to design, arrange, set up and/or shape, generally with a view to specific applications or uses.

The phrase "configurator" as is used herein means a software application or tool that typically is employed to design products that fulfill or match the requirements, desired or needs of customers (or others).

The phrases "console," "system console" and "root console" as are used herein mean the text entry and/or display device for computer system administration (or other) messages, particularly those from a BIOS or boot loader, a kernel, an init system and/or a system logger. It is a physical device generally including a keyboard and/or a screen. On traditional mini computers, the console is "serial console," an RS-232 serial link to a terminal such as a DEC VT100. This terminal is usually kept in a secured room as it could be used for certain privileged functions, such as halting the system or selecting which media to boot from. Large midrange systems, such as those that are commercially available from Sun Microsystems, Inc. (Palo Alto, Calif.), Hewlett-Packard Company (Palo Alto, Calif.) and IBM (Armonk, N.Y.), generally still use serial consoles. In larger installations, the console ports are typically attached to multiplexers or network-connected multiport serial servers that permit an operator to connect his computer terminal to any of the attached servers. On programmable computers (PCs) and workstations, the computer's attached keyboard and/or monitor typically have the equivalent function. Because monitor cables generally carry video signals, they typically cannot be extended to a significant distance from the computer (i.e., typically not father than about 200 feet and, if amplified, about 1,000 feet). Often, installations with many servers, therefore, use keyboard/ video multiplexers (KVM switches) and, possibly, video amplifiers to centralize console access. In recent years, KVM/IP devices have become commercially available from sources known by those having ordinary skill in the art, which allow a remote computer (i.e., a computer to which a user does not have physical access, but which he or she can access and/or manipulate via some kind of network) to view video output and/or send keyboard input via any TCP/IP network and, therefore, the Internet. Some PC BIOSes, particularly in servers, also support serial consoles, giving access to the BIOS through a serial port, so that the simpler and cheaper serial console infrastructure can be used. Even where BIOS support is lacking, some operating systems, e.g. FreeBSD and Linux, can be configured for serial console operation either during bootup, or after startup. It is usually possible to log in from the console. Depending upon configuration, the operating system may treat a login session from the console as being more trustworthy than a login session from other sources. Routers and managed switches (as well as other networking and telecoms equipment) may also have console ports, in particular Cisco Systems Inc. (San Jose, Calif.) routers and switches that use Cisco Systems Inc. IOS (internal operating system) are normally configured via their console ports.

The term "controller" as is used herein means a device that transmits information back and forth from a CPU and main memory to one or more peripherals. Each device generally has its own way of formatting and sending data, and part of the controller's function is to facilitate this.

The phrase "criteria of Energy Star" as is used herein means environmental and/or efficiency criteria and/or requirements promulgated, published or otherwise provided by, or under, the Energy Star program, a U.S. government program created by the U.S. Environmental Protection Agency in an attempt to reduce energy consumption and greenhouse gas emissions. Currently, Energy Star labels are found on over 40 product categories, and save consumers billions of dollars in energy costs. The Energy Star label was established to: (i) reduce greenhouse gas emissions and other pollutants caused by an inefficient use of energy; and (ii) make it easy for consumers to identify and purchase energy-efficient products that offer savings on energy bills without sacrificing performance, features, and comfort. Products can earn the Energy Star label by meeting the energy efficiency requirements set forth in Energy Star product specifications, which the U.S. Environmental Protection Agency establishes based upon the principles of: (i) product categories contributing significant energy savings nationwide; (ii) qualified products delivering features and performance desired or demanded by consumers, in addition to increased energy efficiency; (iii) if the qualified product costs more than a conventional, less-efficient counterpart, purchasers will recover their investment in increased energy efficiency through utility bill savings, within a reasonable period of time; (iv) energy efficiency can be achieved through broadly available, non-proprietary technologies offered by more than one manufacturer; (v) product energy consumption and performance can be measured and verified with testing; and/or (vi) labeling would effectively differentiate products and be visible for purchasers. A wide variety of products meeting Energy Star criteria, including many building products (products relating to insulation, air sealing, roofing, windows, doors, sky lights, heating and cooling (furnaces, humidifiers, purifiers, air conditioners and the like), plumbing, lighting, ceiling fans, and the like), are listed on the U.S. government Energy Star web site. Additional information regarding Energy Star criteria is also present on this web site.

The phrase "criteria of LEED" as is used herein means environmental and/or efficiency criteria and/or requirements promulgated, published or otherwise provided by the U.S. Leadership in Energy and Environmental Design (LEED). LEED is an internationally recognized green building certification system, providing third-party verification that a building or community is designed and built using strategies aimed at improving performance across energy savings, water efficiency, $CO_2$ emissions reduction, improved indoor environmental quality, and stewardship of resources and sensitivity to their impacts. Developed by the U.S. Green Building Council (USGBC), LEED provides building owners and operators a concise framework for identifying and implementing practical and measurable green building design, construction, operations and maintenance solutions, and applies to all building types, commercial as well as residential. It works throughout the building lifecycle, including design and construction, operations and maintenance, tenant fit-out and significant retrofit. LEED promotes a whole-building approach to sustainability by recognizing performance in five key areas of human and environmental health: (i) sustainable site development; (ii) water savings; (iii) energy efficiency; (iv) materials selection; and (iv) indoor environmental quality. Architects, real estate professionals, facility managers, engineers, interior designers, landscape architects, construction managers, lenders and government officials all use LEED to help transform the built environment to sustainability. State and local governments across the country are adopting LEED for public-owned and public-funded buildings. Further, there are LEED initiatives in federal agencies, including the Departments of Defense, Agriculture, Energy, and State, and LEED projects are in countries worldwide. LEED rating systems are developed through an open, consensus-based process led by LEED committees, and are present in detail on the U.S. Green Building Council web site.

The abbreviation "D" as used herein means "dimensional." For example, 2D refers to two dimensional, and 3D refers to three dimensional.

The phrase "database engine" as is used herein refers to that part of a database management system (DBMS) that stores and/or retrieves data. Most DBMS's include an Application Programming Interface (API) that enables a computer operator to directly control the engine without going through the DBMS's user interface.

The phrase "data transfer device" as is used herein means a peripheral, such as a modem, that allows information to be sent and received between a plurality of computers. A modem permits information to be sent across a telephone line, for example, typically at a rate of 56 kilobits (Kb) per second, or approximately 56,000 bits per second (bps).

The phrase "data update server" as is used herein means a server that contains data on one or more physical media devices (DVD, CD-ROM, hard drive, thumb drive, tape drive, RAM drive and/or the like). The data is typically marked or labeled as data that has been updated, changed, modified and/or deleted. The data update server typically receives requests for data from one or a plurality of remote devices in a specific communication protocol and sends the updated, changed, modified and/or deleted data to the remote device(s) in a specific communication protocol.

The term "device" as is used herein means a unit of hardware that generally is outside or inside of a case or housing for the essential computer (processor, memory and data paths), and that is capable of providing input to the essential computer and/or of receiving output. It may include, for example, keyboards, mice, display monitors, hard disk drives, CD-ROM players, printers, audio speakers and microphones, projectors, cameras and other hardware units, which are known by those having ordinary skill in the art. Some devices, such as a hard disk drive or a CD-ROM drive, while physically inside of the computer housing, are considered devices because they are separately installable and replaceable. With notebook and smaller computers, devices tend to be more physically integrated with the "non-device" part of the computer. The units of a computer to which the term device is generally not applied include the motherboard, the main processor and additional processors, such as numeric coprocessors, and random access memory (RAM). The term peripheral is sometimes used as a synonym for device or any input/output unit.

The terms "display," "display screen," "monitor," "computer screen" and "projector" as are used herein, depending upon the context, mean the various devices that can display, show and/or illustrate a computer's user interface and open programs, allowing a user (plan drawer or the like) to interact with the computer, typically using a keyboard and mouse, such as an LCD monitor, or data, information and/or graphics, or a display itself (i.e., that which is shown on a screen or monitor). Other known devices may also include display-type screens and/or displays.

The terms "dock" and "docking stating" as are used herein mean a cradle for a portable device that generally serves to charge the unit and/or connect it to other sources or destinations. For example, it may be a base station for a laptop computer that turns the portable computer into a desktop system. It generally uses a large plug and socket to quickly connect the laptop, which duplicates all of the cable lines for the monitor, printer, keyboard, mouse and/or the like. The docking station typically has one or two slots for expansion boards, and may house speakers and other peripherals, such as an optical drive.

The phrase "Document Explorer" as is used herein refers to software that functions to access and/or display local and/or online Help. Document Explorer of Microsoft Corporation (Redmond, Wash.), for example, has its own Help documentation that may be accessed by opening a Commerce Server 2007 Help system, clicking the "Help" menu, and then clicking "Help on Help." Document Explorer typically provides a table of contents, an index, a full-text search and Help favorites for bookmarking topics, so that a computer operator may easily find information. When the computer operator browses the table of contents or uses the index, local Help is generally accessed. When the operator uses the full-text search feature, there becomes an option of searching local and online content. Using Document Explorer, an operator can see the table of contents or search results while viewing a Help topic. A "Help Favorites" tab may permit an operator to relatively quickly display topics and searches that are referred to frequently.

The term "download" as is used herein means to transfer (data or programs) from a server, host computer and/or other source to another computer or device.

The phrase "Device Drivers, Diagnostics and Technical Information" as is used herein means a program that serves as a resource for device drivers, diagnostics and technical information in the event that they are required or desired to resolve a problem with a computer system. It is generally compatible with a variety of different computers, and is supported by Dell Technical Support when it is provided by Dell Inc., and employed with a Dell system.

The terms "driver" and "device driver" as are used herein mean a program that controls a particular type of device that is generally attached to a computer. There are device drivers for printers, displays, CD-ROM readers, diskette drives and the like, and many device drivers may be built into an operating system or other computer-related product. However, if a new type of a device is subsequently purchased that such operating system did not anticipate, a new device driver may need to be installed. A device driver essentially converts the more general input/output instructions of an operating system to messages that the device type can understand. Some Windows programs are virtual device drivers, and these programs may interface with the Windows Virtual Machine Manager. There is usually a virtual device driver for each main hardware device in a system, including the hard disk drive controller, keyboard, and serial and parallel ports. They are generally used to maintain the status of a hardware device that has changeable settings. In Windows operating systems, a device driver file usually has a file name suffix of DLL or EXE, and a virtual device driver usually has the suffix of VXD.

The phrase "Driver Download Manager" as is used herein means a functionality which is available, for example globally across the support Dell web site, to facilitate a downloading of files, for example, from Dell, Inc. (Roundrock, Tex.). Generally, the time taken to download files using this tool is significantly shorter than would occur otherwise, often up to a 30-40% reduction in time, depending upon the Internet connectivity. It also may include one or more mechanisms to facilitate the process of downloading files, for example, from the foregoing web site. For example, it may permit a computer operator to pause and resume downloads, with the progress of a download being capable of being saved via an icon on the computer, which can often be restarted at any time. It may also permit the computer operator to restart a download in the event of an interruption or termination of an Internet connection during a download, as the Driver Download Manager may save the progress. Additional information about Driver Download Managers is present on the foregoing web site.

The phrases "Dynamic Link Library" and "DLL" as are used herein means an executable file that allows computer programs to share code and/or other resources that are necessary or desirable to perform particular tasks. Microsoft Windows, for example, provides DLL files that contain functions and resources that allow Windows-based programs to operate in the Windows environment.

The phrase "emulator" as is used herein means a hardware, software or a combination of the two that enables a computer to act like another computer, and run applications written for that computer. It may be, for example, a hardware add-on that actually contains an instruction execution module for the emulated computer or software that provides a translation layer from the emulated computer to the computer it is running in. The emulator may generally translate machine language, calls to the operating system and/or the like.

The term "energy" as is used herein means a physical quantity that describes the amount of work that can be performed by a force, an attribute of objects and systems that is subject to a conservation law. Different forms of energy include kinetic, potential, thermal, gravitational, light, sound, elastic and electromagnetic energy, with the forms of energy often named after a related force, and can be expressed in joules, ergs or other units. According to the principle of the conservation of energy, any form of energy can be transformed into another form, but the total energy always remains the same.

The phrase "Energy Efficient Programs" as is used herein refers to programs and/or the like, and related materials, products and/or processes, that have been, are or will be approved by a U.S., state, local, regional or foreign institution, business or governmental body and/or rated by a known professional or skilled energy-related entity or individual as being efficient (decreasing quantities of use, saving costs and/or the like) in a use of energy, electricity, water, other resources and/or the like and includes, but is not limited to, NAHB, HOME STAR, Energy Star, CalStar, and other similar programs, which are known by those having ordinary skill in the art, and which are described in detail on a variety of known Internet web sites.

The phrases "Enterprise software" and "Enterprise application software" as are used herein mean software that is intended to solve an enterprise problem, rather than a departmental problem, and is often written using an Enterprise Software Architecture. Large enterprises often attempt to build enterprise software that models the entire business enterprise and/or is the core Information Technology (IT) system of governing the enterprise and the core of communication within the enterprise. As business enterprises have similar departments and systems in common, enterprise software is often available as a suite of programs that have attached enterprise development tools to customize the programs to the specific enterprise. Enterprise level software is software which provides business logic support functionality for an enterprise, typically in commercial organizations, which aims to improve the enterprise's productivity and efficiency. Services that are provided by enterprise software are typically business-oriented tools such as online shopping and online payment processing, interactive product catalogue, automated billing systems, security, content management, CRM, ERP, Business Intelligence, HR Management, Manufacturing, EAI, Enterprise Forms Automation and the like. Characteristics of enterprise software are performance, scalability and/or robustness. Enterprise software typically has interfaces to other enterprise software (for example LDAP to directory services) and is centrally managed. Enterprise software is often designed and implemented by an Information Technology (IT) group within an enterprise, but it may also be purchased from an independent enterprise software developer, that often installs and maintains the software for their customers. Another model is based on a concept called on-demand software, or Software as a Service. The on-demand model of enterprise software is made possible through the widespread distribution of broadband access to the Internet. Software as Service vendors generally maintain enterprise software on servers within their own enterprise data center, and then provide access to the software to their enterprise customers via the Internet. Enterprise software is often categorized by the business function that it automates, such as accounting software or sales force automation software. The are enterprise systems devised for particular industries, such as manufacturing enterprises. Enterprise application software is application software that often performs business functions such as accounting, production scheduling, customer information management, bank account maintenance, and the like. It is frequently hosted on servers, and generally simultaneously provides services to a large number of enterprises, typically over a computer network. This is in contrast to the more common single-user software applications, which generally run on a user's own local computer and serve only one user at a time.

The phrases "environmental pollutants" and "pollutants" as are used herein mean any element, chemical, compound, gas, solid, liquid, substance, material, component, blend or other combination thereof, and/or the like that has an ability to contaminate (make less pure or clean), and/or cause damage or destruction to, any part of the environment (air, water, soil and/or the like), or to elements within the environment, and includes air pollutants, water pollutants, soil pollutants and/or the like. Environmental pollutants include, but are not limited to, oxides of sulfur (SOx), such as sulfur dioxide ($SO_2$), oxides of nitrogen (NOx), such as nitric oxide (NO), nitrogen dioxide ($NO_2$), nitrous oxide ($N_2O$), carbon monoxide (CO), carbon dioxide ($CO_2$), hydrochloric acid (HCl), methane ($CH_4$), volatile organic compounds (VOCs), dioxin, ammonia ($NH_3$), benzene, hydrogen fluoride, hydrogen sulfide, poly-aromatic hydrocarbons (PAH), hexachlorobutadiene, ethylene dibromide, mercury, arsenic, uranium and thorium, and isotopes thereof, and radioactive products produced by the decay of uranium and thorium, such as radium, radon, polonium, bismuth and lead, particulate matter and/or other radioactive chemicals or substances.

The term "estimate" as is used herein means an opinion, an approximation, a tentative evaluation or a rough calculation of an amount, value or the like, and is not a price.

The term "EXE" as is used herein means the common file name extension denoting an executable file (a program) in the DOS, OpenVMS, Microsoft Windows, Symbian, OS/2 and/or other operating systems. Besides the executable program, many EXE files contain other components called resources, such as bitmaps and icons which the executable program may use for its graphical user interface.

The phrase "executable file" as is used herein generally means a sequence of subroutine calls that cause a computer to perform indicated tasks according to encoded instructions, as opposed to a file that only contains data.

The term "execute" as is used herein in connection with a computer, console, server system or the like means to run, use, operate or carry out an instruction, code, software, program and/or the like.

The term "file" as is used herein means a set of related or other records (written, electronic or otherwise) that are kept together.

The term "geospatial criteria" as is used herein means the data or information that identifies the geographic location of features and/or boundaries on Earth, such as natural features (oceans, land, lakes, mountains, valleys and/or the like) or constructed features (buildings, roads, postal codes, cities and/or the like) and more. Geospatial criteria is generally any data that is, or could be, converted to a latitude and/or longitude coordinate point or points that define a specific or unique location or group of locations linked together on the Earth surface.

The term "green" as used herein means that a construction plan (or other) element, commercial or residential building, object, material, appliance (dishwasher, washing machine, toilet, sink, faucet or the like) and/or the like is environmentally responsible, energy efficient and/or water efficient in that it is certified by the U.S. government or a foreign government, a state or local government or another third party (entity, organization and/or individual) as being: (i) energy efficient and/or water efficient, for example, by having a U.S. "Energy Star" label; and/or (ii) rated "green." Such certification or rating is preferably made by one or more accredited professionals, entities or organizations that have demonstrated a thorough understanding of "green" building practices and principles using a green building rating and/or certification system that it accepted by those of ordinary skill in the art, such as the U.S. Leadership in Energy and Environmental Design (LEED), the U.S. Green Building Council (Washington, D.C.), Building Green, Inc. (Brattleboro, Vt.), Green2Green (Charlottesville, Va.) and/or the like. Typically, a "green" construction plan (or other) element, commercial or residential building, object, material, appliance or the like reduces impacts on the environment and/or health through an increased energy and/or water efficiency in comparison with similar items (i.e., it is "energy efficient" and/or "water efficient") and/or saves related costs. Because the U.S. government provides tax credits, deductions and/or other benefits for constructing buildings that are "green," and using "green" materials, objects and appliances in the construction of buildings, it is very desirable for a builder or building owner to have a building certified as being "green." To determine how a building's energy use compares to other similar buildings in the country, the U.S. Environmental Protection Agency ("EPA") developed an energy performance rating system that rates a building's energy efficiency on a scale of 1-100. A building that scores 75 or above on this scale (placing its energy performance among the top 25 percent among similar buildings) can earn an "Energy Star" label. Receiving a rating for a building can easily be accomplished at the Energy Star web site using Portfolio Manager, a free, online tracking and benchmarking tool. To date, over 27,000 buildings have been rated, and more than 2,800 of them have earned an "Energy Star" label.

The phrase "green schedule" as is used herein means an editable or non-editable schedule, spreadsheet, table and/or the like that includes one or a plurality of construction plan (or other) elements and/or parametric symbols, and optionally one or a plurality of selected characteristics that correspond with the various construction plan (or other) elements and/or parametric symbols, such as height, width, color, quality and/or the like, as is discussed herein, and one or a plurality of accompanying statements and/or indications that correspond with one or a plurality of construction plan (or other) elements and/or parametric symbols that state and/or indicate whether or not the construction plan (or other) elements and/or parametric symbols are "green." The "green schedule" may optionally include statements, data, information, columns, rows, headings, letters, numbers, symbols and/or the like, and may be in any one of many different forms required or desired by a user or otherwise, as is known by those having ordinary skill in the art. No particular form or format is required. Other terms that may be used to refer to a "green schedule" include a "Bill of Materials" (BOM), "Take Off" and/or the like, which are included in this definition for "green schedule."

The term "hard disk" as is used herein means a part of a unit (a "disk drive," "hard drive," or "hard disk drive") that stores and/or provides relatively rapid access to large amounts of data and/or information on an electromagnetically charged surface, or set of surfaces. Today's computers typically come with a hard disk that contains several billion bytes (gigabytes) of storage (i.e., the place where data is held in an electromagnetic or optical form for access by a computer processor).

The phrase "hard drive" as is used herein means a unit that stores data on a computer. It generally houses a hard disk, where all of the computer files and folders are generally physically located. Currently, a typical hard drive can hold over 100 GB of data, and other hard drives can hold more data. The data is generally stored on a stack of disks that are mounted inside of a solid encasement. These disks generally spin extremely fast (often at either 5400 or 7200 RPM), so that data can be accessed immediately from anywhere on the drive. The data is stored on the hard drive magnetically, so it stays on the drive even after the power supply is turned off. In order to install new software on a computer, a user often needs to run an installer program. This program unpacks compressed data included with the installer and writes new information to a hard drive. While some installers do not use compressed data, most use some level of compression since it reduces the size of the files included with the installer. This is especially helpful when downloading programs or software updates from the Internet. RAID (Redundant Array of Independent (or Inexpensive) Disks) is a category of disk drives that employ two or more drives in combination for fault tolerance (an ability of a system to respond gracefully to an unexpected hardware and/or software failure) and performance. RAID disk drives are used frequently on servers, but are not generally necessary for personal computers. RAID allows a user to store the same data redundantly (in multiple paces) in a balanced way to improve overall performance.

The phrase "hardware" as is used herein means a physical aspect of computers, and distinguishes the "box" and the electronic circuitry and components of a computer from the program that is put into it to make it perform different functions. Hardware includes not only the computer proper (central processing unit, input/output devices, main memory, secondary memory devices, chips, boxes, wires, keyboards, speakers, disks, printers, mice, monitors and/or the like), but also the cables, plugs, connectors, power supply units and peripheral devices, such as the keyboard, mouse, audio speakers and printers.

The phrase "HOME STAR" as is used herein means a plan developed by representatives of the U.S. Government that includes predetermined criteria for residential and/or commercial building, home and/or other products, materials and the like regarding an efficiency in using and/or saving energy, which predetermined criteria vary, and are known by those having ordinary skill in the art, and is an Energy Efficient Program. This program typically provides for tax incentives (deductions, credits, reductions, rebates and/or other rewards) for Americans who purchase new windows, doors, insulation, appliances, solar panels, wind turbines and/or similar products or materials that reduce their home (or other) energy use and/or consumption. In the HOME STAR Program, there are different levels, such as "Gold Star," in which rebates for home energy audits and design upgrades reducing energy costs by at least 20% are eligible for a $3,000 rebate, with additional rebates being available for savings above 20%. For example, a vinyl window that has a U Value and SHGC of 0.30 or less in California would meet the HOME STAR criteria, and the purchaser of such window could "write off" (i.e., have deductions, credits and/or the like in connection with) some of the purchase price of the window on their taxes when the window is for a personal use, such as for a use in a single family dwelling. Additional information about the HOME STAR Program is present at the U.S. government Whitehouse web site.

The phrase "immediately" as used herein typically means right away (i.e., within a period of less than about a few minutes) but, in some cases, may mean within the same day.

The term "industrial" as is used herein means a discipline that is concerned with the efficient production of industrial items, generally as affected by elements such as plant and procedural design, the management of materials and energy, the integration of workers within the overall system and/or the like.

The term "init" as is used herein means a Macintosh computer routine that typically is run when the computer is started or restarted. It is used to load and activate drivers and system routines. Many inits are memory resident.

The term "install" as is used herein in connection with a software program generally means writing the necessary data for running the program on a hard drive. Often, the installer program will decompress the data included with the installer immediately before writing the information to a hard drive. Software updates, which are often downloaded from the Internet, typically work the same way. When the update is run, the installer file generally decompresses the data and then updates the correct program or operating system.

The phrases "installer program" and "installer" as are used herein mean a computer program that has an ability to install a new program on a computer or update a program that is currently present on a hard drive. Generally, it can also update or add files to an operating system. Most installers can be run by double-clicking the installer icon and then choosing a folder into which the software should be installed. The installers generally decompress and write the data on the hard drive. Once the installer is finished, the new or updated software can often by used by a computer operator right away. If any system files have been installed, the computer operator may be asked to restart a computer before using the new software (because system files may only be able to be loaded during a computer's boot process).

The term "Internet" as is used herein means a global network that connects a plurality, and possibly millions, of computers together, often permitting exchanges of data, news and/or opinions. Unlike online services, which are generally centrally controlled, the Internet is decentralized by design. Each Internet computer (host) is generally independent. Its operators can choose which Internet services to use and which local services to make available to the global Internet community. There are a variety of ways to access the Internet, including online services such as America Online, and commercial Internet Service Providers, which are well known by those having ordinary skill in the art.

The term "interpreter" as is used herein is a software program that functions like a compiler, but that performs a translation and execution in short bursts in which a small portion of source code, such as one statement, is translated and executed, and then another small portion of source code, such as a second statement, is translated and executed, and so forth.

The term "Intranet" as is used herein means a privately maintained computer network that can generally be accessed only by authorized persons or entities, such as members, employees or representatives of a business, institution, organization or other person or entity that owns it.

The phrase "1stPricing" as used herein refers to 1ST Pricing, which is currently physically located at 1858 East 20th Street, Signal Hill, Calif., 90755, and is a subsidiary of California Distribution Center, Inc. (a California corporation). 1stPricing has an online 1stPricing web site or other designated web sites.

The phrase "1stWindows" as used herein refers to 1stWindows, which is currently physically located at 1858 East 20th Street, Signal Hill, Calif., 90755, and is a subsidiary of California Distribution Center, Inc. (a California corporation). 1stWindows has an online 1$^{st}$Windows web site or other designated web sites.

The abbreviation "ISP" as used herein means Internet Service Provider.

The term "Java" as is used herein means one type of computer programming language that can be used to create computer software programs. It is not tied to any particular processor type and, thus, will work on many different types, and makes, of computers. It is typically is used worldwide, and permits software to be easily exchanged and executed via the World Wide Web (WWW or Web). Further, it includes a library of extra software that can be employed when a computer programmer is developing a program. The library permits the programmer to create graphics, communicate over networks, interact with databases, and the like. Typically, Java applications have a similar basic structure including, for example, comments (first few lines of the program that start with the symbols //, and help readers of the code understand the purpose of the program, and what it accomplishes), a class definition (which defines the Java program), a main method (location at which processing commences, with each programming statement (in the form of lines of code) in the main method being executed one at a time in order until the end of the method is reached, and is preceded by the words "class," "public," "static" and "void"), white space (spaces that separate the words and symbols that are used in a program, and include blanks, tabs and newline character), and PrintIn method (which prints specified characters to a screen in a character screen, and is enclosed in double quote characters (")). When the program is executed, it calls the PrintIn method to print the first statement, and then the second statement, and so forth. The program terminates with the last statement. Additional information about Java is present in John Lewis et al., *Java Software Solutions*, (2nd Edition, Pearson Education, Inc., 2007, ISBN 0-13-222251-5).

The term "kernel" as is used herein means a program that typically constitutes the central core of a computer operating system. It typically has complete control over everything that occurs in a computer system. The kernel itself typically does not interact directly with a user, but rather interacts with other computer programs, as well as with hardware devices on the system, including the processor (central processing unit or CPU) and disk drives. The kernel typically is the first part of the operating system to load into memory during booting (i.e., system startup), and it typically remains there for the entire duration of the computer session because its services are typically required continuously.

The phrases "LAN" and "local area network" as are used herein mean a computer network typically covering a relatively small physical area, such as a house, an office or a small group of buildings, such as a school or an airport. In contrast with WANs, LANs typically have higher data-transfer rates, smaller geographic area and a lack of a need for leased telecommunication lines. LANs are well known by those having ordinary skill in the art.

The term "LEED" as is used herein means a third-party certification program that is the nationally-accepted benchmark for the design, construction and operation of high-performance green buildings. LEED generally gives building owners and operators the tools that they need to have an immediate and measurable impact on their buildings' performance. LEED promotes a whole-building approach to sustainability by recognizing performance in five key areas of human and environmental health: (i) sustainable site development, (ii) water savings, (iii) energy efficiency, (iv) materials selection; and (v) indoor environmental quality. The LEED for New Construction Rating System is designed to guide and distinguish high-performance commercial and institutional projects, including office buildings, high-rise residential buildings, government buildings, recreational facilities, manufacturing plants and laboratories. LEED credits take into account different criteria, such as how close a material is made to a construction project, how much recycled material is present in the product, and the like. The material may have more than one LEED rating and is usually multiplied by the price of the product to get the LEED credit earned. LEED credits may be determined and procured by those having ordinary skill in the art. Typically, to obtain LEED credits, a procurement form must generally be filled out showing how the credits were derived, and they usually include a signature of someone who has verified their accuracy. The add-on computer software that is described herein has an ability to fill out such a form.

The term "library" as is used herein means: (i) a collection of a plurality of programs and/or data files; or (ii) a set of a plurality of ready-made software routines (functions) for programmers. The routines are generally linked into the program when it is compiled.

The term "local" as is used herein means a computer network that typically connects one or more computers together, which can generally share data, and communicate without requiring the data to be sent over the Internet.

The phrase "merge module" as is used herein refers to a packet of computer software code which, when compiled under one programming language, can be used by various programming languages, such as VB.net, C#.net, C++, and others without recompiling or converting the code into the that specific language (VB.net, C#.net, C++, and/or the like).

The phrases "metropolitan area network" and "MAN" as are used herein mean a relatively large computer network that usually spans a city or a large campus. They typically interconnect a plurality of local area networks (LANs) using a high-capacity backbone technology, such as fiber-optical links, and provide up-link services to wide area networks (WANs) and/or the Internet.

The term "modem" as is used herein means a device or program that enables a computer to transmit data over, for example, telephone or cable lines. Computer information is generally stored digitally, whereas information transmitted over telephone lines is transmitted in the form of analog waves, and a modem may convert between these two forms.

The phrase "native software" as is used herein means software that generally is specifically written, compiled and/or or assembled to run on a particular system. Native code generally uses all of the individual features of the target system with no regard for generality or portability.

The abbreviation "NAHB" as is used herein refers to the Association of Home Builders, and is an organization of home builders that provides educational, political, research and/or other information and/or services to others, such as contractors, sub-contractors, builders, homeowners and/or the like. This organization typically publishes a monthly magazine, and has a rating standard for "green," which standard is known by those having ordinary skill in the art, and is the first residential green building rating system to undergo a full consensus process and receive American National Standards Institute approval. Its four threshold levels, which are Bronze, Silver, Gold and Emerald, allow builders to achieve entry-level "green" buildings up to the highest level of sustainable "green" building, which incorporate energy savings of 60% or more. Single-family and multi-unit homes, dwellings, residential remodeling projects and site developments are all covered in this standard. Additional information about the NAHB, its energy rating standard and its publications is present on its web site.

The phrases "network" and "computer network" as are used herein mean a plurality or collection of computers, consoles and/or devices that are typically connected together by communications channels that facilitate communications among users and/or allows users to share resources with other users in a manner that they can exchange information. Connecting two or more computers together can significantly increase the functions, and amount of functions, that can be performed by the computers. If a network includes a printer (or one or more other peripherals), any computer that is connected to the network can print a document on that printer (or communicate with the other peripherals). Networks may be classified according to a wide variety of characteristics. Computer networks can be classified according to the hardware and software technology that is used to interconnect the individual devices in the network, such as optical fiber, Ethernet, Wireless LAN, HomePNA, Power line communication or G.hn. Ethernet uses physical wiring to connect devices. Frequently deployed devices include hubs, switches, bridges and/or routers. Wireless LAN technology is designed to connect devices without wiring (in contrast with wiring). These devices use radio waves or infrared signals as a transmission medium. ITU-T G.hn technology uses existing home wiring (coaxial cables, phone lines and/or power lines) to create a high-speed (typically up to 1 Gigabit/s) local area network. Networks are often classified as local area network (LAN), wide area network (WAN), Metropolitan area network (MAN), personal use network (PAN), virtual private network (VPN), campus area network (CAN), storage area network (SAN) and others, which are known by those having ordinary skill in the art, depending upon their scale, scope and purpose. As is known by those having ordinary skill in the art, usage, trust level and access right often differ between these types of network. For example, LANs tend to be designed for internal use by an organization's internal systems and employees in individual physical locations, such as a building, while WANs may connect physically separate parts of an organization and may include connections to third parties.

The term "offline" as is used herein means not turned on and/or connected, or not connected to the Internet, depending upon the circumstances, which may readily be determined by those having ordinary skill in the art.

The term "online" as is used herein means turned on and/or connected, or connected to the Internet, depending upon the circumstances, which may readily be determined by those having ordinary skill in the art. For example, printers are online when they are ready to receive data from a computer. In contrast, when a printer is offline (not turned on and/or connected), certain tasks, such as advancing paper, may be performed, but data cannot be sent to the printer. Also, computer operators are generally considered to be online when they are connected to a computer service through a modem or to the Internet The phrase "operably connected with" as is used herein in connection with a plurality of instruments or devices, such as one or more computers or consoles, or one or more computers or consoles and one or more peripheral devices, means that the instruments or devices are connected with each other, usually by one or more communication cables inserted into one or more ports present on the instruments or devices or wirelessly (using, for example, Wi-Fi, Bluetooth, 4610X and/or the like) in a manner that information (including data) may be transferred from one instrument or device to the other, or vice versa, or between the devices or instruments.

The phrase "operating system" as is used herein means software that generally communicates with computer hardware on a most basic level, and is the main software of a computer. Without an operating system, generally no software programs can run. The operating system generally allocates memory, processes tasks, accesses disks and peripherals, and/or serves as the user interface. For example, it provides a user interface that allows a user to interact with the machine, such as clicking on an icon to delete a file. It also manages computer resources such as the CPU and main memory. It generally decides when programs can run, where they are loaded into memory, and how hardware devices communicate. As a result of operating systems such as Windows, Mac OS and Linux, programmers can write code using a standard programming interface, or Application Program Interface. Without an operating system, programmers would often need to write about ten times as much code to get the same results. Other known operating systems include Windows 98, Windows NT, Windows 2000, Windows Server 2003, Windows Server 2008, Windows Vista, Windows XP and Windows 7.

The term "palette" as is used herein means any type of computer, console, server and/or on-screen window and/or toolbar that holds one or more (usually related) icons, buttons, menus and/or the like within or outside of an application. A palette preferably, and typically, includes one or a plurality of different libraries.

The term "parametric" as is used herein means an object in a CAD (or other software design or other program) model that can be modified by changing one or a plurality of the parameters used to create it, such as one or more dimensions, design constraints and/or the like.

The phrases "parametric symbol" and "object" as are used herein mean a generic or manufacturer/distributor/other specific architectural, civil engineering, industrial engineering or other 2D or 3D drawing that is typically of a common architectural, mechanical, construction or electronic element, such as a window, an entry or interior door, an acrylic glass block, a sky light or the like, and that includes one or a plurality of parameters about its characteristics, such as size, color, type of material (wood, vinyl, aluminum, etc.), presence or absence of grids, number of grids, type of glass, coating on the glass, presence or absence of breather tubes, and/or the like. Parametric symbols typically enable an architect, civil or industrial engineer and/or other designer and/or architectural CAD software (or other software design tool) to work with an object as a real-world entity, rather than just as lines and polygons.

The term "parameter" as is used herein means the desired or necessary characteristic(s) for a particular construction plan (or other) element, such as size (height, width and/or depth), type of material (vinyl, wood, aluminum or the like), color, type of glass, coating on glass, header height, presence or absence of grids, number of grids, presence or absence of breather tubes, presence or absence of Argon gas, and/or the like. For example, a window may have parameters of being 3'×6' in size (as opposed to a different size), made out of steel (as opposed to wood, aluminum or some other material), being vinyl clad (rather than not being vinyl clad), including low E glass (as opposed to some other type of glass) and having the color white (as opposed to some other color).

The phrase "parametric symbol schedule" as is used herein means a schedule that includes one or a plurality of selected parametric symbols, and selected characteristics that correspond with the selected parametric symbols. It may or may not include price and/or "green" information for the selected parametric symbols.

The terms "peripheral" and "peripheral device" as are used herein mean any external, internal and/or other device that generally is not part of the essential computer (the memory and microprocessor) and provides input and/or output in connection with a computer. For example, a keyboard, a mouse and a CD-ROM drive are input peripherals, while a monitor, a printer and a projector are output peripherals. Peripheral devices typically operate at the periphery, or outer edges, of a system, and can be external, such as a mouse, keyboard, printer, monitor, external Zip drive, scanner, CD-R drive, audio speaker, touch screen, plotter or goggle, or internal, such as a CD-ROM drive, CD-R drive or internal modem. Some peripherals, such as external hard drives, provide both input and output for the computer.

The phrases "personal area network" and "PAN" as are used herein mean a computer network that is typically used for communication among devices, including telephones and personal digital assistants, in proximity to an individual's body. The devices may or may not belong to the person in question. The reach of a PAN is typically a few meters. PANs can be used for communication among the personal devices themselves (intrapersonal communication) and/or for connecting to a higher level network and/or the Internet. Personal area networks may be wired with computer buses, such as universal serial buses (USBs) and fire walls. A wireless PAN can also be made possible with network technologies such as Infrared Data Association, Bluetooth, UWB, Z-wave and ZigBee, as is known by those having ordinary skill in the art.

The terms "preferably" and "preferable" as are used herein mean that an element, step, limitation and/or the like generally is optional, but is more desirable than another element, step, limitation and/or the like or than not including the same at all.

The terms "plurality" and "multiple" as are used herein mean more than one, for example, two, three, four, five, six, seven, eight, nine, ten, eleven, twelve, thirteen, fourteen, fifteen, twenty, twenty-five, thirty, thirty-five, forty, forty-five, fifty, seventy-five, one hundred, two hundred, three hundred, four hundred, and so forth.

The term "price" as is used herein means the actual cost at which a material, good, item or product, such as a window or door having specified features (height, width, depth, material, glass type and/or the like), is procured or obtained, typically as a result of a purchaser (homeowner, building owner, contractor, subcontractor, builder and/or the like) purchasing the same from a seller (manufacturer, distributor, other business, entity or individual and/or the like). A price may or may not include additional costs, such as sales tax, shipping fees, other administrative fees and/or the like. A price is not an estimate and, in contrast with an estimate, may generally be relied upon by a lending institution, such as a bank, when making decisions with respect to loans, mortgages and/or similar lending instruments.

The phrase "price schedule" as is used herein means an editable or non-editable schedule, spreadsheet, table and/or the like that includes pricing data and/or information that corresponds with one or a plurality of construction plan (or other) elements and/or parametric symbols, and one or a plurality of selected characteristics that correspond with the various construction plan (or other) elements and/or parametric symbols, such as height, width, color, quality and/or the like, as is discussed herein. The price schedule may optionally include statements, data, information, columns, rows, headings, letters, numbers, symbols and/or the like, and may be in any one of many different forms required or desired by a user or otherwise, as is known by those having ordinary skill in the art. No particular form or format is required. Other terms that may be used to refer to a "price schedule" include a "Bill of Materials" (BOM), "Take Off" and/or the like, which are included in this definition for "price schedule."

The terms "processor," "microprocessor," "CPU" and "Central Processing Unit" as are used herein mean the logic circuitry of a computer, which responds to, and processes, the basic instructions that drive a computer, which are generally provided by one or a plurality of computer programs. The processor is on a chip (a microprocessor), a part of the main circuit board of a computer.

The phrase "Product Specification Criteria" as is used herein means a generally written statement regarding one or a plurality of required or desired characteristics of an item, element, product, material and/or the like, which is generally documented in a manner that facilitates its procurement, production and/or acceptance. There may be new product specifications that can subsequently be attached to a procurement, production or other schedule that were originally unforeseen (at a previous time) that a scheduling or other system/apparatus described herein can transmit or send back from a database to a user's computer or console, or otherwise create, produce and/or provide, such as logos, installation instructions, manuals, warranty information and/or the like, either with or without a corresponding (or other) price. For example, if a user chooses, the user may select in the system or its program that the user only wants LEED approved products. Thus, in this case, only products that meet the specification as LEED will be sent back from the database, or otherwise provided, to the user's computer or console. The same is true with respect to other types of product specification criteria. A wide variety of product specification criteria are well known by those having ordinary skill in the art. Examples of product specification criteria, include, but are not limited to, color, size, dimensions, weight, material, type of glass (when glass is present), energy rating, compliance with criteria of BOMA (Building Owners and Managers Association International), NAHB, HomeStar, CalStar, RFID and/or other programs, installation instruction, warranty information, amount of VOC and/or other pollutants, and/or the like. Many other product specification criteria are described elsewhere herein.)

The term "RAM" as is used herein means random access memory, a type of computer memory that can generally be accessed randomly, that is, generally any byte of memory can be accessed without touching the preceding bytes. RAM is the most common type of memory found in computers and other devices, such as printers. It also refers to main memory, the memory available to computer programs. For example, a computer with 8 MB RAM has approximately 8 million bytes of memory that programs can use. Currently, a typical computer may come with 256 million bytes of RAM, and a hard disk that can hold 40 billion bytes. RAM generally comes in the form of "discrete" (separate) microchips, and also in the form of one or more modules that may plug into holes in a computer's motherboard. These holes connect through a bus or set of electrical paths to the processor. The hard drive, on the other hand, stores data on a magnetized surface that looks like a phonograph record. Most personal computers are designed to allow a user to add additional RAM modules up to a certain limit. Having more RAM in a computer generally reduces the number of times that the computer processor has to read data in from a hard disk, an operation that generally takes much longer than reading data from RAM.

The term "remote" as is used herein means a device that is located physically not near other similar devices (relatively or otherwise), such as may be present in another room, building, campus, city, state, country and/or the like, depending upon the particular circumstances, as may be determined by those having ordinary skill in the art.

The phrases "remote server," "remote host" and "remote computer" as are used herein mean a computer, peripheral and/or similar device or the like that typically is not attached to a user's keyboard (or other peripheral device), but over which the user has at least some control (>0% to 100%), and is in a remote (relatively distant) location, whether in the same room, in another part of a building, in another part of a group of buildings, in another part of a specified geographical area, such as a town, a city, a state, a country or a continent, or in some other part of the world. These phrases often refer to an any computer, peripheral and/or similar device that offers data, information, graphics, sound and/or video to one or a plurality of other computers, peripherals and/or similar devices. Most of the time, this refers to connecting to a server across the Internet, which is often performed for a purpose of obtaining and/or providing media, data, information and/or the like (or anything else that a user may want to send and/or procure to and/or from the other computer, peripheral and/or device). Large networks will often have a "remote DESKTOP server" as well, allowing login over the local network or across the Internet to use the server, network and Internet connection as if the user were physically sitting in front of it. While there phrases typically refer to a server in a private network or to the public Internet, it also refers to a user's PC in another location that is accessed over the Internet for file transfer or remote control operation.

The phrase "RFID" as used herein means Radio Frequency IDentification, which is a data collection technology that uses electronic tags for storing data. The tag, also known as an "electronic label," "transponder" or "code plate," is made up of an RFID chip attached to an antenna. Transmitting in the kilohertz, megahertz and gigahertz ranges, tags may be battery-powered or derive their power from the RF waves coming from the reader. Like bar codes, RFID tags identify items. However, unlike bar codes, which must be in close proximity and line of sight to a scanner for reading, RFID tags do not require line of sight, and can be embedded within packages. Depending upon the type of tag and application, they can be read at a varying range of distances. In addition, RFID-tagged cartons rolling on a conveyer belt can be read many times faster than bar-coded boxes. Additional information about RFID is present in a wide variety of Internet web sites and in the RFID journal, which provides complete news, information and features in connection with RFID technology, and is available at the RFID journal web site.

The terms "run" and "execute" as are used herein mean to perform an action, a command, an instruction and/or the like, or to be in partial or full operation (typically in full operation), for example, computer software that runs on a computer, or a computer software program that is executed.

The phrase "run time" as is used herein refers to the actual execution of a program. "At runtime" means while a program is running.

The term "scanner" as is used herein means an input device that converts text, photographs and/or graphics into machine readable form.

The terms "screen" and "screen shot" as are used herein mean a picture or illustration of that which is displayed on a computer, console, projector, monitor, other screen and/or the like. Numerous screen shots are illustrated in the various figures set forth herein.

The term "serial console" as is used herein means a text entry and/or display device for system administration messages, particularly those from a BIOS or boot loader, a kernel, an init system and from a system logger. It is a physical device generally including a keyboard and a screen.

The term "server" as is used herein means a computer, device or the like on a network that manages network resources (generally any item that can be used). For example, a file server is a computer and storage device that is dedicated to storing files. Any user on the network can store files on the server. A print server is a computer that manages one or more printers, and a network server is a computer that manages network traffic. A database server is a computer system that processes database queries (requests for information from a database). Servers are often dedicated, meaning that they perform no other tasks besides their server tasks. On multi-processing operating systems, a single computer can execute several programs at once. A server in this case could refer to the program that is managing resources rather than the entire computer.

The phrase "service pack" or "patch" as are used herein means an orderable, downloadable or other update or enhancement to a software that typically corrects one or more existing problems and, in some cases, delivers or provides product enhancements. A service pack is typically a collection of updates and fixes for an operating system or a software program. Many of these patches are often released before the larger service pack, but the service pack generally allows for an easy, single installation. Service packs also often include new features in addition to fixes. IBM Corporation (Armonk, N.Y.) and Microsoft Corporation are examples of entities that use these terms to describe their periodic product updates. When a new product version comes out or is otherwise released, it usually incorporates the fixes from the service packs that have been shipped to update the previous product version. A wide variety of service packs are commercially available from sources that are known by those having ordinary skill in the art, such as IBM Corporation and Microsoft Corporation.

The phrases "software application" and "application software" as are used herein mean a computer software that is designed to help a user perform a particular task and include, for example, word processors, spreadsheets, media players, database applications and/or the other tasks that are described herein, or any combination thereof. An application can typically manipulate text, numbers, graphics, or a combination of these elements. An application suite generally comprises multiple applications bundled together. They usually have related functions, features and/or user interfaces, and may be able to interact with each other, for example, open each other's files. Business applications often come in suites, e.g. Microsoft Office, OpenOffice dot org and iWork, which bundle together a word processor, a spreadsheet, and the like. Suites also exist for other purposes, such as graphics and/or music. Enterprise software addresses the needs of organization processes and data flow, often in a large distributed environment. Examples include Financial, Customer Relationship Management, and Supply Chain Management. Departmental Software is a sub-type of Enterprise Software, with a focus on smaller organizations or groups within a large organization. Examples include Travel Expense Management, and IT Helpdesk. Enterprise infrastructure software provides common capabilities needed to support Enterprise Software systems. Examples include Databases, Email servers, and Network and Security Management. Information worker software addresses the needs of individuals to create and manage information, often for individual projects within a department, in contrast to enterprise management. Examples include time management, resource management, documentation tools, analytical, and collaborative. Word processors, spreadsheets, email and blog clients, personal information system, and individual media editors may aid in multiple information worker tasks. Content access software is software that is used primarily to access content without editing, but may include software that allows for content editing. Such software addresses the needs of individuals and groups to consume digital entertainment and published digital content. Examples include Media Players, Web Browsers and Help browsers. Educational software is related to content access software, but has the content and/or features adapted for use in by educators. For example, it may track progress through material or include collaborative capabilities. Simulation software are for simulation of physical or abstract systems for either research, training or other purposes. Media development software addresses the needs of individuals who generate print and electronic media for others to consume, most often in a commercial or educational setting. This includes Graphic Art software, Desktop Publishing software, Multimedia Development software, HTML editors, Digital Animation editors, Digital Audio and Video composition, and many others. 3D computer graphics software refers to programs that are used to create 3D computer-generated test, imagery, symbols and/or the like. 3D modelers typically allow users to create and alter models via their 3D mesh. Users can generally add, subtract, stretch and/or otherwise change the mesh to their desire, and models can be viewed from a variety of angles, usually simultaneously, and rotated, with the view being capable of being zoomed in and out. Product engineering software is used in developing hardware and software products. This includes computer aided design (CAD), computer aided engineering (CAE), computer language editing and compiling tools, Integrated Development Environments, and Application Programmer Interfaces. Additional information about software applications is present in Paul E. Ceruzzi, *A History of Modern Computing* (MIT Press., 1998) and Kelly Martin Campbell, *Computer: A History of the Information Machine*, (Basic Books, 1996).

The phrase "source code" (commonly just "source" or "code") as is used herein means any collection of statements, declarations and/or instructions written in some human-readable computer programming language. Such programming languages are well known by those having ordinary skill in the art and include, but are not limited to, C#, C++, Java and other programming languages that are described herein (or otherwise). Source code is the mechanism that is typically most often used by programmers to specify the actions to be performed by a computer. The source code which constitutes a program is usually held in one or a plurality of text files (ending in .txt), or other files, for example, C# files (ending in .cs), sometimes stored in databases as stored procedures, and may also appear as code snippets printed in books and/or other media. A large collection of source code files may be organized into a directory tree, in which case it may also be known as a source tree. A computer program's source code is often the collection of files that is typically needed to convert from human-readable form to some kind of computer-executable form. The source code may be converted into an executable file by a compiler, or executed on the fly from the human readable form with the aid of an interpreter, or the like.

The term "spreadsheet" as is used herein means a paper, document, report and/or the like that serves a variety of purposes, most commonly that of holding and/or storing data and/or information. Commonly used in the business and scientific fields, a spreadsheet can be set up in a myriad of ways using rows, columns, headings and/or the like, and may include one or a plurality of price and/or "green" statements, indications and/or items of data and/or information, and is a type of a price schedule and/or "green" schedule. A spreadsheet typically provides structure and/or organization for data and/or information, and often makes calculations. Microsoft Excel is currently likely the most commonly used computer software for creating spreadsheets.

The term "statement" as is used herein means one or more generic or manufacturer/distributor/other specific words, symbols, numbers, letters, indications and/or the like, with or without punctuation (periods, commas, colons, semi colons, question marks, explanation points, and/or the like), such as the symbols @, #, $, %, ^, &, *, (,), _, +, =, {, }, [, ], ", ', <, > and/or the like, or any combination thereof, and is a type of information and data. For example, the statement may simply be the letter "G" (representing that a particular parametric symbol, and corresponding construction plan (or other) element, is "green"). As another example, the statement may be the two letters "NG" (representing that a particular parametric symbol, and corresponding plan construction element, is not "green"). Further, the absence of a statement for a particular parametric symbol, and corresponding plan construction element, may be used to represent that the particular parametric symbol, and corresponding plan construction element, is not "green." A wide variety of statements may be created and/or used, as may readily be determined by those having ordinary skill in the art.

The phrase "Static Product Cart Technology" as used herein means a "standard" (traditional) "off the shelf" type of shopping cart technology that can be purchased commercially, and that does not have any intelligence. It is typically used by a wide variety of known and unknown product manufacturers, such as Circuit City and Best Buy, for selling standard products. "Static Cart Product" technology does not use zip codes, a software design tool or a plug-in (add-on) computer software code, and does not have parametric symbols inserted into a construction plan. Further, it cannot create a price schedule from price quotes.

The phrases "storage medium" and "physical storage medium" as are used herein mean any technology, device, material or product that is used to place, keep and/or retrieve data and/or information, for example, a hard drive, thumb drive, tape drive, CD, DVD and/or the like. A medium is an element used in communicating a message. On a storage medium, typically the messages are in the form of data, and are suspended for use when needed.

The terms "subroutine" and "subprogram" as are used herein mean a portion of computer software code within a larger computer program, which generally performs a specific task, and is relatively independent of the remaining code. A subroutine generally behaves in much the same way as a computer program that is used as one step in a larger program or another subprogram. It is often coded so that it can be started ("called") several times and/or from several places during a single execution of the program, including from other subroutines, and then branch back (return) to the next instruction after the "call" once the subroutine's task is complete. Subroutines are a programming tool, and the syntax of many programming languages includes support for writing and using them. Judicious use of subroutines (for example, through the structured programming approach) often substantially reduces the cost of developing and maintaining a large program, while increasing its quality and reliability. Subroutines, often collected into libraries, are an important mechanism for sharing and trading software.

The term "substantially" as is used herein means almost or in an extensive, considerable, or ample way, and may be determined by those having ordinary skill in the art.

The term "suitable" as is used herein means satisfactory, operable or capable of producing a desired result.

The phrase "symbol palette" or "palette" as is used herein means a dialog box that has some or all of the options that a user can choose for a particular object or construction plan (or other) element. (See, for example, FIGS. 10-13.).

The phrases "system logger" and "logger" as are used herein mean a device or system that allows a separation of a computer software that generates messages from the system that stores them and/or the software that reports and/or analyzes them. It also generally provides devices, which would otherwise be unable to communicate, a means to notify administrators of problems or performance. A Syslog (system logger) can be used for computer system management and security auditing, as well as generalized informational, analysis and debugging messages. It is typically supported by a wide variety of devices, such as printers and routers, and receivers across multiple platforms, which devices are well known by those having ordinary skill in the art. Because of this, a syslog can be used to integrate log data from many different types of systems into a central repository.

The phrase "system software" as is used herein means software that is involved in integrating a computer's various capabilities, but typically does not directly apply them in the performance of tasks that benefit a user, such as an operating system.

The phrase "Take Off" as is used herein is a term that is often used in the engineering and construction industries, and refers to a list of one or a plurality of materials with one or a plurality of corresponding (or other) quantities and/or types that are required or desired to build, manufacture and/or otherwise produce one or more designed (or other) structures or items. This list is typically generated by an analysis of a blueprint and/or other design document, may include one or a plurality of price and/or "green" statements, indications and/or items of data and/or information, and is a type of a price schedule and/or "green" schedule.

The phrase "Tao Framework" as is used herein means a C# library giving .NET and Mono developers (and others) access to popular graphics and/or gaming libraries, like OpenGL and SDL. It was originally developed by the C# OpenGL programmer, and since its start many developers have contributed to the project. The latest version of Tao is version 2.1 released on May 1, 2008. Additional information about Tao Framework is present on its web site.

The phrase "text" as is used herein mean letters, numbers, symbols (plus signs, minus signs and/or the like), words, instructions, directions and/or the like.

The phrases "three-dimensional" and "3D" as are used herein mean having three or more dimensions. Three-dimensional objects generally have, or appear to have, extension in depth, and have height, width and depth.

The phrases "two-dimensional" and "2D" as are used herein mean having two dimensions. Two-dimensional objects generally do not have, or appear to have, extension in depth, and have height and width, but not depth.

The phrases "third party certification" and "certified by a third party" as are used herein in connection with "green" buildings, construction plan (and other) elements, objects, building materials, appliances and/or the like mean a certification of a specific product or process as being "green" that is performed by an organization independent from those who produce the product or process. Certification is often used to substantiate one or a plurality of environmental attributes of specific products (such as the percentage of recycled content) or processes (such as a sustainable harvesting operation for forests).

As is used herein, the phrase "UL Listed" means that Underwriters Laboratories Inc. (UL) (Northbrook, Ill.) has tested one or a plurality of representative samples of a product and determined that it meets UL's requirements, which are based primarily on UL's published and nationally-recognized Standards for Safety.

The term "update" as is used herein in connection with a database, physical storage medium and/or the like means changing, typically using more current data and/or information, one or more database records (deleting, adding and/or otherwise editing or changing such records), which may be performed periodically at any required or desired period of time including, but not limited, to hourly, daily, bi-weekly, weekly, bi-monthly, monthly, bi-annually, annually and/or the like, or upon demand (i.e., at any time and/or date).

The phrases "virtual private network" and "VPN" as are used herein mean a computer network that typically is layered on top of an underlying computer network. The generally private nature of a VPN means that the data travelling over the VPN is not generally visible to, or is encapsulated from, the underlying network traffic. Similarly, the traffic within the VPN generally appears to the underlying network as just another traffic stream to be passed. The term VPN can be used to describe many different network configurations and protocols, which are known by those having ordinary skill in the art.

The term "viewer" as is used herein means a program that generally displays the contents of an electronic (digital) file. Viewers may generally be stand-alone programs or components within a larger program. They are widely used to display images downloaded from online and other services and from the Internet. Viewers for sound and video files are also available. A viewer typically displays or plays one type of file, whereas a file viewer is a program that typically supports many different formats.

The phrases "video card" and "video adaptor" as are used herein mean a display adapter, such as a printed circuit or other board that plugs (or may otherwise be inserted) into a computer to generate images for a computer's screen (i.e., to give it display capabilities). Many different types of video adapters are available for computers, most of which conform to one of the video standards defined by IBM or VESA. Each adapter usually offers several different video modes, such as text and/or graphics. In text mode, a monitor can generally display only ASCII characters, whereas in a graphics mode, a monitor can generally display any bit-mapped image. Modern video adapters contain memory, so that the computer's RAM is not used for storing displays. In addition, most adapters have their own graphics coprocessor for performing graphics calculations.

The phrase "video signals" as is used herein in connection with text, images, symbols and/or the like mean the data and/or information definition of the text, images or symbols, or a combination thereof, including, for example, color, hue, saturation, and all other visual characteristics of the text, images, symbols, or a combination thereof, as well as the data that describes the physical characteristics of the text, images, symbols, or a combination thereof, such as size, shape, location and/or the like. This data is typically in a format that is understandable by computer monitor(s) and/or optical projector(s), so that the computer monitor(s) and/or optical projector(s) can display it.

The phrases "Visual Studio" and "VS" as are used herein refer to a suite of programming languages and development tools that are designed to help software developers create innovative, next-generation applications, and are commercially available from known sources, for example, from Microsoft Corporation. This language product includes, for example, Visual Basic, Visual C++, Visual C#, Visual FoxPro, Visual J++ and Visual InterDev. The Visual Studio development system is a comprehensive suite of tools. Its features may include: (i) leveraging of local storage and local resources, such as peripherals, for high-performance and occasionally-connected applications; (ii) through LINQ, performing query, set, and transform operations using familiar object-oriented languages, such as Visual C# and Visual Basic; (iii) creating client applications that utilize Web services or offline tools that are complementary to Web-based applications; (iv) providing, via a .NET Framework, a wide variety of pre-built services that aid a computer operator in working more efficiently; (v) enhancing efficiency by providing inline code guidance right in the editor (without paging back and forth to documentation); (vi) collaborating more effectively and efficiently with designers through integration between Visual Studio and Microsoft Expression; and (vi) using integrated debugging and static code analysis to improve quality early and often.

The abbreviation "VSTO" as is used herein refers to Visual Studio Tools for Office, which are commercially available from Microsoft Corporation.

The terms "volatile organic compounds" and "VOCs" as are used herein mean carbon-containing compounds that are released from burning fuel (gasoline, oil, wood, coal, natural gas and/or the like), solvents, paints, glues and other products, or otherwise, and that generally produce vapors readily. Volatile organic compounds are environmental pollutants and include, but are not limited to, gasoline, benzene (and other industrial chemicals), toluene, xylene (and other solvents), methylene chloride, methyl chloroform and tetrachloroethylene (perchloroethylene). In addition to causing ozone (smog) effects, many VOCs cause serious illnesses, such as cancer, and are harmful to plants.

The phrases "WAN" and "wide area network" as are used herein mean a computer network that typically covers a broad area, such as a network having communication links that cross metropolitan, regional, or national boundaries. This is typically in contrast with personal area networks (PANs), local area networks (LANs), campus area networks (CANs) and Metropolitan area networks (MANs), which are usually limited to a room, a building, a campus or a specific metropolitan area, such as a city, respectively.

The terms "web" and "World Wide Web" as are used herein mean a system of Internet servers that generally support specially formatted documents. The documents are generally formatted in a markup language (HTML or HyperText Markup Language) that supports links to other documents, as well as graphics, audio and/or video files. Generally, one may move from one document to another by clicking on hot spots. Not all Internet servers are part of the World Wide Web, and there are several applications (Web browsers) that make it easy to access the World Wide Web, two of which are Netscape Navigator and Microsoft Corporation's Internet Explorer.

The phrase "wireless USB adaptor" as is used herein means a network adapter (a network or communications controller) that typically plugs into a computer via a USB (or other) port.

Additional information regarding computers, software, applications and programming, and related definitions, are present in Deborah Russell et al., *Computer Science Basics* (O'Reilly, ISBN 0937175714).

General Description

The present invention is directed to an automated pricing and/or "green" indicating system in which a price schedule and/or a "green" schedule for a construction product, such as a window, is optionally, but typically, generated and inserted directly into a set of construction project (or other architectural, civil, industrial or other) plans. For example, in a preferred embodiment, the construction product can be a construction material, such as a window, an acrylic glass block, a door, a skylight and/or the like, and is inset into the construction plans. Of course, it is to be understood that any number of product types can be employed, and any other different symbols can be employed in a different embodiment other than construction materials, without departing from the present invention. The description that follows, with particular applicability to construction materials, should be regarded as exemplary and not limiting.

The present invention is preferably implemented using a plug-in (or add-on) computer software code component that has an ability to work within, or outside of, an architectural CAD (Computer Aided Design) software product, or other software design tool, and with an online 1stPricing, 1stWindows or similar database, or with an offline database. While most of the discussion that is set forth herein refers to the 1stPricing online web site or database, the 1stWindows online web site or database, or a similar web site or database, or a database that is not on-line, may also be employed. Each construction plan (or other) element selected by a user, such as a window, an acrylic glass block, a door and/or a skylight, is optionally, but preferably, inset into the building (or other) plans via one or more selected parametric symbols that are optionally, but preferably, present in the plug-in (add-on) computer software code. Alternatively or additionally, parametric symbols may be present in a software design tool (i.e., already existing), or may not be present at all, as is discussed hereinbelow. Each parametric symbol optionally, but preferably, adds a combined two-dimensional and/or three-dimensional representation of the associated (corresponding) construction product to the construction plans.

Very advantageously, a cost value (final price) can be calculated by an online 1stPricing or similar database, or offline database, or using some other database or web site, for one or a plurality of, or each, selected construction plan (or other) element (and/or parametric symbol), which may optionally advantageously include a price comparison for one or a plurality of, or each, selected construction product between different available manufacturers, distributors and/or other entities, individuals, systems and/or devices within a selected zip code, or nationally (i.e., not within any one or more particular zip codes, but within the country, state or other geographic region or area) in order that a user may optionally procure "the" best or most competitive price for one or a plurality of, or each, selected construction product, and a total (final) cost can then optionally but very advantageously automatically and virtually instantaneously be calculated by the same database (typically within from about 5 to about 15 seconds) for an entire set of construction elements (all of the selected parametric symbols). Other types of prices, such as an "average" price/cost or a "general" price/cok (or any other type of a price/cost) for a construction plan (or other) element or parametric symbol, or both, in a particular geographic region or area, or nationally, and/or the like, may additionally or alternatively be procured by a user. The systems and methods of the present invention work using any type and/or source of pricing (and/or "green") databases, regardless of the source of the databases, and regardless of the type of price and/or "green" information desired, required or procured. Advantageously, a price schedule that includes the foregoing costs can then optionally automatically, manually or otherwise, and virtually instantaneously be created (typically within about 1 to about 13 seconds) by the online 1stPricing database (or a different database), and then the price schedule advantageously can optionally, but preferably, be inset directly into the building (or other) plans by the plug-in (add-on) computer software code, so that the building plans themselves advantageously can optionally include one or a plurality of, or each, selected parametric symbol and/or construction plan (or other) element, as well as a final price schedule for all such parametric symbols and/or construction plan (or other) elements. The price schedule advantageously may contain a detailed list of the selected construction products with attached corresponding pricing to provide a total cost value therefore. The price schedule can also optionally be exported as a standalone object in the form of various common computer applications or formats including, but not limited to, Excel, Word, Plain Text, HTML, XML, PDF and the like. Pricing may optionally be determined via an Intranet, an Internet or other connection between the architectural, civil or industrial plan drawer's local and/or remote, host, client-side and/or other computer system and/or console and one or a plurality of database(s) maintained locally, for example, on a physical storage medium, or on a remote system, such as the online 1stPricing database. Product data and/or information (product characteristics and/or features) passes from the plan drawer's local or remote computer(s) or console(s) to the database(s), and pricing data and/or information (and, optionally, information as to whether or not selected construction plan elements are "green") then passes back to the plan drawer's local or remote computer(s) and/or consoles and optionally, but preferably, becomes embedded within the construction (or other) plans. The system may be implemented, for example, over an Intranet, the Internet, on a network, such as a LAN, a WAN, a MAN, a CAN, a SAN, a VPN and/or the like, using a physical storage medium (any device that is capable of recording and/or storing data and/or information), such as a CD, a DVD, a hard drive, a thumb drive, a tape drive and/or the like, and/or the like.

The systems and methods of the invention often include the actions of dragging one or more construction plan (or other) elements and/or parametric symbols from one location to another on a computer, console, other display screen, server and/or the like, dropping them into a desired position or location therein or thereon, as is required or desired, and may readily be performed by those having ordinary skill in the art, pinging one or a plurality of databases and transmitting, bringing or sending back pricing and/or "green" information therefrom to the computer, console, other display screen, server, and/or the like. Although various databases and web sites are discussed herein, any one or more databases that include pricing and/or "green" information and/or data, that can be employed to purchase one or a plurality of construction plan (or other) elements and/or parametric symbols, and/or that can otherwise function in the manner described herein, and/or the like, can be employed by a user, and may be accessed automatically, manually and/or otherwise. For example, once desired characteristics of a particular construction plan (or other) element and/or parametric symbol have been determined and/or selected, such as a window having a particular height, width, color, material, type of glass and/or the like, a user can perform a search on a search engine, such as Google, Yahoo and/or the like, to locate particular web sites of manufacturers, distributors and/or others that sell, market, distribute and/or otherwise provide such construction plan (or other) elements to the public or others, and manually purchase the same from them.

Also very advantageously, a statement and/or indication of whether or not a particular construction plan element (optionally, but preferably, corresponding to a specified parametric symbol) is "green" or not can optionally be automatically provided by the online 1stPricing or similar, or offline or other, database for one or a plurality of, or each, selected construction plan (or other) element (optionally, but preferably, corresponding with a parametric symbol). Advantageously, a "green" schedule that includes such statements and/or indications can then optionally, but preferably, automatically and virtually instantaneously be created (typically within about 1 to about 13 seconds) by the online 1stPricing (or other) database, and then the "green" schedule advantageously can optionally, but preferably, be inset directly into the building (or other) plans by the plug-in (add-on) computer software code, so that the building plans themselves may advantageously include one or a plurality of, but preferably each, selected parametric symbol and/or construction plan element, as well as a final "green" schedule for all such parametric symbols and/or construction plan elements. The "green" schedule advantageously may optionally contains a detailed list of the selected construction (or other) products with attached (or other) corresponding statements and/or indications as to whether or not the selected construction products are "green." The "green" schedule can also optionally be exported as a standalone object in the form of various common computer applications or formats including, but not limited to, Excel, Word, Plain Text, HTML, XML, PDF and/or the like. Whether or not a selected construction plan (or other) element is "green" may be determined via an Internet or other connection between the architectural, civil or industrial plan drawer's local and/or remote computer system and/or console and one or a plurality of database(s) maintained locally, for example, on a physical storage medium, or on a remote system, such as the online 1stPricing database. Product data and/or information (product characteristics and/or features) passes from the plan drawer's local or remote computer(s) or console(s) to the database(s), and data and/or information regarding whether or not one or a plurality of selected construction plan (or other) elements are "green" (and, optionally, pricing data) then passes back to the plan drawer's local or remote computer(s) and/or console(s) and optionally becomes embedded within the construction plans. The system may be implemented, for example, over the Internet, on a network, such as a LAN, a WAN, a MAN, a CAN, a SAN, a VPN and/or the like, using a physical storage medium, such as a CD, a DVD, a hard drive, a thumb drive, a tape drive and/or the like, and/or the like.

The basic steps of one practical implementation of the present invention are laid out herewith. Detailed explanations and step-by-step processes of various preferred embodiments within the present invention (including preferred elements, steps, limitations and the like) are set forth in detail in associated sections hereinbelow. These preferred embodiments of the present invention (and preferred elements, steps, limitations and/or the like) are capable of a wide variation, as is discussed herein or as may readily be determined by those having ordinary skill in the art. All such variations are included in the systems and methods of the present invention.

Energy Certifications and Ratings

For the reasons that are set forth below, it is very advantageous for "green" statements and a "green" schedule to be rapidly and efficiently provided or produced in connection with parametric symbols that may optionally be inserted into a construction (or other) plan, and their associated construction plan elements. "Green" construction (and other) plan elements, materials, appliances and buildings typically very desirably:

promote good indoor air quality (typically through reduced emissions of volatile organic compounds (VOCs), formaldehyde and/or other pollutants);
are durable, and have low or relatively decreased maintenance requirements;
incorporate recycled content (post-consumer and/or post-industrial);
have been salvaged from existing or demolished buildings for reuse;
are made using natural and/or renewable resources;
have low "embodied energy" (the energy required to produce and transport materials);
do not contain chlorofluorocarbons (CFCs), hydrochlorofluorocarbons (HCFCs) or other ozone depleting substances or pollutants;
do not contain highly toxic compounds or pollutants, and their production does not result in highly toxic by-products or pollutants;
are obtained from local resources and manufacturers or distributors;
for wood or bio-based products, employ "Sustainable Harvesting" practices;
can be easily reused (either whole or through disassembly);
can be readily recycled (preferably in a closed-loop recycling system); and/or
are biodegradable.

The characteristics of "green" products can vary depending on the material type. The "green" attributes of a concrete mix, for instance, might include the use of fly-ash (a post-industrial recycled content material), while the "green" attributes of an interior paint might focus on low volatile organic compound (VOC) content. Because of this high degree of variability, the evaluation of "green" products generally requires a working knowledge of:

relevant health and environmental impact issues associated with different material types;
U.S., state, local, regional and/or foreign government, industry, and third-party standards for "green" products, where they exist; and
available "green" products in the marketplace, including their specific "green" attributes, performance characteristics, appearance, and costs.

Computers

The systems and methods of the present invention typically include one or a plurality of local and/or remote computers and/or consoles (or devices that function similarly thereto), often operably connected with each other and/or with other devices that are described herein, which function in the manners that are dictated by system software installed therein, as is discussed herein. There is generally no limit to the number of computers and consoles that may be employed in these systems and methods.

Any type and/or brand of computer or console that has an ability to perform the functions that are described herein, from any source, and whether present in or out of a computer network, or used with or without the Internet or the World Wide Web, may be employed in the systems and methods of the invention. Examples of computers that may be employed include, but are not limited to, personal computers, business computers, desktop computers, laptop computers, notebook computers, personal digital assistants and other hand-held computers, pocket computers, general purpose computers, special purpose computers, and the like, such as those that are sold by Dell, Inc. (Round Rock, Tex.) at its web site or at 1-800-www-dell, Apple Computer, Inc. (Cupertino, Calif.) at its web site or 1-800-my-apple, Hewlett Packard Company (Palo Alto, Calif.) at its web site or 1-800-buy-myhp and/or similar companies.

The computers and/or consoles that are employed in the systems and methods of the invention preferably include one or a plurality of means for enabling a user to view graphics and/or video, on a computer and/or display screen, such as an internal or external graphics card, or similar device.

As is known by those having ordinary skill in the art, a computer network can be a public network, and typically includes a central processing unit (CPU) or processor that executes the individual demands of a computer program, that has an ability to add, subtract, multiply and/or divide a multitude of numbers, and is connected to a system memory, which typically contains an operating system, a hard drive (for storing data), RAM (a chip that holds data), one or more application programs, one or more input devices (permitting a user to interact with the computer), such as a mouse or a keyboard, one or more output devices (also permitting a user to interact with a computer), such as a printer, a display monitor, and a communications interface, such as an Ethernet card, to communicate to an electronic network, for example, via a Wide Area Network (WAN), as an inter-network, such as the Internet, or otherwise. Many other similar configurations are known by those having ordinary skill in the art, and it is contemplated that all of these configurations could be used in the systems and methods of the present invention. Furthermore, using the information that is provided herein, it is within the abilities of those having ordinary skill in the art to program and configure a computer system to implement one or more of the steps of the present invention, as are discussed herein. Moreover, the present invention contemplates providing computer readable data storage means with program code recorded thereon for implementing the method steps that are described herein.

A wide variety of computer accessories may be employed with the computers that may be used in the systems and methods of the invention. Such accessories include, but are not limited to, computer drives (hard drives, thumb drives, tape drives, DVD media drives, CD media drives and/or other drives), monitors, screens, mice, keyboards, batteries, printers, storage units, docking stations, USB (and other) ports and cords, memories, memory upgrade kits, modems, wireless (and other) adaptors, routers, cables, remote controls, surge protectors, power supplies, servers, mounts, stands, speakers, headsets, headphones, web cams, DVD and CD media and media cases, carrying cases, and/or the like. These and other computer accessories are commercially available from sources that are known by those having ordinary skill in the art, such as Dell, Inc. (Round Rock, Tex., Apple Computer, Inc. (Cupertino, Calif.), Hewlett Packard Company (Palo Alto, Calif;) and similar computer supply companies.

Computer systems can be configured to receive inputs from a user, such as a query as to whether an action has been performed, and output the status or lack of status of the action. Still other embodiments could be configured to output reminders, form schedules based on actions associated with the present invention, and the like, to assist in the practice of the invention and/or to manage the practice of the invention.

Embodiments within the scope of the present invention include program products on computer-readable media, and carriers for carrying or having computer-executable instructions or data structures stored thereon. Such computer-readable media can be any available media which can be accessed by a general purpose or special purpose computer, for example, RAM, ROM, EPROM, EEPROM, CD-ROM or other optical disk storage, magnetic disk storage or other magnetic storage devices, or any other medium which can be used to carry and/or store desired program code in the form of computer-executable instructions or data structures, and which can be accessed by a general purpose, special purpose or other computer. When information is transferred or provided over a network or another communications connection (generally hardwired, wireless, or a combination of hardwired or wireless) to a computer, the computer generally properly views the connection as a computer-readable medium. Thus, any such connection is properly termed a computer-readable medium. Computer-executable instructions comprise, for example, instructions and data which cause a general purpose computer, special purpose computer, or special purpose processing device to perform a certain function or group of functions.

The present invention is described in the general context of method steps which may be implemented in one embodiment by a program product including computer-executable instructions, such as program modules, executed by computers in networked environments. Generally, program modules include routines, programs, objects, components, data structures, and the like, that perform particular tasks or implement particular abstract data types. Computer-executable instructions, associated data structures, and program modules represent examples of program code for executing steps of the methods disclosed herein. The particular sequence of such executable instructions or associated data structures represent examples of corresponding acts for implementing the functions described in such steps.

The present invention is suitable for being operated in a networked environment using logical connections to one or more remote computers having processors. Logical connections may include a local area network (LAN), a wide area network (WAN) and the like. Other computer networks that may be employed, for example, are discussed herein. Such networking environments are commonplace in office-wide or enterprise-wide computer networks, intranets and the Internet. Such network computing environments typically encompass many types of computer system configurations, including personal computers, hand-held devices, multi-processor systems, microprocessor-based or programmable consumer electronics, network PCs, minicomputers, mainframe computers and/or the like. The present invention may also be practiced in distributed computing environments where tasks are performed by local and remote processing devices that are linked (by hardwired links, wireless links, by a combination of hardwired or wireless links and/or otherwise) through a communications network. In a distributed computing environment, program modules may be located in both local and remote memory storage devices.

The order of the steps that are described herein may generally be varied, and two or more steps may generally be performed separately, concurrently and/or with partial concurrence. Such variation will depend upon the software and/or hardware systems chosen and on designer choice. All such variations are within the scope of the present invention. Also, software and web implementations of the present invention could be accomplished with standard programming techniques with rule based logic and other logic to accomplish the various steps thereof.

The computers that are employed in the systems and methods of the invention are optionally, but preferably, connected with a means for controlling the movement of a cursor or pointer on a display screen, such as a mechanical, optomechanical or optical mouse and its connecting wire, which may be connected to the computer in a variety of manners, such as via a an RS-232C serial port or a PS/2 port., or may be cordless, and rely on infrared or radio waves to communicate with the computer. They optionally, but preferably, are also connected with a means for displaying data, information and/or graphics, such as a display screen or monitor, and a means for entering or inputting data into the computers, such as an internal or external keyboard, and include one or more means for connecting them with one or more monitors, such as a video port, graphics port, VGA port or other socket on the back (or other portion) of a computer that is used to connect a monitor. The computer is also preferably connected with one or a plurality of internal or external means for permitting data to be exchanged between the computer's components and one or more peripherals, such as cables or cords, for example, power cables (for electrically or otherwise powering the computer), VGA or DVI video cables (for transferring video signals between devices, such as a monitor and a computer), IDE and SATA cables (for transferring data between a computer's internal components and the motherboard), USB and Firewall cables (for permitting peripherals to connect to a computer and transfer data, generally at high speeds), Ethernet cables (for joining two network devices, and permitting data to be transferred, generally at high speeds between the devices in the form of a series of electrical pulses), and the like.

The one or plurality of computers or consoles may be operably connected with one or a plurality of other computers, consoles and/or devices that are being, or may be, employed in the systems and methods of the invention with, for example, video cables.

Additional information regarding computers, consoles and computing is present in the following books, each of which is hereby incorporated herein in its entirety by reference: (i) Douglas E. Comer, *Computer Networks and Internets with Internet Applications* (5th Edition, Prentice Hall, 2008); (ii) M. Morris Mano and Charles Kime, *Logic and Design Computer Fundamentals* (4th Edition, Prentice Hall, 2003); (iii) Randal E. Bryant and David R. O'Hallaron, *Computer Systems: A Programmer's Perspective* (Prentice Hall, 2002); (iv) William Stallings, *Data and Computer Communications* (8th Edition, Prentice Hall, 2008); (v) Harold Abelson, Gerald Jay Sussman and Julie Sussman, *Structure and Interpretation of Computer Programs*, (2nd Edition, McGraw-Hill, 1996); (vi) J. Stanley Warford, *Computer Systems* (4th Edition, Jones & Bartlett Pub, 2009); and (vii) John Lewis et al., *Java Software Solutions*, (2nd Edition, Pearson Education, Inc., 2007, ISBN 0-13-222251-5).

Display Screens

The systems and methods of the invention generally include one or a plurality of means for displaying data, information and/or graphics, such as a computer's user interface and open programs, allowing the user to interact with the computer, and the data, information and/or graphics appearing thereon, for example, display screens that are internal and/or external to the computer(s) being employed. Any type and/or brand of such means that has an ability to perform the functions that are described herein, from any source, may be employed in the systems and methods of the invention.

Cables

The systems and methods of the invention preferably include one or a plurality of means for transferring information, data, graphics and/or the like between computers, consoles, optical projectors, monitors, keyboards, mouse(s), printers, drives, adaptors and/or other peripherals, such as cables, cords or the like, for supplying electrical (or other) power to the foregoing devices, and/or for performing similar or other functions, which means are commercially available from sources that are known by those having ordinary skill in the art. Using the detailed information that is provided herein, those having ordinary skill in the art may readily determine which type, and the number and suitable length, of such means that should be used for a particular project, and would know how to connect such means between the foregoing and/or other devices. Power cables (typically one per computer, console or monitor) are usually supplied with computers, consoles and/or monitors (Dell Inc.), and video cables (typically one per monitor) are usually supplied with monitors (Dell Inc.).

Computer Mountings

The systems and methods of the invention optionally may include one or a plurality of movable or non-movable mountings, stands, tables and/or the like for the computers (or similar devices) and/or peripherals (keyboard, mouse, monitors and/or the like), which function to provide support therefore, and a place for them to rest at a position, height and/or location that renders them convenient for a user to use.

Computer Software

The computers and consoles that may be included or employed in the systems and methods of the invention include one or a plurality of computer software programs, which function in the manner that is described herein, and which may be procured from sources that are known by those having ordinary skill in the art, such as 1st Windows and/or 1st Pricing for the plug-in computer software, and/or written by computer programmers having ordinary skill in the art using the information and illustrations that are described, and provided, herein in great detail.

When writing a computer program, a programmer typically tries to solve a particular problem by, for example, understanding the problem, breaking the problem into manageable units, designing a solution, considering alternatives to the solution, refining the solution, implementing the solution (by writing a program in the form of code), and testing the solution, fixing any problems. When developing software, separate pieces are generally designed that are responsible for different parts of the solution, and then are subsequently put together. A program is written in a particular programming language, such as Java (an object-oriented programming language in which objects are the basic pieces that make up a program), Ada, C++, C#, Pascal or Smithtalk, which typically employ specific, words and symbols to express the problem solution. Different programming languages define different sets of rules that determine exactly how a programmer can combine the words and symbols of the language into programming statements (instructions that are carried out when a program is executed).

Four general categories of programming languages currently exist, and include machine language, assembly language, high-level languages and fourth-generation languages. In order for a particular program to run on a computer, the program must generally be in the computer's machine language. Each type of a CPU typically has its own machine language. Because machine language code is expressed as a series of binary digits, such code is difficult for human beings to read and write. While assembly language, which employs relatively short words that represent commands or data, is significantly easier for programmers to use, a program in this language generally cannot be executed directly on a computer. It generally first needs to be translated into machine language. Most programmers employ high-level language, such as Java, Ada, C++, C# and Smithtalk, to write software, which employs phrases, and is relatively easy for programmers to read and write, but must also generally be translated into machine language before it can be executed, for example, using a commercially-available compiler and/or interpreter. A wide variety of commercially-available Software Development Kits (SDKs) are often used by programmers to develop software, such as the Java Software Development Kit, which includes a compiler, an interpreter, and several other software tools that may be useful for a programmer, and may be downloaded at no cost from the Sun Microsoft web site. In addition, Integrated Development Environments (IDEs), programs that combine an editor, compiler and other Java support tools, may be used by programmers to support a development of Java programs. One of these programs, known as NetBeans, incorporates the development tools provided by Java Software Development Kits, into one convenient GUI-based program, and may be downloaded at no cost from the NetBeans web site. A similar Integrated Development Environment (IDEs) that is called Eclipse, and is promoted by IBM, may be downloaded at no cost from its web site.

A wide variety of computer software programs and operating systems that may be employed in the systems and methods of the invention are commercially available from sources that are know by those having ordinary skill in the art, such as Microsoft Corporation (Redmond, Wash.), Dell, Inc. (Round Rock, Tex.), Apple Computer, Inc. (Cupertino, Calif.), Hewlett Packard Company (Palo Alto, Calif.), 1st Windows, 1st Pricing, and similar computer software supply (or other) companies, and/or may be written by computer programmers having ordinary skill in the art. The present in invention is not limited to any particular type, number or version of computer software programs or operating systems, or to any particular manufacturer or distributor of computer software or operating system. As is well known by those having ordinary skill in the art, more than one computer software program, or version thereof, and often a wide variety of computer software programs, and versions thereof, or combined software programs, may be used to perform the same function on, or in connection with, a computer. Also, computer software programs that may retain the same function are often routinely or continuously updated or enhanced, sometimes with the use of "plug-in" or "add-in" computer code and/or with other enhancements, additions, deletions and/or substitutions to existing code. Thus, any type and number of computer software programs and/or operating systems may be employed in the systems and methods of the present invention, as long as they have an ability to perform the functions that are described herein, and such computer software and operating system may be procured from any known (or other) computer software manufacturer or distributor or store or generated by a computer programmer having ordinary skill in the art. Further, additional computer programs may be employed in the systems and methods of the invention, as long as they are compatible with computer programs that are required for the invention to properly operate, which may readily be determined by those having ordinary skill in the art.

There are several general categories of computer software that may be employed in the systems and methods of the invention. Programming software generally come in forms of tools that assist a programmer in writing computer programs (sets of logical instructions that make a computer system perform certain tasks). The tools that help the programmers in instructing a computer system include text editors, compilers and interpreters. System software helps in running the computer hardware and the computer system, and is a collection of operating systems; devise drivers, servers, windowing systems and/or utilities. System software helps an application programmer in abstracting away from hardware, memory and other internal complexities of a computer. Application software enables the end users to accomplish certain specific tasks. Business software, databases and educational software are some forms of application software. Different word processors, which are dedicated for specialized tasks to be performed by the user, are other examples of application software. Utility software helps in the management of computer hardware and application software, and performs a relatively small range of tasks, such as disk defragmenters, systems utilities and virus scanners. Data backup and recovery software provides functionalities beyond simple copying of data files. This software often supports user needs of specifying what is to be backed up and when. Backup and recovery software generally preserve the original organization of files, and allow an easy retrieval of the backed up data. Installation software functions to prepare an application (software package) to run in a computer. Typically combined with the application it is installing, the install program creates a folder with a default name on the hard disk and copies the application files to that folder. The complete installation package is generally either an Internet download or on a CD-ROM, DVD-ROM or a diskette. Application files are generally compressed in the package, and the install program decompresses them into their original format and respective folders. With Windows applications, the install program often adds or updates extensions to Windows that reside in the Windows folder. It is also customary for the install program to deposit an uninstall option so the application can be easily removed later on. Install programs may also be used to attach a new peripheral device to a computer. The install program may add the device's driver to the operating system, or it may be used to set or reset parameters in an updatable memory (flash memory, EEPROM, etc.) on the expansion board that has been plugged in. Security software provides some measure of security from attack to a an individual computer, or a computer that forms part of a network, and the data present therein. Document display software functions to display text documents on a display screen, so that they can be read and/or modified. Networking software, such as Microsoft Outlook and Internet Explorer, function to permit communication over a network via email, Internet and/or the like, and/or allow a user to perform network maintenance, troubleshooting and/or setup. Computer configuration software functions to configure a computer for usage, for example, setting up graphics cards, performing maintenance, such as cleanup and/or error detection on hard drives, and/or to install, configure and/or uninstall other hardware components on the computer. Database software development software functions to create, maintain and/or query databases that can be used as standalone databases and/or have them incorporated into one or more other software programs. Software development software functions to permit a user to write one or more software programs that will run (execute) on one or a plurality of different software programs.

In order for the systems and methods of the invention to work, in addition to the computer hardware and peripheral devices discussed herein, there must be a specialized add-on (plug-in) computer software code (program) written specifically for this purpose (or otherwise procured), which may run either internally within the software design program or externally (outside of the software design tool), operating in the latter as a dynamic link library, executable (.exe), ActiveX, COM object, or combination thereof, and/or the like. This code typically is to be compiled from the source code into an executable code to be run on one or a plurality of local or remote computers using the computer operating system for which it is compiled.

The systems and methods of the invention use data and/or properties that are optionally, but preferably, attached to one or more parametric symbols via the add-on (plug-in) computer code, permitting such parametric symbols, which may be present in the add-on computer code, in the software design tool, or otherwise, to be recognized when sent or otherwise transmitted by a user from one or more local or remote computers to one or more local or remote (or other) databases. Extremely advantageously, such add-on computer code, databases, systems and methods may generally be employed by a user in a wide variety of different manners in a wide variety of different scenarios, including, but not limited to, the following, and any combination thereof:

| Scenario | Software Design Tool Manufacturer or Distributor | Software Design Tool | Database |
|---|---|---|---|
| A | Multiple | Multiple | Multiple |
| B | One | Multiple | Multiple |
| C | One | One | Multiple |
| D | One | One | Multiple |

-continued

| Scenario | Software Design Tool Manufacturer or Distributor | Software Design Tool | Database |
|---|---|---|---|
| E | One | One | One |
| F | One | Multiple | One |
| G | Multiple | Multiple | One |
| H | Multiple | One | One |
| I | Multiple | One | Multiple |

In scenario A above, for example, one add-on computer code can be used in connection multiple different CAD (or other software design tool) manufacturers, distributors and/or other individuals or entities, and with a wide variety of different CAD (or other software design tool) products manufactured, distributed and/or otherwise provided by different companies, including, but not limited to, Autodesk Revit, Autodesk Architecture, ArchiCAD, Autodesk Inventor, Autodesk Civil, Vectorworks, TurboCAD, Chief Architect, SoftDesk, SoftCAD, Softplan, Microstation, SketchUp, and/or the like, via the communication module that is described and illustrated herein with a plurality of different databases. In scenario E, for example, one specific add-on computer code may be written for and/or employed with only one type of CAD (or other software design tool) product from only one CAD (or other software design tool) manufacturer or distributor and/or only work with one specific database. For example, in the case of a window, the window code identifier assigned to the window may be, for example "XO" (or any other symbol chosen by a user), and the particular properties and/or features that make up such "XO" window, such as width and height, are sent by the user to one database, for example, as P1 width=X and P2 Height=X (or using any other symbols chosen by the user). The system then looks for a match in the database of "XO" with the properties of P1 and P2. When the system locates a similar or exact match, the system will send back from the database to the user's desk top, lap top or other computer information and/or data including, but not limited to, that regarding pricing, "green," LEED, VOC, owners manual, warranty information, and/or the like. The system is typically set up to transmit back to the user's computer any such information and/or alphanumeric text, which may or may not be present in a file (pdf file, text file, word document, text file, xml, logos and/or the like). Further, and very advantageously, there is no limit to the number of properties, features and/or attributes that a particular parametric symbol and/or construction plan element may have, such as one or a plurality. The system can work with items that have at least one identifying code and no properties, one property, multiple properties and/or the like.

When a communication module is installed as part of the plug-in computer software code, or as a companion component working together with the plug-in code, the software development time and programming code required to make the CAD (or other software design tool) software functional is typically reduced. Each software design tool vendor, and vendor version, can require different computer programming languages (C++, C#.net, VB.net, VBA, Assembler or the like), and different activation methods (merge modules, activeX, COM or the like) to allow communication with the database(s), either locally installed on the computer or remotely installed or occurring across the Intranet and/or Internet. As the database(s) of objects grows, changes and/or is updated or otherwise modified, the existing software design tool programs typically become non-operational, produce errors, and can stop functioning because the protocol to communicate with the database(s) must generally change. Very advantageously, the communication module described herein solves these problems by providing a simple interface, and concise method for the software design program to send data and/or information to the database(s), and/or to receive data and/or information from the database(s), all without having to be reprogrammed or updated. Very advantageously, the communication module translates the object attribute data into a protocol that the database(s), whether locally installed or remotely installed, can understand. As the protocol between the database(s) changes, the communication module can be updated and not cause any problems (errors, stop functioning, become non-operational and/or the like), with the existing CAD (or other software design tool) objects, and software programming.

One example of the above is a scenario in which a CAD vendor A supports a library of windows including window code type "XOX," while a CAD vendor B on version 12 supports a partial library of windows, wherein some of the windows are not supported, and window code type "XOX" is excluded. The communication module described herein supports sending all of the library of the windows, including window type "XOX. If, in the future, CAD vendor B on version 13 supports the window code type "XOX," the communication module will not have to be upgraded because the window code type "XOX" is already supported in the communication module. This very advantageously allows one common database to be used for all of the different software design tool vendors, programs and versions, and such vendors can decide to support, or not support, all of the database objects in their current version, while still allowing the vendor to change existing or future versions without having to change/upgrade the communication module. Changing or upgrading the communication module is accomplished by using an installer program to remove the existing communications module version and installing a newer version or by incorporating the communication module in the installer that installs the software design tool program/system on a user's computer.

The communication module preferably sits (or is otherwise positioned) between the software design tool program/system and the database(s). The communication module typically receives object attribute data from the software design tool program/system, receives requests to clear the communications module list of object data, and receives requests to procure pricing and/or predetermined environmental, energy and/or green data from the database. When the communication module receives a request to procure data and/or information, such as pricing and/or predetermined environmental, energy and/or green data, from the database(s), the communication module typically converts the data and/or information into a communication protocol that the local or remote database(s) can process, and sends the data and/or information to the database(s). The database(s) typically processes the request from the communication module, and returns the data and/or information back to the communication module in a data return communication protocol, which generally includes the original data and/or information and the additional requested data and/or information (pricing, predetermined environmental, energy and/or green data). The communication module generally processes all the data and/or information received from the database(s), translates the data and/or information into a form that the software design tool program/system can understand, stores the data and/or information at a location where the software design tool program/ system can access the data, and notifies the software design program/system that the data and/or information has been received from the database(s). The software design tool program/system then generally retrieves the data and/or information (pricing, predetermined environmental, energy and/or green data) from the communications module and stores and/or displays the data and/or information inside the software design program/system, typically by either attaching the data and/or information to the software design tool objects, creating and/or displaying an object schedule showing the pricing, predetermined environmental, energy and/or green data and/or information, thus completing the cycle.

Very advantageously, the communication module allows multiple software design tool vendors/products/programs/versions to be supported while maintaining a single programming code with one or a plurality of master databases, which is far superior in terms of ease, efficiency, flexibility and time to the traditional, very time-consuming and inefficient method of creating one special unique program code for each vendor, product, program and/or version.

Additional future database objects can be supported within the communications module and, thus, the software design tool program/systems, as the communication module preferably includes an internal "database update" feature, which allows the local and/or remote database(s) to send new and/or updated data and/or information to the communication module and/or update it without having to uninstall the existing communication module and install a newer, more current, communication module.

When a communication module is employed, it is preferably employed, installed and/or activated in a manner described herein to "translate" the different ways that one or more software design tool programs are set up to export data, which may readily be determined using methods known by those having ordinary skill in the art, and may be achieved using a computer software download from the Internet or from a physical storage medium, such as a CD, DVD, hard drive, thumb drive, tape drive and/or the like to bring the add-on computer software to the software design tool. As an example, the communication module may send the attributes/properties and translates them from the various CAD (or other software design tool) languages to one or a plurality of server protocols of height, for example, as P1 (or using any other desired symbol). In this instance, the communication module takes in this attribute as P1 from the CAD software program, and subsequently changes (translates) height as P1 to height as P2 (or to some other desired symbol) prior to sending it to the database. Then, it sends it to the database. When this is done, a "translation" occurs. For instance, every software design manufacturer or distributor can speak different languages, as is discussed above, or have data and/or information stored in different ways, so that the computer software design tool may speak, for example, x, y or z, and the server may speak, for example, E. The communication module will take in X, and transmit the request into the server as E. When it receives the request back, it sends X back to the software design tool program. This is extremely advantageous because only one data set is required to talk to all CAD (or other software design tool) platforms, and the plug-in computer code may not need to change for every CAD platform because the communication module can make the necessary changes or be programmed to make the changes, as is explained above. The communication'module will subsequently receive height as P2 back from the database along with data and/or information, and then change (translate) height as P2 to height as P1 prior to sending the height back to the CAD software to perform the routine, such as inserting a price and/or "green" schedule into a plan drawing on a local computer. The advantage of the communication module, which is very significant, is that, due to the foregoing "translation" that occurs, there is no need to have a separate database for each CAD software company, even though most CAD (and other software design tool) platforms speak and send data in different ways from one another, as is discussed above. Also, very advantageously, if the method of sending or otherwise transmitting data and/or information between the server/database and the communication module changes as described above, the CAD software program/object/parametric symbol is typically unaffected, or may be changed by the user, if needed or desired as described above.

The pricing and/or "green" information database(s) that are described herein may, very advantageously, be present on one or a plurality of local and/or remote servers via an Intranet, the Internet, on one or a plurality of physical storage mediums, such as CDs, DVDs, hard drives, tape drives, thumb drives and/or the like, on a network, such as a LAN, a WAN, a MAN, a CAN, a SAN, a VPN and/or the like, and/or the like, and updates to the data and/or information present thereon may come from any or all of the foregoing, periodically or upon demand of a user (i.e., at any date and/or time). The foregoing may have associate systems, devices and/or apparatuses for retrieving and/or using such information, such as CD players, DVD players and/or the like, which are well known by those having ordinary skill in the art.

Very advantageously, the systems and methods of the invention can be used with any object in CAD (or other software design tool), and with any CAD company and/or product, as is discussed above, either with or without a communication module. Further, different add-on computer codes with similar methodologies work successfully with different CAD (or other software design tool) software programs. If, for example, plug-in computer codes are changed for different CAD companies due to their programming (as is discussed above), and as a result of what is needed to make them perform the system and/or method of the invention, and they are attaching attributes/properties and one or a plurality of identifiers for the purpose of sending to a database to retrieve information, then the system and method is essentially the same.

Further, and very advantageously, the add-on computer code can either run inside of a CAD (or other software design) program and/or environment or outside of a CAD (or other software design) program and/or environment. In one environment, when the add-on computer code is installed (as is discussed herein), it acts as if it is part of the software design program, and a merge module can put or insert the computer add-on code into the software design program. The merge module code operates as if it was compiled using the operating specific language.

Alternatively, the add-on computer code can run outside of the software design program operating as a dynamic link library (DLL), executable (.exe), ActiveX, COM object, or combination thereof, or the like, permitting a user to feel as though it is working inside of a computer software design program, even though it is working outside of a computer software design program or platform.

Additional information about computer software programs and computer programming is present in John Lewis et al., *Java Software Solutions* (2nd Edition, Pearson Education, Inc., 2007, ISBN 0-13-222251-5); Donald E. Knuth, *The Art of Computer Programming, Volumes* 1-4 (Addison-Wesley. ISBN 0-201-48541-9); O.-J. Dahl et al., *Structured Programming* (Academic Press, ISBN 0-12-200550-3); Wilkes, M. V. et al., *Preparation of Programs for an Electronic Digital*

*Computer* (Addison-Wesley); and Alexander Stepanov et al., *Elements of Programming* (Pearson Education, Inc., ISBN 13-978-0-321-63537-2).

Using the detailed teachings, resources and other information that are provided herein, those of ordinary skill in the art may readily purchase and/or write various computer software programs that function in the manners that are described herein, and may properly install them in a computer to produce the systems of the present invention, and to carry out the methods of the present invention.

Installation of Architectural CAD Software on Local Computer

An initial step of the methods and systems of the present invention is to install architectural CAD (Computer Aided Design) software (or another architectural, civil, industrial or other software design tool) on an architectural, civil, industrial or other plan drawer's local, remote or other computer and/or console system. The plug-in (add-on) computer software code of the present invention, in the form of installation files, is also optionally, but preferably, installed on the same local or remote computer system during the basic installation of the architectural CAD (or other software design tool) software. Alternatively, the plug-in (add-on) computer software code of the present invention may be installed after an installation of the architectural CAD software, and could be acquired either from a physical storage medium containing the add-on code (e.g., a compact disc, a DVD, a thumb drive, a tape drive and/or the like), or by its download from a remote server system, such as from the 1stPricing web site or another designated web site. (See the section set forth hereinbelow regarding "Installation.")

After the software installation, the architectural CAD software program (or another architectural, civil, industrial or other software design tool) is then started in a manner known by those of skill in the art. An existing architectural CAD drawing, for example, for a room in a house or in a commercial building, is then opened, or a new set of architectural, civil or industrial design plans is created using an architectural CAD "Wall" (or similar) tool in a manner known by those having ordinary skill in the art. (See the section set forth hereinbelow regarding "Interacting with the Wall Tool.") The Symbol Palette of the desired object (dragged and dropped from the symbol library—See FIG. 3), if one is present or employed, may then be activated in a manner known by those having ordinary skill in the art. (See the section set forth hereinbelow regarding "Activation.")

In an embodiment of the invention in which one or a plurality of local and/or remote databases containing pricing information and/or one or a plurality of local and/or remote databases containing information regarding whether or not one or a plurality of construction plan (or other) elements are "green" is maintained on a remote server system, such as an Internet web site, for example, the online 1stPricing web site, a connection is preferably activated by the CAD or other software design tool user, who has the plug-in (add-on) computer software installed within or outside of his architectural (or other) CAD program, e.g. an Internet connection. For a first-time user (generally an architect, builder or civil or industrial engineer) accessing the remote server system database(s), a ZIP code may, optionally, be entered to obtain pricing information for construction (or other) products in connection with the construction (or other) project, which may be obtained in connection with one, two, three, four, five or more different manufacturers, distributors and/or other individuals, businesses, organizations and/or entities within the zip code, or outside of the zip code (nationally), to procure "the" best price for one or a plurality of, or each, construction product within such zip code or nationally (if a price of a product should not, or will not, vary much or at all between or among different zip codes), respectively. In certain situations, but not others, which may readily be determined by those having ordinary skill in the art, the price of one or more selected construction (or other) products (windows, doors, acrylic glass blocks, sky lights and/or the like) may or may not vary widely, or at all, with the geographical location, region or area of the construction (or other) project. Alternatively, such a price schedule (and/or a "green" schedule) can be generated without the use of a ZIP code.

In some cases, pricing is national, rather than regional or local, and such pricing will not vary much or at all among, or between, different areas or regions of the country or other geographic areas (i.e., the pricing will be the same, or very similar, for all regions). When pricing is national, it is generally not necessary or desirable to use a zip code when generating a price for a construction plan (or other) element or price schedule. (It is not always necessary or desirable to use a zip code when generating a "green" schedule. In some cases, which may readily be determined by those having ordinary skill in the art, a zip code may be needed to determine whether or not an item, product, material and/or the like is "green" as a result of a geographical and/or manufacturing location of the same and/or construction project location or if the materials that make up the same are native to the construction project location. The product may be "green" and also have, for instance, a LEED rating due to its location in relation to the construction project location. In some cases, whether or not an item is "green" does not always depend upon a region.) Velux skylights, for example, are typically the same price no matter where they are transported to, or from, because their manufacturer is a national company, and does not vary its prices according to different regions or areas of, or zip codes within, the country. Further, the energy efficiency characteristics generally are the same for Velux skylights no matter where they are purchased in the United States (or elsewhere). Additionally, many of the moldings and decking lumbers that are employed by builders currently are made of 100 percent recycled material, and their "green" rating does not change depending upon their zip code of manufacture. Using the detailed information and illustrations that are provided herein, those having ordinary skill in the art may readily determine whether or not a zip code is desirable or required in a particular situation and/or region in connection with a procurement of pricing and/or "green" type of information.

Parametric symbols corresponding to construction plan (or other) elements are optionally, but preferably, employed in the systems and methods of the present invention, and may be provided by the software design tool and/or by the plug-in computer software code. If one or more parametric symbols are employed, a parametric symbol (window, door, acrylic glass block, sky light and/or the like) is clicked by a user, and a symbol palette dialog box typically opens up with the various options/attributes for the user to select. Data for the product options are entered by the user via drop down boxes, check boxes or radio buttons, or via direct data entry, and then clicking "OK." By clicking "OK," the user selects the options/attributes for the parametric symbol and preferably inserts the resulting object into the construction plan. (A parametric symbol becomes an object once the user attaches attributes to it and inserts it into the construction plan.) Entry is then made of specific parameters that make up the parametric symbol, such as color, type of material, size, presence or absence of grids and the like. The parametric symbol is then optionally, but preferably, inserted into the construction or design plans, for example, into a wall of a kitchen of a house. From there, the parameters of the parametric symbols can be modified, as is necessary or desired. (See the section set forth hereinbelow regarding "Symbol Properties.") The latter two steps can be repeated to establish the desired placement of the construction plan elements for the construction project into the construction plan drawings. Afterwards, a price schedule and/or a "green" schedule may optionally be created. (See the section set forth hereinbelow regarding "Scheduler Creation Controls.")

Each of the parametric symbols employed by a user can be revised, added, deleted, modified and/or edited in any manner that is desired, or as the construction (or other) project requires. A resulting price schedule and/or "green" schedule can then be updated one or more times by the user, as is necessary or desired, and then may optionally be transmitted (exported) over an Intranet or Internet connection, a LAN (local area network) or other network, an external storage device or the like into one or a plurality of databases. Revised pricing and/or "green" data, statements, indications and/or information can then be transmitted or sent back to the architectural CAD (or other) drawing, which reflects new changes that have been made, and optionally, but preferably, provides a price schedule and/or "green" schedule "Reference Number." This price schedule and/or "green" schedule "Reference Number" can be entered into one or a plurality of databases by the user to retrieve pricing information and/or information regarding whether or not selected construction plan (or other) elements and/or parametric symbols (corresponding to selected construction plan (or other) elements) are "green," upon which the building products (doors, windows, and/or the like) listed in the price schedule and/or "green" schedule can advantageously then be immediately purchased, or purchased on a subsequent date and/or at a subsequent time. (See the section set forth hereinbelow regarding "Online Operations.") Each time an object, parametric symbol and/or construction plan (or other) element is changed after the initial drawing has been priced and/or analyzed for "green" information, the plug-in (add-on) computer software optionally, but preferably, reminds the plan drawer that plan pricing and/or "green" information should be updated. Also, the plug-in (add-on) computer software optionally, but preferably, pings the pricing database(s) and/or "green" database(s) periodically to see if any pricing and/or "green" information has changed, or if there is a new version of the plug in (add-on) computer software, and then asks the plan drawer to make appropriate updates.

The methods and systems of the present invention are improvement to the methods and systems that are described in U.S. patent application Ser. No. 12/004,187 in that they have the added novel feature of being capable of automatically determining whether or not the parametric symbols (and corresponding construction plan elements) or construction plan elements are "green," which is extremely advantageous to architects, civil and industrial engineers and other plan drawers. Such determination may be made with or without corresponding pricing information, depending upon the needs or desires of the plan drawer. There has been a long-felt and unmet need for this feature in the architectural, and civil and industrial engineering, industries, which very advantageously saves plan drawers a significant amount of time and labor. Withotit this feature, the plan drawers have to manually look up information with respect to each separate construction plan element regarding whether or not such construction plan element is "green," which is very labor intensive and time consuming. Currently, there is no other existing rapid or automated method for procuring this "green" information. These improvements have been achieved with an enhancement of the plug-in (add-on) computer software code and databases that are described in U.S. patent application Ser. No. 12/004,187, which now additionally include information regarding whether or not the parametric symbols (and corresponding construction plan elements) or construction plan (or other) elements are "green." It is to be noted that the inventors are not themselves rating parametric symbols (and corresponding construction plan elements) or construction plan elements as being "green" or not, but rather are including in their database on the 1 stPricing or other web site (or other databases) information in connection with "green" certifications that have been made by third parties, for example, the U.S. government ("Energy Star" labels), LEED, building product or material manufacturers and/or other third parties and/or entities.

Installation of Plug-In Computer Software on Local or Other Computer System and/or Console—FIG. 1

Installation of the plug-in (add-on) computer software code component described herein (permitting accessing of pricing and/or "green" data and/or information for one or a plurality of construction plan (or other) elements and/or in connection with one or a plurality of parametric symbols), which a user may obtain from a CD ROM (or other physical storage device) or download from the 1stPricing or other website, or otherwise, on the same or other local or remote computer system and/or console may be accomplished via a set of installation files in a manner known by those having ordinary skill in the art. These installation files may be part of the architectural CAD (or other software design tool) software installation program, or may be accessed from a CD, LAN, WAN, Intranet, Internet or any other such medium or network. The installation procedure typically requires the running of a Setup.exe (executable file), preferably using standard Windows™ OS methodology, although the invention can also be implemented using Mac, Linux or any other such type of operating system. It is contemplated to include an opening advertisement popup to the architectural CAD software, promoting the present invention. This popup could appear each time that the architectural CAD software is started. Selecting a checkbox that would be imbedded within the popup would deactivate it.

The plug-in (add-on) computer software code is a set of computer code that is designed to run within a parent computer software application or code, particularly architectural CAD software (or another architectural, civil, industrial or other software design tool), as an internal component, i.e., it "adds on" to the parent software application. Alternatively, the plug-in computer code may run outside of the software design tool operating as a dynamic link library, executable (.exe), ActiveX, COM object, or combination thereof; and/or the like. Installation of the plug-in (add-on) computer software code optionally has an effect of placing "parametric symbols" files, and associated data files, onto a computer in which the plug-in (add-on) computer software code is installed. The parametric symbols in the parametric symbols files depict popular configurations of common products, preferably construction elements, such as different types of windows, doors, acrylic glass blocks, sky lights, cabinets, fireplaces, Forced Air Units, drywall, lumber, insulation, molding, laminates, plumbing fixtures, electrical fixtures, and the like. In a preferred embodiment, three types of parametric symbols are provided: (1) Windows; (2) Doors; and (3) Acrylic Glass Blocks. The installation of the plug-in (add-on) computer software code also optionally, but preferably, adds the following controls to the architectural CAD (or other) software: (1) an "activation" button, which is added to the main architectural CAD (or other) software toolbar, as is shown in FIG. 1; (2) a menu item labeled "1stPricing," which is added in the architectural CAD (or other) software "View" menu; and (3) a "1stPricing" parametric symbol palette, which is added to the architectural CAD (or other) software palettes.

The systems and methods of the present invention may optionally employ a palette of one or a plurality of parametric symbols that comes standard (or otherwise) with architectural, civil, industrial and/or other computer software or that is provided by the plug-in computer software code, and enables the existing software design tool to transmit or bring back from one or a plurality of databases data and/or information and can use an existing palette, if necessary or desired. In the former situation, the plug-in computer software code enables existing functions in the architectural, civil, industrial and/or other computer software to price and/or pull in (bring or transmit back) information from one or a plurality of databases, remote server systems and/or the like. Alternatively, no palette, which is optional, may be employed. The systems and methods of the present invention will work successfully as long as they have at least one identifier code, as is discussed herein.

Figure 35:
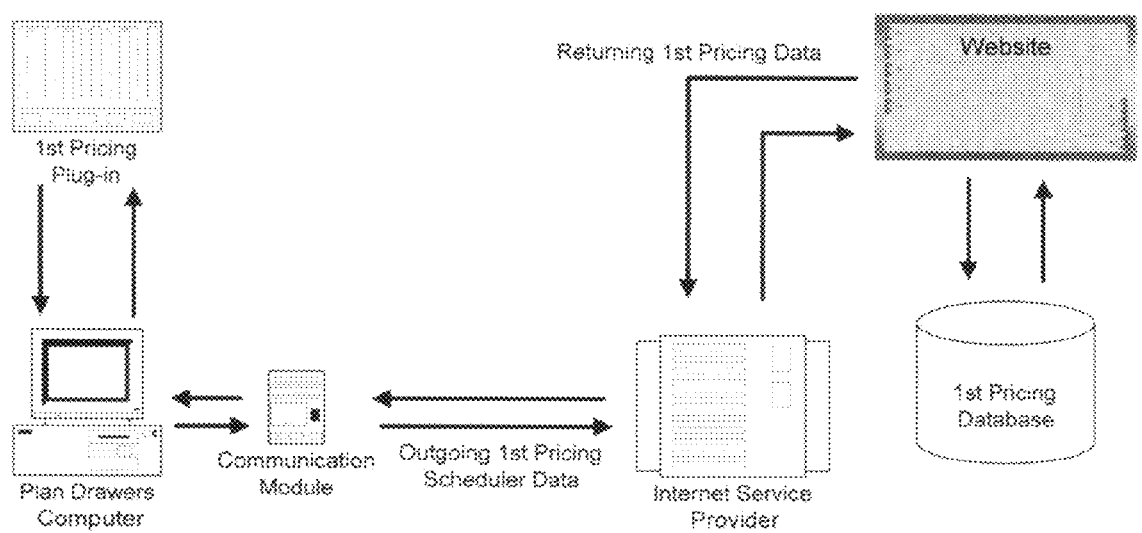
FIG. 35 is a flow chart that illustrates the basic data interaction between the plug-in (add-on) computer software code and one or a plurality of 1stPricing or 1stWindows (or other) online or offline (or other) databases in embodiments within the present invention. In contrast with the flow chart that is shown in FIG. 2, the flow chart shown in FIG. 35 additionally includes a communication module, which results in an enhanced communication path.
Figure 36:
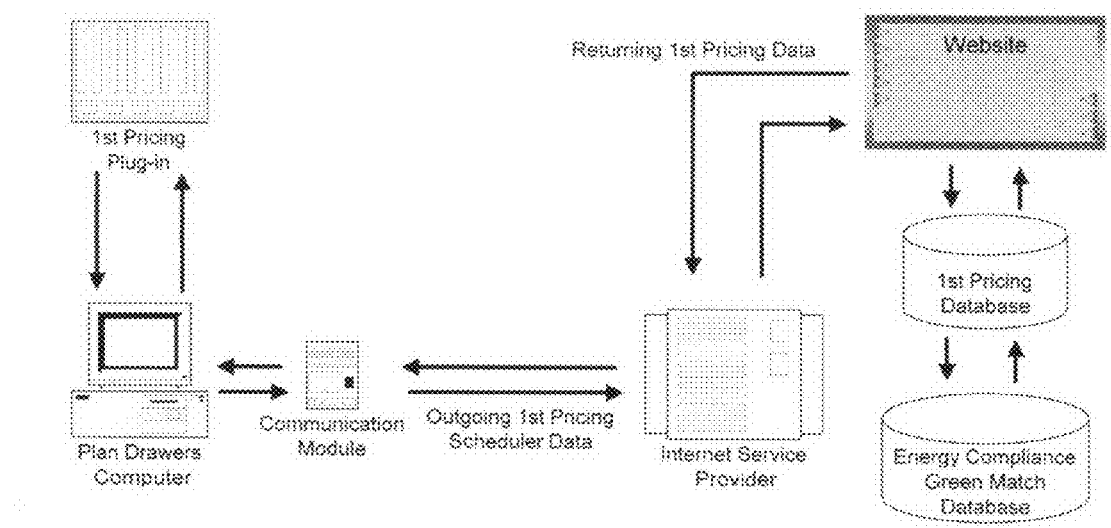
FIG. 36 shows the same flow chart as FIG. 35, with the exception that it additionally includes one or a plurality of databases containing "green" data.

Data Flow—FIGS. 2, 35 and 36

FIGS. 2, 35 and 36 show three different basic data interactions that may occur between the plug-in (add-on) computer software code described hereinabove and the corresponding online or other database of pricing data and/or information (RFID tags, geospatial information, product specification information and the like.) In contrast with FIG. 2, the flow charts that are shown in FIGS. 35 and 36 additionally include an optional communication module. In contrast with FIG. 35, the flow chart that is shown in FIG. 36 additionally includes a database containing "green" data and/or information. In these figures, the plug-in (add-on) computer software code operates within the architectural CAD (or other) software design tool, and transmits or sends outgoing data and/or information regarding one or a plurality, or all, of the construction plan (or other) elements and/or parametric symbols that have been selected by the user (construction products), and that have optionally been imbedded within the construction plans, and their parameters, preferably first to an optional communication module (FIGS. 35 and 36), and then to a to a remote server system (FIGS. 2, 35 and 36). However, as is shown in FIG. 2, the outgoing data and/or information may be sent directly to a remote server system (i.e., without using a communication module). The outgoing data is optionally, but preferably sent from the user's local computer over the Internet via the user's ISP to a web site on a remote server system, for example, the online 1stPricing web site (FIGS. 2, 35 and 36). The remote server system implements a pricing database and/or a "green" database (FIG. 36) in accordance with the present invention, and with the plug-in (add-on) computer software code. The plug-in (add-on) computer software code makes the construction plan (or other) elements and/or parametric symbols/objects "smart" by assigning code to the construction plan (or other) elements and/or parametric symbols/objects, particularly once they are inserted into the construction plan. When pricing or "green" information is generated, this plug-in (add-on) computer software counts the objects along with their assigned code, and then goes out of the program preferably first to the communication module (FIGS. 35 and 36), and then to the external database and optionally provides a zip code. However, as is shown in FIG. 2, this information may go directly to the external database (i.e., without using an optional communication module). Then, this plug-in (add-on) computer software code gives the list of objects and their attributes to the server, and asks for a match. After that, the plug-in (add-on) computer software sends the matches and the pricing and/or "green" information back to the communication module (FIGS. 35 and 36), and then to the CAD user's computer. However, as is shown in FIG. 2, this information may go directly to the CAD user's computer (i.e., without using a communication module). (The remote server is one or more databases containing pricing and/or "green" information and "talks" to CAD (or other software design tool) drawing objects preferably via a communication module when they come in. The plug-in (add-on) computer software code is a communication link from the CAD (or other) software design tool to the database server (or other database(s)) and back to the CAD (or other) software design tool).)

Computer software that is present on the remote server system (or elsewhere), such as on the online 1stPricing web site, compares the information and/or data that it receives from the user with a pricing database and/or database containing "green" information ("green" certifications made by third parties) that is present at the remote server system (or elsewhere) to determine appropriate prices and/or "green" statements for the various construction or other products, and for the particular characteristics (parameters) thereof, that may optionally be represented by the parametric symbols. The computer software then returns the pricing information, "green" information and/or data, preferably over the Internet, preferably to the communication module, and then to the user's local computer system (FIG. 2). The plug-in (add-on) computer software code receives the pricing data and/or "green" information provided from the remote server (or other) system, optionally generates a price schedule and/or a "green" schedule for the construction plan or other elements, and optionally imbeds the price schedule and/or "green" schedule with the pricing and/or "green" data, statements and/or indications directly into an architectural CAD (or other software design) drawing, such as into a window that is present in a kitchen of a house.

Figure 3:
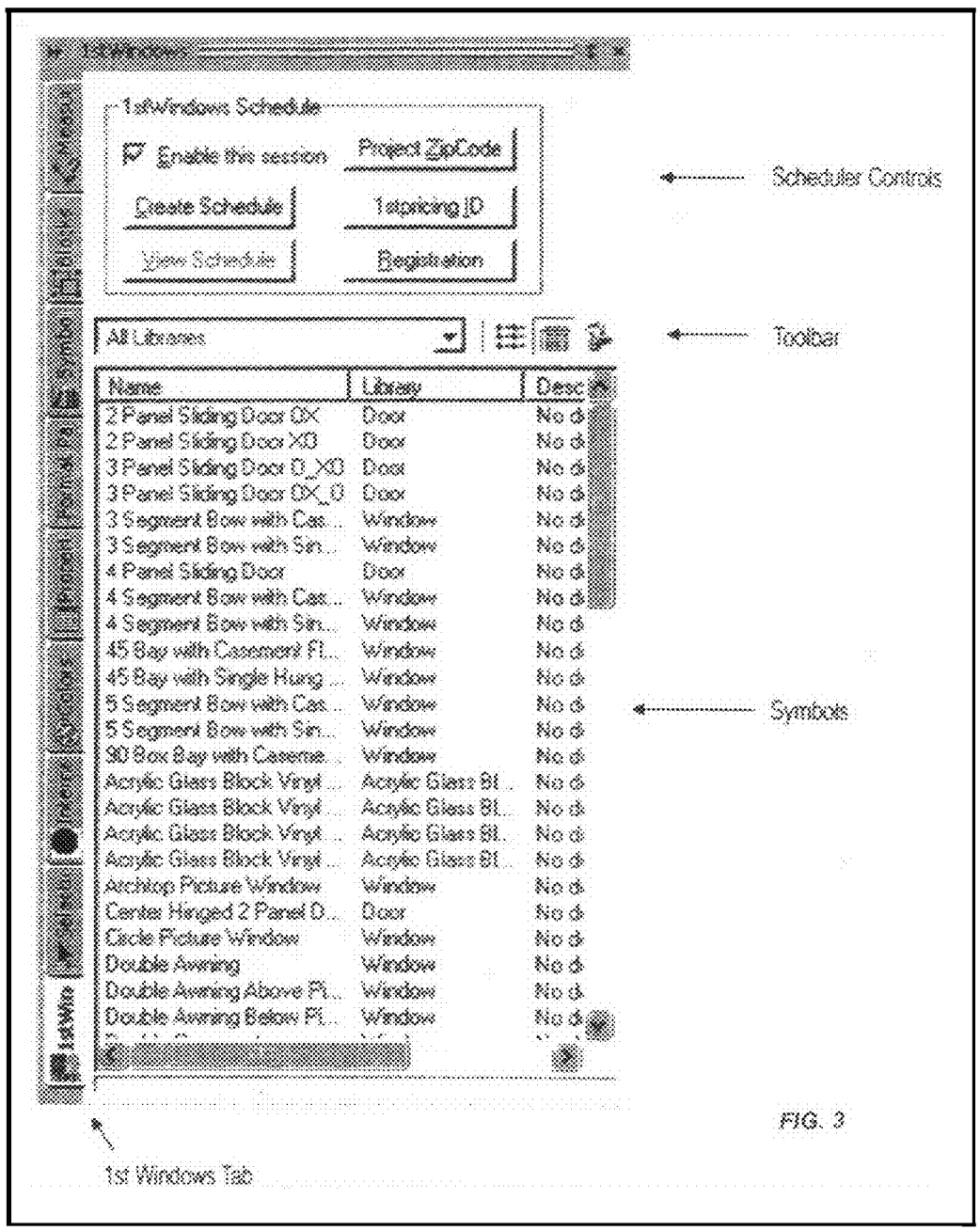
FIG. 3 illustrates a Parametric Symbol Palette that may be present in the plug-in (add-on) computer software code that is used with the present invention.

Symbols Palette—FIG. 3.

As is shown in FIG. 3, a Symbols Palette, which optionally becomes present on the user's local or other computer and/or console as a result of the plug-in (add-on) computer software code, includes a set of controls and a list of one or more architectural (or other) parametric symbols. The controls are preferably divided into two groups: (1) a toolbar; and (2) scheduler controls. In the disclosed embodiment, the parametric symbols are preferably organized into three groups or libraries: (1) windows; (2) doors; and (3) acrylic glass blocks.

Activation

The Symbols Palette typically cannot be used until it is activated. Clicking the activation button or menu item that is present therein will generally launch (activate) the Symbols Palette. After installation of the plug-in (add-on) computer software, the Symbols Palette can be launched by default. To activate the Symbols Palette, an architect or other user may: (1) click the "1stPricing activation" (or a similar type of) button; (2) select "View/1stPricing" (or a similar menu item) from the menu; or (3) click the "1stPricing" (or a similar type of) tab in the architectural CAD (or other software design tool) software palette.

Figure 5:
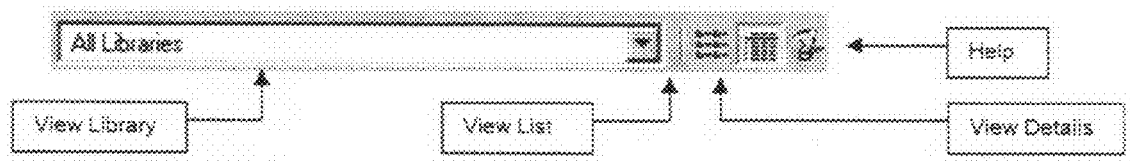
FIG. 5 shows the toolbar of the Parametric Symbol Palette that is illustrated in FIG. 3.

Toolbar—FIGS. 4 and 5

In a preferred embodiment of the invention, as is shown in FIG. 5, the toolbar comprises four controls, which include one drop down menu, and three buttons, and are as follows:
(1) A "View Library" drop down menu allows the user to arrange a list of available construction plan (or other) elements and/or corresponding parametric symbols to display a specific type of construction plan (or other)

element and/or parametric symbol, such as windows, doors, skylights, acrylic glass blocks, and/or the like, or to view all of the construction plan (or other) elements and/or parametric symbols by selecting the "All 1$^{st}$Pricing Symbols" option (or a similar type of option).

(2) A "View List" button allows the user to set the construction plan (or other) elements and/or parametric symbols list, so that only the names of the construction plan (or other) elements and/or parametric symbols appear, such as Bay with Casement Flankers, or 2 Panel Sliding Door XO.

(3) A "View Details" button allows the user to set the construction plan (or other) elements and/or parametric symbols list, so that each construction plan (or other) element and/or parametric symbol is optionally, but preferably, listed with four details (FIG. 4): (1) Name; (2) Library; (3) Description; and (4) Full Path. Preferably, the construction plan (or other) elements and/or parametric symbols are listed vertically, with the detail organized in four columns horizontally. When this option is selected, an additional control button is preferably appended to the top of each of the detail columns. Clicking on any of these additional buttons preferably reorders the symbols list alphabetically by the detail that the associated column contains.

(4) An optional "View Help" button allows the user to open a "1stPricing" (or other) help system, which permits the user to get help.

Parametric Symbols—FIGS. 6, 7, 8 and 9

Optionally, but preferably, a set of one or more architectural (or other) parametric symbols (or construction plan (or other) elements) are provided by the plug-in (add-on) computer software code to represent a majority (or more) of possible options that are generally available to a user of the system of the present invention. Each parametric symbol (or construction plan element) typically has one or a plurality of unique aspects and/or attributes (parametric symbol values) which, optionally, may be selected by a user prior to optionally inserting a parametric symbol (or construction plan element) into a construction plan drawing, such as width, height, color, depth, thickness of glass and/or texture, and is typically a combination of two architectural CAD (or other software design tool) objects: (1) a two-dimensional representation of a construction element; and (2) a three-dimensional representation of a construction element (as is shown, respectively, in FIGS. 8 and 9). However, the user does not need to select any parametric symbol values for any parametric symbols, which values are optional, because each parametric symbol (or construction plan element) will typically have pre-set parametric symbol values, which will generally be used unless the user selects different parametric symbol values, as is discussed below. The parametric symbols (and construction plan elements) are designed to interact with an architectural CAD software "Wall Tool" (or similar tool). After a user optionally selects one or more parametric values for one or more parametric symbols (or construction plan elements), the parametric symbols (or construction plan elements) are optionally, but preferably, inserted into the construction plan drawings by clicking on one or more of the parametric symbols (or construction plan elements) that are present in the list of parametric symbols that is present in the Symbols Palette, and then moving (dragging) them into the architectural (or other) drawing, such as a room of a house. A parametric symbol (or construction plan element) advantageously will typically automatically align itself with the orientation of a wall of a structure, such as a house, if applicable, or with any other applicable location, thereby showing the user a preview of the parametric symbol (or construction plan element) prior to placing the parametric symbol (or construction plan element) within the architectural drawing.

Before a parametric symbol (or construction plan element) is moved into the construction (or other) plans, preferably a "1stPricing Symbol Properties" palette (or similar) dialog automatically appears. This "1stPricing Symbol Properties" palette dialog allows "parametric symbol values," such as color, construction material, size, presence or absence of grids, layout of grids, number of grids, type of glass, and/or the like, for example, in the case of a window, 42"×36", Standard Pattern Flat Grids and 5 Segment Bow, or in the case of lumber, 2"×4"×10' lumber, to be optionally specified for each parametric symbol (or construction plan element) that is present in the Symbols Palette. Entry may be made by a user of specific parameters that make up the parametric symbol (parametric symbol values) by clicking on various available drop down menus, and then selecting specific available parameters, as is described herein.

Figure 6:
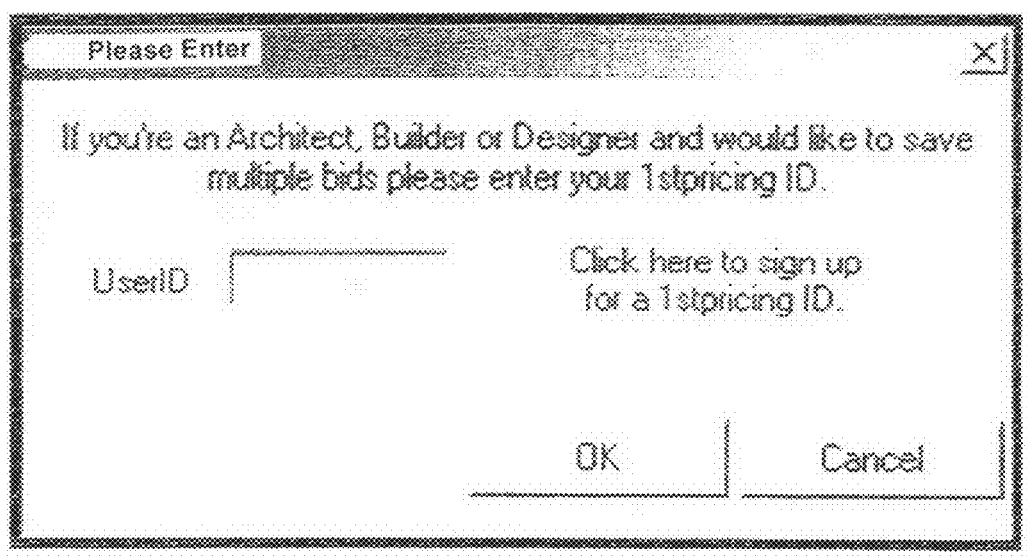
FIG. 6 shows a User ID dialog that appears in the plug-in (add-on) computer software code when a first parametric symbol is inserted into a set of construction plans (by clicking on the parametric symbol in the Parametric Symbol Palette).

Parametric symbol values can include any size or material specification for a given item, such as a construction product (window, door, acrylic glass block sky light, and the like), including a standard product item number for a respective construction element. In a new drawing, as is shown in FIG. 6, a User ID dialog preferably automatically appears when the first parametric symbol (or construction plan element) is inserted into the construction plans if a User ID has not yet been entered by the user. Further, and very advantageously, the "1stPricing Symbol Properties" palette dialog (or a similar dialog) may optionally be recalled to edit one or more parametric values for any parametric symbol (or construction plan element) that has already been inserted into the construction plans. Selecting a parametric symbol and clicking the right button on a computer mouse will generally open a local menu. Selecting the "1stPricing Symbol Properties" palette option from the local menu will generally open the "1stPricing Symbol Properties" dialog for the parametric symbol.

Figure 7:
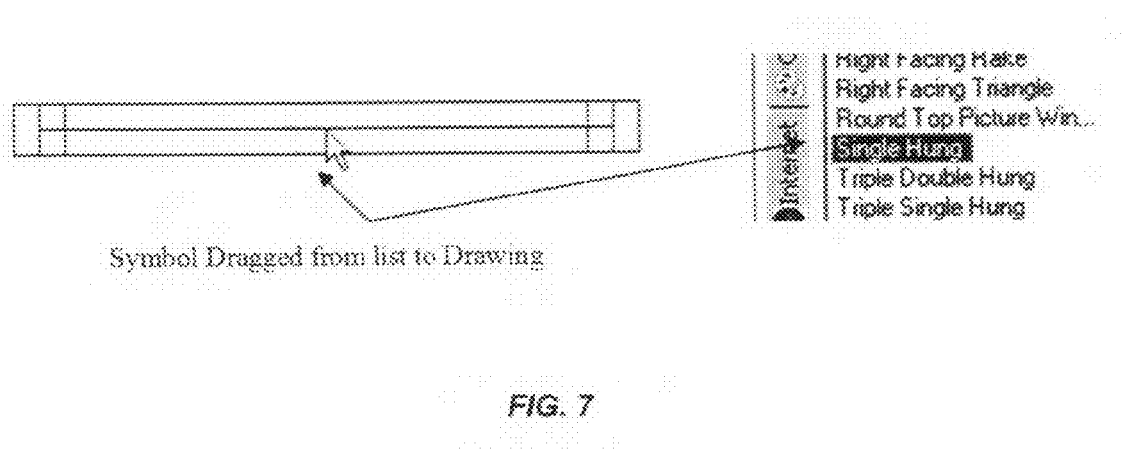
FIG. 7 illustrates an operation for inserting parametric symbols into a set of construction plans in accordance with the plug-in (add-on) computer software code of the present invention.
Figure 8:
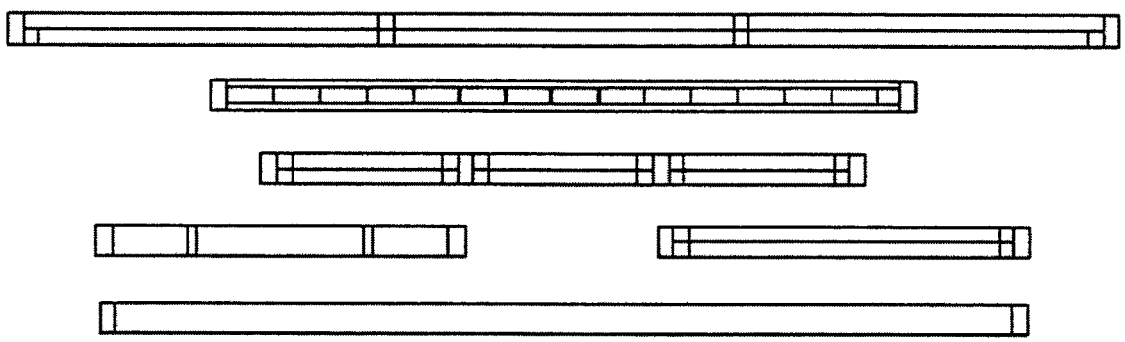
FIGS. 8 and 9, respectively, show two and three dimensional representations of the parametric symbols that may be employed in accordance with the plug-in (add-on) computer software code of the present invention.
Figure 9:
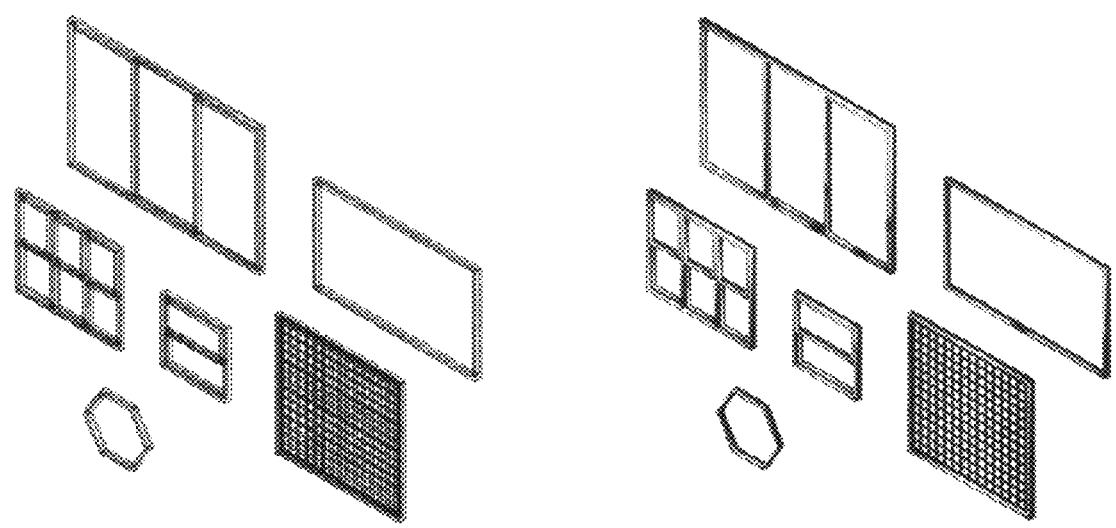

Operation can be employed, for example, in the manner that is shown in FIG. 7. A user may click on the parametric symbol(s) (or construction plan elements) to be inserted into the construction plans, and move (drag) the parametric symbol(s) (or construction plan elements) to a particular location in the construction plans where it is to be inserted, such as a particular wall in a kitchen of a house, and then release the button. The user may modify the parametric properties using the "1stPricing Symbol Properties" palette (or a similar type of) dialog, as is desired or necessary. When the parametric symbol (or construction plan element) is placed into the construction plans, and modified as desired or required, the user may click "OK," which typically causes the object to change to reflect the new parameters entered into to the palette.

Symbol Properties

Each type of parametric symbol corresponding to a product item, such as a construction plan (or other) element (windows, doors, acrylic glass blocks, sky lights and the like), generally has a unique set of parametric attributes (properties) that may be specified for each parametric symbol. In addition, each specific parametric symbol generally has a unique range of values that is permissible for those parametric attributes. In some embodiments of the invention, parametric symbol properties may only be edited by using the "Properties Dialog" (or a similar type of a dialog). To edit the parametric symbol properties in these embodiments, a user should select the parametric symbol to be modified, and then click the right mouse button. The user should then select "1stPricing Properties" from the local menu and modify the parametric symbol properties in the "Properties Dialog" as is necessary or desired. When the parametric symbol properties modified as required or desired, the user should then click "OK."

Figure 10:
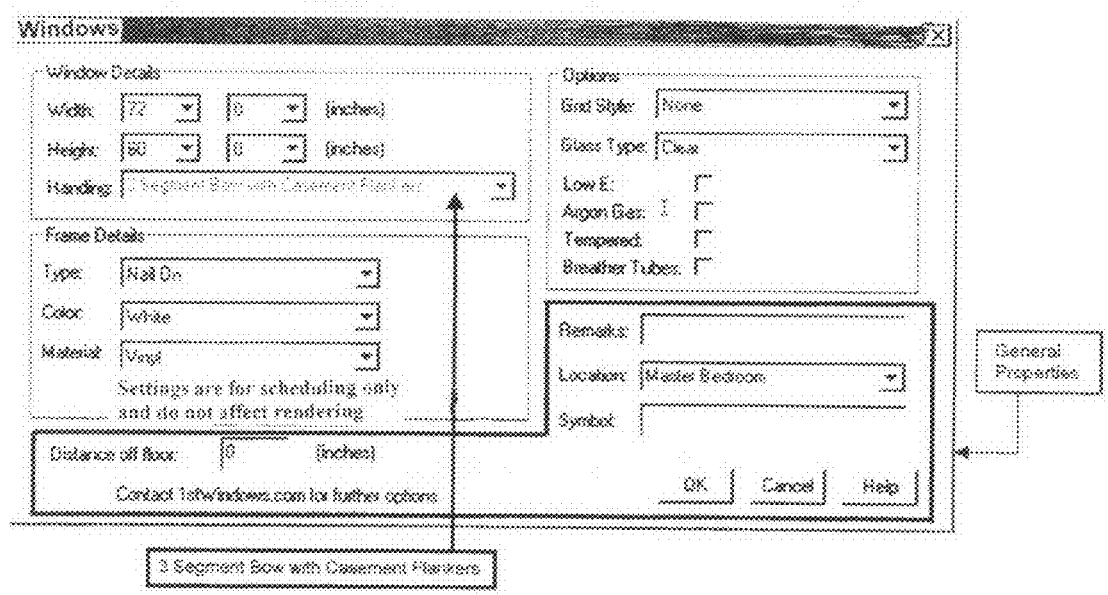
FIG. 10 shows a portion of a dialog for specifying general properties for one or more parametric symbols (location, remarks, distance off of floor, and/or the like) in accordance with the plug-in (add-on) computer software code of the present invention.

General Properties for Parametric Symbols—FIG. 10

As is shown in FIG. 10, "General Properties" are optionally available for all construction plan (or other) element and/or parametric symbol types (often herein collectively referred to as "parametric symbols"). The "Parametric Controls" (or similar types of controls) that are preferably available as General Properties are indicated as follows. The "Symbol" text box field allows the user to notate individual parametric symbols (to put a text notation next to the parametric symbol/object when it is optionally inserted into the construction plan). The notation will typically also be placed on an optional price schedule and/or "green" schedule. The "Location" text box field allows the user to notate (to insert a personal remark or notation) the physical location of the parametric symbol in the set of construction plans (e.g. master bedroom, kitchen, living room, bathroom, etc.). The "Remarks" text box field allows the user to make special notations about the parametric symbol, such as Game room or Master Bedroom. The "Distance off Floor" text box field allows the user to specify a measurement value that specifies where the bottom of the parametric symbol is set in relation to a floor, for example, how far a bay window is off of the floor. Advantageously, the plug-in (add-on) computer software code also optionally includes an implementation wherein, upon insertion of a parametric symbol, the implementation indicates whether or not the location of that parametric symbol meets the criteria of a Uniform Building Code (UBC). The plug-in (add-on) computer software code generally knows the building codes for the various parametric symbols, particularly once they are optionally inserted into the construction plan. It knows a window is a window, and that building codes are associated with it. For example, a window 2 feet from a door must generally be tempered. If a window is inserted less than 2 feet from a door, the computer program would typically let the user know to temper it. As another example, a 2"×4"×16" on center wall framing can generally only be used for the first two floors of a structure. Thus, when a $3^{rd}$ floor of a structure is drawn on top of a 2nd floor, and the $1^{st}$ floor is 2"×4"×16" on center, the computer program would typically let the user know that the $1^{st}$ floor must change to 2"×6"16" on center.

The "Properties Dialog" preferably also contains three buttons that are preferably present for all parametric symbols, and which preferably function as follows:

Clicking the "OK" button accepts the parametric symbol configuration, closes the "Properties Dialog," and makes the appropriate changes in the construction plans;

Clicking "cancel" closes the "Properties Dialog," and ignores any changes that were made to parametric symbol properties; and The "help" button allows the user to open the "1stPricing" help system, which offers assistance in using the plug-in (add-on) computer software code, such as how to insert a parametric symbol into a construction plan.

Figure 11:
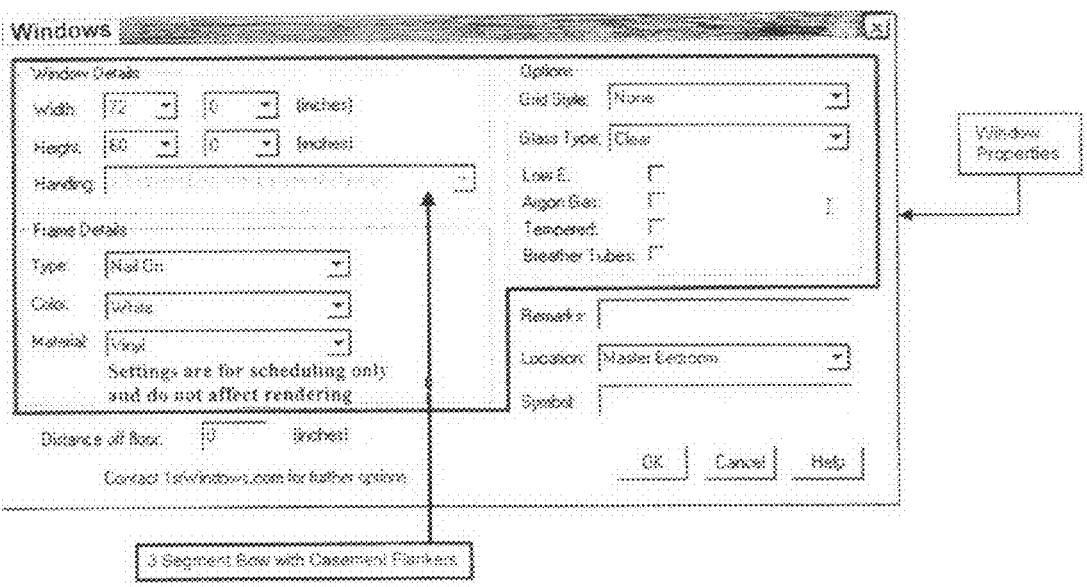
FIGS. 11, 12 and 13 show portions of respective dialogs in accordance with the plug-in (add-on) computer software code of the present invention for windows, acrylic glass blocks and doors, respectively, that specify attributes of particular parametric symbol types, such as the width, height, handling, frame type, color and composition of a window.

Windows Properties (For Windows Only)—FIG. 11

As is shown in FIG. 11, "Windows Properties" are specific parametric attributes that pertain specifically to windows. Specific ranges/options for windows may vary for each parametric symbol. As is discussed below, there are optionally, but preferably, three Windows Properties' classifications for windows: (1) Window Details; (2) Frame Details; and (3) Options.

Window Details

The "Width" drop down menus that are preferably located in the "Symbols Palette" are used to select width of windows in inches and in fractional inch increments. The "Height" drop down menus are used to select the height of windows in inches and in fractional inch increments. The "Handing" drop down menus are used to select the handing (right or left) type for the windows where applicable, such as for a 3 Segment Bow Window with Casement Flankers.

Window Frame Details

The "Type" drop down menu that is preferably located in the "Symbols Palette" is used to select the window frame type, such as "Nail On" or block frame. The "Color" drop down menu is used to select the window frame color, such as white, black, green or the like. The "Material" drop down menu is used to select the composition of the window frame, such as vinyl, wood, aluminum, fiberglass or wood clad.

Window Options

The "Grid Style" drop down menu that is preferably located in the Symbols Palette is used to select the desired window grid pattern, such as standard pattern flat, standard pattern sculptured, pattern 3a flat or pattern 2 sculptured. The plug-in (add-on) computer software code generally automatically calculates the grid frequency for a window based upon the size of the window. The "Glass Type" drop down menu is used to select the desired window glass type, such as Azurite, Solar Grey, Glue Chip, Obscured and the like. The "Low E" check box is used to select a Low Emissive Coating on the window glass. The "Argon Gas" check box is used to select Argon Gas filled window glass. The "Tempered" check box is used to select Tempered Glass for the window. The "Breather Tubes" check box is used to select breather tubes for the window.

Figure 12:
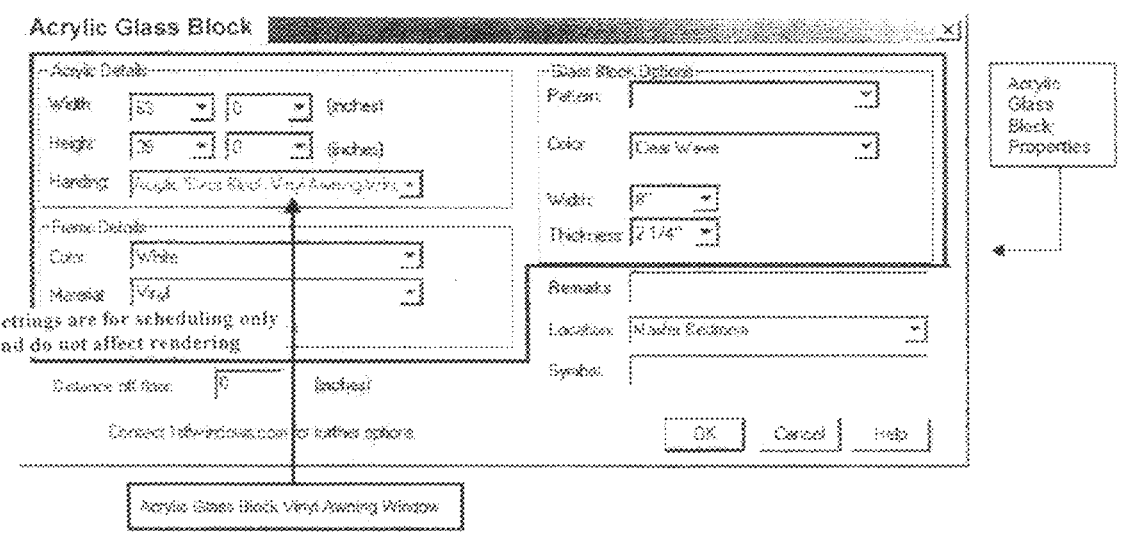

Acrylic Glass Block Properties (For Acrylic Glass Blocks Only)—FIG. 12

As is shown in FIG. 12, Acrylic Glass Block properties are specific parametric attributes that pertain specifically to acrylic glass blocks. Specific ranges/options for acrylic glass blocks may vary for each parametric symbol. There are preferably three classifications for the acrylic glass blocks: (1) Acrylic Glass Block details; (2) Frame Details; and (3) Options.

Acrylic Glass Block Details

The "Width" drop down menu that is preferably located in the "Symbols Palette" is generally used to select width of the acrylic glass block in inches and in fractional inch increments. The "Height" drop down menu is generally used to select the height of the acrylic glass block in inches and fractional inch increments. The "Handing" drop down menu is generally used to select the handing (right or left) type of the acrylic glass block where applicable.

Frame Details

The "Color" drop down menu that is preferably located in the "Symbols Palette" is generally used to select the acrylic glass block frame color, such as white, black, green, blue or the like. The "Material" drop down menu is generally used to select the composition of the acrylic glass block frame, such as vinyl, wood, aluminum, fiberglass, wood or clad.

Acrylic Glass Block Options

The "Pattern" drop down menu that is preferably located in the "Symbols Palette" is generally used to select the acrylic block pattern, such as diagonal patterns. The "Color" drop down menu is generally used to select the acrylic glass block color, such as clear wave, frosted wave, green or blue. The "Width" drop down menu is generally used to select the acrylic glass block width, such as 6". The "Thickness" drop down menu is generally used to select the acrylic glass block thickness, such as 2¼".

Figure 13:
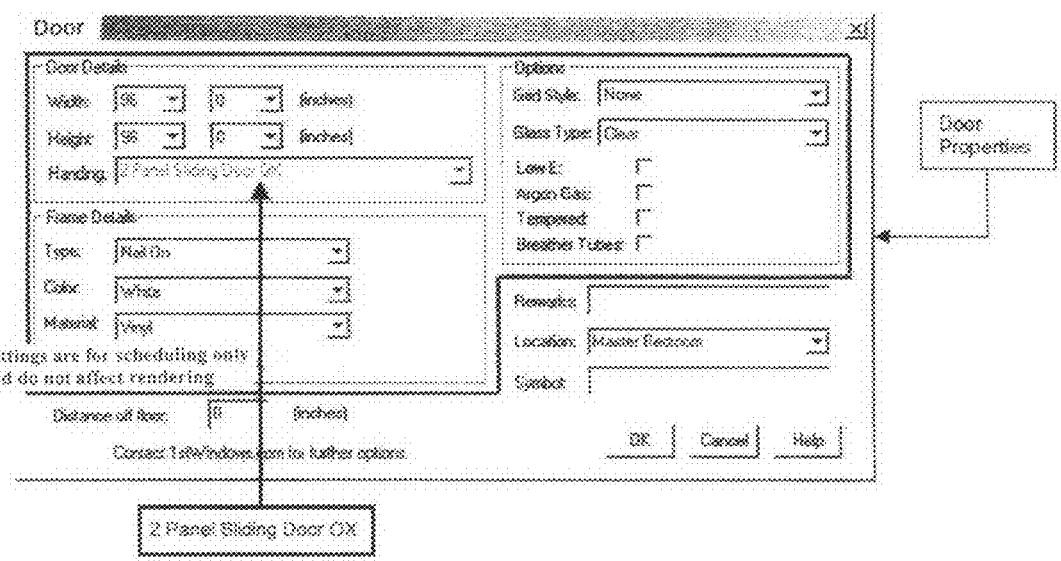

Door Properties (For Doors Only)—FIG. 13

As is shown in FIG. 13, "Door Properties" are specific parametric attributes that pertain specifically to doors. Specific ranges/options for doors may vary for each parametric symbol. There are preferably three classifications for doors: (1) Door Details; (2) Frame Details; and (3) Options.

Door Details

The "Width" drop down menu that is preferably located in the "Symbols Palette" is generally used to select width of a door in inches and in fractional inch increments, such as 96". The "Height" drop down menu is generally used to select the height of a door in inches and in fractional inch increments, such as 96". The "Handing" drop down menu is generally used to select the handing (right or left) of a door type where applicable, such as for a 2 Panel Siding Door OX. ("OX" means "O" is the stationary panel and "X" is the moving panel as viewed from outside of the door looking in.)

Frame Details

The "Type" drop down menu that is preferably located in the "Symbols Palette" is generally used to select the door frame type, such as "Nail On" or block frame. The "Color" drop down menu is generally used to select the door frame color, such as white, black, blue, red, green or the like. The "Material" drop down menu is generally used to select the composition of door frame, such as vinyl, wood, aluminum or fiberglass.

Options

The "Grid Style" drop down menu that is preferably located in the "Symbols Palette" is generally used to select the desired grid pattern of the door, such as standard pattern flat, standard pattern sculptured, pattern 3a flat or pattern 2 sculptured The plug-in (add-on) computer software code optionally, but preferably, automatically calculates the grid frequency based upon the size of the door. The "Glass Type" drop down menu is generally used to select the desired door glass type, such as clear, Azurite, Solar Grey, Glue Chip or Obscured. The "Low E" drop down menu is generally used to select a Low Emissive Coating on the door glass. The "Argon Gas" check box is generally used to select Argon Gas filled door glass. The "Tempered" check box is generally used to select Tempered Glass for the door. The "Breather Tubes" check box is generally used to select breather tubes for the door.

Figure 14:
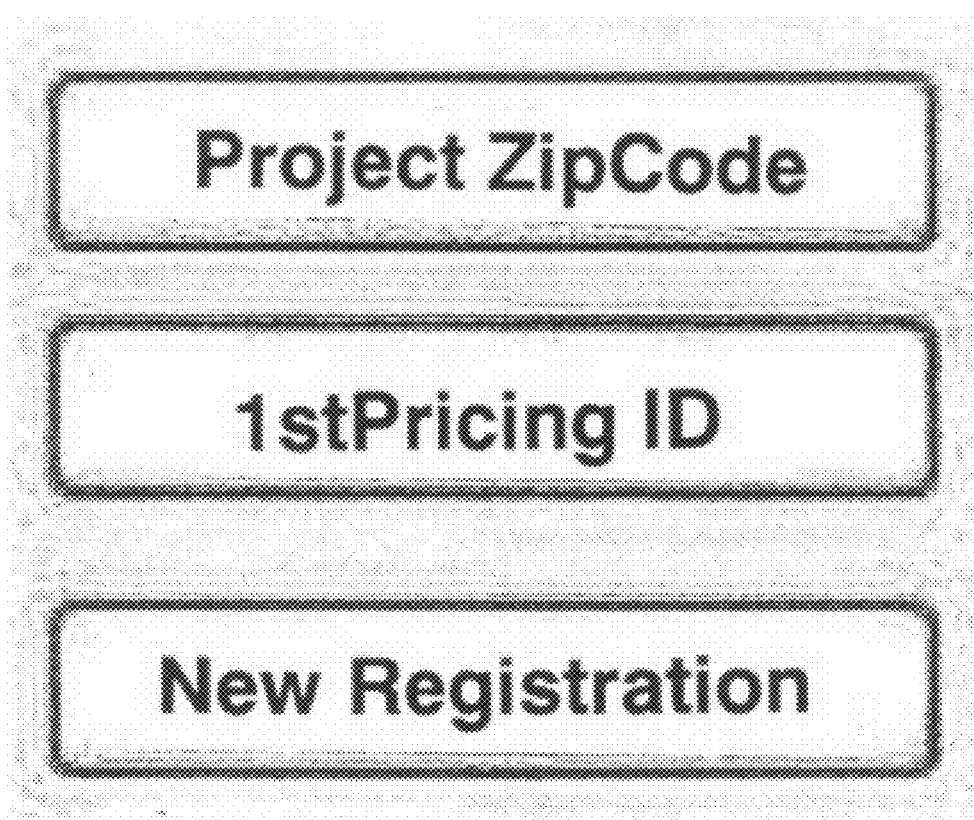
FIG. 14 depicts "Scheduler Controls" that may be used with the Parametric Symbol Palette of the plug-in (add-on) computer software code of the present invention.

Scheduler Controls (Pricing and "Green" Information)—FIG. 14

As is shown in FIG. 14, the "Scheduler Controls" optionally provided by the plug-in (add-on) computer software code are used to optionally create and maintain a price schedule and/or a "green" schedule that is generated using the parametric symbol data that is optionally contained in the construction plans. A price schedule is a detailed part list of the one or more parametric symbols and/or construction plan elements that are optionally contained in the construction plans with appended pricing data. A "green" schedule is a detailed part list of the one or more parametric symbols and/or construction plan elements that are optionally contained in the construction plans with appended statements or indications indicating whether or not the parametric symbols (and corresponding construction plan elements) and/or construction plan elements are "green." The pricing scheduler and "green" scheduler of the present invention typically use an Internet connection to access corresponding pricing data from one or more databases present on a remote server system, such as a web site, for example, the online 1stPricing web site. However, an Internet connection is not necessary, and pricing and/or "green" data and/or information may be accessed from one or more databases that are present on or in a physical storage medium, such as a CD, DVD, hard drive, disc drive, tape drive and/or the like, or over a network or an Intranet. In some circumstances, such as when a physical storage medium or network is not employed, if no Internet connection is present, an open price schedule and/or "green" schedule may be generated, but pricing data and "green" data will typically be absent. Only one piece of data is generally required for the pricing portion of the scheduler to work to procure price data that varies between different zip codes, regions or areas, which is a ZIP code for the location of the construction project. However, when price data and/or information does not vary between different zip codes, regions or areas, such as when a price is a national price (i.e., it is the same or very similar regardless of location within the United States or another country), the use of a zip code is not necessary. Only one or more attributes from the inserted parametric symbols and/or construction plan elements are generally required for the "green" data and/or information portion of the scheduler to work (i.e. a zip code is not necessary). One control which is accessible from different paths in the pricing scheduler and/or "green" scheduler is preferably, but optionally, used to input this pricing data and/or "green" data. (If the user does not allow one or more parametric symbols and/or construction plan elements to be priced or linked with corresponding "green" data, no list of materials, or corresponding pricing or "green" data, will generally be provided. However, the user can still draw the objects.)

Pricing and "Green" Data Scheduler Data Controls

As is described below, and as is shown in FIG. 14, three Pricing and "Green" data Scheduler Data Control buttons are preferably used to create and/or update the price scheduler and/or "green" scheduler for accurate operation: (1) Registration Button; (2) Project ZIP Code Button; and (3) 1stPricing ID Button.

Figure 15:
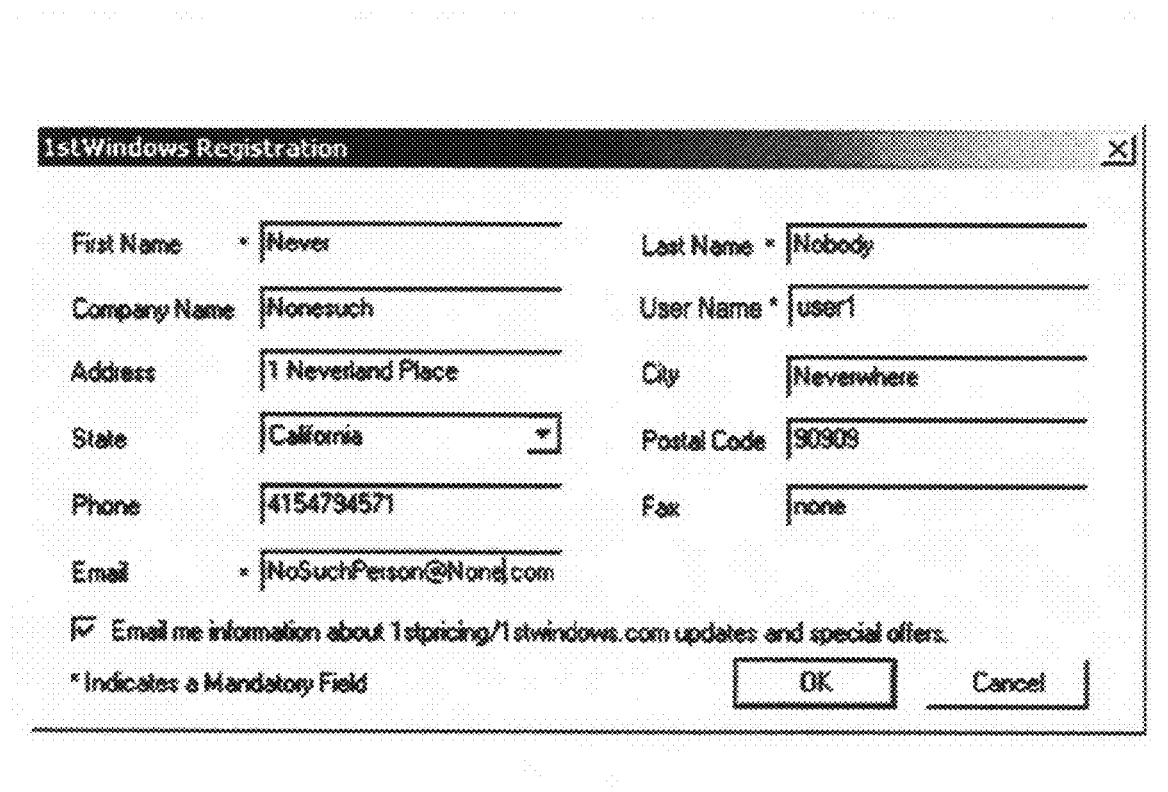

Registration Button—FIG. 15

For new users, clicking the "Registration" button generally opens up the optional Registration Dialog that is shown in FIG. 15. To first get to the "Registration" button, the user can also click on the 1stPricing ID button (FIG. 17) (or a similar type of a button). The user should then click a "Click here to sign up for a 1stPricing ID" link (or similar link), which generally opens up the "Registration" dialog box (FIG. 15), and complete the registration form that generally appears once the Registration Dialog is opened, which registers the new user with the online 1stPricing web site maintained by 1stPricing (or with a similar web site or registration tool). An active Internet connection may often be required for this to work properly, but is not always necessary. The Registration Dialog preferably provides the following controls for entering data: (1) a "First Name" text box (preferably mandatory); (2) a "Last Name" text box (preferably mandatory); (3) a "Company Name" text box; (4) an "Address" text box; (5) a "City" text box; (6) a "State" drop down menu; (7) a "Postal Code" text box; (8) a "Phone" text box; (9) a "Fax" text box; (10) an "Email" text box (preferably mandatory); and (11) an "Email me about updates and special offers" check box. To register the new user with 1stPricing (or another entity), the user clicks the "Registration" button, fills out the registration form (FIG. 15) and then clicks "OK." A new user confirmation notification is preferably subsequently sent to the new user electronically (via an Intranet, the Internet, a LAN or other network, etc.) or physically (U.S. or foreign mail, facsimile, etc.) containing the user information. Such registration generally creates an online or other account at the 1stPricing web site maintained by 1stPricing (or at some other desired location), which can be used for placing orders for construction (or other) products, reviewing orders, comparison-shopping among a wide variety of different, and possibly competing, manufacturers, distributors that market products within the zip code selected, and/or other third parties and/or entities, and obtaining "green" information. This, very advantageously, allows a consumer to procure "green" information and/or the most competitive pricing within a particular zip code, or nationally, for one or more construction (or other) products having a wide variety of desired characteristics, for example, a white, vinyl clad, double pane bay window having a specific height, width and depth, a specific number and type of grids, a Low Emissive Coating on the glass, and tempered and Argon gas filled glass, as well as breather tubes.

Figure 16:
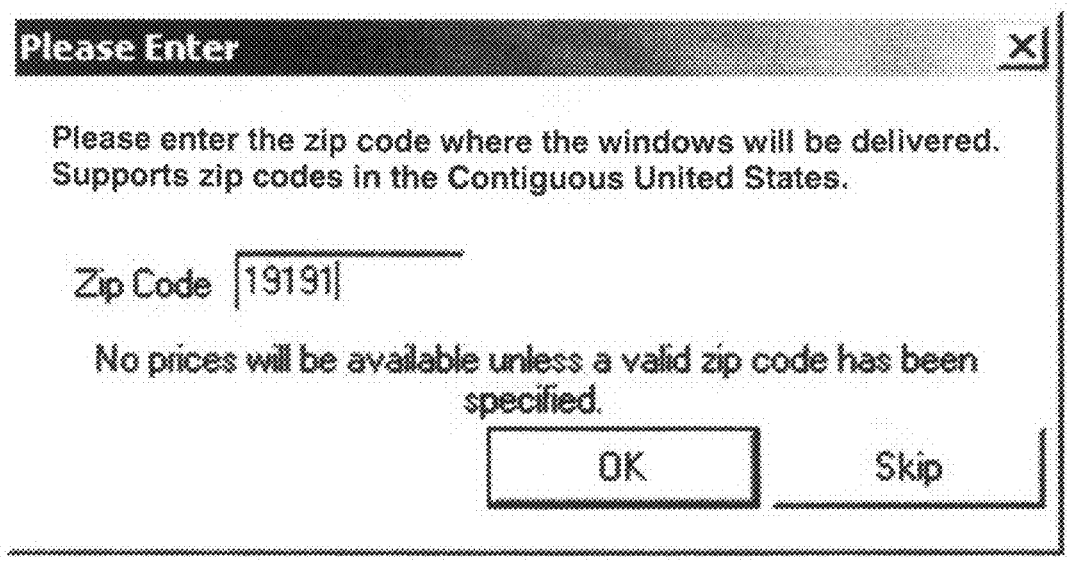
FIG. 16 depicts a "Zip Code" dialog opened upon actuation of a "Zip Code" scheduler control button in accordance with the plug-in (add-on) computer software code of the present invention.

Project ZIP Code Button—FIG. 16

Clicking the "Project ZIP Code" button preferably opens a ZIP Code dialog, as is shown in FIG. 16. The ZIP Code dialog is optionally used to enter the physical zip code of the site of a construction (or other) project, which is used to obtain an accurate price quotation and/or "green" information for one or more construction (or other) products within that zip code that optionally correspond to one or more parametric symbols that have optionally been inserted into the set of construction (or other) plans. The ZIP Code dialog preferably provides two buttons: (1) "OK"; and (2) "Skip." Selecting the "OK" button generally has the effect of entering the ZIP code into the pricing scheduler and the "green" scheduler. Pressing "Skip" will generally cause ZIP code changes to be ignored, and the user will generally be prompted that a correct ZIP code may be required for accurate pricing. To properly set the project ZIP code, the user should: (1) click the "Project ZIP Code" button; (2) then, enter the correct ZIP code for the project location; and (3) then, click "OK." A zip code is not necessary if a user only desires to procure "green" information for inserted parametric symbols and/or construction plan elements, or if a user desires to procure national or other regional pricing data and/or information.

Figure 17:
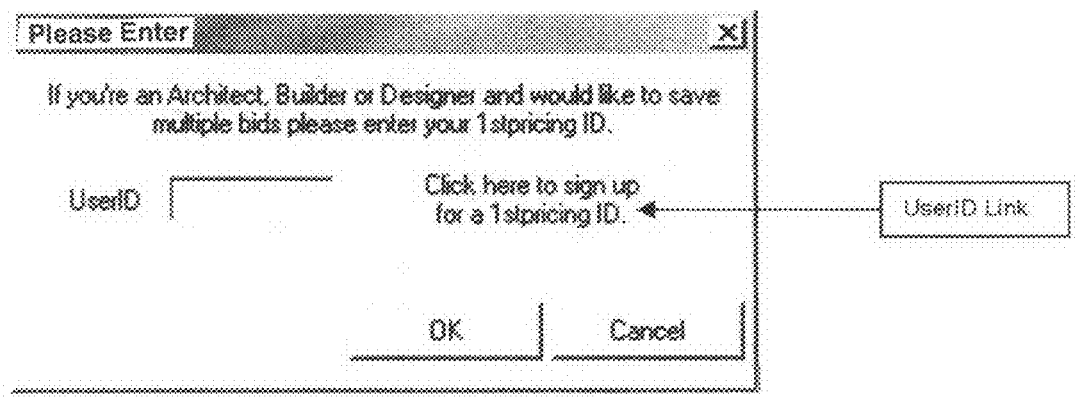
FIG. 17 depicts a "User ID" dialog opened upon actuation of the "Zip Code" scheduler control button in accordance with the plug-in (add-on) computer software code of the present invention.

1stPricing ID Button—FIG. 17

Clicking the 1stPricing ID Button (or a similar button) preferably opens a "User ID" (or similar) dialog, as is shown in FIG. 17. This User ID dialog preferably provides a "User ID" text box field, which generally enables a user to obtain a "1stPricingID" (or a similar type of an identification or ID). In order to have a 1stPricing ID generated, and set a User ID, the user preferably must first have filled out and submitted the Registration Dialog form (FIG. 15) (or a similar type of a form), as is described hereinabove. The User ID will typically initially be whatever the user specifies as a User Name on the Registration Dialog form. Clicking the "OK" button (FIG. 17) generally sets the User ID, closes the dialog, and provides the 1stPricing ID, which is also typically the set User ID. (The User ID and the 1stPricing ID are typically the same. The 1stPricing ID is typically a user ID name that the user has selected himself. He uses it along with a password to save pricing quotes.) The user is then typically sent a user name and Password ID electronically via Intranet, Internet, e-mail, LAN or other network, facsimile, U.S. or foreign mail, or the like. In contrast, clicking the "Cancel" button generally closes the dialog. To set the User ID as indicated above (and receive a 1stPricing ID), the user generally clicks the "1stPricing ID" button, and after properly registering, enters a User ID and then clicks "OK."

Figure 19:
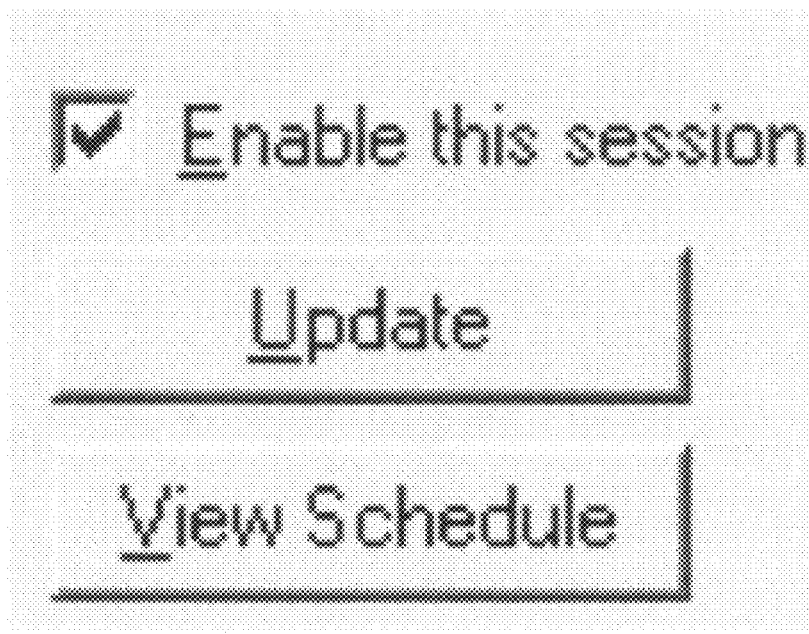
FIG. 19 shows "Scheduler Creation" controls in accordance with the plug-in (add-on) computer software code of the present invention that may be used with the Parametric Symbol Palette of the present invention, which enable the creation, updating and/or viewing of a parametric symbol, a price schedule and/or a schedule of statements indicating whether or not construction plan elements corresponding to inserted parametric symbols are "green," and which allow the plug-in (add-on) computer software code of the present invention to connect to the 1stPricing or 1stWindows (or other) online or offline database in accordance with the present invention to obtain pricing information, or information regarding energy and/or water efficiency (i.e., whether "green" or not), for various construction plan (or other) elements.

Parametric Symbol "Scheduler Creation" Controls—FIG. 19

The parametric symbol "Scheduler Creation" controls that are shown in FIG. 19 enable an optional creation, updating, and/or viewing of a schedule of one or more selected parametric symbols, and their characteristics, which may include pricing data and/or information, "green" statements and/or indications, or both, as well as other types of data and/or information. The "Enable this Session" check box generally allows the plug-in (add-on) computer software code to connect to one or more online 1stPricing web site (or other designated web site) databases and/or offline databases containing: (1) pricing information preferably from at least one to up to about ten or more different manufacturers, distributors or other third parties or entities (for one or more, or all, parametric symbols, and one or more, or all, parameters) to obtain pricing information for selected parametric symbols, and selected parameters (often those that have been inserted into the set of construction plans); and/or (2) "green" information (for one or more, or all, parametric symbols, and one or more, or all, parameters) to obtain "green" statements and/or indications for selected parametric symbols, and selected parameters (often those that have been inserted into the set of construction plans). If this box is not checked, the parametric symbol scheduler and user may not be able to access a database containing pricing and/or "green" information, and the parametric symbol schedule may possibly be generated without corresponding pricing and "green" data. The "Update" and "View Schedule" buttons are preferably used once a plan has already been priced and/or "green" information has been provided. "Update" will preferably generate a new price schedule and/or a new "green" schedule, and "View Schedule" generally takes the user to the existing price schedule and "green" schedule.

Figure 20:
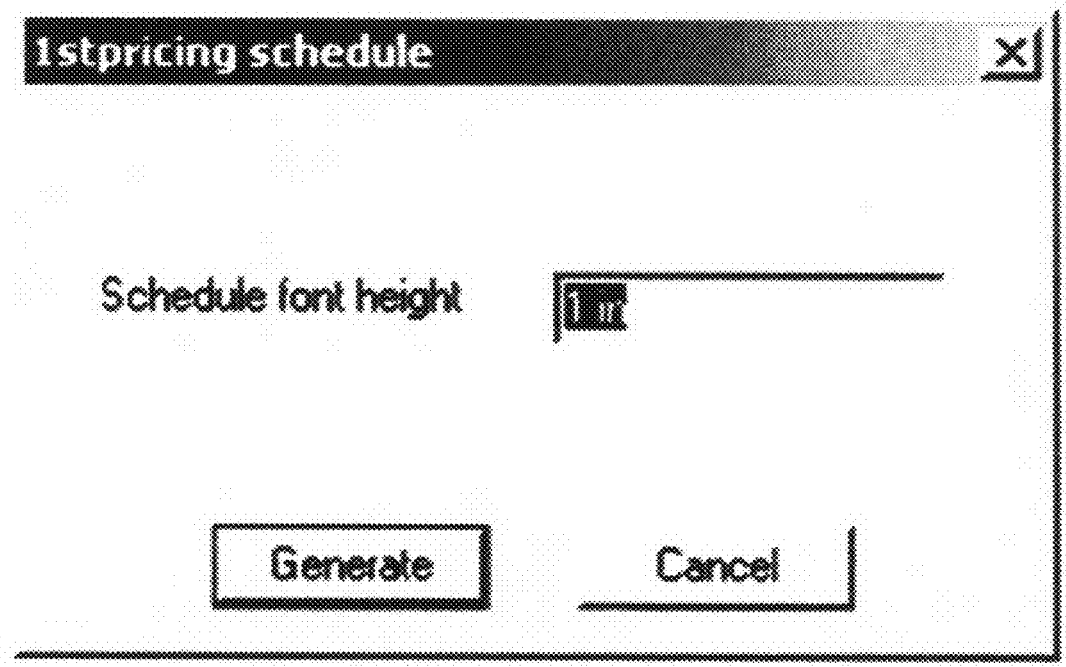
FIG. 20 shows a parametric symbol schedule dialog in accordance with the plug-in (add-on) computer software code of the present invention, which may be used to generate a parametric symbol schedule based upon the parametric symbols that have been inserted into a set of construction plans in accordance with the present invention.
Figure 37:
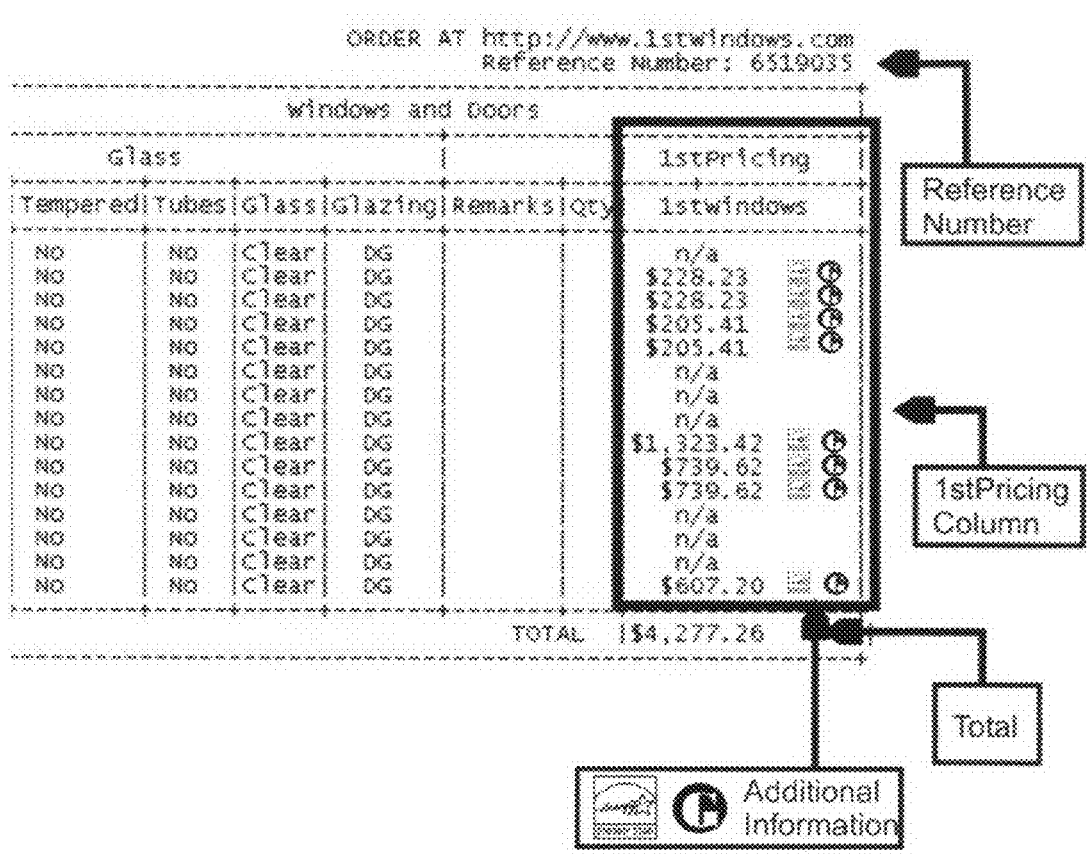
FIG. 37 shows the same details of the parametric symbol schedule of FIG. 20 as is shown in FIG. 21, with the exception that FIG. 37 additionally includes "green" statements for the construction plan elements listed therein.
Figure 38:
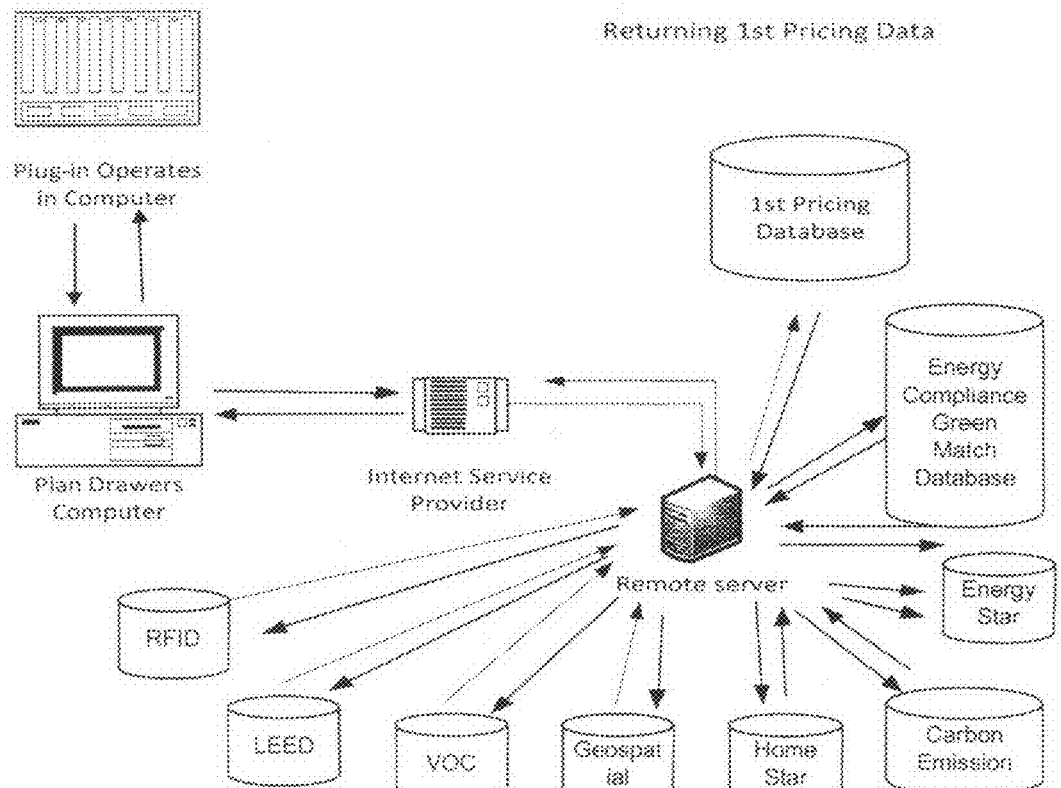
FIG. 38 shows a flow chart that is similar to the flow chart shown in FIG. 36, with the exceptions that: (i) it does not include a separate communication module; and (ii) the "green" data and/or information (energy compliance (green match), Energy Star, carbon emission, Home Star, geospatial, VOC, LEED, RFID and the like) is procured using a remote server system that accesses a plurality of separate databases. The databases can be connected directly to the remote server or the remote server can access additional remote servers which provide the "green" data and/or information.
Figure 39:
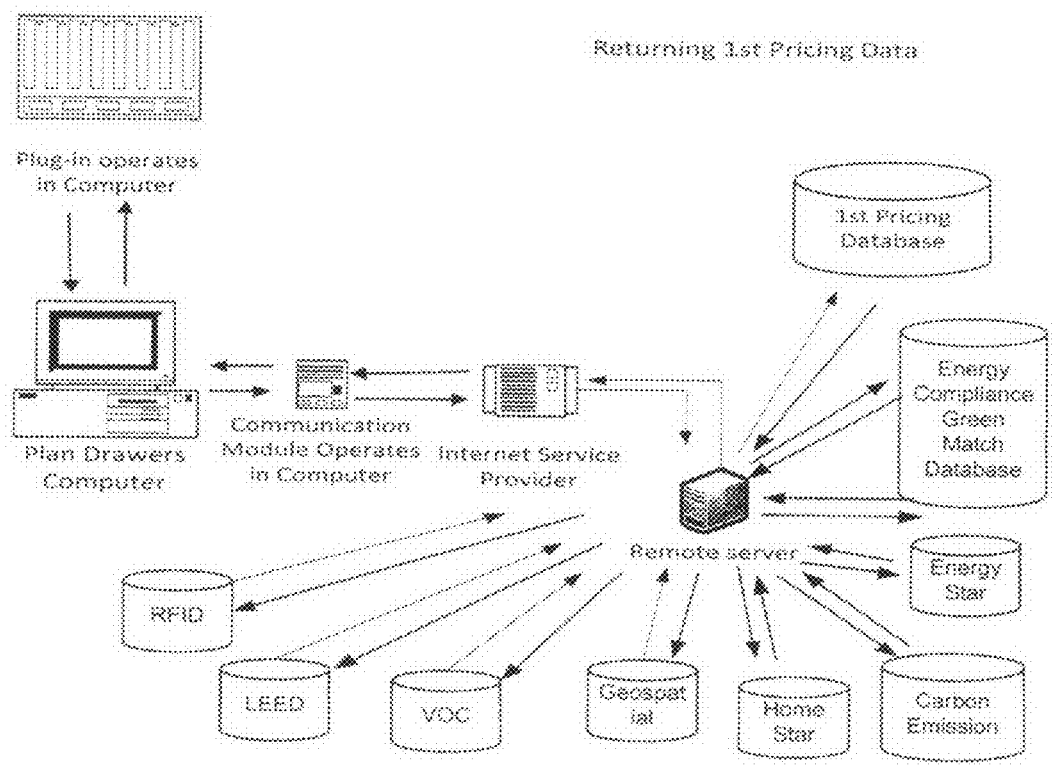
FIG. 39 shows a similar flow chart as FIG. 38, with the exception that it additionally includes a separate communication module that operates in a user's computer or console.
Figure 40:
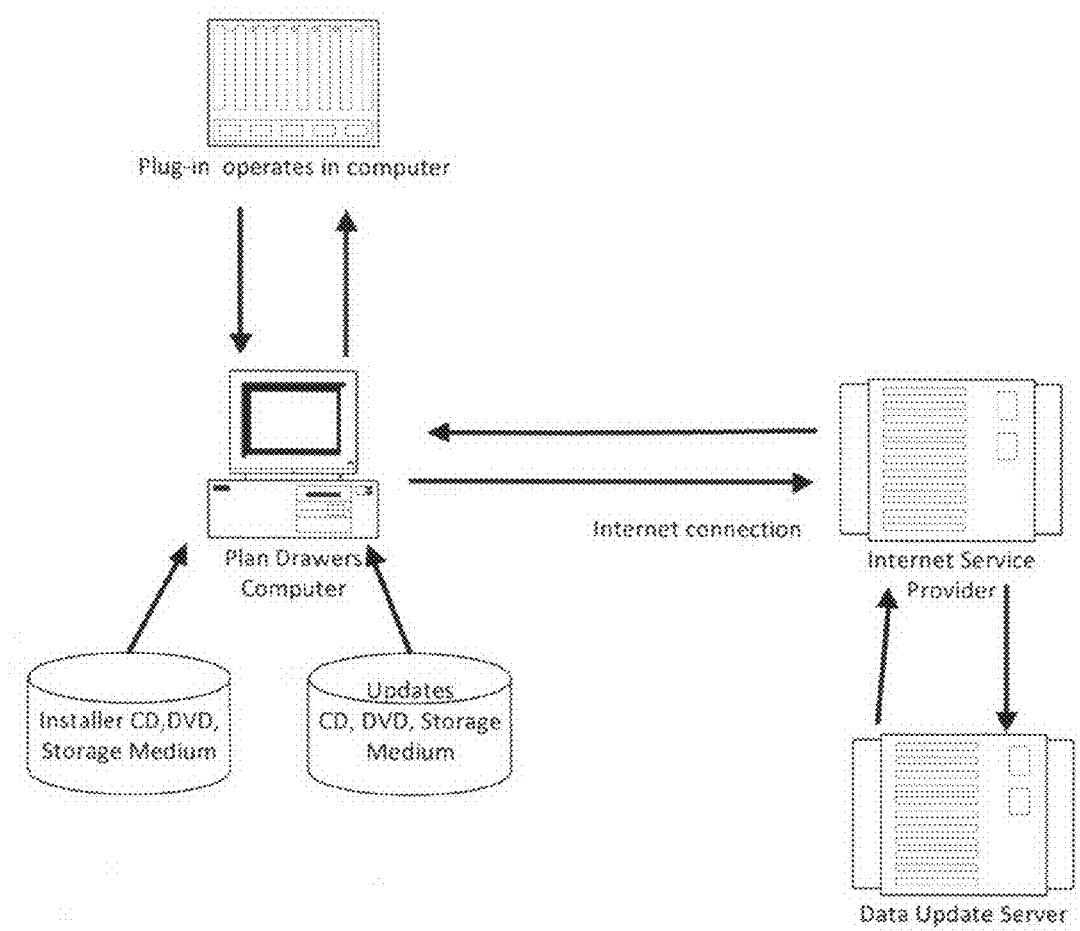
FIG. 40 shows a flow chart that is similar to the flow chart shown in FIG. 35, with the exceptions that: (i) the database(s), which include pricing, "green" and/or other data and/or information, is present on a physical storage medium (CD, DVD, thumb drive, tape drive and/or the like); (ii) the system does not include a communication module; (iii) the system includes a remote data update server that updates the pricing, "green" and/or other database(s) across the Internet with more current pricing, "green" and/or other data and/or information (in comparison with previously-existing data and/or information), which may be used by the plug-in computer software code periodically (at any desired or required time interval, such as daily, bi-weekly, weekly, bi-monthly, monthly, bi-annually, annually and/or the like) or upon demand of a user (i.e., at any time and/or date); and (iv) the system includes a computer software update database installer program to install database updates or database update systems from, for example, a physical storage medium (CD, DVD, thumb drive, tape drive and/or the like).
Figure 41:
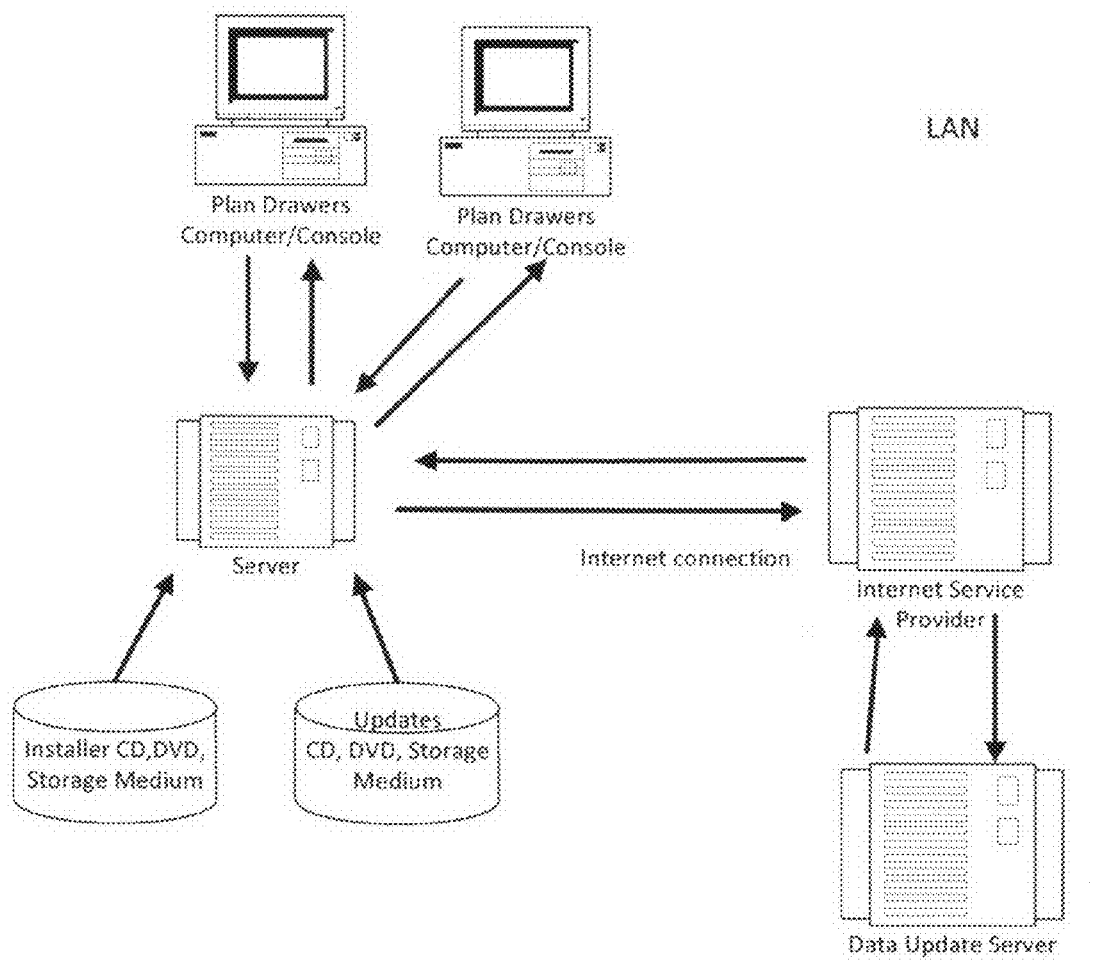
FIG. 41 shows a flow chart that is similar to the flow chart shown in FIG. 40, with the exceptions that: (i) the system illustrated includes a plurality of plan drawer (or other user) computers: (ii) the plurality of plan drawer computers each include a console; (iii) no 1st Pricing plug-in computer software code is present separately; (iv) a local server is present; and (v) the system is present in a local area network (LAN).
Figure 42:
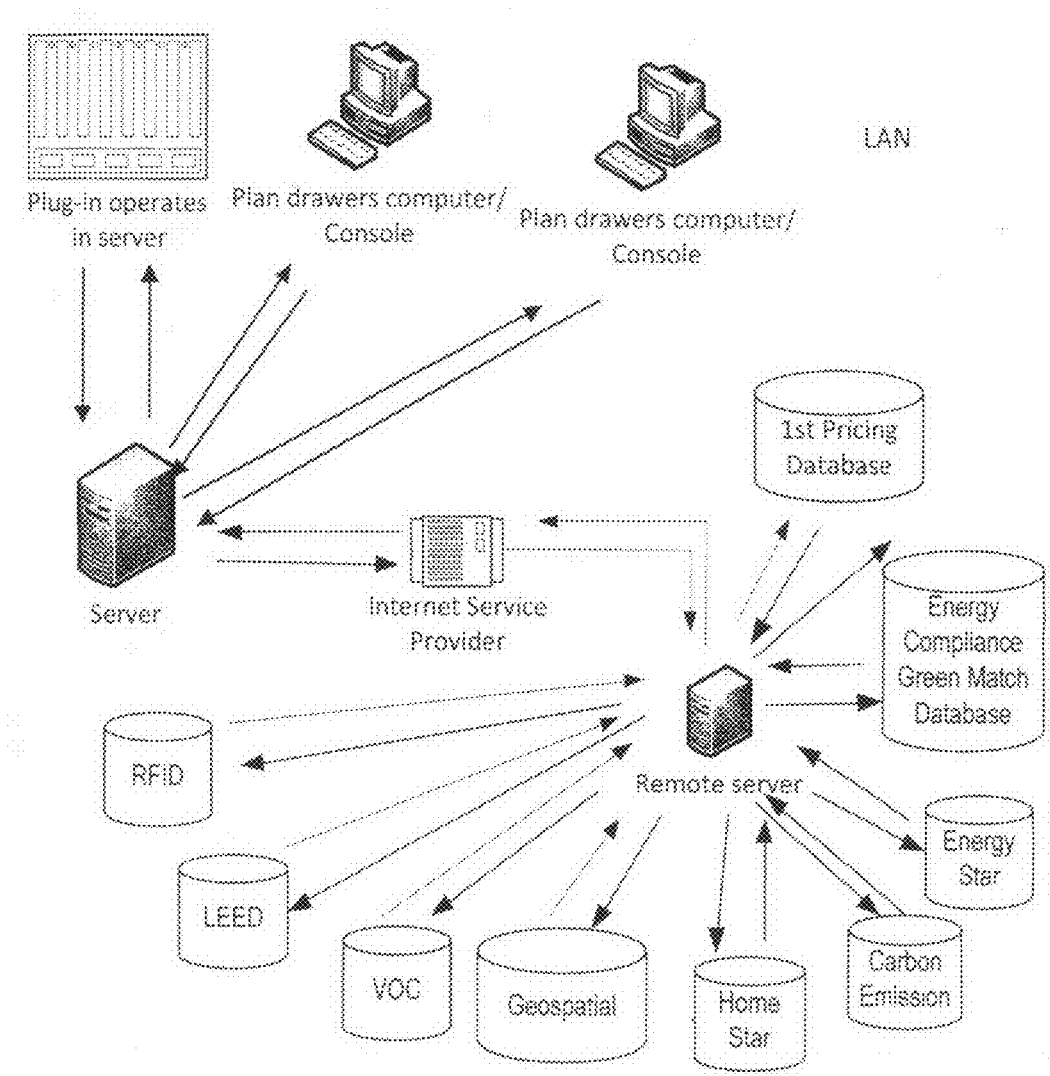
FIG. 42 shows a flow chart that is similar to the flow chart that is shown in FIG. 38, with the exceptions that: (i) the system illustrated includes a plurality (two) of local plan drawer (or other user) computers: (ii) the plurality of plan drawer (or other user) computers each include a console; (iii) the plug-in computer software code operates in a local server (rather than in a user's computer/console); (iv) the system is present, and operates, in a local area network (LAN); and (v) the system does not include a separate communication module.
Figure 43:
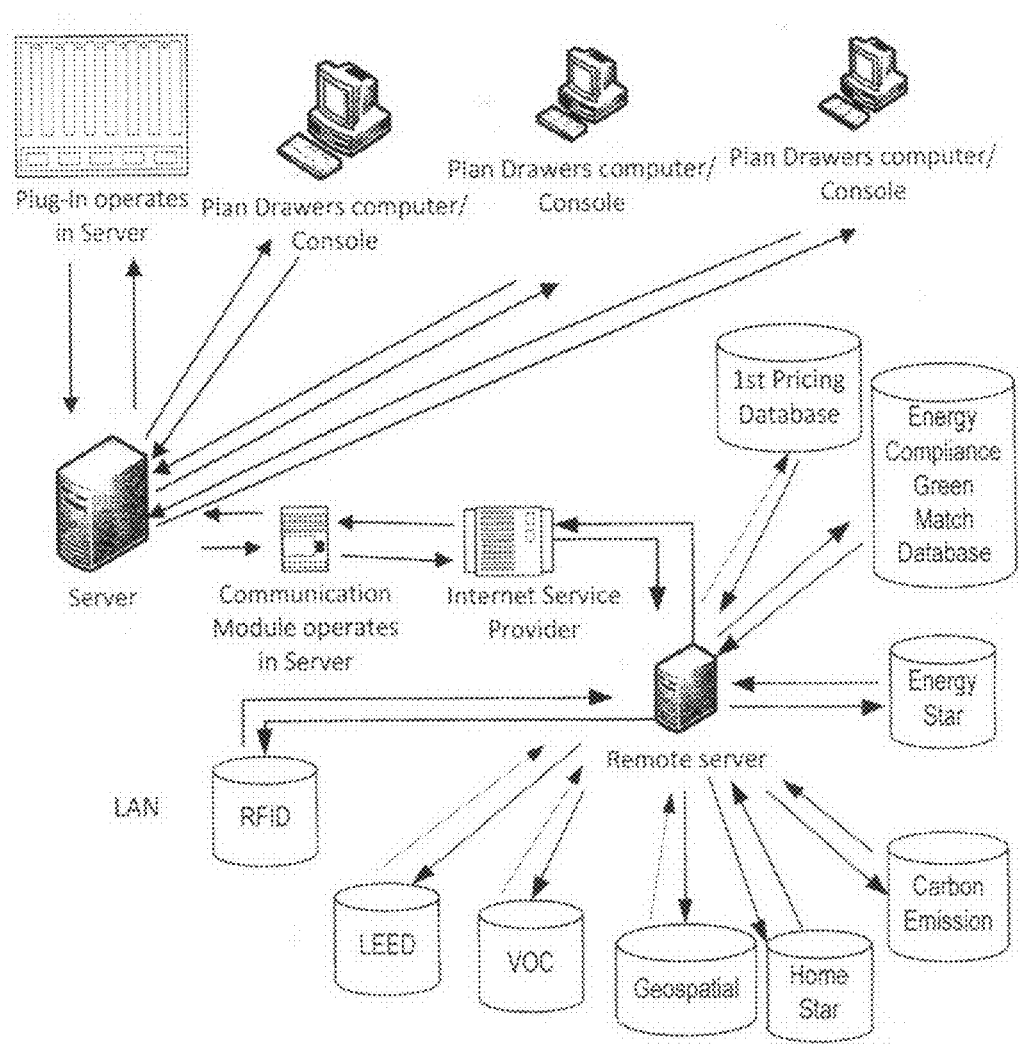
FIG. 43 shows a flow chart that is similar to the flow chart shown in FIG. 42, with the exceptions that: (i) the system illustrated additionally includes a communication module that operates in the local server; and (ii) three, rather than two, local plan drawer computers/consoles are shown. This system is also present in a local area network (LAN), and the pricing, "green" and/or other data and/or information is procured using a remote server system that accesses one or a plurality of separate local and/or remote databases, which can be connected directly to the remote server, or the remote server can access additional remote servers which provide the data and/or information.
Figure 44:
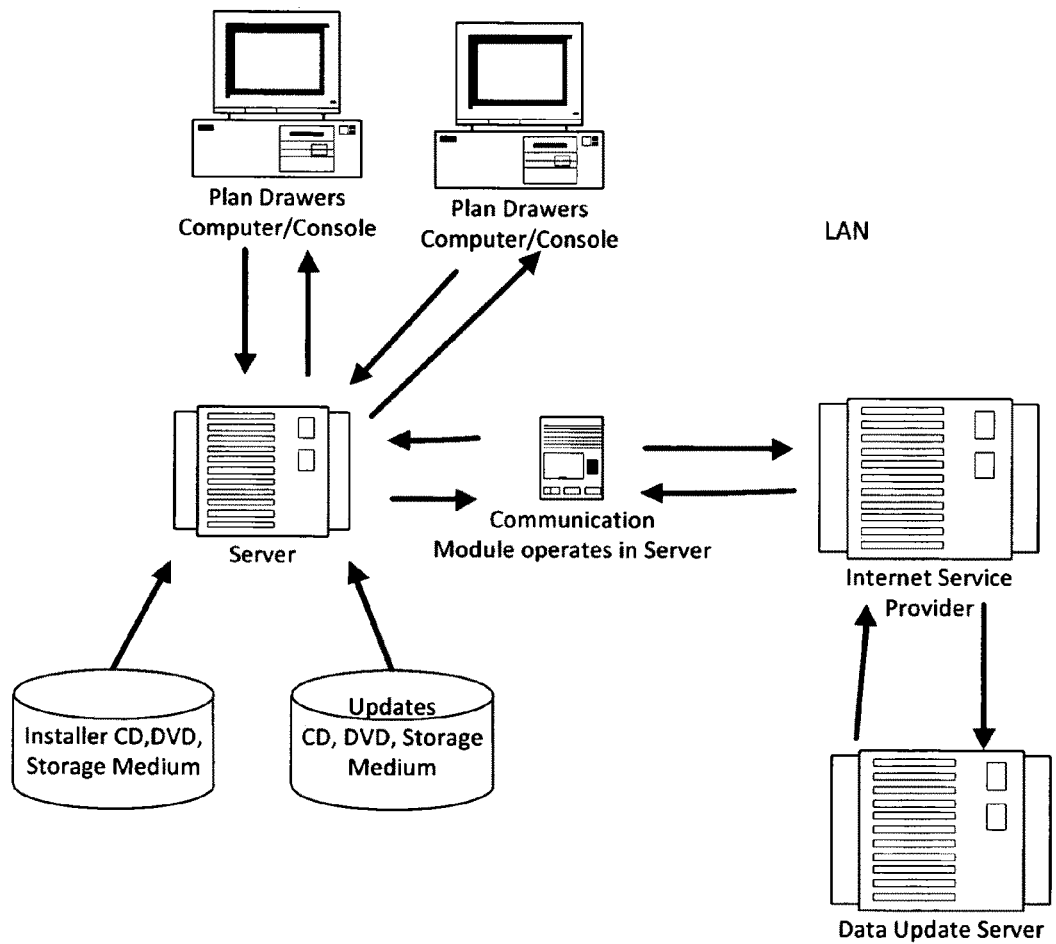
FIG. 44 shows the same flow chart as FIG. 41, with the exception that the system additionally includes a communication module (with the communication module software code operating in a local server). The communication module may update the databases across the Internet with more current pricing, "green" and/or other data and/or information; and/or from one or a plurality of physical storage media (CD, DVD, thumb drive, tape drive and/or the like).
Figure 45:
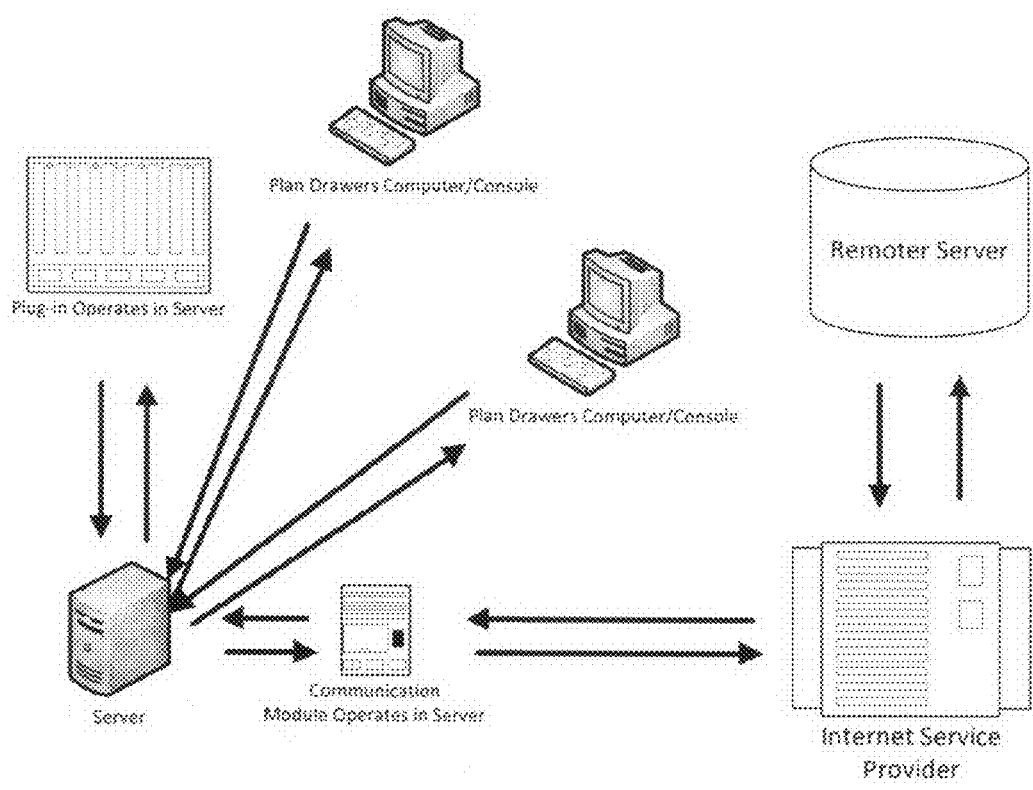
FIG. 45 shows a flow chart that is similar to the flow chart shown in FIG. 42, with the exception that the remote server does not accesses a plurality of separate databases but, rather, only accesses pricing data and/or information (i.e., not "green" data and/or information).
Figure 46:
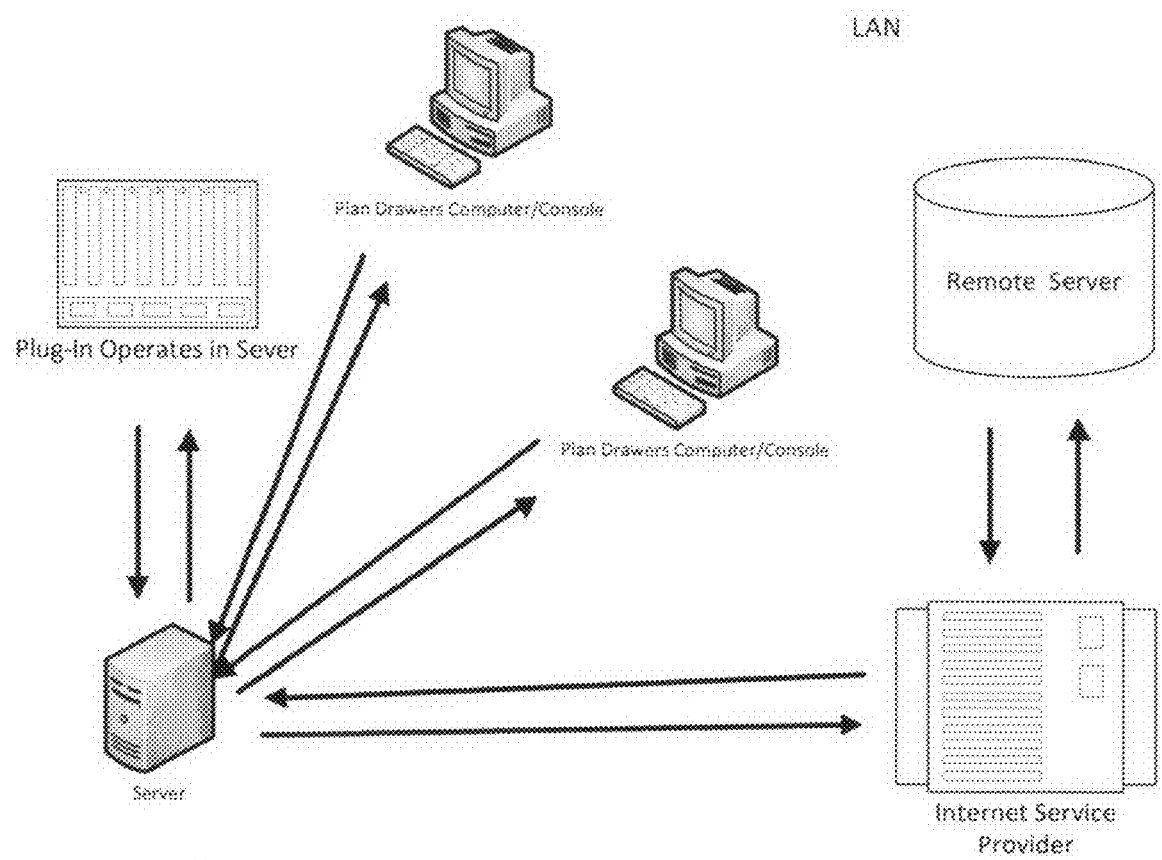
FIG. 46 shows the same flow chart as FIG. 45, with the exception that it does not include a communication module. One or a plurality of the plan drawer's computers/consoles requests pricing, "green" and/or other data and/or information from the plug-in computer software code (operating in a local server), and the plug-in computer software code requests the pricing and/or other data and/or information from the remote server, which accesses one or a plurality of local and/or remote databases including pricing, "green" and/or other information. The remote server sends the pricing, "green" and/or other data and/or information procured from the database(s) to the plug-in computer software code, and the plug-in computer software code sends the data and/or information to one or a plurality of the plan drawer's computers/consoles. This system also is present, and operates, in a LAN.
Figure 47:
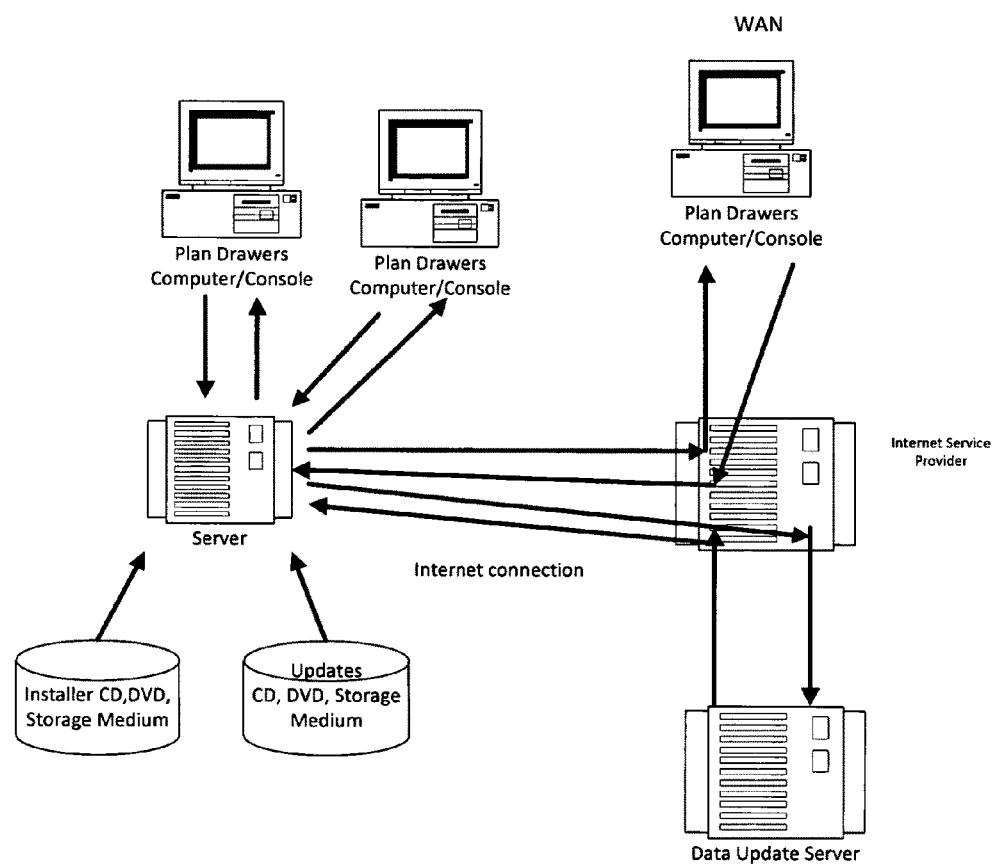
FIG. 47 shows the same flow chart as FIG. 41, with the exceptions that: (i) a remote third plan drawer's (or other user's) computer is shown; and (ii) the system is present in a wide area network (WAN), rather than in a LAN.
Figure 48:
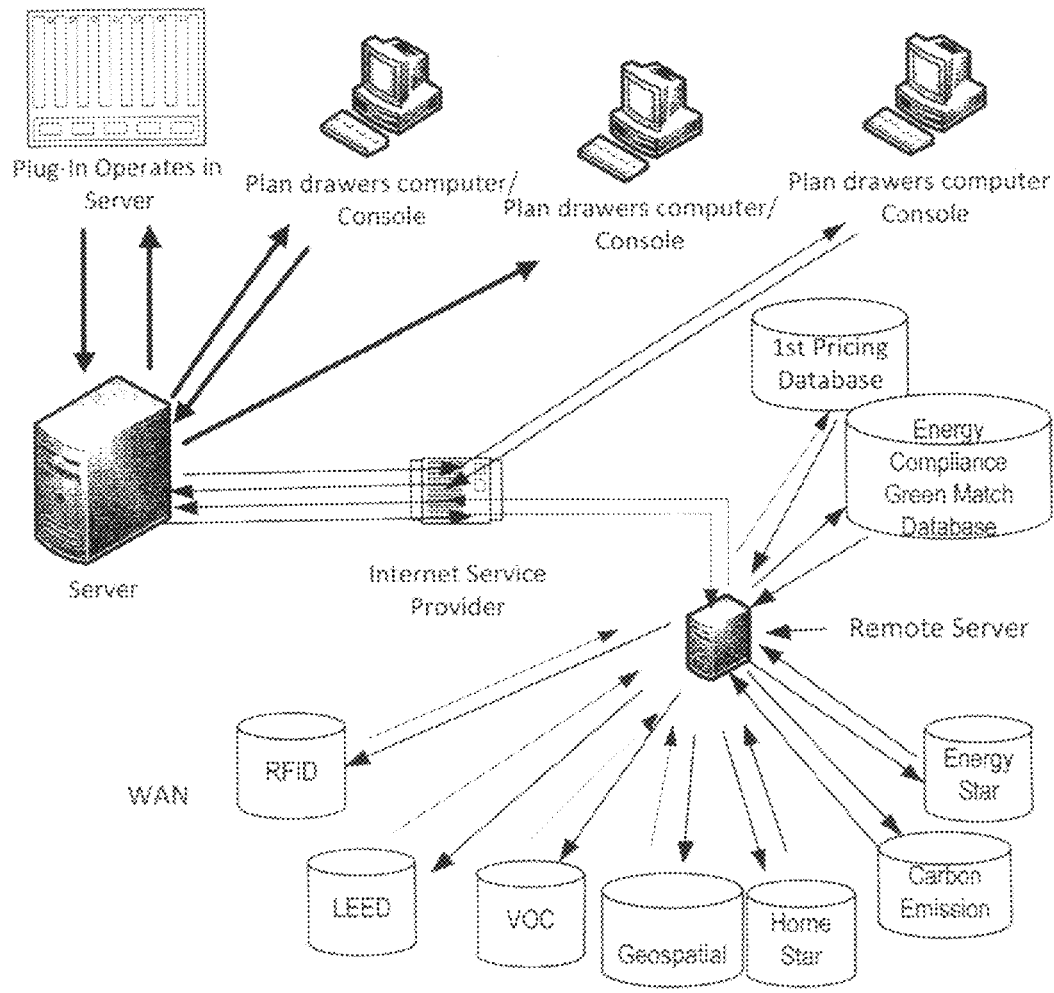
FIG. 48 shows the same flow chart as FIG. 42, with the exceptions that: (i) a remote third plan drawer's (or other user's) computer is shown; and (ii) the system is present in a wide area network (WAN), rather than in a LAN. The remote third plan drawer's computer/console (and optionally the first and/or second local plan drawer's computers/consoles) requests pricing, "green" and/or other data and/or information from the plug-in computer software code (operating in a local server) across the WAN, the plug-in computer software code requests the data and/or information from the remote server, and the remote server procures the data and/or information from one or a plurality of pricing, "green" and/or other databases. The remote server sends the data and/or information across the WAN to the plug-in computer software code (operating in the local server) and/or one or a plurality of the plan drawer's computers/consoles.
Figure 49:
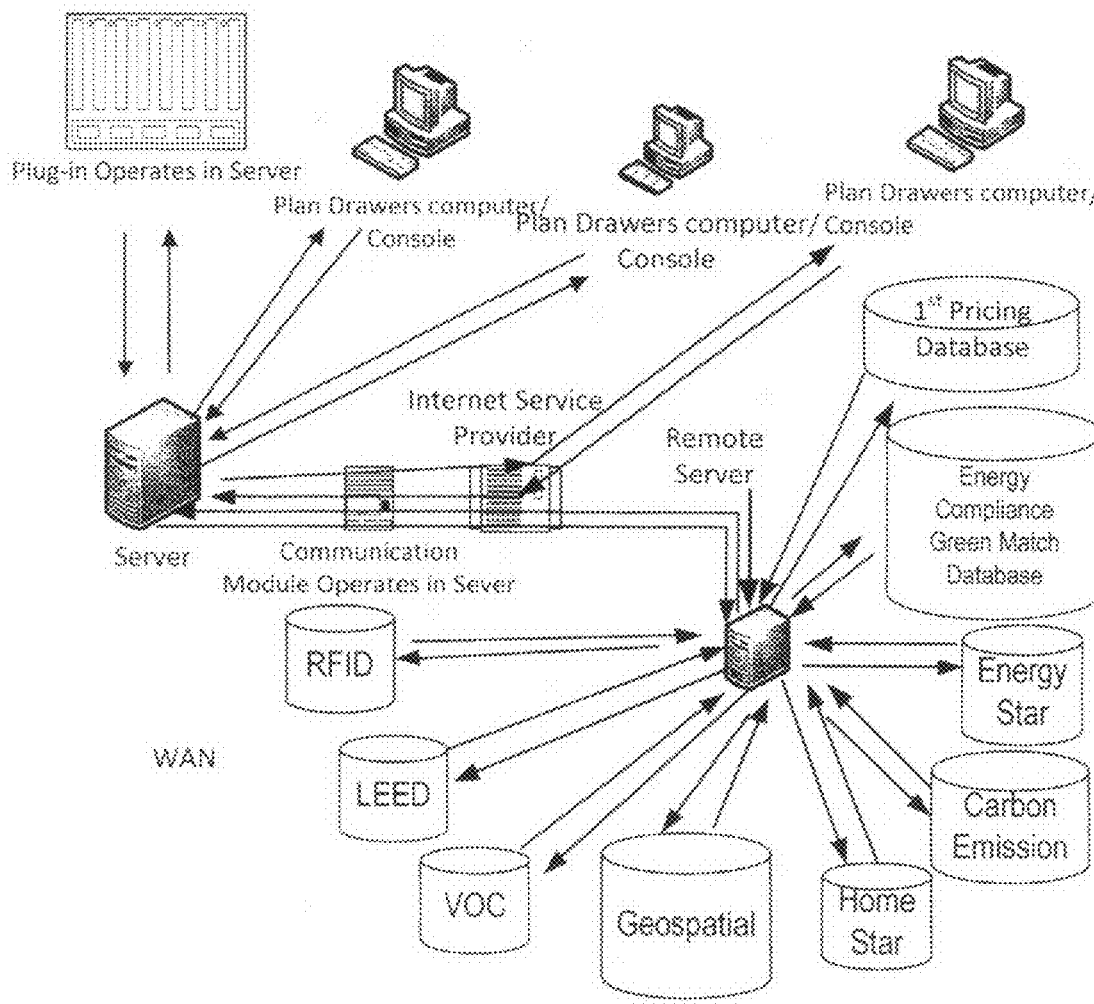
FIG. 49 shows a flow chart that is similar to the flow chart shown in FIG. 48, with the exception that it additionally includes a communication module that operates in the local server. The third remote plan drawer's (or other user's) computer/console (and optionally the plan drawer's first and/or second local computers/consoles) requests pricing, "green" and/or other data and/or information from the plug-in computer software code (operating in a local server) across the WAN, the plug-in computer software code requests the data and/or information from the communication module, and the communication module requests the data and/or information from the remote server, which procures it from one or a plurality of local and/or remote databases. The remote server sends the data and/or information to the communication module, the communication module sends the data and/or information to the plug-in computer software code, and the plug-in computer software code sends the data and/or information to the third remote plan drawers computer/console across the WAN (and optionally to one or both of the local computers/consoles).
Figure 50:
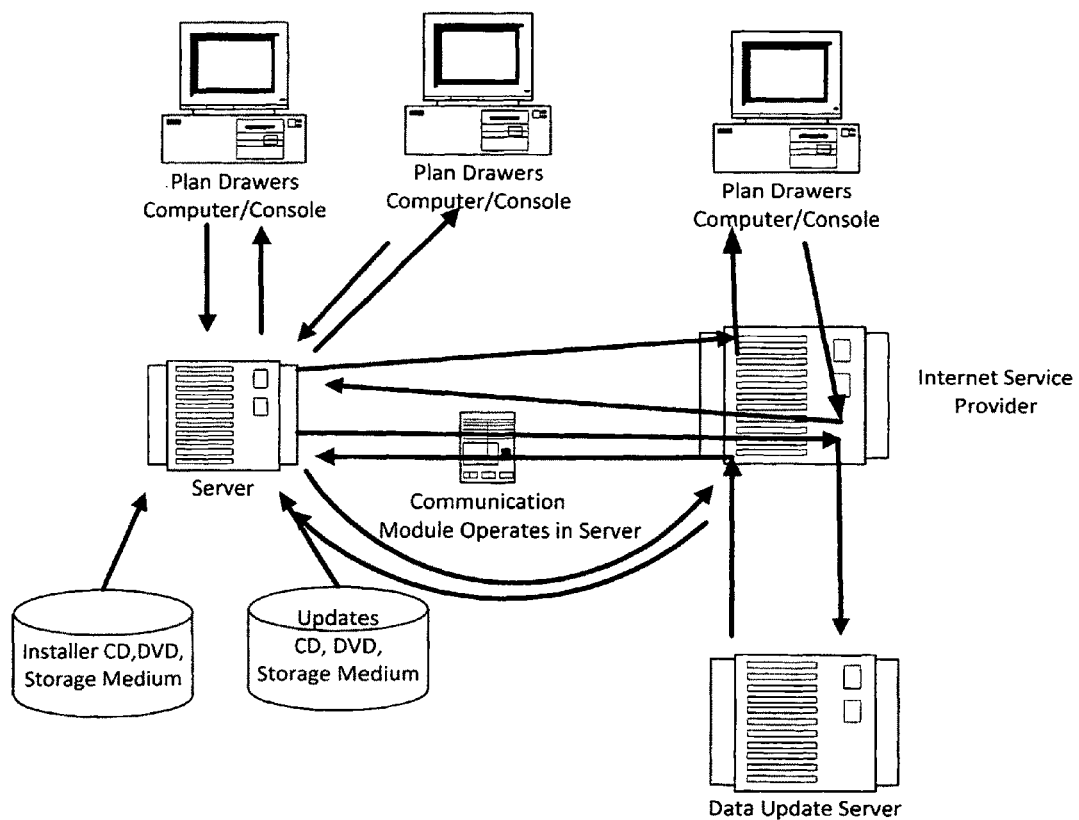
FIG. 50 shows the same flow chart as FIG. 47, with the exception that it additionally includes a communication module. The remote third plan drawer's (or other user's) computer/console (and optionally the plan drawer's first and/or second local computers/consoles) requests updated pricing, "green" and/or other data and/or information from the plug-in computer software code (operating in a local server) across the WAN, the plug-in computer software code requests the updated data and/or information from the communications module, and the communication module requests the updated data and/or information from the remote data update server. The remote data update server sends the updated data and/or information to the communications module, the communication module sends the updated data and/or information to the plug-in computer software code; and the plug-in computer software code stores the updated data and/or information to one or a plurality of physical storage media, the local server and/or on one or a plurality of the three plan drawer's computers/consoles across the WAN.
Figure 51:
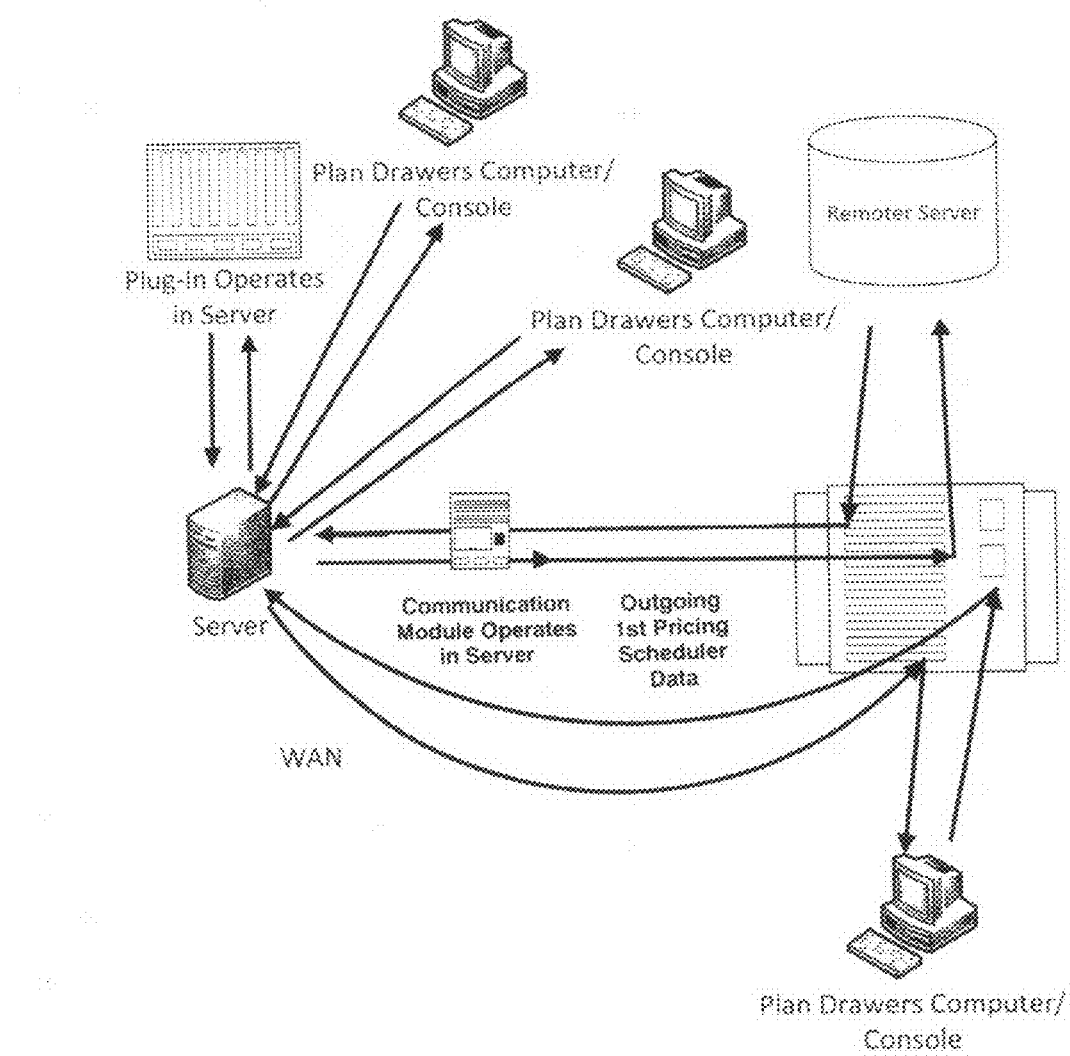
FIG. 51 shows the same flow chart as FIG. 45 with the exceptions that: (i) the system includes three, rather than two, plan drawer (or other user) computers, with one being remote and two being local; and (ii) the system is present in a wide area network (WAN), rather than in a LAN. The plan drawer's remote third computer/console (and optionally the local first and/or second computers/consoles) requests pricing and/or other data and/or information from the plug-in computer software code (operating in a local server) across the WAN, the plug-in computer software code requests the data and/or information from the communication module, the communication module requests the data and/or information from the remote server, which procures the data and/or information from one or a plurality of local and/or remote databases. The remote server sends the data and/or information to the communication module, the communication module sends the data and/or information back to the plug-in computer software code, and the plug-in computer software code sends the data and/or information to the third remote plan drawers computer/console (and optionally to the first and/or second local computers/consoles) across the WAN.
Figure 52:
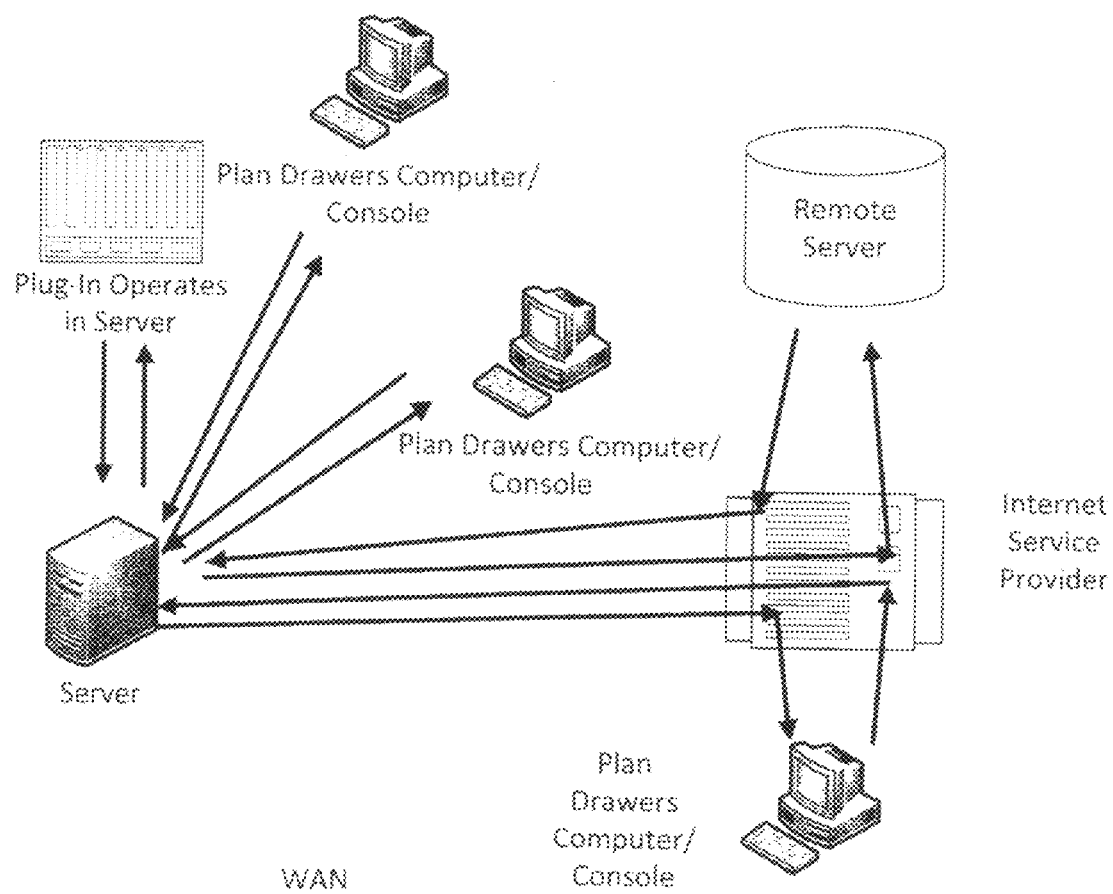
FIG. 52 shows the same flow chart as FIG. 51, with the exception that it does not include a communication module. The third remote plan drawer's (or other user's) computer/console (and optionally the local first and/or second computers/consoles) request pricing, "green" and/or other data and/or information from the plug-in computer software code (operating in a local server) across the WAN, and the plug-in computer software code requests the data and/or information from the remote server. The remote server sends the data and/or information to the plug-in computer software code, and the plug-in computer software code sends the data and/or information to the remote third plan drawer's computer/console (and optionally to the local first and/or second computers/consoles) across the WAN.

"Create" and "Update" Parametric Symbol Schedule Buttons—FIGS. 20 and 37

If no optional parametric symbol schedule yet exists, the user will preferably see a "Create" button, which is preferably located in the "Symbols Palette" (FIG. 3). Clicking on this "Create" button will preferably open a "1stPricing" schedule dialog (or a similar type of a dialog), as is shown in FIG. 20 and FIG. 37, which preferably includes a "Generate" and a "Cancel" button. This "1stPricing" schedule dialog is generally used to generate a parametric symbol schedule that is based upon the parametric symbols, and their corresponding characteristics, that may optionally have been inserted into the construction plans, and that may include pricing data and/or "green" statements and/or indications (FIG. 37). This "1stPricing" dialog also preferably prompts the user to input the size of font to be used in the parametric symbol schedule for ease of reading the schedule. The size of the parametric symbol schedule that is generated generally depends upon the font size used, as well as upon the scale settings that are set by the plan drawer in architectural CAD (or in another software design tool). Thus, to create a parametric symbol schedule, generally the "Create" button is clicked, a schedule font height is typed in, and the "Generate" button is clicked. A parametric symbol schedule will typically then be created, which contains pricing date (FIG. 20) and/or "green" data (FIG. 37), and possibly other types of data and/or information. The programming of the optional communication module, at the 1stPricing web site or 1stWindows web site (or at similar types of web sites) generally knows if a user is attempting to procure pricing information, "green" data or both in connection with inserted or other parametric symbols and/or construction plan elements (i.e., this can be determined from tags that are put into the code when it comes from the plan drawer or other user). The parametric symbol schedule (including a pricing schedule, "green" schedule, or both, or the like) can then optionally be inserted directly into the construction plans by the plug-in (add-on) computer software code.

If, on the other hand, a parametric symbol schedule already exists, the user will preferably see a different button on the "Symbols Palette" (FIG. 3) that is preferably labeled "Update," instead of "Create," as well as a button preferably labeled "Export Schedule." Using the "Update" button will generally have the effect of changing the parametric symbol or construction plan element schedule according to parametric symbol or construction plan element changes that may have been made by the user since the creation of the parametric symbol schedule, for example, to change the selected size of a window, or since its last update. In all other respects, this procedure preferably is generally the same as using the "Create" button. If the user clicks the "Export Schedule" button (FIG. 3), the user is then preferably asked the file format of the database that the user intends to use (Excel, Plain Text, Word, PDF and/or the like), and where to save the parametric symbol schedule file on the user's computer.

When an optional parametric symbol schedule is generated, all of the schedule information is preferably saved at the online 1stPricing or other designated web site, and can be accessed by the user using the plans' 1$^{st}$ Pricing Reference Number generated by the plug-in (add-on) computer software code. When a user session is enabled, and there is an open Internet or other connection, a "Reference Number" is preferably appended to the parametric symbol schedule. Preferably, this number can be used to retrieve the parametric symbol schedule at the online 1stPricing or other designated web site.

Some construction (or other) products may not be available in an area designated by a ZIP code that is entered by a user. In such an instance, pricing is not always listed for all of the parametric symbols that are inserted into the construction plans, and a "N/A" (not applicable) (or similar) designation is preferably placed into the optional parametric symbol or price schedule in place of a price.

"View Schedule" Button

Clicking a "View Schedule" (or similar type of a) button on the Symbols Palette (FIG. 3) will typically zoom to the part of the architectural CAD (or other software design tool) drawing of the construction plans where the optional parametric symbol (or pricing and/or "green") schedule has been inserted. If one or more parametric symbols have been altered without updating the parametric symbol (or pricing and/or "green") schedule, a message will preferably be appended to the schedule that reads the same as, or similar to, the following: "Schedule may not reflect the window specifications." (If windows are not involved, the message will preferably refer to the particular type of parametric symbols, objects and/or construction plan elements that are involved, such as doors, acrylic glass blocks, cabinets, drywall and/or the like.)

Figure 21:
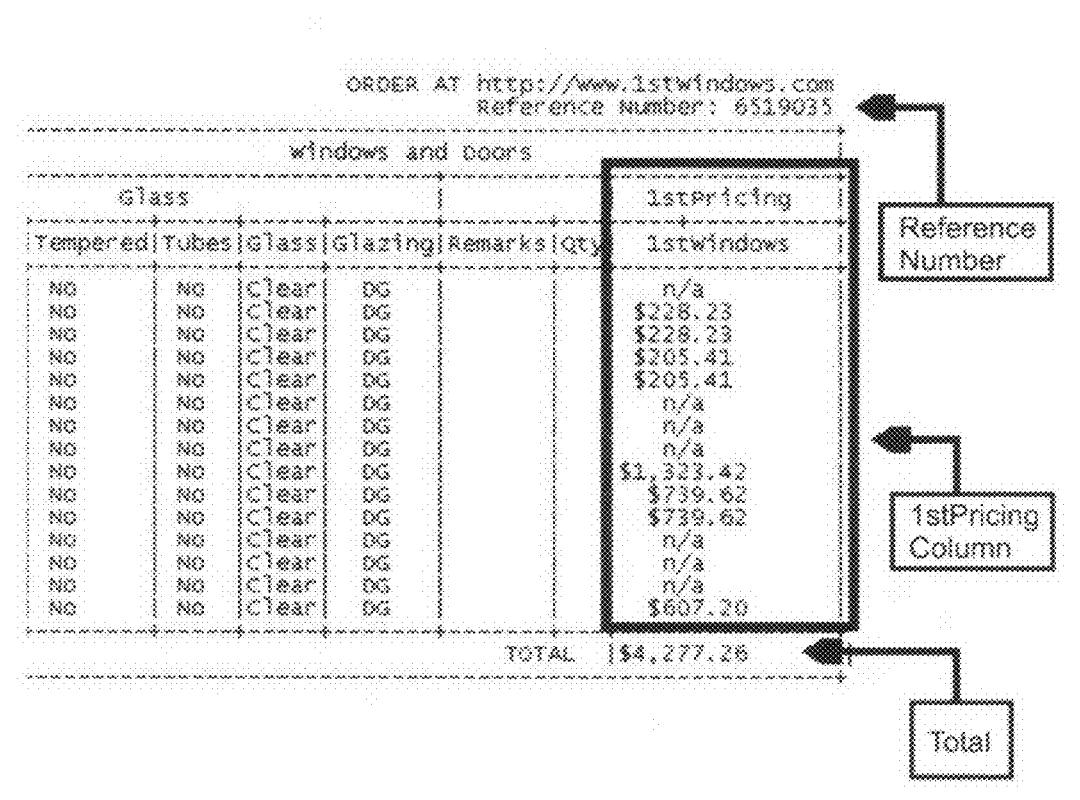

The Schedule—FIGS. 21 and 37

In a resulting price schedule (FIG. 21 and FIG. 37), unique parametric symbols and/or construction plan elements, such as windows, doors, skylights, cabinets, acrylic block and/or the like, are preferably listed vertically. Details (characteristics) for one or more, or each, parametric symbol and/or construction plan element are preferably organized horizontally under the following (or similar types of) columns: Symbol, Location, Width, Height, Handing, Color, Type, Material, Grid Style, Low E, Argon Gas, Tempered, Breather Tubes, Glass, Glazing, Remarks, Quantity and Pricing from at least one Manufacturer or Distributor (or other third party or entity). The same is generally the case with a resulting "green" schedule (FIG. 37).

Figure 22:
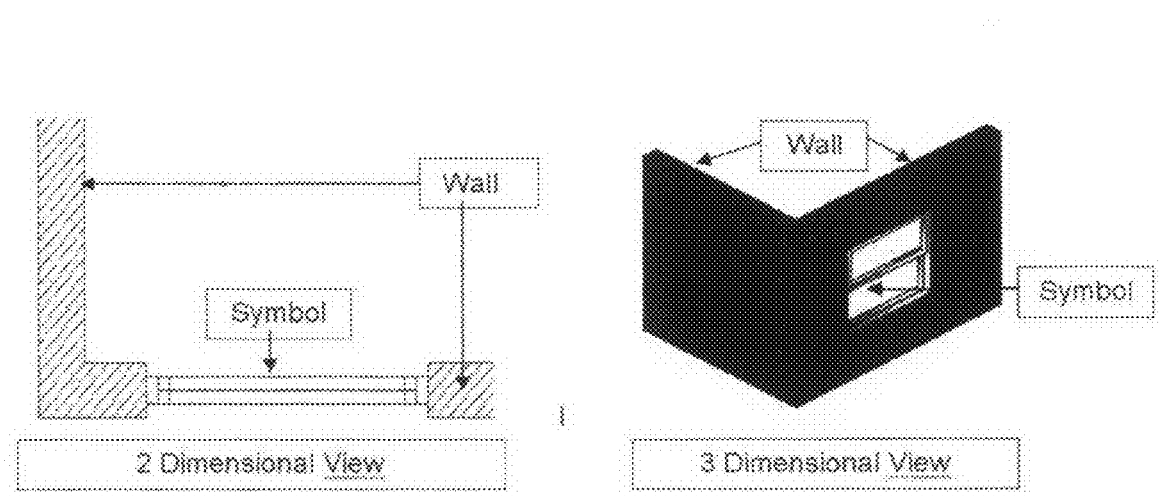
FIG. 22 shows in an architectural CAD "Wall Tools" feature, parametric symbols that are embedded into walls of a structure in accordance with embodiments within the present invention.

Interaction of Parametric Symbols with CAD Wall Tool—FIG. 22

Very advantageously, as a result of the plug-in (add-on) computer software code, the architectural parametric symbols and/or construction plan elements can optionally be made by the user to auto-imbed into one or more wall depictions that have been created with the architectural CAD (or other software design tool) computer program, particularly its "Wall Tool," as is shown in the two-dimensional and three-dimensional depictions that are present in FIG. 22. A parametric symbol and/or construction plan element can optionally be moved from the Symbols Pallet into a selected wall, for example, into a wall in a master bedroom of a house, or into a wall in an office of a commercial building. To insert a parametric symbol and/or construction plan element into a particular wall, the particular parametric symbol is preferably dragged and dropped to the desired wall location, and then entry is preferably made of the specific parameters that make up the parametric symbol and/or construction plan element into the construction plans at the site of the desired wall. The properties of the parametric symbols and/or construction plan elements can preferably be modified using the Properties Dialog, as is necessary or desired, and as is described hereinabove. Afterwards, the user preferably clicks "OK." The parametric symbol and/or construction plan element will typically automatically, properly and almost instantaneously align with the wall and auto-embed itself into the wall, thereby, permitting the user to see how the parametric symbol and/or construction plan element will look in the wall, or in a room that contains the wall. Appropriate cutouts for the parametric symbol and/or construction plan element are preferably made in the wall, and the wall will preferably then typically "heal" around the parametric symbol and/or construction plan element.

Online, Offline and Other Operations

A wide variety of numerous different embodiments of the systems and methods of the present invention that can be employed to automatically procure pricing and/or "green" data and/or information for one or a plurality of construction plan (or other) elements (or parametric symbols corresponding to construction plan elements) are illustrated in detail in FIGS. 23-52. These various embodiments may or may not employ an Intranet or the Internet, and may or may not include one or a plurality of local and/or remote computers, consoles, server systems, communication modules, databases, physical storage mediums (CDs, DVDs, hard drives, thumb drives, tape drives and/or the like), data update servers, networks (LAN, WAN, CAN, SAN, MAP, PAN, VPN and/or the like), installer programs and/or the like. From the detailed information and numerous illustrations that are included herein, those having ordinary skill in the art will recognize that many other embodiments of the systems and methods of the present invention also exist, which are fully included within these systems and methods.

Procuring Price and/or "Green" Information—FIGS. 23, 24, 25, 26

Figure 23:
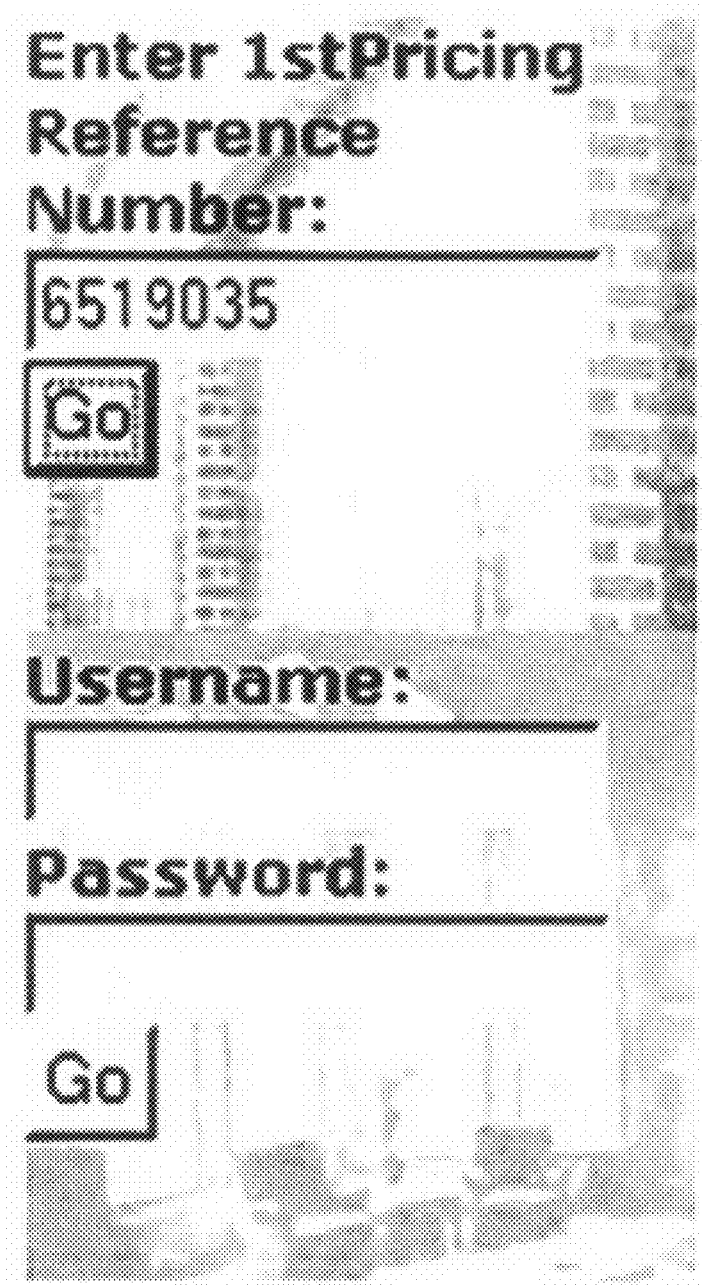
FIG. 23 shows a login screen in accordance with the plug-in (add-on) computer software code of the present invention in which a Reference Number may be inserted, which insertion has the effect of automatically logging a user onto the 1stPricing or 1stWindows (or other) online database, which provides pricing information for selected parametric symbols (construction elements).
Figure 25:
FIG. 25 shows an exemplary price quote that is generated by the 1stPricing or 1stWindows (or other) online or offline database in accordance with the present invention.

As is shown in FIG. 23, the "Reference Number" listed on a 1stPricing Scheduler, such as 6519035, is the name of a price schedule and/or "green" schedule. A Reference Number may be used on the online 1stPricing or other designated web site, or in connection with another online or offline database, to access pricing data and/or information and/or "green" statements and/or indications for one or a plurality of construction plan (or other) elements and/or that correspond to a particular parametric symbol schedule. Using the Reference Number will generally automatically log a user onto this web site. Price schedules and "green" schedules may also be reviewed by logging onto the online 1stPricing or other designated web site, or into one or a plurality of other databases, by entering the 1$^{st}$Pricing Reference Number and then clicking "Go." Once a pricing schedule and, optionally, a "green" schedule has been displayed, the user may select the type of window, acrylic block, door and/or other type of manufacturer, distributor or other third party or entity that it would like to receive a price quote (an actual price, an average cost, another type of desired cost and/or the like) from, as is shown in FIG. 24. A price schedule and, optionally, a "green" schedule will typically be presented to the user when the user selects type and "Continue," as is shown in the example that is illustrated in FIG. 25. The user may also access pricing schedules and/or "green" schedules by entering the User ID and Password that was created for the user during registration, as is described hereinabove. This will preferably provide access to the "My Account" area of this web site. The user's account will preferably contain all of the parametric symbol, price schedules and "green" schedules that have been generated by the registered user. By selecting "View" (or similar button) of the desired price schedule and/or "green" schedule, the user can preferably access the pricing data and/or information and/or "green" statements and/or indications.

If a price schedule and/or "green" schedule needs to be changed, the user can preferably click the "Alter Quote" button (or a similar type of button), as is shown in FIG. 26, and change the size and/or options for any or all of the products specified in the price schedule and/or "green" schedule.

Figure 27:
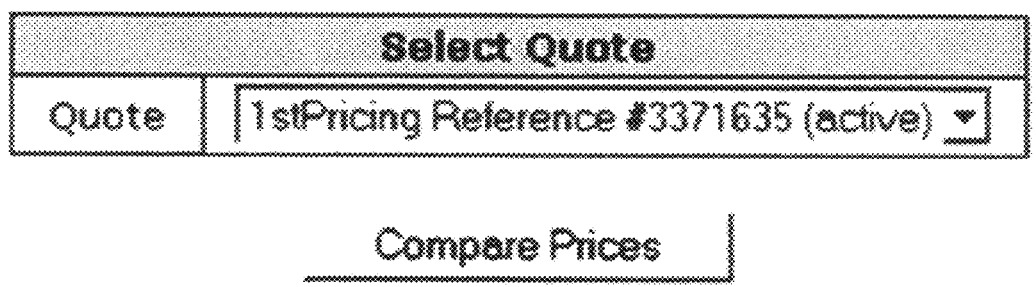
FIG. 27 shows a comparison pricing dialog in the 1stPricing or 1stWindows (or other) online or offline database of the present invention that appears when the user clicks on "Compare Prices" in the price quote shown in FIG. 26, and that permits the user to select a particular quote for which comparison pricing for a parametric symbol (construction element) between available manufacturers or distributors (or others) within, or outside of, a selected zip code will be generated.
Figure 28:
FIG. 28 shows a comparison price quote generated by the 1stPricing or 1stWindows (or other) online or offline database in accordance with the present invention when the user clicks on "Compare Prices" in the comparison pricing dialog that is shown in FIG. 26, with five different prices being shown for five different patio door manufacturers in connection with a vinyl sliding patio door having specified features and a specified size.

Comparison Shopping Among Different Manufacturers/Distributors—FIGS. 27 and 28

A tremendous advantage of the systems and methods of the present invention is an extended option that is present in the online 1stPricing or other designated web site, or that may be employed with one or a plurality of other databases, that permits a user to almost instantaneously (generally within no more than about five seconds, and usually at least within about the same day) comparison shop for price quotes tailored to a particular construction (or other) plan element schedule or parametric symbol schedule among two, three, four, five or even ten or more different window, acrylic glass block, door, sky light and/or other manufacturers and/or distributors (or others) that manufacture and/or distribute (or otherwise provide) corresponding construction products within the zip code selected by the user, or nationally or within some other region or area, as is discussed hereinabove, or from other third parties or entities. This feature very advantageously generally permits the user to determine the most competitive or "best" "real time" price for each of the different construction (or other) plan elements and/or parametric symbols that are preferably described in the price schedule, which can potentially provide a user with a huge savings of money and/or energy (and associated costs), as well as time spent comparison shopping, and to see a side-by-side comparison of pricing provided by competing manufacturers and/or distributors (or other third parties or entities) in all states throughout the United States, in other U.S. or foreign regions or areas, or nationally (i.e., "buy-it-now" pricing at the time of request by the user). The "best" price is generally a final price that the user can rely on, and that will typically not change (unless the user makes changes to one or more construction plan elements and/or parametric symbols), which is in stark contrast to an "estimate." As is known by those having ordinary skill in the art, a "price" is an assigned amount of money that is required to be paid in order to make a purchase, and an "estimate," in stark contrast, is a rough calculation, an approximation, a judgment or an opinion.

As is shown in FIG. 27, a user can generally generate a comparison of pricing between available manufacturers/distributors (or other third parties or entities) by clicking on "Compare Prices" in the "Comparison Pricing Palette." In addition to prices, manufacturer/distributor (or other third party or entity) information will generally also appear, such as the manufacturer's name, address, phone number, e-mail address and/or the like. For example, the construction product "1stWindows Vinyl Sliding Patio Door" having particular characteristics and configurations selected by a user is described in FIG. 28 (left side). The center and right portions of FIG. 28 show pricing for this particular construction product (patio door) within the zip code selected by the user by five different patio door manufacturers/distributors (1stWindows, International, Milgard, Summit and Superior). Because these prices for the exact same type of patio door, and "green" ratings and/or certifications, vary widely (from $506.51 at 1stWindows to $636.35 at Summit), this feature very advantageously permits the user to choose the patio door manufacturer/distributor for the construction project that has the most competitive or "best" pricing and a "green" certification. If the user desires to substitute another patio door manufacturer's/distributor's construction product, the user can simply click on the "Radio" button next to the desired price. The price schedule and "green" schedule will then generally be amended, and the newly selected patio door manufacturer's/distributor's product will then generally appear in the price schedule and "green" schedule.

The prices that are described herein are typically final prices that may be used to immediately purchase (on line, offline or otherwise) one or more construction (or other) plan elements that are present in a construction (or other) plan, such as a window and/or door. However, the prices may, alternatively, be average or any other types of desired prices within a particular zip code, foreign or U.S. region or area, or nationally. The online 1stPricing or other designated web site, or other databases, very advantageously permits architects, civil engineers, industrial engineers, builders, contractors, subcontractors and other users to rapidly create a precise bill of materials with multiple brands, distributors, manufacturers (or other third parties or entities), line item pricing, line item "green" statements and/or indications and online or offline purchasing.

Completing the Order and Purchasing the Products—FIGS. 29, 30, 31, 32 and 33

Figure 29:
Figure 30:
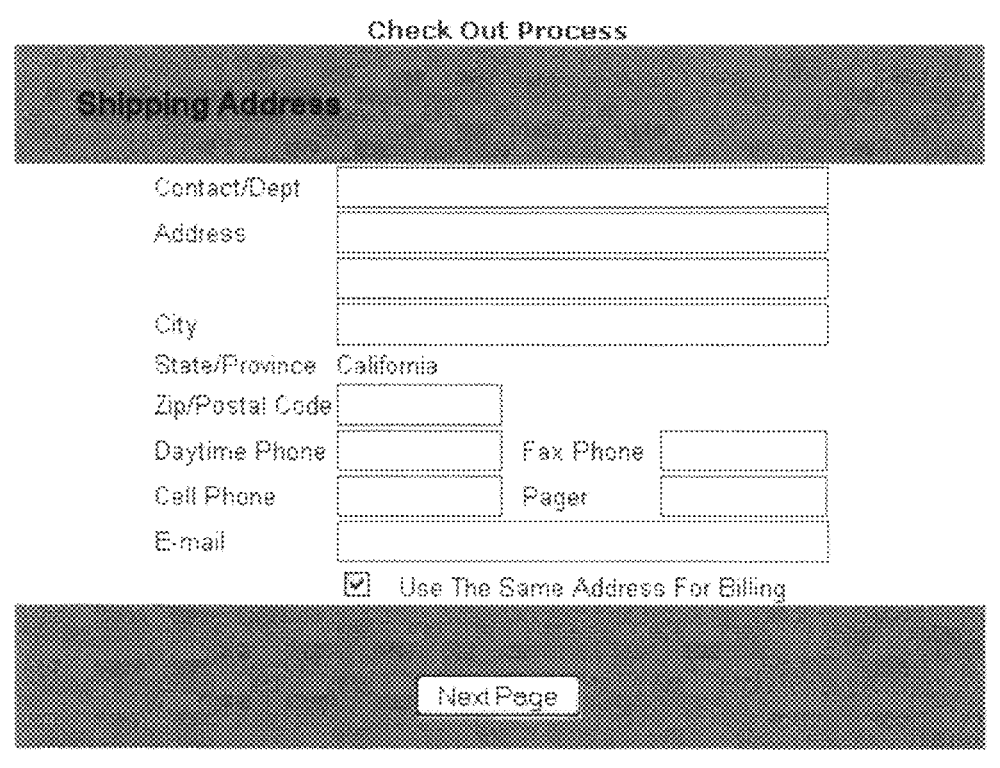

Once a price schedule and/or "green" schedule is completed and verified by the user, the user can generally proceed to a check out process to purchase the desired construction or other products, such as one or more windows, doors, acrylic glass blocks and/or sky lights. To begin the check out process, the user can click the "Check Out" button (or similar type of a button) preferably located in the "Check Out" window of the online 1stPricing or other designated web site (or otherwise). If the user either is not a registered user, or is a registered user, but is not logged into the suitable user account, in this embodiment (but possibly not in other embodiments), the user will generally be redirected to a page where the user is given the choice of "Sign Up," "Continue" or "Check Out," which is illustrated in FIG. 29. The user typically either logs in by inserting the user's User Name and password or, if not a member, just clicks the "Check Out" button (or a similar type of a button) preferably located at the bottom of a "Non-Member" column located on the Check Out page. In either case, a "Shipping Address" dialog is preferably displayed, as is shown in FIG. 30. The desired shipping information is entered by the user in the fields typically provided (address, city, state/province, zip postal code, daytime phone, cell phone, e-mail address, facsimile number, pager number and/or the like). If the "Ship to" address and billing address are the same, the user then typically clicks (checks) the "Use The Same Address For Billing" box (or a similar type of a box). If, however, a separate billing address is required, the user should leave that box unchecked. The user should then click on the "Next Page" button (or a similar type of a button), and a page will typically be provided on which the user can enter the correct billing address information. When completed, the user should again click on the "Next Page" button.

In a second step of the check out process, payment information is preferably entered in the fields of a dialog provided, as is shown in FIG. 31. The user should then read the "Terms and Conditions of Sales" policy that preferably appears, click the box next to the acceptance policy to check it, and click the "Next Page" button. The 1stPricing online or other designated web site (or other web site, provider, database and/or the like) preferably accepts American Express, Visa, MasterCard, Discover Card and other credit cards, and preferably all credit card information is transmitted to this web site or the like via a secure server or "pay on account" and "pay over the phone." The user should then click the "Next Page" button to proceed.

Figure 33:
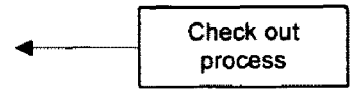

In a final step before placing an order, all of the inputted information will generally be displayed on the online 1stPricing or other designated web site (or offline or otherwise) in a dialog as is shown in FIG. 32, and should be reviewed closely by the user to ensure the accuracy of this information. Once finished, the user should click the "Submit Order" button (or a similar type of button), or if changes are needed or desired, the "Change Fields" button (or a similar type of button). The billing address input by the user preferably matches the billing address of the credit card employed in order to ensure a successful transaction. In this manner, the ordering process may be completed. An order acknowledgment dialog, as is shown in FIG. 33, will preferably then display the order Reference Number, and an e-mail message will preferably be sent to the user showing the contents of the user's order. A customer service representative will preferably contact the user within 24 to 48 hours to verify all facets of the user's order. Once this step has been completed, generally the order will be placed, the provided credit card will be charged, and the construction or other products ordered will be manufactured or ordered from a selected distributor (or other third party or entity), and then shipped to the construction site (or to some other required or desired location).

Figure 34:
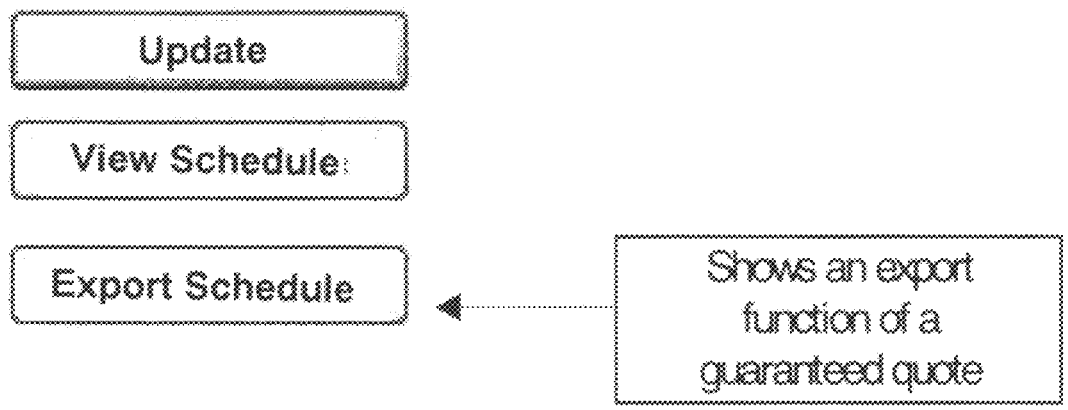

Exportation of a Price Schedule—FIG. 34

As is shown in FIG. 34, an export function of a generated price schedule (FIGS. 21 and 37) in the online 1stPricing or other designated web site online database, or offline or other database, permits the price schedule to be exported as a standalone object into a database in the form of various common computer applications or formats including, but not limited to, Excel, Word, Plain Text, HTML, XML, PDF and/or the like. The same is true of a "green" schedule (FIG. 37).

Dynamic Product Cart Technology

In contrast with a "Static Product Cart" technology, the present invention is a new "Dynamic Product Cart" technology preferably having the features that are described below.

Characteristics of the "Dynamic Product Cart" Technology

It is not a "standard" (traditional) "off the shelf" type of shopping cart technology that can be purchased commercially for selling standard products. In contrast, it is a "custom" shopping cart technology that has intelligence. ("Off the shelf" shopping cart technology does not know where a user is located at the time of pricing. It prices an object, such as a book, and then asks the user for his address to calculate shipping charges. In contrast, the systems and methods of the present invention often ask a user for his zip code and then prices one or more products (or prices such products nationally, or using other regional or area information). Product price, in some situations, can be different in every zip code. For example, the price for an identical windows may be more in Beverly Hills, Calif., than in Long Beach. (This is known as "dynamic" pricing.) Then, the shipping cost is calculated.

Its pricing system can typically perform complex calculations "on the fly" (on demand). With this system, each building material manufacturer/distributor or other third party or entity (which generally employs a different method for pricing its products, and product options) can develop a unique pricing scheme that can be programmed into the system. The system can then calculate, for example, square footage pricing, linear footage pricing, perimeter footage pricing, average pricing, other types of pricing, one time fees and/or one time fees based upon an independent variable being added (if then statement) on top of adding the base unit list price for the building material according to zip code or U.S. or foreign area or region or nationally.

Pricing glass may be by the square foot, whereas pricing block frame can be by the perimeter foot, or a one time fee, with slope still calculated by length. A user may key in a product type with specific options by, for example, clicking "Add to Cart." The system can then calculate the price on demand. In the case of architectural CAD, a list of options may be sent to a database, with the specifications then being calculated to provide line-item pricing. This "on demand" type pricing permits the pricing of virtually millions of different pricing demands, typically in just seconds. New construction, flush fin, block, windows having slope sill frames and different types of glass, and thicknesses thereof, can be priced in this manner. For example, a $71^{15}/_{16} \times 47^{3}/_{8}$ inch net frame size full casement bay window having paint grade head and seat board, fold down cranks with low E, gray and $^{3}/_{16}$" thick glass would typically compute a base list of window size and add the one time fee for the head and seat board, add the one time price for the folding crank handles, add a square footage charge for Low E and gray glass, and then add a 3/16" glass thickness square foot charge. Additionally, grids on top window panels only, and windows tempered on the bottom vent only, can be priced. It also typically permits a user to order "rough opening" size windows (using a stud to stud measurement) in comparison with "net frame size" windows (in which the size that is ordered is the size that is produced).

Shipping costs, as set forth by a manufacturer, distributor or other third party or entity (typically a one time fee or a fee that changes as an order increases in size), can be calculated.

It can be used to price products other than windows (alone or in addition to windows), and is not limited to "new construction" and/or "standard size" windows or products. It can provide a price quote for a wide variety of "custom" products.

It can produce a price quote for more than one type of building (or other) material or component, for example, for a kitchen window, a front door and a garage door.

It can produce, or alter, the prices for more than one type of building (or other) material or component, whether the same or different, with more than one feature, for example, a window that has gray glass and Low E glass, and has a glass thickness of 1/4", and has a block frame, and measures 8'×4' in size, and has a horizontal grid pattern (one, two, three, four, five or all six of these characteristics).

Comparison pricing of products (i.e. for the same product using a wide variety of different product manufacturers, distributors or other third parties or entities) can be performed.

Items within any zip code region, or other region or area, within the United States or abroad, or nationally or internationally can be priced.

Zip codes are often used.

This technology uses a software design tool.

This technology uses a plug-in (add-on) computer software code.

Architectural, civil, industrial or other parametric symbols are often inserted into a construction (or other) plan or drawing.

A price schedule may be created from architectural CAD objects.

As is described hereinabove, the methods and systems of the present invention (both the pricing features and the "green" features) are revolutionary, and solve many of the problems that have long been associated with previous type devices.

Sources of Materials

All of the materials and equipment that are employed in the methods and systems of the present invention are commercially available from sources that are known by those of ordinary skill in the art.

While the present invention has been described herein with specificity, and with reference to certain preferred embodiments thereof, those of ordinary skill in the art will recognize numerous variations, modifications and substitutions of that which has been described and illustrated which can be made, and which are within the scope and spirit of the invention. It is intended that all of these modifications and variations be within the scope of the present invention as described, illustrated and claimed herein, and that the invention be limited only by the scope of the claims which follow, and that such claims be interpreted as broadly as is reasonable. For example, various elements, steps and/or limitations of the methods and systems or the invention, or other elements, steps and/or limitations, may be added, removed and/or otherwise modified in a manner known by those having ordinary skill in the art using the detailed teachings and fifty two illustrations that are present herein.

Throughout this document, various patents, web sites and/or other publications have been cited. The entireties of each of these patents, web sites and other publications are hereby incorporated by reference herein. All of the web sites that are referred to herein may readily be located by those having ordinary skill in the art by performing a search on the Internet using a Google, Yahoo or other search engine and one or a plurality of relevant key words, such as 1st Pricing, 1stWindows, Government, Whitehouse, address, phone number, database, publication and/or the like, as is well known by those having ordinary skill in the art. Further, the 1stPricing and 1stWindows online databases that are discussed herein are present at the 1stPricing and 1stWindows web sites, respectively.

What is claimed is:

1. An automated system for creating one or a plurality of statements or indications, or a combination thereof, for one or a plurality of construction plan elements of a construction project that describes or indicates whether or not the construction plan elements fulfill one or a plurality of predetermined environmental or efficiency criteria or requirements, or both, and optionally one or a plurality of corresponding schedules comprising:
   (a) one or a plurality of local or remote computers or consoles, or any combination thereof;
   (b) one or a plurality of local or remote servers, or any combination thereof;
   (c) an architectural, civil or industrial software design tool, wherein the software design tool provides on the computer, console or server a construction plan drawing having one or a plurality of construction plan elements;
   (d) a local server system or remote server system that maintains one or a plurality of databases including data or information, or both, for one or a plurality of the construction plan elements, wherein the data, information or both state or indicate, or both, whether or not the one or a plurality of construction plan elements fulfill one or a plurality of predetermined environmental or efficiency criteria, or both, and wherein an Intranet connection exists between the local server system and the computer or console or an Internet connection exists between the remote server system and the computer or console, or both; and
   (e) an add-on computer software code that runs as an internal component within the software design tool when executed on the computer, console or server or outside of the software design tool operating as a dynamic link library, executable (.exe), ActiveX, COM object, or combination thereof;
   wherein the add-on computer software code optionally includes a palette, or uses an existing palette, that contains one or a plurality of parametric symbols that correspond with one or a plurality of the construction plan elements, and that optionally may be selected by a user for insertion into the construction plan drawing; and
   wherein the add-on computer software code, when executed by the computer, console, server, dynamic link library, executable (.exe), ActiveX, COM object, or a combination thereof:

(i) optionally inserts one or a plurality of the construction plan elements, or of the parametric symbols that may optionally be selected by a user, or both, into the construction plan drawing;

(ii) transmits via the Intranet connection, the Internet connection, or both, data or information, or both, corresponding to one or a plurality of construction plan elements or parametric symbols from the computer, console, server, dynamic link library, executable (.exe), ActiveX, Component Object Model (COM) object, or a combination thereof, to the local server system, the remote server system, or both, either directly or via an optional communication module;

(iii) receives via the Intranet connection, the Internet connection, or both, from the local server system, the remote server system, or both, for one or a plurality of the construction plan elements or parametric symbols, or both, one or a plurality of statements or indications, or any combination thereof, describing or indicating whether or not the one or plurality of construction plan elements or parametric symbols, or both, fulfill one or a plurality of predetermined environmental or efficiency criteria or requirements, or both, either directly or via an optional communication module; and (iv) optionally, generates a schedule from the statements or indications, or any combination thereof, that includes one or a plurality of statements or other indications, or any combination thereof, for the one or plurality of construction plan elements or parametric symbols, or both, stating or indicating, or both, whether or not one or a plurality of construction plan elements or parametric symbols fulfill one or a plurality of predetermined environmental or efficiency criteria, or both.

2. The system of claim 1 wherein the add-on computer code runs inside of the software design tool.

3. The system of claim 1 wherein the add-on computer code runs outside of the software design tool operating as a dynamic link library, executable (.exe), ActiveX or COM object, or combination thereof.

4. The system of claim 2 wherein the add-on computer code is executed by a computer.

5. The system of claim 2 wherein the add-on computer code is executed by a console.

6. The system of claim 2 wherein the add-on computer code is executed by a server.

7. The system of claim 1 wherein one database is maintained on the local server system or remote server system.

8. The system of claim 1 wherein a plurality of databases is maintained on the local server system or remote server system, or combination thereof.

9. The system of claim 1 wherein the one or plurality of databases include data or information, or a combination thereof, discussing or indicating, or both, energy compliance, carbon emission compliance, geospatial compliance, Energy Star compliance, Home Star compliance, VOC compliance, LEED compliance, RFID compliance or CalStar compliance, or any combination thereof, for the one or a plurality of construction plan elements.

10. The system of claim 1 wherein the add-on computer software code includes a palette that contains one or a plurality of parametric symbols corresponding to one or a plurality of the construction plan elements.

11. The system of claim 1 wherein the add-on computer code does not include a palette that contains one or a plurality of parametric symbols corresponding to one or a plurality of the construction plan elements.

12. The system of claim 1, wherein the software design tool includes a palette that contains one or a plurality of parametric symbols corresponding to one or a plurality of the construction plan elements.

13. The system of claim 1 wherein the add-on computer software code, when executed by a computer, inserts one or a plurality of construction plan elements or parametric symbols, or both, into the construction plan drawing.

14. The system of claim 1 wherein the add-on computer software code, when executed by a console, inserts one or a plurality of construction plan elements or parametric symbols, or both, into the construction plan drawing.

15. The system of claim 1 wherein the add-on computer software code, when executed by a server, inserts one or a plurality of construction plan elements or parametric symbols, or both, into the construction plan drawing.

16. The system of claim 1 wherein the add-on computer software code, when executed by a dynamic link library, executable (.exe), ActiveX or COM object, or combination thereof, inserts one or a plurality of construction plan elements or parametric symbols, or both, into the construction plan drawing.

17. The system of claim 1 wherein the system does not include a communication module.

18. The system of claim 1 wherein the system includes a communication module.

19. The system of claim 18 wherein the communication module operates in a server.

20. The system of claim 18 wherein the communication module operates in a computer or console.

21. The system of claim 1 wherein the system includes one or a plurality of physical storage mediums, wherein the physical storage mediums include one or a plurality of databases or database updates, or a combination thereof.

22. The system of claim 21 wherein the physical storage mediums are one or a plurality of CDs, DVDs, hard drives, thumb drives or tape drives, or any combination thereof.

23. The system of claim 22 wherein a physical storage medium is a CD, wherein the system additionally includes a CD player, and wherein the CD and CD player are present in, or on, a user's computer or console.

24. The system of claim 23 wherein the CD provides updated data, information, statements or indications, or a combination thereof, to the user's computer or console.

25. The system of claim 22 wherein a physical storage medium is a DVD, wherein the system additionally includes a DVD player, and wherein the DVD and DVD player are present in, or on, a user's computer or console.

26. The system of claim 25 wherein the DVD provides updated data, information, statements or indications, or a combination thereof, to the user's computer or console.

27. The system of claim 21 wherein the structure of the physical storage medium permits it to be updated with more current data, information, statements, indications, or combination thereof, using an Intranet or an Internet.

28. The system of claim 1 wherein the system additionally includes a local or remote data update server that functions to update data, information, statements or indications, or a combination thereof, when desired or required, or on a regular basis, via an Intranet or an Internet.

29. The system of claim 1 wherein the system is present, or operates, in a network.

30. The system of claim 29 wherein the network is a local area network (LAN), a wide area network (WAN), a Metropolitan area network (MAN), a personal use network (PAN), a virtual private network (VPN), a campus area network (CAN) or a storage area network (SAN), or a combination thereof.

31. The system of claim 30 wherein the network is a local area network (LAN) or a wide area network (WAN).

32. The system of claim 31 wherein the network is a local area network (LAN).

33. The system of claim 31 wherein the network is a wide area network (WAN).

34. The system of claim 30 wherein the network is a Metropolitan area network (MAN).

35. The system of claim 30 wherein the network is a personal use network (PAN).

36. The system of claim 30 wherein the network is a virtual private network (VPN).

37. The system of claim 30 wherein the system is a campus area network (CAN).

38. The system of claim 30 wherein the network is a storage area network (SAN).

39. The system of claim 1 wherein the add-on computer software code has an ability to confirm that one or a plurality of construction plan elements or parametric symbols, or both, comply with one or a plurality of product specification criteria.

40. The system of claim 39 wherein the add-on computer software code has an ability to confirm that one or a plurality of construction plan elements or parametric symbols, or both, comply with one or a plurality of criteria of an Energy Efficient Program.

41. The system of claim 39 wherein the add-on computer software code has an ability to confirm that the one or a plurality of construction plan elements or parametric symbols, or both, comply with one or a plurality of criteria of LEED.

42. The system of claim 39 wherein the add-on computer software code has an ability to confirm that the one or a plurality of construction plan elements or parametric symbols, or both, includes RFID data, information, or both.

43. The system of claim 39 wherein the add-on computer software code has an ability to confirm that the one or a plurality of construction plan elements or parametric symbols, or both, comply with one or a plurality of criteria of Energy Star.

44. The system of claim 39 wherein the add-on computer software code has an ability to confirm that the one or a plurality of construction plan elements or parametric symbols, or both, comply with one or a plurality of criteria of NAHB.

45. The system of claim 39 wherein the add-on computer software code has an ability to confirm that the one or a plurality of construction plan elements or parametric symbols, or both, comply with one or a plurality of criteria of Home Star.

46. The system of claim 39 wherein the add-on computer software code has an ability to confirm that the one or a plurality of construction plan elements or parametric symbols, or both, comply with one or a plurality of criteria of CalStar.

47. The system of claim 39 wherein the add-on computer software code has an ability to confirm that the one or a plurality of construction plan elements or parametric symbols, or both, comply with one or a plurality of predetermined geospatial compliance criteria.

48. The system of claim 1 wherein the add-on computer software code has an ability to transmit one or a plurality of LEED credits from one or a plurality of databases to the computer, console or server for one or a plurality of the construction plan elements or parametric symbols, or both.

49. The system of claim 48 wherein the add-on computer software code has an ability to transmit a pre-filled out procurement form including one or a plurality of LEED credits to the computer, console or server for the one or a plurality of construction plan elements or parametric symbols, or both.

50. The system of claim 1 wherein the add-on computer software code has an ability to transmit data or information, or both, to the computer, console or server, or a combination thereof, describing or indicating, or both, a quantity of carbon emissions emitted during a manufacture or use, or both, of one or a plurality of products, materials, construction plan elements, or parametric symbols, or a combination thereof, thereby providing a size of a carbon emission footprint of one or a plurality of construction plan elements or parametric symbols, or both.

51. The system of claim 1 wherein the add-on computer software code has an ability to transmit data or information, or both, to the computer, console or server, or a combination thereof, describing or indicating a quantity of volatile organic compounds emitted during a manufacture or use, or both, of one or a plurality of products, materials, construction plan elements, parametric symbols, or a combination thereof.

52. The system of claim 1 wherein the add-on computer software code has an ability to pre-select one or a plurality of types of data or information, or both, to be transmitted from one or a plurality of databases to one or a plurality of computers, consoles or servers, or a combination thereof, for the one or a plurality of construction plan elements or parametric symbols, or both.

53. The system of claim 1 wherein the add-on computer software code has an ability to operate in one or a plurality of the following scenarios:

| Scenario | Software Design Tool Manufacturer or Distributor | Software Design Tool | Database |
|---|---|---|---|
| A | Multiple | Multiple | Multiple |
| B | One | Multiple | Multiple |
| C | One | One | Multiple |
| D | One | One | Multiple |
| E | One | One | One |
| F | One | Multiple | One |
| G | Multiple | Multiple | One |
| H | Multiple | One | One |
| I | Multiple | One | Multiple. |

54. The system of claim 53 wherein the add-on computer software code has an ability to operate in Scenario A.

55. The system of claim 53 wherein the add-on computer software code has an ability to operate in Scenario B.

56. The system of claim 53 wherein the add-on computer software code has an ability to operate in Scenario C.

57. The system of claim 53 wherein the add-on computer software code has an ability to operate in Scenario E.

58. The system of claim 53 wherein the add-on computer software code has an ability to operate in Scenario F.

59. The system of claim 53 wherein the add-on computer software code has an ability to operate in Scenario G.

60. The system of claim 53 wherein the add-on computer software code has an ability to operate in Scenario H.

61. The system of claim 53 wherein the add-on computer software code has an ability to operate in Scenario I.

62. The system of claim 1 wherein the system includes one local computer or console.

63. The system of claim 1 wherein the system includes a plurality of local computers or consoles, or a combination thereof.

64. The system of claim 1 wherein the system includes one remote computer or console.

65. The system of claim 1 wherein the system includes a plurality of remote computers or consoles, or a combination thereof.

66. The system of claim 1 wherein the system includes at least one local computer or console and at least one remote computer or console.

67. The system of claim 1 wherein the system includes one local server.

68. The system of claim 1 wherein the system includes a plurality of local servers.

69. The system of claim 1 wherein the system includes one remote server.

70. The system of claim 1 wherein the system includes a plurality of remote servers.

71. The system of claim 1 wherein the system includes at least one local server and at least one remote server.

72. The system of claim 1 wherein the software design tool is an architectural software design tool.

73. The system of claim 1 wherein the software design tool is a civil engineering software design tool.

74. The system of claim 1 wherein the software design tool is an industrial software design tool.

75. The system of claim 1 wherein the system includes a local server system and an Intranet connection exists between the local server system and the computer or console.

76. The system of claim 1 wherein the system includes a remote server system and an Internet connection exists between the remote server system and the computer or console.

77. The system of claim 1 wherein the system includes both a local server system and a remote server system, and wherein an Intranet connection exists between the local server system and a computer or console and an Internet connection exists between the remote server system and a computer or console.

78. The system of claim 1 wherein the one or plurality of construction plan elements or parametric symbols, or both, are generic.

79. The system of claim 1 wherein the one or plurality of construction plan elements or parametric symbols, or both, are specific to a particular manufacturer, distributor, marketer or other provider of the construction plan elements or parametric symbols.

80. The system of claim 1 wherein the system does not generate any schedule.

81. The system of claim 1 wherein the system generates one or a plurality of schedules.

82. The system of claim 81 wherein one or a plurality of the schedules becomes inserted into the construction plan drawing.

83. The system of claim 81 wherein the one or a plurality of schedules include or list, or both, one or a plurality of the construction plan elements or parametric symbols, or both.

84. The system of claim 83 wherein none of the schedules generated include one or a plurality of statements or indications, or any combination thereof, for the one or plurality of construction plan elements or parametric symbols, or both, stating or indicating, or both, whether or not the construction plan elements or parametric symbols, or both, fulfill one or a plurality of predetermined environmental or efficiency criteria, or both.

85. The system of claim 81 wherein the system generates a schedule including one or a plurality of statements or indications, or both, stating or indicating, or both, whether or not the one or more construction plan elements or parametric symbols, or both, meet predetermined environmental or efficiency criteria, or both.

86. The system of claim 84 wherein the schedule contains a list of the construction plan elements or parametric symbols, or both, with corresponding statements or indications, or both, stating or indicating, or both, whether or not the construction plan elements or parametric symbols, or both, meet predetermined environmental or efficiency criteria, or both.

87. The system of claim 81 wherein the schedule additionally includes a reference number.

88. The system of claim 83 wherein the schedule additionally includes a reference number.

89. The system of claim 84 wherein the schedule additionally includes a reference number.

90. The system of claim 85 wherein the schedule additionally includes a reference number.

91. The system of claim 86 wherein the schedule additionally includes a reference number.

92. The system of claim 1 wherein the system employs an architectural software design tool, and wherein the architectural software design tool is a CAD software product.

93. The system of claim 1 wherein the construction plan elements or parametric symbols, or both, are selected from a group comprising at least one of a window, a door and an acrylic glass block.

94. The system of claim 1 wherein the add-on computer software code additionally confirms that one or a plurality of construction plan elements or parametric symbols, or both, meet one or a plurality of criteria of a building code.

95. The system of claim 1 wherein the system does not permit a user to place an order to purchase one or more of the construction plan elements or parametric symbols, or both.

96. The system of claim 83 wherein the system permits a user to place an order to purchase one or more of the construction plan elements or parametric symbols, or both, that are present in a schedule.

97. The system of claim 86 wherein the system permits a user to place an order to purchase one or more of the construction plan elements or parametric symbols, or both, that are present in a schedule.

98. The system of claim 96 wherein the order may be placed using an Intranet, an Internet, the local or remote computers or consoles, web sites present on the local or remote servers, or any combination thereof.

99. The system of claim 97 wherein the order may be placed using an Intranet, an Internet, the local or remote computers or consoles, web sites present on the local or remote servers, or any combination thereof.

100. The system of claim 83 wherein the schedule includes one or two construction plan elements or parametric symbols, or both.

101. The system of claim 83 wherein the schedule includes two or more construction plan elements or parametric symbols, or both.

102. The system of claim 1 wherein the construction plan drawing includes one or more walls, and wherein one or more of the construction plan elements or parametric symbols, or both, automatically align with a wall.

103. The system of claim 102 wherein the one or more construction plan elements or parametric symbols, or both, automatically auto-embeds itself into the wall.

104. The system of claim 1 wherein the system employs one or more parametric symbols, and wherein the one or more parametric symbols have one or more corresponding parametric symbol values.

105. The system of claim 104 wherein the system permits one or more of the parametric symbol values to be modified after a corresponding parametric symbol is inserted into the construction plan drawing.

106. The system of claim 83 wherein the system permits one or more changes to be made to one or more construction plan elements or parametric symbols, or both, that are present in the schedule.

107. The system of claim 86 wherein the system permits one or more changes to be made to one or more construction plan elements or parametric symbols, or both, that are present in the schedule.

108. The system of claim 106 wherein the system can function to automatically edit the schedule to correspond to the changes.

109. The system of claim 107 wherein the system can function to automatically edit the schedule to correspond to the changes.

110. The system of claim 3 wherein the add-on computer code runs outside of the software design tool operating as a dynamic link library.

111. The system of claim 3 wherein the add-on computer code runs outside of the software design tool operating as an executable (.exe).

112. The system of claim 3 wherein the add-on computer code runs outside of the software design tool operating as an ActiveX.

113. The system of claim 3 wherein the add-on computer code runs outside of the software design tool operating as a COM object.

114. The system of claim 1 wherein the database is formed, maintained or supported, or a combination thereof, by 1stPricing or 1stWindows.

115. The system of claim 1 wherein the database is not formed, maintained or supported by 1stPricing or 1stWindows.

116. The system of claim 115 wherein the database may be accessed using a web site.

117. An automated system for creating for one or a plurality of construction plan elements of a construction project both one or a plurality of prices and one or a plurality of statements or indications, or a combination thereof, that describes or indicates, or both, whether or not the construction plan elements fulfill one or a plurality of predetermined environmental or efficiency criteria or requirements, or both, and optionally one or a plurality of corresponding schedules comprising:
(a) one or a plurality of local or remote computers or consoles, or any combination thereof;
(b) one or a plurality of local or remote servers, or any combination thereof;
(c) an architectural, civil or industrial software design tool, wherein the software design tool provides on the computer, console or server a construction plan drawing having one or a plurality of construction plan elements;
(d) a local server system or remote server system that maintains one or a plurality of databases including pricing data or information, or both, for the one or a plurality of construction plan elements and data or information, or both, that states or indicates, or both, whether or not one or a plurality of the construction plan elements fulfill one or a plurality of predetermined environmental or efficiency criteria, or both, wherein an Intranet connection exists between the local server system and the computer or console or an Internet connection exists between the remote server system and the computer or console, or both; and
(e) an add-on computer software code that runs as an internal component within the software design tool when executed on the computer, console or server or outside of the software design tool operating as a dynamic link library;
executable (.exe), ActiveX or ActiveX, Component Object Model (COM) object, or any combination thereof;
wherein the add-on computer software code optionally includes a palette, or uses an existing palette, that contains one or a plurality of parametric symbols that corresponds with one or a plurality of the construction plan elements, and that optionally may be selected by a user for insertion into the construction plan drawing; and
wherein the add-on computer software code, when executed by the computer, console, server or dynamic link library, executable (.exe), ActiveX or COM object:
(i) optionally inserts one or a plurality of the construction plan elements, or parametric symbols that may optionally be selected by a user, into the construction plan drawing;
(ii) transmits via the Intranet connection, the Internet connection, or both, data, information or both corresponding to one or a plurality of the construction plan elements or parametric symbols from the computer, console, server or dynamic link library, executable (.exe), ActiveX or COM object to the local server system, the remote server system, or both, either directly or via an optional communication module;
(iii) receives via the Intranet connection, the Internet connection, or both, from the local server system, the remote server system, or both, for one or a plurality of the construction plan elements or parametric symbols, or both:
(a) one or a plurality of prices for a purchase of one or a plurality of construction plan elements or parametric symbols, or both, wherein the prices may be determined using price data or information, or both, that is present on, or accessed by, the local server system, the remote server system, or both, and, optionally, using a zip code, a geographical location, or a combination thereof, and corresponds with a purchase of the one or a plurality of construction plan elements or parametric symbols, or both, and, optionally, when a zip code, geographical location, or a combination thereof, is employed, within an area or region within the zip code or geographical location, either directly or via an optional communication module; and
(b) one or a plurality of statements or indications, or any combination thereof, describing or indicating whether or not the one or a plurality of construction plan elements or parametric symbols, or both, fulfill one or a plurality of predetermined environmental or efficiency criteria, or both, either directly or via an optional communication module; and
(iv) optionally generates:
(a) a price schedule from the prices, wherein the price schedule includes individual or combined costs for the one or plurality of construction plan elements or parametric symbols, or both, a total cost for all of the construction plan elements or parametric symbols, or any combination thereof, wherein the price schedule optionally can include one or a plurality of construction plan elements or parametric symbols, or both, and wherein the price schedule optionally can be used immediately or at a subsequent time or date, or both, on the computer, console, server, dynamic link library, executable (.exe), ActiveX or COM object to place an order to purchase one or a plurality of construction plan elements or parametric symbols that are present in the price schedule;

(b) a schedule of statements or indications, or any combination thereof, stating or indicating whether or not one or a plurality of the construction plan elements or parametric symbols, or both, fulfill one or a plurality of predetermined environmental or efficiency criteria, or both; or (c) both of the schedules described in (a) and (b).

118. The system of claim 117 wherein the add-on computer code runs inside of the software design tool.

119. The system of claim 117 wherein the add-on computer code runs outside of the software design tool operating as a dynamic link library, executable (.exe), ActiveX or COM object, or combination thereof.

120. The system of claim 118 wherein the add-on computer code is executed by a computer.

121. The system of claim 118 wherein the add-on computer code is executed by a console.

122. The system of claim 118 wherein the add-on computer code is executed by a server.

123. The system of claim 117 wherein one database is maintained on the local server system or remote server system.

124. The system of claim 117 wherein a plurality of databases is maintained on the local server system or remote server system, or combination thereof.

125. The system of claim 117 wherein the one or plurality of databases include data or information, or a combination thereof, discussing or indicating, or both, energy compliance, carbon emission compliance, geospatial compliance, Energy Star compliance, Home Star compliance, VOC compliance, LEED compliance, RFID compliance or CalStar compliance, or any combination thereof, for the one or a plurality of construction plan elements.

126. The system of claim 117 wherein the add-on computer software code includes a palette that contains one or a plurality of parametric symbols corresponding to one or a plurality of the construction plan elements.

127. The system of claim 117 wherein the add-on computer code does not include a palette that contains one or a plurality of parametric symbols corresponding to one or a plurality of the construction plan elements.

128. The system of claim 117, wherein the software design tool includes a palette that contains one or a plurality of parametric symbols corresponding to one or a plurality of the construction plan elements.

129. The system of claim 117 wherein the add-on computer software code, when executed by a computer, inserts one or a plurality of construction plan elements or parametric symbols, or both, into the construction plan drawing.

130. The system of claim 117 wherein the add-on computer software code, when executed by a console, inserts one or a plurality of construction plan elements or parametric symbols, or both, into the construction plan drawing.

131. The system of claim 117 wherein the add-on computer software code, when executed by a server, inserts one or a plurality of construction plan elements or parametric symbols, or both, into the construction plan drawing.

132. The system of claim 117 wherein the add-on computer software code, when executed by a dynamic link library, executable (.exe), ActiveX or COM object, or combination thereof, inserts one or a plurality of construction plan elements or parametric symbols, or both, into the construction plan drawing.

133. The system of claim 117 wherein the system does not include a communication module.

134. The system of claim 117 wherein the system includes a communication module.

135. The system of claim 134 wherein the communication module operates in a server.

136. The system of claim 134 wherein the communication module operates in a computer or console.

137. The system of claim 117 wherein the system includes one or a plurality of physical storage mediums, wherein the physical storage mediums include one or a plurality of databases or database updates, or a combination thereof.

138. The system of claim 137 wherein the physical storage mediums are one or a plurality of CDs, DVDs, hard drives, thumb drives or tape drives, or any combination thereof.

139. The system of claim 138 wherein a physical storage medium is a CD, wherein the system additionally includes a CD player, and wherein the CD and CD player are present in, or on, a user's computer or console.

140. The system of claim 139 wherein the CD provides updated data, information, statements or indications, or a combination thereof, to the user's computer or console.

141. The system of claim 138 wherein a physical storage medium is a DVD, wherein the system additionally includes a DVD player, and wherein the DVD and DVD player are present in, or on, a user's computer or console.

142. The system of claim 141 wherein the DVD provides updated data, information, statements or indications, or a combination thereof, to the user's computer or console.

143. The system of claim 137 wherein the structure of the physical storage medium permits it to be updated with more current data, information, statements, indications, or combination thereof, using an Intranet or an Internet.

144. The system of claim 117 wherein the system additionally includes a local or remote data update server that functions to update data, information, statements or indications, or a combination thereof, when desired or required, or on a regular basis, via an Intranet or an Internet.

145. The system of claim 117 wherein the system is present, or operates, in a network.

146. The system of claim 145 wherein the network is a local area network (LAN), a wide area network (WAN), a Metropolitan area network (MAN), a personal use network (PAN), a virtual private network (VPN), a campus area network (CAN) or a storage area network (SAN), or a combination thereof.

147. The system of claim 146 wherein the network is a local area network (LAN) or a wide area network (WAN).

148. The system of claim 147 wherein the network is a local area network (LAN).

149. The system of claim 147 wherein the network is a wide area network (WAN).

150. The system of claim 146 wherein the network is a Metropolitan area network (MAN).

151. The system of claim 146 wherein the network is a personal use network (PAN).

152. The system of claim 146 wherein the network is a virtual private network (VPN).

153. The system of claim 146 wherein the system is a campus area network (CAN).

154. The system of claim 146 wherein the network is a storage area network (SAN).

155. The system of claim 117 wherein the add-on computer software code has an ability to confirm that one or a plurality of construction plan elements or parametric symbols, or both, comply with one or a plurality of product specification criteria.

156. The system of claim 155 wherein the add-on computer software code has an ability to confirm that one or a plurality of construction plan elements or parametric symbols, or both, comply with one or a plurality of criteria of an Energy Efficient Program.

157. The system of claim 155 wherein the add-on computer software code has an ability to confirm that the one or a plurality of construction plan elements or parametric symbols, or both, comply with one or a plurality of criteria of LEED.

158. The system of claim 155 wherein the add-on computer software code has an ability to confirm that the one or a plurality of construction plan elements or parametric symbols, or both, includes RFID data, information, or both.

159. The system of claim 155 wherein the add-on computer software code has an ability to confirm that the one or a plurality of construction plan elements or parametric symbols, or both, comply with one or a plurality of criteria of Energy Star.

160. The system of claim 155 wherein the add-on computer software code has an ability to confirm that the one or a plurality of construction plan elements or parametric symbols, or both, comply with one or a plurality of criteria of NAHB.

161. The system of claim 155 wherein the add-on computer software code has an ability to confirm that the one or a plurality of construction plan elements or parametric symbols, or both, comply with one or a plurality of criteria of Home Star.

162. The system of claim 155 wherein the add-on computer software code has an ability to confirm that the one or a plurality of construction plan elements or parametric symbols, or both, comply with one or a plurality of criteria of CalStar.

163. The system of claim 155 wherein the add-on computer software code has an ability to confirm that the one or a plurality of construction plan elements or parametric symbols, or both, comply with one or a plurality of predetermined geospatial compliance criteria.

164. The system of claim 117 wherein the add-on computer software code has an ability to transmit one or a plurality of LEED credits from one or a plurality of databases to the computer, console or server for one or a plurality of the construction plan elements or parametric symbols, or both.

165. The system of claim 164 wherein the add-on computer software code has an ability to transmit a pre-filled out procurement form including one or a plurality of LEED credits to the computer, console or server for the one or a plurality of construction plan elements or parametric symbols, or both.

166. The system of claim 117 wherein the add-on computer software code has an ability to transmit data or information, or both, to the computer, console or server, or a combination thereof, describing or indicating, or both, a quantity of carbon emissions emitted during a manufacture or use, or both, of one or a plurality of products, materials, construction plan elements, or parametric symbols, or a combination thereof, thereby providing a size of a carbon emission footprint of one or a plurality of construction plan elements or parametric symbols, or both.

167. The system of claim 117 wherein the add-on computer software code has an ability to transmit data or information, or both, to the computer, console or server, or a combination thereof, describing or indicating a quantity of volatile organic compounds emitted during a manufacture or use, or both, of one or a plurality of products, materials, construction plan elements, parametric symbols, or a combination thereof.

168. The system of claim 117 wherein the add-on computer software code has an ability to pre-select one or a plurality of types of data or information, or both, to be transmitted from one or a plurality of databases to one or a plurality of computers, consoles or servers, or a combination thereof, for the one or a plurality of construction plan elements or parametric symbols, or both.

169. The system of claim 117 wherein the add-on computer software code has an ability to operate in one or a plurality of the following scenarios:

| Scenario | Software Design Tool Manufacturer or Distributor | Software Design Tool | Database |
| --- | --- | --- | --- |
| A | Multiple | Multiple | Multiple |
| B | One | Multiple | Multiple |
| C | One | One | Multiple |
| D | One | One | Multiple |
| E | One | One | One |
| F | One | Multiple | One |
| G | Multiple | Multiple | One |
| H | Multiple | One | One |
| I | Multiple | One | Multiple. |

170. The system of claim 169 wherein the add-on computer software code has an ability to operate in Scenario A.

171. The system of claim 169 wherein the add-on computer software code has an ability to operate in Scenario B.

172. The system of claim 169 wherein the add-on computer software code has an ability to operate in Scenario C.

173. The system of claim 169 wherein the add-on computer software code has an ability to operate in Scenario E.

174. The system of claim 169 wherein the add-on computer software code has an ability to operate in Scenario F.

175. The system of claim 169 wherein the add-on computer software code has an ability to operate in Scenario G.

176. The system of claim 169 wherein the add-on computer software code has an ability to operate in Scenario H.

177. The system of claim 169 wherein the add-on computer software code has an ability to operate in Scenario I.

178. The system of claim 117 wherein the system includes one local computer or console.

179. The system of claim 117 wherein the system includes a plurality of local computers or consoles, or a combination thereof.

180. The system of claim 117 wherein the system includes one remote computer or console.

181. The system of claim 117 wherein the system includes a plurality of remote computers or consoles, or a combination thereof.

182. The system of claim 117 wherein the system includes at least one local computer or console and at least one remote computer or console.

183. The system of claim 117 wherein the system includes one local server.

184. The system of claim 117 wherein the system includes a plurality of local servers.

185. The system of claim 117 wherein the system includes one remote server.

186. The system of claim 117 wherein the system includes a plurality of remote servers.

187. The system of claim 117 wherein the system includes at least one local server and at least one remote server.

188. The system of claim 117 wherein the software design tool is an architectural software design tool.

189. The system of claim 117 wherein the software design tool is a civil engineering software design tool.

190. The system of claim 117 wherein the software design tool is an industrial software design tool.

191. The system of claim 117 wherein the system includes a local server system and an Intranet connection exists between the local server system and the computer or console.

192. The system of claim 117 wherein the system includes a remote server system and an Internet connection exists between the remote server system and the computer or console.

193. The system of claim 117 wherein the system includes both a local server system and a remote server system, and wherein an Intranet connection exists between the local server system and a computer or console and an Internet connection exists between the remote server system and a computer or console.

194. The system of claim 117 wherein the one or plurality of construction plan elements or parametric symbols, or both, are generic.

195. The system of claim 117 wherein the one or plurality of construction plan elements or parametric symbols, or both, are specific to a particular manufacturer, distributor, marketer or other provider of the construction plan elements or parametric symbols.

196. The system of claim 117 wherein the system does not generate any schedule.

197. The system of claim 117 wherein the system generates one or a plurality of schedules.

198. The system of claim 197 wherein one or a plurality of the schedule becomes inserted into the construction plan drawing.

199. The system of claim 197 wherein the one or a plurality of schedules include or list, or both, one or a plurality of the construction plan elements or parametric symbols, or both.

200. The system of claim 199 wherein none of the schedules generated include for the one or a plurality of the construction plan elements or parametric symbols, or both: (i) price data or information, or a combination thereof; or (ii) one or a plurality of statements or indications, or any combination thereof, stating or indicating, or both, whether or not the construction plan elements or parametric symbols, or both, fulfill one or a plurality of predetermined environmental or efficiency criteria, or both.

201. The system of claim 197 wherein the system generates one or a plurality of schedules including: (i) pricing data or information, or both; (ii) one or a plurality of statements or indications, or both, stating or indicating, or both, whether or not the one or more construction plan elements or parametric symbols, or both, meet predetermined environmental or efficiency criteria, or both; or (iii) both (i) and (ii).

202. The system of claim 201 wherein the schedule contains a list of the construction plan elements or parametric symbols, or both, with corresponding: (i) price data or information, or both; (ii) statements or indications, or both, stating or indicating, or both, whether or not the construction plan elements or parametric symbols, or both, meet predetermined environmental or efficiency criteria, or both; or (iii) both (i) and (ii).

203. The system of claim 197 wherein the schedule additionally includes a reference number.

204. The system of claim 199 wherein the schedule additionally includes a reference number.

205. The system of claim 200 wherein the schedule additionally includes a reference number.

206. The system of claim 201 wherein the schedule additionally includes a reference number.

207. The system of claim 202 wherein the schedule additionally includes a reference number.

208. The system of claim 117 wherein the system employs an architectural software design tool, and wherein the architectural software design tool is a CAD software product.

209. The system of claim 117 wherein the construction plan elements or parametric symbols, or both, are selected from a group comprising at least one of a window, a door and an acrylic glass block.

210. The system of claim 117 wherein the add-on computer software code additionally confirms that one or a plurality of construction plan elements or parametric symbols, or both, meet one or a plurality of criteria of a building code.

211. The system of claim 197 wherein the system permits a user to place an order to purchase one or more of the construction plan elements or parametric symbols, or both, that are present in a schedule.

212. The system of claim 199 wherein the system permits a user to place an order to purchase one or more of the construction plan elements or parametric symbols, or both, that are present in a schedule.

213. The system of claim 200 wherein the system permits a user to place an order to purchase one or more of the construction plan elements or parametric symbols, or both, that are present in a schedule.

214. The system of claim 201 wherein the system permits a user to place an order to purchase one or more of the construction plan elements or parametric symbols, or both, that are present in a schedule.

215. The system of claim 202 wherein the system permits a user to place an order to purchase one or more of the construction plan elements or parametric symbols, or both, that are present in a schedule.

216. The system of claim 211 wherein the order may be placed using an Intranet, an Internet, the local or remote computers or consoles, web sites present on the local or remote servers, or any combination thereof.

217. The system of claim 212 wherein the order may be placed using an Intranet, an Internet, the local or remote computers or consoles, web sites present on the local or remote servers, or any combination thereof.

218. The system of claim 213 wherein the order may be placed using an Intranet, an Internet, the local or remote computers or consoles, web sites present on the local or remote servers, or any combination thereof.

219. The system of claim 214 wherein the order may be placed using an Intranet, an Internet, the local or remote computers or consoles, web sites present on the local or remote servers, or any combination thereof.

220. The system of claim 215 wherein the order may be placed using an Intranet, an Internet, the local or remote computers or consoles, web sites present on the local or remote servers, or any combination thereof.

221. The system of claim 197 wherein the schedule includes one or two construction plan elements or parametric symbols, or both.

222. The system of claim 197 wherein the schedule includes two or more construction plan elements or parametric symbols, or both.

223. The system of claim 117 wherein the construction plan drawing includes one or more walls, and wherein one or more of the construction plan elements or parametric symbols, or both, automatically align with a wall.

224. The system of claim 223 wherein the one or more construction plan elements or parametric symbols, or both, automatically auto-embeds itself into the wall.

225. The system of claim 117 wherein the system employs one or more parametric symbols, and wherein the one or more parametric symbols have one or more corresponding parametric symbol values.

226. The system of claim 225 wherein the system permits one or more of the parametric symbol values to be modified after a corresponding parametric symbol is inserted into the construction plan drawing.

227. The system of claim 197 wherein the system permits one or more changes to be made to one or more construction plan elements or parametric symbols, or both, that are present in the schedule.

228. The system of claim 202 wherein the system permits one or more changes to be made to one or more construction plan elements or parametric symbols, or both, that are present in the schedule.

229. The system of claim 227 wherein the system can function to automatically edit the schedule to correspond to the changes.

230. The system of claim 228 wherein the system can function to automatically edit the schedule to correspond to the changes.

231. The system of claim 119 wherein the add-on computer code runs outside of the software design tool operating as a dynamic link library.

232. The system of claim 119 wherein the add-on computer code runs outside of the software design tool operating as an executable (.exe).

233. The system of claim 119 wherein the add-on computer code runs outside of the software design tool operating as an ActiveX.

234. The system of claim 119 wherein the add-on computer code runs outside of the software design tool operating as a COM object.

235. The system of claim 117 wherein the system does not use a zip code or geographic location.

236. The system of claim 117 wherein the system uses a zip code but not a geographic location.

237. The system of claim 117 wherein the system uses a geographic location but not a zip code.

238. The system of claim 117 wherein the system uses both a zip code and a geographic location.

239. The system of claim 117 wherein a price schedule is generated and the price schedule is a Bill of Materials.

240. The system of claim 117 wherein a price schedule is generated and the price schedule is a Take Off.

241. The system of claim 117 wherein a price schedule is generated and the price schedule is a spreadsheet.

242. The system of claim 117 wherein a price schedule or a schedule stating whether or not the one or more construction plan elements or parametric symbols, or both, meet predetermined environmental or efficiency criteria, or both, or both, is generated and the system can function to export one or both of the schedules as a standalone object into a database in a form of a computer application or format.

243. The system of claim 242 wherein the computer application or format is Excel, Word, Plain Text, HTML, XML or PDF, or any combination thereof.

244. The system of claim 117 wherein a price schedule or a schedule stating whether or not the one or more construction plan elements or parametric symbols, or both, meet predetermined environmental or efficiency criteria, or both, or both, is generated and the system can function to edit one or both of the schedules.

245. The system of claim 117 wherein the price data or information, or both, or the statements or indications as to whether or not the one or more construction plan elements or parametric symbols, or both, meet predetermined environmental or efficiency criteria, or both, or both, is present on, or is accessed by, the local server system.

246. The system of claim 117 wherein the price data or information, or both, or the statements or indications as to whether or not the one or more construction plan elements or parametric symbols, or both, meet predetermined environmental or efficiency criteria, or both, or both, is present on, or is accessed by, the remote server system.

247. The system of claim 117 wherein the price data or information, or both, or the statements or indications as to whether or not the one or more construction plan elements or parametric symbols, or both, meet predetermined environmental or efficiency criteria, or both, or both, is present on, or is accessed by, both the local server system and the remote server system.

248. The system of claim 117 wherein the price data or information, or both, is within an area or region within the zip code.

249. The system of claim 117 wherein the price data or information, or both, is within an area or region within the geographic location.

250. The system of claim 117 wherein the price data or information, or both, is within an area or region within the zip code or the geographic location, or both.

251. The system of claim 117 wherein: (i) the system generates a price schedule and the price schedule includes one or a plurality of individual costs for the one or plurality of construction plan elements or parametric symbols, or both; (ii) the system generates a schedule, and the schedule includes one or a plurality of statements or indications, or both, stating or indicating whether or not the one or more construction plan elements or parametric symbols, or both, meet predetermined environmental or efficiency criteria, or both; or (iii) or both.

252. The system of claim 251 wherein the system generates a price schedule and the price schedule includes one or a plurality of combined costs for the one or plurality of construction plan elements or parametric symbols, or both.

253. The system of claim 251 wherein the system generates a price schedule and the price schedule includes a total cost for all of the one or plurality of construction plan elements or parametric symbols, or both.

254. The system of claim 251 wherein either one or both schedules has an ability to include therein one or a plurality of construction plan elements or parametric symbols, or both.

255. The system of claim 251 wherein one or both of the schedules can be used immediately or at a subsequent time or date, or both, on the computer, console, server, dynamic link library, executable (.exe), ActiveX or COM object, or combination thereof, to place an order to purchase one or a plurality of the construction plan elements or parametric symbols, or both, that are present in the schedule, or both.

256. The system of claim 255 wherein one or both schedules can be used immediately on the computer, console, server, dynamic link library, executable (.exe), ActiveX or COM object, or combination thereof, to place an order to purchase one or a plurality of the construction plan elements or parametric symbols that are present in the schedule, or both.

257. The system of claim 255 wherein one or both schedules can be used at a subsequent time or date, or both, on the computer, console, server, dynamic link library, executable (.exe), ActiveX or COM object, or combination thereof, to place an order to purchase one or a plurality of the construction plan elements or parametric symbols that are present in the schedule, or both.

258. The system of claim 117 wherein the system does not generate a price schedule.

259. The system of claim 117 wherein the system additionally generates a schedule of one or a plurality of construction plan elements or parametric symbols, or both, selected by a user, wherein the schedule does not include any prices, and wherein the system does not generate any other schedules.

260. The system of claim 117 wherein the database is formed, maintained or supported, or a combination thereof, by 1stPricing or 1stWindows.

261. The system of claim 117 wherein the database is not formed, maintained or supported by 1stPricing or 1stWindows.

262. The system of claim 261 wherein the database may be accessed using a web site.

263. An automated method for creating one or a plurality of statements or indications, or a combination thereof, for one or a plurality of construction plan elements of a construction project that describes or indicates whether or not the construction plan elements fulfill one or a plurality of predetermined environmental or efficiency criteria or requirements, or both, and optionally one or a plurality of corresponding schedules comprising:
(a) providing on a local or remote computer, console or server an architectural, civil or industrial software design tool and a construction plan drawing having one or a plurality of construction plan elements, wherein the construction plan drawing is created with the software design tool;
(b) providing on the computer, console or server, or on a dynamic link library, executable (.exe), ActiveX or Component Object Model (COM) object:
(i) an add-on computer software code that runs as an internal component within the software design tool when executed on the computer, console or server, or outside of the software design tool when executed by the dynamic link library, executable (.exe), ActiveX or COM object:
and (ii) optionally, a palette containing one or a plurality of parametric symbols that correspond with one or more of the construction plan elements, and optionally one or a plurality of corresponding parametric symbol values;
(c) optionally, selecting one or a plurality of the construction plan elements, or parametric symbols included in the optional palette, for insertion into the construction plan drawing;
(d) optionally inserting one or a plurality of the construction plan elements or parametric symbols, or both, into the construction plan drawing;
(e) using the add-on computer software code and an Intranet connection, an Internet connection, or both, transmitting data, information, or both, by the computer, corresponding to one or a plurality of the construction plan element5s or parametric symbols, or both, from the computer, console, server or dynamic link library, executable (.exe), ActiveX or COM object to a local server system, a remote server system, or both, either directly or via an optional communication module;
(f) using the add-on computer software code and an Intranet connection, an Internet connection, or both, accessing data, information, or both, from one or a plurality of databases maintained on, or accessed by, the local server system, the remote server system, or both, stating, indicating, or both, whether or not the one or plurality of construction plan elements or parametric symbols, or both, fulfill one or a plurality of predetermined environmental or efficiency criteria, or both; and
(g) optionally, using the add-on computer software code, creating a schedule from the data, information, or both, wherein the schedule states, indicates, or both, for the one or plurality of construction plan elements or parametric symbols, or both, whether or not the construction plan elements or parametric symbols, or both, fulfill one or a plurality of predetermined environmental or efficiency criteria, or both.

264. The method of claim 263 wherein the add-on computer code runs inside of the software design tool.

265. The method of claim 263 wherein the add-on computer code runs outside of the software design tool operating as a dynamic link library, executable (.exe), ActiveX or COM object, or combination thereof.

266. The method of claim 264 wherein the add-on computer code is executed on a computer.

267. The method of claim 264 wherein the add-on computer code is executed on a console.

268. The method of claim 264 wherein the add-on computer code is executed on a server.

269. The method of claim 263 wherein one database is maintained on the local server system or remote server system.

270. The method of claim 263 wherein a plurality of databases is maintained on the local server system or remote server system, or combination thereof.

271. The method of claim 263 wherein the one or plurality of databases include data or information, or a combination thereof, discussing or indicating, or both, energy compliance, carbon emission compliance, geospatial compliance, Energy Star compliance, Home Star compliance, VOC compliance, LEED compliance, RFID compliance or CalStar compliance, or any combination thereof, for the one or a plurality of construction plan elements.

272. The method of claim 263 wherein a palette that contains one or a plurality of parametric symbols corresponding to one or a plurality of the construction plan elements is provided on the computer, console or server, or on the dynamic link library, executable (.exe), ActiveX or COM object.

273. The method of claim 263 wherein a palette is not provided on the computer, console or server, or on the dynamic link library, executable (.exe), ActiveX or COM object.

274. The method of claim 272 wherein the palette is provided by the add-on computer software code.

275. The method of claim 272 wherein the palette is provided by the software design tool.

276. The method of claim 263 wherein the add-on computer software code, when executed on a computer, inserts one or a plurality of the construction plan elements or parametric symbols, or both, into the construction plan drawing.

277. The method of claim 263 wherein the add-on computer software code, when executed on a console, inserts one or a plurality of the construction plan elements or parametric symbols, or both, into the construction plan drawing.

278. The method of claim 263 wherein the add-on computer software code, when executed on a server, inserts one or a plurality of construction plan elements or parametric symbols, or both, into the construction plan drawing.

279. The method of claim 263 wherein the add-on computer software code, when executed by a dynamic link library, executable (.exe), ActiveX or COM object, or combination thereof, inserts one or a plurality of construction plan elements or parametric symbols, or both, into the construction plan drawing.

280. The method of claim 263 wherein the method does not employ a communication module.

281. The method of claim 263 wherein the method employs a communication module.

282. The method of claim 281 wherein the communication module employed operates in a server.

283. The method of claim 281 wherein the communication module employed operates in a computer or console.

284. The method of claim 263 wherein the method employs one or a plurality of physical storage mediums, wherein the physical storage mediums include one or a plurality of databases or database updates, or a combination thereof.

285. The method of claim 284 wherein the physical storage mediums are one or a plurality of CDs, DVDs, hard drives, thumb drives or tape drives, or any combination thereof.

286. The method of claim 285 wherein a physical storage medium is a CD, wherein the method additionally employs a CD player, and wherein the CD and CD player are present in, or on, a user's computer or console.

287. The method of claim 286 wherein the CD provides updated data, information, statements or indications, or a combination thereof, to the user's computer or console.

288. The method of claim 285 wherein a physical storage medium is a DVD, wherein the system additionally employs a DVD player, and wherein the DVD and DVD player are present in, or on, a user's computer or console.

289. The method of claim 288 wherein the DVD provides updated data, information, statements or indications, or a combination thereof, to the user's computer or console.

290. The method of claim 284 wherein the structure of the physical storage medium permits it to be updated with more current data, information, statements, indications, or a combination thereof, using an Intranet or an Internet.

291. The method of claim 263 wherein the method additionally employs a local or remote data update server that functions to update data, information, statements or indications, or a combination thereof, when desired or required, or on a regular basis, via an Intranet or an Internet.

292. The method of claim 263 wherein the method operates in a network.

293. The method of claim 292 wherein the network is a local area network (LAN), a wide area network (WAN), a Metropolitan area network (MAN), a personal use network (PAN), a virtual private network (VPN), a campus area network (CAN) or a storage area network (SAN), or a combination thereof.

294. The method of claim 293 wherein the network is a local area network (LAN) or a wide area network (WAN).

295. The method of claim 294 wherein the network is a local area network (LAN).

296. The method of claim 294 wherein the network is a wide area network (WAN).

297. The method of claim 293 wherein the network is a Metropolitan area network (MAN).

298. The method of claim 293 wherein the network is a personal use network (PAN).

299. The method of claim 293 wherein the network is a virtual private network (VPN).

300. The method of claim 293 wherein the method is a campus area network (CAN).

301. The method of claim 293 wherein the network is a storage area network (SAN).

302. The method of claim 263 wherein the add-on computer software code has an ability to confirm that one or a plurality of the construction plan elements or parametric symbols, or both, comply with one or a plurality of product specification criteria.

303. The method of claim 302 wherein the add-on computer software code has an ability to confirm that one or a plurality of the construction plan elements or parametric symbols, or both, comply with one or a plurality of criteria of an Energy Efficient Program.

304. The method of claim 302 wherein the add-on computer software code has an ability to confirm that the one or a plurality of the construction plan elements or parametric symbols, or both, comply with one or a plurality of criteria of LEED.

305. The method of claim 302 wherein the add-on computer software code has an ability to confirm that the one or a plurality of the construction plan elements or parametric symbols, or both, includes RFID data, information, or both.

306. The method of claim 302 wherein the add-on computer software code has an ability to confirm that the one or a plurality of construction plan elements or parametric symbols, or both, comply with one or a plurality of criteria of Energy Star.

307. The method of claim 302 wherein the add-on computer software code has an ability to confirm that the one or a plurality of construction plan elements or parametric symbols, or both, comply with one or a plurality of criteria of NAHB.

308. The method of claim 302 wherein the add-on computer software code has an ability to confirm that the one or a plurality of the construction plan elements or parametric symbols, or both, comply with one or a plurality of criteria of Home Star.

309. The method of claim 302 wherein the add-on computer software code has an ability to confirm that the one or a plurality of the construction plan elements or parametric symbols, or both, comply with one or a plurality of criteria of CalStar.

310. The method of claim 302 wherein the add-on computer software code has an ability to confirm that the one or a plurality of the construction plan elements or parametric symbols, or both, comply with one or a plurality of predetermined geospatial compliance criteria.

311. The method of claim 263 wherein the add-on computer software code has an ability to transmit one or a plurality of LEED credits from one or a plurality of databases to the computer, console or server for one or a plurality of the construction plan elements or parametric symbols, or both.

312. The method of claim 311 wherein the add-on computer software code has an ability to transmit a pre-filled out procurement form including one or a plurality of LEED credits to the computer, console or server for the one or a plurality of construction plan elements or parametric symbols, or both.

313. The method of claim 263 wherein the add-on computer software code has an ability to transmit data or information, or both, to the computer, console or server, or a combination thereof, describing or indicating, or both, a quantity of carbon emissions emitted during a manufacture or use, or both, of one or a plurality of products, materials, construction plan elements, or parametric symbols, or a combination thereof, thereby providing a size of a carbon emission footprint of one or a plurality of construction plan elements or parametric symbols, or both.

314. The method of claim 263 wherein the add-on computer software code has an ability to transmit data or information, or both, to the computer, console or server, or a combination thereof, describing or indicating a quantity of volatile organic compounds emitted during a manufacture or use, or both, of one or a plurality of products, materials, construction plan elements, parametric symbols, or a combination thereof.

315. The method of claim 263 wherein the add-on computer software code has an ability to pre-select one or a plurality of types of data or information, or both, to be transmitted from one or a plurality of databases to one or a plurality of computers, consoles or servers, or a combination thereof, for the one or a plurality of construction plan elements or parametric symbols, or both.

316. The method of claim 263 wherein the add-on computer software code has an ability to operate in one or a plurality of the following scenarios:

| Scenario | Software Design Tool Manufacturer or Distributor | Software Design Tool | Database |
|---|---|---|---|
| A | Multiple | Multiple | Multiple |
| B | One | Multiple | Multiple |
| C | One | One | Multiple |
| D | One | One | Multiple |
| E | One | One | One |
| F | One | Multiple | One |
| G | Multiple | Multiple | One |
| H | Multiple | One | One |
| I | Multiple | One | Multiple. |

317. The method of claim 316 wherein the add-on computer software code has an ability to operate in Scenario A.

318. The method of claim 316 wherein the add-on computer software code has an ability to operate in Scenario B.

319. The method of claim 316 wherein the add-on computer software code has an ability to operate in Scenario C.

320. The method of claim 316 wherein the add-on computer software code has an ability to operate in Scenario E.

321. The method of claim 316 wherein the add-on computer software code has an ability to operate in Scenario F.

322. The method of claim 316 wherein the add-on computer software code has an ability to operate in Scenario G.

323. The method of claim 316 wherein the add-on computer software code has an ability to operate in Scenario H.

324. The method of claim 316 wherein the add-on computer software code has an ability to operate in Scenario I.

325. The method of claim 263 wherein the method employs one local computer or console.

326. The method of claim 263 wherein the method employs a plurality of local computers or consoles, or a combination thereof.

327. The method of claim 263 wherein the method employs one remote computer or console.

328. The method of claim 263 wherein the method employs a plurality of remote computers or consoles, or a combination thereof.

329. The method of claim 263 wherein the method employs at least one local computer or console and at least one remote computer or console.

330. The method of claim 263 wherein the method employs one local server.

331. The method of claim 263 wherein the method employs a plurality of local servers.

332. The method of claim 263 wherein the method employs one remote server.

333. The method of claim 263 wherein the method employs a plurality of remote servers.

334. The method of claim 263 wherein the method employs at least one local server and at least one remote server.

335. The method of claim 263 wherein the software design tool is an architectural software design tool.

336. The method of claim 263 wherein the software design tool is a civil engineering software design tool.

337. The method of claim 263 wherein the software design tool is an industrial software design tool.

338. The method of claim 263 wherein the method employs a local server system and an Intranet connection exists between the local server system and the computer or console.

339. The method of claim 263 wherein the method employs a remote server system and an Internet connection exists between the remote server system and the computer or console.

340. The method of claim 263 wherein the method employs both a local server system and a remote server system, and wherein an Intranet connection exists between the local server system and a computer or console and an Internet connection exists between the remote server system and a computer or console.

341. The method of claim 263 wherein the one or plurality of construction plan elements or parametric symbols, or both, are generic.

342. The method of claim 263 wherein the one or plurality of construction plan elements or parametric symbols, or both, are specific to a particular manufacturer, distributor, marketer or other provider of the construction plan elements or parametric symbols.

343. The method of claim 263 wherein the method does not create any schedule.

344. The method of claim 263 wherein the method creates one or a plurality of schedules.

345. The method of claim 344 wherein one or a plurality of the schedules becomes inserted into the construction plan drawing.

346. The method of claim 344 wherein the one or a plurality of schedules include or list, or both, one or a plurality of the construction plan elements or parametric symbols, or both.

347. The method of claim 346 wherein none of the schedules created include one or a plurality of statements or indications, or any combination thereof, for the one or plurality of construction plan elements or parametric symbols, or both, stating or indicating, or both, whether or not the construction plan elements or parametric symbols, or both, fulfill one or a plurality of predetermined environmental or efficiency criteria, or both.

348. The method of claim 344 wherein the method creates a schedule including one or a plurality of statements or indications, or both, stating or indicating, or both, whether or not the one or more construction plan elements or parametric symbols, or both, meet predetermined environmental or efficiency criteria, or both.

349. The method of claim 348 wherein the schedule contains a list of the construction plan elements or parametric symbols, or both, with corresponding statements or indications, or both, stating or indicating, or both, whether or not the construction plan elements or parametric symbols, or both, meet predetermined environmental or efficiency criteria, or both.

350. The method of claim 344 wherein the schedule additionally includes a reference number.

351. The method of claim 346 wherein the schedule additionally includes a reference number.

352. The method of claim 347 wherein the schedule additionally includes a reference number.

353. The method of claim 348 wherein the schedule additionally includes a reference number.

354. The method of claim 349 wherein the schedule additionally includes a reference number.

355. The method of claim 263 wherein the method employs an architectural software design tool, and wherein the architectural software design tool is a CAD software product.

356. The method of claim 263 wherein the construction plan elements or parametric symbols, or both, are selected from a group comprising at least one of a window, a door and an acrylic glass block.

357. The method of claim 263 wherein the add-on computer software code additionally confirms that one or a plurality of the construction plan elements or parametric symbols, or both, meet one or a plurality of criteria of a building code.

358. The method of claim 263 wherein the method does not permit a user to place an order to purchase one or more of the construction plan elements or parametric symbols, or both.

359. The method of claim 346 wherein the method permits a user to place an order to purchase one or more of the construction plan elements or parametric symbols, or both, that are present in the schedule.

360. The method of claim 349 wherein the method permits a user to place an order to purchase one or more of the construction plan elements or parametric symbols, or both, that are present in the schedule.

361. The method of claim 359 wherein the order may be placed using an Intranet, an Internet, the local or remote computer or console, a web site present on the local or remote server, or any combination thereof.

362. The method of claim 360 wherein the order may be placed using an Intranet, an Internet, the local or remote computer or console, a web site present on the local or remote server, or any combination thereof.

363. The method of claim 346 wherein the schedule created includes one or two construction plan elements or parametric symbols, or both.

364. The method of claim 346 wherein the schedule created includes two or more construction plan elements or parametric symbols, or both.

365. The method of claim 263 wherein the construction plan drawing includes one or more walls, and wherein one or more of the construction plan elements or parametric symbols, or both, automatically align with a wall.

366. The method of claim 365 wherein the one or more construction plan elements or parametric symbols, or both, automatically auto-embeds itself into the wall.

367. The method of claim 263 wherein the method employs one or more parametric symbols, and wherein the one or more parametric symbols have one or more corresponding parametric symbol values.

368. The method of claim 367 wherein the method additionally modifies one or more of the parametric symbol values after a corresponding parametric symbol is inserted into the construction plan drawing.

369. The method of claim 346 wherein the method additionally makes one or more changes to the one or more construction plan elements or parametric symbols, or both, that are present in the schedule.

370. The method of claim 349 wherein the method additionally makes one or more changes to the one or more construction plan elements or parametric symbols, or both, that are present in the schedule.

371. The method of claim 369 wherein the method additionally automatically edits the schedule to correspond to the changes.

372. The method of claim 370 wherein the method additionally automatically edits the schedule to correspond to the changes.

373. The method of claim 265 wherein the add-on computer code runs outside of the software design tool operating as a dynamic link library.

374. The method of claim 265 wherein the add-on computer code runs outside of the software design tool operating as an executable (.exe).

375. The method of claim 265 wherein the add-on computer code runs outside of the software design tool operating as an ActiveX.

376. The method of claim 265 wherein the add-on computer code runs outside of the software design tool operating as a COM object.

377. The method of claim 263 wherein the method comprises an additional step of placing an order to purchase one or more of the construction plan elements or parametric symbols, or both, and wherein one or more schedules are or are not generated.

378. The method of claim 377 wherein the order is placed using an Intranet, an Internet, one or a plurality of local or remote computers or consoles, web sites, local or remote servers or networks, or any combination thereof.

379. The method of claim 378 wherein the order is placed without a use of a computer or console.

380. The method of claim 379 wherein the order is placed in person at a manufacturer, distributor or other provider of construction plan elements, or using a telephone, a facsimile machine or a U.S. or foreign mail carrier or deliverer, or any combination thereof.

381. The method of claim 263 wherein the method employs one or a plurality of parametric symbols, and wherein one or more parametric symbol values are selected by a user.

382. The method of claim 381 wherein one or a plurality of parametric symbols is inserted into the construction plan drawing, wherein one or more parametric symbol values is selected by a user, and wherein one or more of the selected parametric symbol values is modified after a corresponding parametric symbol is inserted into the construction plan drawing.

383. The method of claim 263 wherein the database is formed, maintained or supported, or a combination thereof, by 1stPricing or 1stWindows.

384. The method of claim 263 wherein the database is not formed, maintained or supported by 1stPricing or 1stWindows.

385. The method of claim 384 wherein the database may be accessed using a web site.

386. An automated method for creating for one or a plurality of construction plan elements of a construction project both one or a plurality of prices and one or a plurality of statements or indications, or a combination thereof, that describes or indicates, or both, whether or not the construction plan elements fulfill one or a plurality of predetermined environmental or efficiency criteria or requirements, or both, and optionally one or a plurality of corresponding schedules comprising:

(a) providing on a local or remote computer, console or server an architectural, civil or industrial software design tool and a construction plan drawing having one or a plurality of construction plan elements, wherein the construction plan drawing is created with the software design tool; (b) providing on the local computer, console or server, or on a dynamic link library, executable (.exe), ActiveX or Component Object Model (COM) object:

(i) an add-on computer software code that runs as an internal component within the software design tool when executed on the computer, console or server, or outside of the software design tool when executed by the dynamic link library, executable (.exe), ActiveX or COM object: and (ii) optionally, a palette containing one or a plurality of parametric symbols that correspond with the one or more construction plan elements, and optionally one or a plurality of corresponding parametric symbol values;

(c) optionally, selecting one or a plurality of the construction plan elements, or parametric symbols included in the optional palette, or both, for insertion into the construction plan drawing;

(d) optionally, selecting one or a plurality of construction plan elements or parametric symbol values, or both, for one or a plurality of the selected parametric symbols;

(e) optionally, selecting one or a plurality of types of manufacturers, distributors or other construction plan element providers for one or a plurality of the construction plan elements or parametric symbols, or both;

(f) optionally, inserting one or a plurality of the construction plan elements or parametric symbols, or both, into the construction plan drawing;

(g) using the add-on computer software code and an Intranet connection, an Internet connection, or both, transmitting data, information, or both, corresponding to one or a plurality of the construction plan elements or parametric symbols, or both, from the computer, console, server or dynamic link library, executable (.exe), ActiveX or 5COM object to a local server system, a remote server system, or both, either directly or via an optional communication module;

(h) using the add-on computer software code and an Intranet connection, an Internet connection, or both, and, optionally, a zip code, a geographical location, or a combination thereof, accessing price data, information or both from the local server system, the remote server system, or both, that includes price data, information or both for a purchase of the one or plurality of construction plan elements or parametric symbols, or both, optionally from one or a plurality of available manufacturers, distributors or other construction plan element providers, or any combination thereof, optionally within the zip code or geographical location, or a combination thereof, and using the add-on computer software code and the Intranet connection, the Internet connection, or both, accessing data, information, or both, from the local server system, the remote server system, or both, that states or indicates, or both, whether or not the one or plurality of construction plan elements or parametric symbols, or both, fulfill one or a plurality of predetermined environmental or efficiency criteria, or both;

(i) determining, by the computer, from the price data, information, or both, one or a plurality of prices for the one or plurality of construction plan elements or parametric symbols, or both; and (j) optionally, using the add-on computer software code:

(1) generating a price schedule from the prices, wherein the price schedule includes individual or combined costs for the one or plurality of construction plan elements or inserted parametric symbols, or both, a total cost for all of the construction plan elements or inserted parametric symbols, or both, or any combination thereof, wherein the price schedule can optionally include one or a plurality of construction plan elements or inserted parametric symbols, or both, and wherein the price schedule can optionally be used immediately or at a subsequent time or date, or both, on the computer, console, server or dynamic link library, executable (.exe), ActiveX or COM object to place an order to purchase one or a plurality of construction plan elements or inserted parametric symbols, or both, that are present in the price schedule;

(2) generating a schedule of statements or indications, or any combination thereof, stating or indicating whether or not the one or a plurality of the construction plan elements or inserted parametric symbols, or both, fulfill one or a plurality of predetermined environmental or efficiency criteria, or both; or (3) generating both of the schedules of (1) and (2).

387. The method of claim 386 wherein the add-on computer code runs inside of the software design tool.

388. The method of claim 386 wherein the add-on computer code runs outside of the software design tool operating as a dynamic link library, executable (.exe), ActiveX or COM object, or combination thereof.

389. The method of claim 387 wherein the add-on computer code is executed on a computer.

390. The method of claim 387 wherein the add-on computer code is executed on a console.

391. The method of claim 387 wherein the add-on computer code is executed on a server.

392. The method of claim 386 wherein one database is maintained on the local server system or remote server system.

393. The method of claim 386 wherein a plurality of databases is maintained on the local server system or remote server system, or combination thereof.

394. The method of claim 386 wherein the one or plurality of databases include data or information, or a combination thereof, discussing or indicating, or both, energy compliance, carbon emission compliance, geospatial compliance, Energy Star compliance, Home Star compliance, VOC compliance, LEED compliance, RFID compliance or CalStar compliance, or any combination thereof, for the one or a plurality of construction plan elements.

395. The method of claim 386 wherein a palette that contains one or a plurality of parametric symbols corresponding to one or a plurality of the construction plan elements is provided on the computer, console or server, or on the dynamic link library, executable (.exe), ActiveX or COM object.

396. The method of claim 386 wherein a palette is not provided on the computer, console or server, or on the dynamic link library, executable (.exe), ActiveX or COM object.

397. The method of claim 395 wherein the palette is provided by the add-on computer software code.

398. The method of claim 395 wherein the palette is provided by the software design tool.

399. The method of claim 386 wherein the add-on computer software code, when executed on a computer, inserts one or a plurality of the construction plan elements or parametric symbols, or both, into the construction plan drawing.

400. The method of claim 386 wherein the add-on computer software code, when executed on a console, inserts one or a plurality of the construction plan elements or parametric symbols, or both, into the construction plan drawing.

401. The method of claim 386 wherein the add-on computer software code, when executed on a server, inserts one or a plurality of construction plan elements or parametric symbols, or both, into the construction plan drawing.

402. The method of claim 386 wherein the add-on computer software code, when executed by a dynamic link library, executable (.exe), ActiveX or COM object, or combination thereof, inserts one or a plurality of construction plan elements or parametric symbols, or both, into the construction plan drawing.

403. The method of claim 386 wherein the method does not employ a communication module.

404. The method of claim 386 wherein the method employs a communication module.

405. The method of claim 404 wherein the communication module employed operates in a server.

406. The method of claim 404 wherein the communication module employed operates in a computer or console.

407. The method of claim 386 wherein the method employs one or a plurality of physical storage mediums, wherein the physical storage mediums include one or a plurality of databases or database updates, or a combination thereof.

408. The method of claim 407 wherein the physical storage mediums are one or a plurality of CDs, DVDs, hard drives, thumb drives or tape drives, or any combination thereof.

409. The method of claim 408 wherein a physical storage medium is a CD, wherein the method additionally employs a CD player, and wherein the CD and CD player are present in, or on, a user's computer or console.

410. The method of claim 409 wherein the CD provides updated data, information, statements or indications, or a combination thereof, to the user's computer or console.

411. The method of claim 408 wherein a physical storage medium is a DVD, wherein the system additionally employs a DVD player, and wherein the DVD and DVD player are present in, or on, a user's computer or console.

412. The method of claim 411 wherein the DVD provides updated data, information, statements or indications, or a combination thereof, to the user's computer or console.

413. The method of claim 407 wherein the structure of the physical storage medium permits it to be updated with more current data, information, statements, indications, or a combination thereof, using an Intranet or an Internet.

414. The method of claim 386 wherein the method additionally employs a local or remote data update server that functions to update data, information, statements or indications, or a combination thereof, when desired or required, or on a regular basis, via an Intranet or an Internet.

415. The method of claim 386 wherein the method operates in a network.

416. The method of claim 415 wherein the network is a local area network (LAN), a wide area network (WAN), a Metropolitan area network (MAN), a personal use network (PAN), a virtual private network (VPN), a campus area network (CAN) or a storage area network (SAN), or a combination thereof.

417. The method of claim 416 wherein the network is a local area network (LAN) or a wide area network (WAN).

418. The method of claim 417 wherein the network is a local area network (LAN).

419. The method of claim 417 wherein the network is a wide area network (WAN).

420. The method of claim 416 wherein the network is a Metropolitan area network (MAN).

421. The method of claim 416 wherein the network is a personal use network (PAN).

422. The method of claim 416 wherein the network is a virtual private network (VPN).

423. The method of claim 416 wherein the method is a campus area network (CAN).

424. The method of claim 416 wherein the network is a storage area network (SAN).

425. The method of claim 386 wherein the add-on computer software code has an ability to confirm that one or a plurality of the construction plan elements or parametric symbols, or both, comply with one or a plurality of product specification criteria.

426. The method of claim 425 wherein the add-on computer software code has an ability to confirm that one or a plurality of the construction plan elements or parametric symbols, or both, comply with one or a plurality of criteria of an Energy Efficient Program.

427. The method of claim 425 wherein the add-on computer software code has an ability to confirm that the one or a plurality of the construction plan elements or parametric symbols, or both, comply with one or a plurality of criteria of LEED.

428. The method of claim 425 wherein the add-on computer software code has an ability to confirm that the one or a plurality of the construction plan elements or parametric symbols, or both, includes RFID data, information, or both.

429. The method of claim 425 wherein the add-on computer software code has an ability to confirm that the one or a plurality of construction plan elements or parametric symbols, or both, comply with one or a plurality of criteria of Energy Star.

430. The method of claim 425 wherein the add-on computer software code has an ability to confirm that the one or a plurality of construction plan elements or parametric symbols, or both, comply with one or a plurality of criteria of NAHB.

431. The method of claim 425 wherein the add-on computer software code has an ability to confirm that the one or a plurality of the construction plan elements or parametric symbols, or both, comply with one or a plurality of criteria of Home Star.

432. The method of claim 425 wherein the add-on computer software code has an ability to confirm that the one or a plurality of the construction plan elements or parametric symbols, or both, comply with one or a plurality of criteria of CalStar.

433. The method of claim 425 wherein the add-on computer software code has an ability to confirm that the one or a plurality of the construction plan elements or parametric symbols, or both, comply with one or a plurality of predetermined geospatial compliance criteria.

434. The method of claim 386 wherein the add-on computer software code has an ability to transmit one or a plurality of LEED credits from one or a plurality of databases to the computer, console or server for one or a plurality of the construction plan elements or parametric symbols, or both.

435. The method of claim 434 wherein the add-on computer software code has an ability to transmit a pre-filled out procurement form including one or a plurality of LEED credits to the computer, console or server for the one or a plurality of construction plan elements or parametric symbols, or both.

436. The method of claim 386 wherein the add-on computer software code has an ability to transmit data or information, or both, to the computer, console or server, or a combination thereof, describing or indicating, or both, a quantity of carbon emissions emitted during a manufacture or use, or both, of one or a plurality of products, materials, construction plan elements, or parametric symbols, or a combination thereof, thereby providing a size of a carbon emission footprint of one or a plurality of construction plan elements or parametric symbols, or both.

437. The method of claim 386 wherein the add-on computer software code has an ability to transmit data or information, or both, to the computer, console or server, or a combination thereof, describing or indicating a quantity of volatile organic compounds emitted during a manufacture or use, or both, of one or a plurality of products, materials, construction plan elements, parametric symbols, or a combination thereof.

438. The method of claim 386 wherein the add-on computer software code has an ability to pre-select one or a plurality of types of data or information, or both, to be transmitted from one or a plurality of databases to one or a plurality of computers, consoles or servers, or a combination thereof, for the one or a plurality of construction plan elements or parametric symbols, or both.

439. The method of claim 386 wherein the add-on computer software code has an ability to operate in one or a plurality of the following scenarios:

| Scenario | Software Design Tool Manufacturer or Distributor | Software Design Tool | Database |
| --- | --- | --- | --- |
| A | Multiple | Multiple | Multiple |
| B | One | Multiple | Multiple |
| C | One | One | Multiple |
| D | One | One | Multiple |
| E | One | One | One |
| F | One | Multiple | One |
| G | Multiple | Multiple | One |
| H | Multiple | One | One |
| I | Multiple | One | Multiple. |

440. The method of claim 439 wherein the add-on computer software code has an ability to operate in Scenario A.

441. The method of claim 439 wherein the add-on computer software code has an ability to operate in Scenario B.

442. The method of claim 439 wherein the add-on computer software code has an ability to operate in Scenario C.

443. The method of claim 439 wherein the add-on computer software code has an ability to operate in Scenario E.

444. The method of claim 439 wherein the add-on computer software code has an ability to operate in Scenario F.

445. The method of claim 439 wherein the add-on computer software code has an ability to operate in Scenario G.

446. The method of claim 439 wherein the add-on computer software code has an ability to operate in Scenario H.

447. The method of claim 439 wherein the add-on computer software code has an ability to operate in Scenario I.

448. The method of claim 386 wherein the method employs one local computer or console.

449. The method of claim 386 wherein the method employs a plurality of local computers or consoles, or a combination thereof.

450. The method of claim 386 wherein the method employs one remote computer or console.

451. The method of claim 386 wherein the method employs a plurality of remote computers or consoles, or a combination thereof.

452. The method of claim 386 wherein the method employs at least one local computer or console and at least one remote computer or console.

453. The method of claim 386 wherein the method employs one local server.

454. The method of claim 386 wherein the method employs a plurality of local servers.

455. The method of claim 386 wherein the method employs one remote server.

456. The method of claim 386 wherein the method employs a plurality of remote servers.

457. The method of claim 386 wherein the method employs at least one local server and at least one remote server.

458. The method of claim 386 wherein the software design tool is an architectural software design tool.

459. The method of claim 386 wherein the software design tool is a civil engineering software design tool.

460. The method of claim 386 wherein the software design tool is an industrial software design tool.

461. The method of claim 386 wherein the method employs a local server system and an Intranet connection exists between the local server system and the computer or console.

462. The method of claim 386 wherein the method employs a remote server system and an Internet connection exists between the remote server system and the computer or console.

463. The method of claim 386 wherein the method employs both a local server system and a remote server system, and wherein an Intranet connection exists between the local server system and a computer or console and an Internet connection exists between the remote server system and a computer or console.

464. The method of claim 386 wherein the one or plurality of construction plan elements or parametric symbols, or both, are generic.

465. The method of claim 386 wherein the one or plurality of construction plan elements or parametric symbols, or both, are specific to a particular manufacturer, distributor, marketer or other provider of the construction plan elements or parametric symbols.

466. The method of claim 386 wherein the method does not create any schedule.

467. The method of claim 386 wherein the method creates one or a plurality of schedules.

468. The method of claim 467 wherein one or a plurality of the schedules becomes inserted into the construction plan drawing.

469. The method of claim 467 wherein the one or a plurality of schedules include or list, or both, one or a plurality of the construction plan elements or parametric symbols, or both.

470. The method of claim 469 wherein none of the schedules generated include for the one or a plurality of the construction plan elements or parametric symbols, or both: (i) price data or information, or a combination thereof; or (ii) one or a plurality of statements or indications, or any combination thereof, stating or indicating, or both, whether or not the construction plan elements or parametric symbols, or both, fulfill one or a plurality of predetermined environmental or efficiency criteria, or both.

471. The method of claim 467 wherein the method creates one or a plurality of schedules including: (i) pricing data or information, or both; (ii) one or a plurality of statements or indications, or both, stating or indicating, or both, whether or not the one or more construction plan elements or parametric symbols, or both, meet predetermined environmental or efficiency criteria, or both; or (iii) both (i) and (ii).

472. The method of claim 471 wherein the schedule contains a list of the construction plan elements or parametric symbols, or both, with corresponding: (i) price data or information, or both; (ii) statements or indications, or both, stating or indicating, or both, whether or not the construction plan elements or parametric symbols, or both, meet predetermined environmental or efficiency criteria, or both; or (iii) both (i) and (ii).

473. The method of claim 467 wherein the schedule additionally includes a reference number.

474. The method of claim 469 wherein the schedule additionally includes a reference number.

475. The method of claim 470 wherein the schedule additionally includes a reference number.

476. The method of claim 471 wherein the schedule additionally includes a reference number.

477. The method of claim 472 wherein the schedule additionally includes a reference number.

478. The method of claim 386 wherein the method employs an architectural software design tool, and wherein the architectural software design tool is a CAD software product.

479. The method of claim 386 wherein the construction plan elements or parametric symbols, or both, are selected from a group comprising at least one of a window, a door and an acrylic glass block.

480. The method of claim 386 wherein the add-on computer software code additionally confirms that one or a plurality of the construction plan elements or parametric symbols, or both, meet one or a plurality of criteria of a building code.

481. The method of claim 467 wherein the method permits a user to place an order to purchase one or more of the construction plan elements or parametric symbols, or both, that are present in the schedule.

482. The method of claim 472 wherein the method permits a user to place an order to purchase one or more of the construction plan elements or parametric symbols, or both, that are present in the schedule.

483. The method of claim 481 wherein the order may be placed using an Intranet, an Internet, the local or remote computer or console, a web site present on the local or remote server, or any combination thereof.

484. The method of claim 482 wherein the order may be placed using an Intranet, an Internet, the local or remote computer or console, a web site present on the local or remote server, or any combination thereof.

485. The method of claim 467 wherein the schedule created includes one or two construction plan elements or parametric symbols, or both.

486. The method of claim 467 wherein the schedule created includes two or more construction plan elements or parametric symbols, or both.

487. The method of claim 386 wherein the construction plan drawing includes one or more walls, and wherein one or more of the construction plan elements or parametric symbols, or both, automatically align with a wall.

488. The method of claim 487 wherein the one or more construction plan elements or parametric symbols, or both, automatically auto-embeds itself into the wall.

489. The method of claim 386 wherein the method employs one or more parametric symbols, and wherein the one or more parametric symbols have one or more corresponding parametric symbol values.

490. The method of claim 489 wherein the method additionally modifies one or more of the parametric symbol values after a corresponding parametric symbol is inserted into the construction plan drawing.

491. The method of claim 472 wherein the method additionally makes one or more changes to the one or more construction plan elements or parametric symbols, or both, that are present in the schedule.

492. The method of claim 491 wherein the method additionally automatically edits the schedule to correspond to the changes.

493. The method of claim 487 wherein the add-on computer code runs outside of the software design tool operating as a dynamic link library.

494. The method of claim 487 wherein the add-on computer code runs outside of the software design tool operating as an executable (.exe).

495. The method of claim 487 wherein the add-on computer code runs outside of the software design tool operating as an ActiveX.

496. The method of claim 487 wherein the add-on computer code runs outside of the software design tool operating as a COM object.

497. The method of claim 386 wherein the method does not use a zip code or geographic location.

498. The method of claim 386 wherein the method uses a zip code but not a geographic location.

499. The method of claim 386 wherein the method uses a geographic location but not a zip code.

500. The method of claim 386 wherein the method uses both a zip code and a geographic location.

501. The method of claim 386 wherein a price schedule is generated and the price schedule is a Bill of Materials.

502. The method of claim 386 wherein a price schedule is generated and the price schedule is a Take Off.

503. The method of claim 386 wherein a price schedule is generated and the price schedule is a spreadsheet.

504. The method of claim 386 wherein a price schedule or a schedule stating whether or not the one or more construction plan elements or parametric symbols, or both, meet predetermined environmental or efficiency criteria, or both, or both, is generated and the method additionally exports one or both of the schedules as a standalone object into a database in a form of a computer application or format.

505. The method of claim 504 wherein the computer application or format is Excel, Word, Plain Text, HTML, XML or PDF, or any combination thereof.

506. The method of claim 386 wherein a price schedule or a schedule stating whether or not the one or more construction plan elements or parametric symbols, or both, meet predetermined environmental or efficiency criteria, or both, or both, is generated and the method additionally edits one or both of the schedules.

507. The method of claim 386 wherein the price data or information, or both, or the statements or indications as to whether or not the one or more construction plan elements or parametric symbols, or both, meet predetermined environmental or efficiency criteria, or both, or both, is present on, or is accessed by, the local server system.

508. The method of claim 386 wherein the price data or information, or both, or the statements or indications as to whether or not the one or more construction plan elements or parametric symbols, or both, meet predetermined environmental or efficiency criteria, or both, or both, is present on, or is accessed by, the remote server system.

509. The method of claim 386 wherein the price data or information, or both, or the statements or indications as to whether or not the one or more construction plan elements or parametric symbols, or both, meet predetermined environmental or efficiency criteria, or both, or both, is present on, or is accessed by, both the local server system and the remote server system.

510. The method of claim 386 wherein the price data or information, or both, is within an area or region within the zip code.

511. The method of claim 386 wherein the price data or information, or both, is within an area or region within the geographic location.

512. The method of claim 386 wherein the price data or information, or both, is within an area or region within the zip code or the geographic location, or both.

513. The method of claim 386 wherein: (i) the method creates a price schedule and the price schedule includes one or a plurality of individual costs for the one or plurality of construction plan elements or parametric symbols, or both; (ii) the system creates a schedule, and the schedule includes one or a plurality of statements or indications, or both, stating or indicating whether or not the one or more construction plan elements or parametric symbols, or both, meet predetermined environmental or efficiency criteria, or both; or (iii) or both.

514. The method of claim 386 wherein the method creates a price schedule and the price schedule includes one or a plurality of combined costs for the one or plurality of construction plan elements or parametric symbols, or both.

515. The method of claim 513 wherein the method creates a price schedule and the price schedule includes a total cost for all of the one or plurality of construction plan elements or parametric symbols, or both.

516. The method of claim 513 wherein either one or both schedules has an ability to include therein one or a plurality of construction plan elements or parametric symbols, or both.

517. The method of claim 513 wherein one or both of the schedules can be used immediately or at a subsequent time or date, or both, on the computer, console, server, dynamic link library, executable (.exe), ActiveX or COM object, or combination thereof, to place an order to purchase one or a plurality of the construction plan elements or parametric symbols, or both, that are present in the schedule, or both.

518. The method of claim 517 wherein one or both schedules can be used immediately on the computer, console, server, dynamic link library, executable (.exe), ActiveX or COM object, or combination thereof, to place an order to purchase one or a plurality of the construction plan elements or parametric symbols that are present in the schedule, or both.

519. The method of claim 517 wherein one or both schedules can be used at a subsequent time or date, or both, on the computer, console, server, dynamic link library, executable (.exe), ActiveX or COM object, or combination thereof, to place an order to purchase one or a plurality of the construction plan elements or parametric symbols that are present in the schedule, or both.

520. The method of claim 386 wherein the method does not generate a price schedule.

521. The method of claim 386 wherein the method comprises an additional step of placing an order to purchase one or more of the construction plan elements or parametric symbols, or both, and wherein one or more schedules are or are not generated.

522. The method of claim 521 wherein the order is placed using an Intranet, an Internet, one or a plurality of local or remote computers or consoles, web sites, local or remote servers or networks, or any combination thereof.

523. The method of claim 521 wherein the order is placed without a use of a computer or console.

524. The method of claim 523 wherein the order is placed in person at a manufacturer, distributor or other provider of construction plan elements, or using a telephone, a facsimile machine or a U.S. or foreign mail carrier or deliverer, or any combination thereof.

525. The method of claim 386 wherein the method employs one or a plurality of parametric symbols, and wherein one or more parametric symbol values are selected by a user.

526. The method of claim 386 wherein one or a plurality of parametric symbols is inserted into the construction plan drawing, wherein one or more parametric symbol values is selected by a user, and wherein one or more of the selected parametric symbol values is modified after a corresponding parametric symbol is inserted into the construction plan drawing.

527. The method of claim 386 wherein the method permits a user to automatically generate: (i) a price schedule; (ii) a schedule that includes one or a plurality of statements or indications, or both, stating or indicating whether or not the one or more construction plan elements or parametric symbols, or both, meet predetermined environmental or efficiency criteria, or both; or (iii) or both.

528. The method of claim 386 wherein a price schedule or a schedule that includes one or a plurality of statements or indications, or both, stating or indicating whether or not the one or more construction plan elements or parametric symbols, or both, meet predetermined environmental or efficiency criteria, or both, is generated by a user manually.

529. The method of claim 386 wherein the method comprises an additional step of inserting a price schedule or a schedule that includes one or a plurality of statements or indications, or both, stating or indicating whether or not the one or more construction plan elements or parametric symbols, or both, meet predetermined environmental or efficiency criteria, or both, or both, into the construction plan drawing.

530. The method of claim 386 wherein a price schedule or a schedule that includes one or a plurality of statements or indications, or both, stating or indicating whether or not the one or more construction plan elements or parametric symbols, or both, meet predetermined environmental or efficiency criteria, or both, or both, is created and contains a list of the one or plurality of construction plan elements or parametric symbols, or both, with: (i) corresponding prices; (ii) corresponding statements or indications, or both, stating or indicating whether or not they meet predetermined environmental or efficiency criteria, or both; or (iii) both.

531. The method of claim 386 wherein the method creates a price schedule or a schedule that includes one or a plurality of statements or indications, or both, stating or indicating whether or not the one or more construction plan elements or parametric symbols, or both, meet predetermined environmental or efficiency criteria, or both, or both, including one or two construction plan elements or parametric symbols, or both.

532. The method of claim 386 wherein a price schedule or a schedule that includes one or a plurality of statements or indications, or both, stating or indicating whether or not the one or more construction plan elements or parametric symbols, or both, meet predetermined environmental or efficiency criteria, or both, or both, is created, and thereafter one or more changes is made to one or more of the construction plan elements or parametric symbols, or both, that are present therein, and one or both of the schedules is automatically edited to correspond to the changes.

533. The method of claim 386 wherein the database is formed, maintained or supported, or a combination thereof, by 1stPricing or 1stWindows.

534. The method of claim 386 wherein the database is not formed, maintained or supported by 1stPricing or 1stWindows.

535. The method of claim 534 wherein the database may be accessed using a web site.

536. An automated system for creating for one or a plurality of construction plan elements of a construction project one or a plurality of statements or indications, or a combination thereof, that describes or indicates, or both, whether or not the construction plan elements fulfill one or a plurality of predetermined environmental or efficiency criteria or requirements, or both, and optionally one or a plurality of corresponding schedules comprising:
- (a) one or a plurality of local or remote computers, consoles or servers, or any combination thereof;
- (b) an architectural, civil or industrial software design tool, wherein the software design tool provides on the computer, console or server a construction plan drawing having at least one construction plan element;
- (c) one or a plurality of databases including data or information, or both, for the one or more construction plan elements, wherein the data or information, or both, states or indicates, or both, whether or not the one or more construction plan elements meet predetermined environmental or efficiency criteria, or both; and
- (d) an add-on computer software code that runs as an internal component within the software design tool on the computer, console or server;

wherein the add-on computer software code optionally has a palette that includes one or more parametric symbols that corresponds with the one or more construction plan elements, and that may optionally be selected by a user for insertion into the construction plan drawing; and wherein the add-on computer software code when executed by the computer, console or server:
- (i) optionally inserts at least one of the parametric symbols that are optionally selected by a user into the construction plan drawing;
- (ii) transmits data or information, or both, corresponding to the one or more construction plan elements or parametric symbols, or both, from the computer, console or server to the database, either directly or via an optional communication module;
- (iii) receives from the database for one or more construction plan elements or parametric symbols, or both, one or a plurality of statements or indication, or both, stating or indicating, or both, whether or not the construction plan elements or parametric symbols, or both, meet predetermined environmental or efficiency criteria, or both, either directly or via an optional communication module; and
- (iv) optionally generates a schedule from the statements or indications, or both, wherein the schedule includes one or a plurality of statement or indications, or both, for one or more of the construction plan elements or parametric symbols, or both, stating or indicating, or both, whether or not the construction plan elements or parametric symbols meet predetermined environmental or efficiency criteria, or both.

537. An automated system for creating for one or a plurality of construction plan elements of a construction project both one or a plurality of prices and one or a plurality of statements or indications, or a combination thereof, that describes or indicates, or both, whether or not the construction plan elements fulfill one or a plurality of predetermined environmental or efficiency criteria or requirements, or both, and optionally one or a plurality of corresponding schedules comprising:
- (a) one or a plurality of local or remote computers, consoles or servers, or any combination thereof;
- (b) an architectural, civil or industrial software design tool, wherein the software design tool provides on the computer, console or server a construction plan drawing having one or more construction plan elements;
- (c) one or more databases for the construction plan elements including pricing data or information, or both, or data or information, or both, stating or indicating whether or not the construction plan elements meet predetermined environmental or efficiency criteria, or both, or a combination thereof; and
- (d) an add-on computer software code that runs as an internal component within the software design tool on the computer, console or server;

wherein the add-on computer software code optionally has a palette that includes one or more parametric symbols that correspond with one or more construction plan elements, and that may optionally be selected by a user for insertion into the construction plan drawing; and wherein the add-on computer software code when executed by the computer, console or server:
- (i) optionally, inserts at least one of the construction plan elements or parametric symbols, or both, that are optionally selected by a user into the construction plan drawing;
- (ii) transmits data or information, or both, corresponding to one or more construction plan elements or parametric symbols, or both, from the computer, console or server to the database;
- (iii) receives from the database for the one or more construction plan elements or parametric symbols, or both:
  - (a) a price for the purchase of the one or more construction plan elements or parametric symbols, or both, wherein the price may be determined using price data or information, or both, that is present in the database; and/or
  - (b) a statement as to whether or not the one or more construction plan elements or parametric symbols, or both, meet predetermined environmental or efficiency criteria, or both; and
- (iv) optionally, generates:
  - (a) a price schedule from the prices, wherein the price schedule may optionally include one or more costs for the one or more construction plan elements or parametric symbols, or both, or a total cost for all of the construction plan elements or parametric symbols, or both, wherein the price schedule can optionally include one or more construction plan elements or parametric symbols, or both, and wherein the price schedule can optionally be immediately used on the local computer to place an order to purchase one or more construction plan elements or parametric symbols, or both, that are present in the price schedule;
  - (b) a schedule of statements or indications, or both, stating or indicating whether or not the one or more construction plan elements or parametric symbols, or both, meet predetermined environmental or efficiency criteria, or both; or
  - (c) both the price schedule of (a) and the schedule of (b).

538. An automated method for creating one or a plurality of statements or indications, or a combination thereof, for one or a plurality of construction plan elements of a construction project that describes or indicates whether or not the construction plan elements fulfill one or a plurality of predetermined environmental or efficiency criteria or requirements, or both, and optionally one or a plurality of corresponding schedules comprising:

(a) providing on a local or remote computer, console or server an architectural, civil or industrial software design tool and a construction plan drawing having at least one construction plan element, wherein the construction plan drawing is created with the software design tool;

(b) providing on the computer, console or server an add-on computer software code that runs as an internal component within the software design tool, and that optionally includes a palette containing one or more parametric symbols that correspond with one or more construction plan elements, and optionally one or more corresponding parametric symbol values;

(c) optionally, selecting one or more of the construction plan elements or parametric symbols, or both, that is included in the optional palette for insertion into the construction plan drawing;

(d) optionally, inserting one or more of the construction plan elements or parametric symbols into the construction plan drawing;

(e) using the add-on computer software code, transmitting data or information, or both, by the computer, corresponding to the one or more construction plan elements or parametric symbols, or both, from the computer, console or server to one or a plurality of databases, either directly or via an optional communication module;

(f) using the add-on computer software code, accessing data or information, or both, from the database that includes data or information, or both, for the one or more construction plan elements or parametric symbols, or both, wherein the data or information, or both, states whether or not the one or more construction plan elements or parametric symbols, or both, meet predetermined environmental or efficiency criteria, or both; and (g) optionally, using the add-on computer software code, creating a schedule from the data or information, or both, wherein the schedule states for the one or more construction plan elements or parametric symbols, or both, whether or not the one or more construction plan elements or parametric symbols, or both, meet predetermined environmental or efficiency criteria, or both.

539. An automated method for creating for one or a plurality of construction plan elements of a construction project both one or a plurality of prices and one or a plurality of statements or indications, or a combination thereof, that describes or indicates, or both, whether or not the construction plan elements fulfill one or a plurality of predetermined environmental or efficiency criteria or requirements, or both, and optionally one or a plurality of corresponding schedules comprising:

(a) providing on one or a plurality of local or remote computers, servers or consoles, or a combination thereof, an architectural, civil or industrial software design tool and a construction plan drawing having at least one construction plan element, wherein the construction plan drawing is created using the software design tool;

(b) providing on the computer, server or console an add-on computer software code that runs as an internal component within the software design tool, and that optionally includes a palette containing one or more parametric symbols corresponding to the one or more construction plan elements, and optionally one or more corresponding parametric symbol values;

(c) optionally, selecting one or more of the parametric symbols that is included in the palette for insertion into the construction plan drawing;

(d) optionally, selecting one or more parametric symbol values for one or more of the selected parametric symbols;

(e) optionally, selecting one or more types of manufacturers, distributors or other construction plan element providers for one or more of the construction plan elements or parametric symbols, or both;

(f) optionally, inserting one or more of the construction plan elements or parametric symbols, or both, into the construction plan drawing;

(g) using the add-on computer software code, transmitting data or information, or both, corresponding to the construction plan elements or parametric symbols, or both, from the one or plurality of computers, consoles or servers to one or a plurality of databases, either directly or via an optional communication module;

(h) using the add-on computer software code, accessing price data or information, or both, from the database that includes price data or information, or both, for a purchase of one or a plurality of the construction plan elements or parametric symbols, or both, and, using the add-on computer software code, accessing data or information, or both, from the database that states or indicates, or both, whether or not the one or plurality of construction plan elements or parametric symbols, or both, meet predetermined environmental or efficiency criteria, or both;

(i) determining, by the computer, from the price data a price for the one or a plurality of construction plan elements or parametric symbols, or both; and (j) optionally, using the add-on computer software code when executed by the one or plurality of computers, consoles or servers:

(1) creating a price schedule from the prices, wherein the price schedule may optionally include one or more costs or a total cost for all of the construction plan elements or parametric symbols, or both, wherein the price schedule may optionally include one or more construction plan elements or parametric symbols, or both, and wherein the price schedule may optionally be immediately used on the local computer to place an order to purchase one or more construction plan elements or parametric symbols, or both, that are present in the price schedule;

(2) creating a schedule from the data or information, or both, that states or indicates, or both, whether or not the one or more construction plan elements or parametric symbols, or both, meet predetermined environmental or efficiency criteria, or both, wherein the schedule states for the one or more construction plan elements or parametric symbols, or both, whether or not the construction plan elements or parametric symbols, or both, meet predetermined environmental or efficiency criteria, or both; or (3) creating both the price schedule of (1) and the schedule of (2).

* * * * *